US012721163B2

(12) United States Patent
Nakano et al.

(10) Patent No.: US 12,721,163 B2
(45) Date of Patent: Aug. 25, 2026

(54) SEMICONDUCTOR DEVICE

(71) Applicant: DENSO CORPORATION, Kariya-city (JP)

(72) Inventors: Keisuke Nakano, Kariya-city (JP); Tomomi Okumura, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 373 days.

(21) Appl. No.: 18/504,255

(22) Filed: Nov. 8, 2023

(65) Prior Publication Data

US 2024/0079291 A1 Mar. 7, 2024

Related U.S. Application Data

(63) Continuation of application No. PCT/JP2022/018366, filed on Apr. 21, 2022.

(30) Foreign Application Priority Data

May 27, 2021 (JP) ................................ 2021-088986

(51) Int. Cl.
*H01L 23/373* (2006.01)
*H01L 23/29* (2006.01)
(Continued)

(52) U.S. Cl.
CPC ........ *H10W 40/255* (2026.01); *H10W 74/114* (2026.01); *H10W 74/47* (2026.01)

(58) Field of Classification Search
CPC .. H10W 40/255; H10W 74/114; H10W 74/47
See application file for complete search history.

(56) References Cited

U.S. PATENT DOCUMENTS 5,920,117 A * 7/1999 Sono ........................ H01L 23/13 257/676
6,037,657 A * 3/2000 Tsurumi ............... H05K 3/3436 257/704
(Continued)

FOREIGN PATENT DOCUMENTS

JP 2011-199110 A 10/2011
JP 2020-115568 A 7/2020
(Continued)

OTHER PUBLICATIONS

U.S. Appl. No. 18/790,510, filed Jul. 31, 2024, Nakamura et al.
(Continued)

*Primary Examiner* — Peniel M Gumedzoe
(74) *Attorney, Agent, or Firm* — Posz Law Group, PLC

(57) ABSTRACT

A semiconductor device includes a semiconductor element having main electrodes on opposite faces opposite in a predetermined direction, a substrate, and a sealing body containing resin. The substrate has an insulating base member, a front-face metal body on a front face of the insulating base member and a back-face metal body on a back face of the insulating base member, the front-face metal body being connected to at least one of the main electrodes of the semiconductor element. The insulating base member and the sealing body satisfy a relationship of Tgs≥Tgi and a relationship of αi≥αs, in which Tgi is a glass transition point of the insulating base member, αi is a linear expansion coefficient of the insulating base member, Tgs is a glass transition point of the sealing body, and αs is a linear expansion coefficient of the sealing body.

5 Claims, 83 Drawing Sheets

(51) Int. Cl.

| | |
|---|---|
| ***H01L 23/31*** | (2006.01) |
| ***H10W 40/25*** | (2026.01) |
| ***H10W 74/10*** | (2026.01) |
| ***H10W 74/47*** | (2026.01) |

(56) References Cited

U.S. PATENT DOCUMENTS

| | | | | |
|---|---|---|---|---|
| 6,197,617 | B1 * | 3/2001 | Ohuchi | H01L 23/13 257/E21.503 |
| 6,809,421 | B1 * | 10/2004 | Hayasaka | H01L 23/642 257/621 |
| 2005/0067721 | A1 | 3/2005 | Blaszczak et al. | |
| 2016/0027716 | A1 * | 1/2016 | Yamada | H01L 23/3735 257/712 |
| 2019/0221496 | A1 | 7/2019 | Tsuchimochi | |
| 2021/0407876 | A1 | 12/2021 | Yamada | |
| 2022/0051961 | A1 * | 2/2022 | Ogawa | H01L 23/24 |

FOREIGN PATENT DOCUMENTS

| | | | |
|---|---|---|---|
| JP | 2022-181812 | A | 12/2022 |
| JP | 2022-181814 | A | 12/2022 |
| JP | 2022-181816 | A | 12/2022 |
| JP | 2022-181820 | A | 12/2022 |
| JP | 2022-181821 | A | 12/2022 |

OTHER PUBLICATIONS

U.S. Appl. No. 18/802,821, filed Aug. 13, 2024, Yoshikawa.
U.S. Appl. No. 18/504,487, filed Nov. 8, 2023, Kawashima et al.
U.S. Appl. No. 18/504,296, filed Nov. 8, 2023, Tsuchimochi et al.
U.S. Appl. No. 18/504,231, filed Nov. 8, 2023, Murozaki et al.
U.S. Appl. No. 18/504,271, filed Nov. 8, 2023, Kimura et al.
U.S. Appl. No. 18/504,307, filed Nov. 8, 2023, Omae et al.
U.S. Appl. No. 18/504,332, filed Nov. 8, 2023, Munakata et al.

* cited by examiner

SEMICONDUCTOR DEVICE

CROSS REFERENCE TO RELATED APPLICATIONS

The present application is a continuation application of International Patent Application No. PCT/JP2022/018366 filed on Apr. 21, 2022, which designated the U.S. and claims the benefit of priority from Japanese Patent Application No. 2021-088986 filed on May 27, 2021. The entire disclosures of all of the above applications are incorporated herein by reference.

TECHNICAL FIELD

The present disclosure relates to a semiconductor device.

BACKGROUND

JP 2020-150021 A discloses a semiconductor device having a semiconductor element, a substrate and a sealing body. The semiconductor element has main electrodes on opposite faces thereof. The substrate has an insulating base member and metal body disposed on opposite faces of the insulating base member. The contents of JP 2020-150021 A are incorporated by reference as descriptions of technical elements in this specification.

SUMMARY

The present disclosure describes a semiconductor device. In an aspect, a semiconductor device disclosed herein is to be arranged adjacent to a cooler in a predetermined direction, and includes a semiconductor element, a substrate, and a sealing body. The semiconductor element has main electrodes on both faces opposite in the predetermined direction. The substrate has an insulating base member containing resin, a front-face metal body disposed on a front face of the insulating base member and a back-face metal body disposed on a back face of the insulating base member. The front-face metal body is electrically connected to at least one of the main electrodes of the semiconductor element. The sealing body contains resin and seals at least a part of the substrate and the semiconductor element. A glass transition point of the insulating base member is referred to as Tgi, and a linear expansion coefficient of the insulating base member is referred to as $\alpha i$. A glass transition point of the sealing body is referred to as Tgs, and a linear expansion coefficient of the sealing body is referred to as $\alpha s$. The insulating base member and the sealing body satisfy a relationship of $Tgs \geq Tgi$ and a relationship of $\alpha i \geq \alpha s$.

BRIEF DESCRIPTION OF DRAWINGS

FIG. 120 is a sectional view taken along line CXX-CXX of FIG. 113.

FIG. 121 is an enlarged view of a region CXXI in FIG. 120.

DETAILED DESCRIPTION

Figure 1:
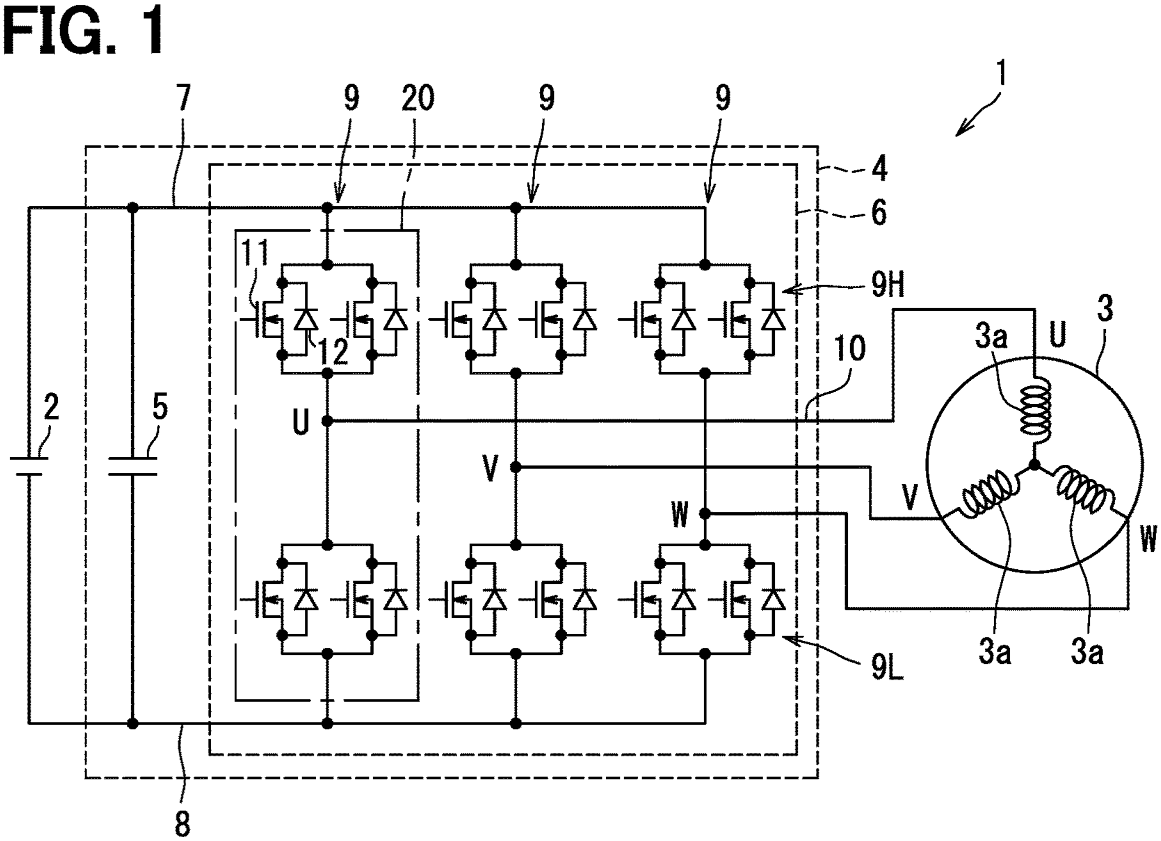
FIG. 1 is a diagram illustrating a circuit configuration of a power conversion device to which a semiconductor device according to a first embodiment is applied.

For example, there is known a semiconductor device having a semiconductor element, a substrate and a sealing body. The semiconductor element has main electrodes on opposite faces thereof. The substrate has an insulating base member and metal body disposed on opposite faces of the insulating base member. The sealing body seals the semiconductor element in order to suppress stress concentration on the main electrodes and a bonding portion with the main electrodes. If the sealing function is deteriorated, there is a feat that cracks occur at the main electrodes or the bonding portion with the main electrodes. If warpage occurs in the semiconductor device and an opposing distance between the semiconductor device and a cooler increases, a thermal resistance increases. When the thermal resistance increases, it is difficult to effectively release heat of the semiconductor element. Further, there may be a fear that the semiconductor element is brought into an overheated state. From the above-described viewpoint or from other viewpoints not mentioned, further improvement is required for the semiconductor device.

The present disclosure provides a semiconductor device with enhanced reliability.

According to an aspect of the present disclosure, a semiconductor device is to be arranged adjacent to a cooler in a predetermined direction, and includes a semiconductor element, a substrate, and a sealing body. The semiconductor element has main electrodes on both faces opposite in the predetermined direction. The substrate has an insulating base member containing resin, a front-face metal body disposed on a front face of the insulating base member and a back-face metal body disposed on a back face of the insulating base member. The front-face metal body is electrically connected to at least one of the main electrodes of the semiconductor element. The sealing body contains resin and seals at least a part of the substrate and the semiconductor element. A glass transition point of the insulating base member is referred to as Tgi, and a linear expansion coefficient of the insulating base member is referred to as $\alpha i$. A glass transition point of the sealing body is referred to as Tgs, and a linear expansion coefficient of the sealing body is referred to as $\alpha s$. The insulating base member and the sealing body satisfy a relationship of $Tgs \geq Tgi$ and a relationship of $\alpha i \geq \alpha s$.

The sealing body seals the semiconductor element. The sealing body is located closer to the semiconductor element than the insulating base member. Therefore, when the semiconductor element is operated, that is, when heat is generated from the semiconductor element, the temperature of the sealing body is likely to be higher than the temperature of the insulating base member. According to the aspect described above, the glass transition point Tgs of the sealing body is equal to or higher than the glass transition point Tgi of the insulating base member. Therefore, the temperature of the sealing body is less likely to be higher than the glass transition point Tgs of the sealing body. As such, it is less likely that the Young's modulus of the sealing body will decrease due to the temperature of the sealing body exceeding the glass transition point, and the sealing function of the sealing body will decrease. Further, it is less likely that stress will concentrate on the main electrode of the semiconductor element and the bonding portion with the main electrode due to the decrease in the sealing function. That is, it is possible to improve the connection reliability. In addition, the linear expansion coefficient $\alpha i$ of the insulating base member is equal to or higher than the linear expansion coefficient $\alpha s$ of the sealing body. Therefore, when the semiconductor element is operated, the amount of expansion of the insulating base member is larger than the amount of expansion of the sealing body. Due to the difference of the amounts of expansion, warpage protruding outward occurs in the semiconductor device in the predetermined direction. As a result, the opposing distance between the semiconductor device and the cooler is reduced, and the thermal resistance between the semiconductor device and the cooler is reduced. Since the heat of the semiconductor element is effectively released, it is possible to suppress the semiconductor element from being in the overheated state. Accordingly, the semiconductor device having enhanced reliability can be provided.

A plurality of embodiments disclosed in this specification employ technical measures different from each other in order to achieve respective objects. Objects, features, and beneficial advantages, as referred to in this specification, will become clear with reference to the following detailed explanation or accompanying drawings.

Hereinafter, a plurality of embodiments will be described with reference to the drawings. Note that the same reference signs are given to corresponding components in each embodiment, and redundant description may be omitted. When only part of the configuration is described in each embodiment, the configuration of the other preceding embodiment(s) can be applied to other parts of the configuration. A combination of configurations is not limited to the combination of the configurations explicitly described in the description of each embodiment. Configurations of a plurality of embodiments can be combined in part even if not explicitly described as long as there is no problem in the combination.

The semiconductor device according to the present embodiment is applicable to, for example, a power conversion device for a moving object with a rotary electric machine as a drive source. The moving object is, for example, an electrically driven vehicle such as an electric vehicle (EV), a hybrid vehicle (HV), or a plug-in hybrid vehicle (PHV), a flying object such as a drone, a ship, a construction machine, or an agricultural machine. Hereinafter, an example applied to a vehicle will be described.

First Embodiment

First, a schematic configuration of a drive system 1 of a vehicle will be described with reference to FIG. 1.

<Vehicle Drive System>

As illustrated in FIG. 1, the drive system 1 of a vehicle is provided with a direct current (DC) power supply 2, a motor generator 3, and a power conversion device 4.

The DC power supply 2 is a direct-current voltage source including a chargeable/dischargeable secondary battery. The secondary battery is, for example, a lithium ion battery or a nickel hydride battery. The motor generator 3 is a three-phase alternating current (AC) type rotary electric machine. The motor generator 3 functions as a vehicle driving power source, that is, an electric motor. The motor generator 3 functions also as a generator during regeneration. The power conversion device 4 performs power conversion at a position between the DC power supply 2 and the motor generator 3.

<Power Conversion Device>

Next, a circuit configuration of the power conversion device 4 will be described with reference to FIG. 1. The power conversion device 4 includes a power conversion circuit. The power conversion device 4 according to the present embodiment includes a smoothing capacitor 5 and an inverter 6 which is a power conversion circuit.

The smoothing capacitor 5 mainly smooths a DC voltage supplied from the DC power supply 2. The smoothing capacitor 5 is connected to a P line 7 which is a power supply line on a high potential side and an N line 8 which is a power supply line on a low potential side. The P line 7 is connected to a positive electrode of the DC power supply 2, and the N line 8 is connected to a negative electrode of the DC power supply 2. The positive electrode of the smoothing capacitor 5 is connected to the P line 7 at a position between the DC power supply 2 and the inverter 6. The negative electrode of the smoothing capacitor 5 is connected to the N line 8 at a position between the DC power supply 2 and the inverter 6. The smoothing capacitor 5 is connected in parallel with the DC power supply 2.

The inverter 6 is a DC-AC conversion circuit. The inverter 6 converts a DC voltage into a three-phase AC voltage, and outputs the AC voltage to the motor generator 3 according to switching control by a control circuit (not illustrated). Thereby, the motor generator 3 is driven to generate a predetermined torque. The inverter 6 converts the three-phase AC voltage generated by the motor generator 3 by receiving a rotational force from the wheels during a regenerative braking of the vehicle into the DC voltage according to the switching control by the control circuit, and outputs the DC voltage to the P line 7. In such manner, the inverter 6 performs bidirectional power conversion between the DC power supply 2 and the motor generator 3.

The inverter 6 includes upper-lower arm circuits 9 for three phases. The upper-lower arm circuit 9 may be referred to as a "leg". The upper-lower arm circuit 9 has an upper arm 9H and a lower arm 9L, respectively. The upper arm 9H and the lower arm 9L are connected in series between the P line 7 and the N line 8, with the upper arm 9H put on the P line 7 side. A connection point between the upper arm 9H and the lower arm 9L is connected to a winding 3*a* of the corresponding phase in the motor generator 3 via an output line 10. The inverter 6 includes six arms. Each arm is configured to include a switching element. At least part of each of the P line 7, the N line 8, and the output line 10 is composed of a conductive member such as a bus bar.

In the present embodiment, an n-channel type MOSFET 11 is adopted as a switching element composing each arm. The number of switching elements constituting each arm is not particularly limited. The number thereof may be one or more. The MOSFET is an abbreviation for "metal oxide semiconductor field effect transistor".

As an example, in the present embodiment, each arm includes two MOSFETs 11. The two MOSFETs 11 constituting one arm are connected in parallel. In the upper arm 9H, drains of the two MOSFETs 11 connected in parallel are connected to the P line 7. In the lower arm 9L, sources of the two MOSFETs 11 connected in parallel are connected to the N line 8. Sources of the two MOSFETs 11 connected in parallel in the upper arm 9H and drains of the two MOSFETs 11 connected in parallel in the lower arm 9L are connected to each other. The two MOSFETs 11 connected in parallel are driven on or off at the same timing by a common gate drive signal (drive voltage).

A freewheeling diode 12 is connected in anti-parallel to each of the MOSFETs 11. The diode 12 may be a parasitic diode (i.e., body diode) of the MOSFET 11 or may be provided separately from the parasitic diode. An anode of the diode 12 is connected to the source of the corresponding MOSFET 11, and a cathode is connected to the drain thereof. The upper-lower arm circuit 9 for one phase is provided by one semiconductor device 20. Details of the semiconductor device 20 will be described later.

The power conversion device 4 may further include a converter as a power conversion circuit. The converter is a DC-DC conversion circuit that converts a DC voltage into a DC voltage having a different value. The converter is provided at a position between the DC power supply 2 and the smoothing capacitor 5. The converter is configured to include, for example, a reactor and the above-mentioned upper-lower arm circuit 9. This configuration can boost and suppress voltage. The power conversion device 4 may include a filter capacitor that removes power supply noise from the DC power supply 2. The filter capacitor is provided at a position between the DC power supply 2 and the converter.

The power conversion device 4 may include a drive circuit for the switching elements constituting the inverter 6 and the like. The drive circuit supplies a drive voltage to a gate of the MOSFET 11 of the corresponding arm based on a drive command of the control circuit. The drive circuit drives a corresponding MOSFET 11, that is, drives a corresponding MOSFET 11 on or off, by applying a drive voltage. The drive circuit may be referred to as a "driver".

The power conversion device 4 may include a control circuit for the switching element. The control circuit generates a drive instruction for operating the MOSFET 11, and outputs the drive command to the drive circuit. The control circuit generates a drive command based on a torque request input from a higher-level ECU (not illustrated) and signals detected by various sensors. ECU is an abbreviation of "electronic control unit".

Various sensors include, for example, a current sensor, a rotation angle sensor, and a voltage sensor. The current sensor detects a phase current flowing through the winding 3*a* of each phase. The rotation angle sensor detects a rotation angle of a rotor of the motor generator 3. The voltage sensor detects a voltage between both ends of the smoothing capacitor 5. The control circuit outputs, for example, a PWM signal as a drive command. The control circuit includes, for example, a processor and a memory. PWM is an abbreviation of "pulse width modulation".

<Semiconductor Device>

Figure 2:
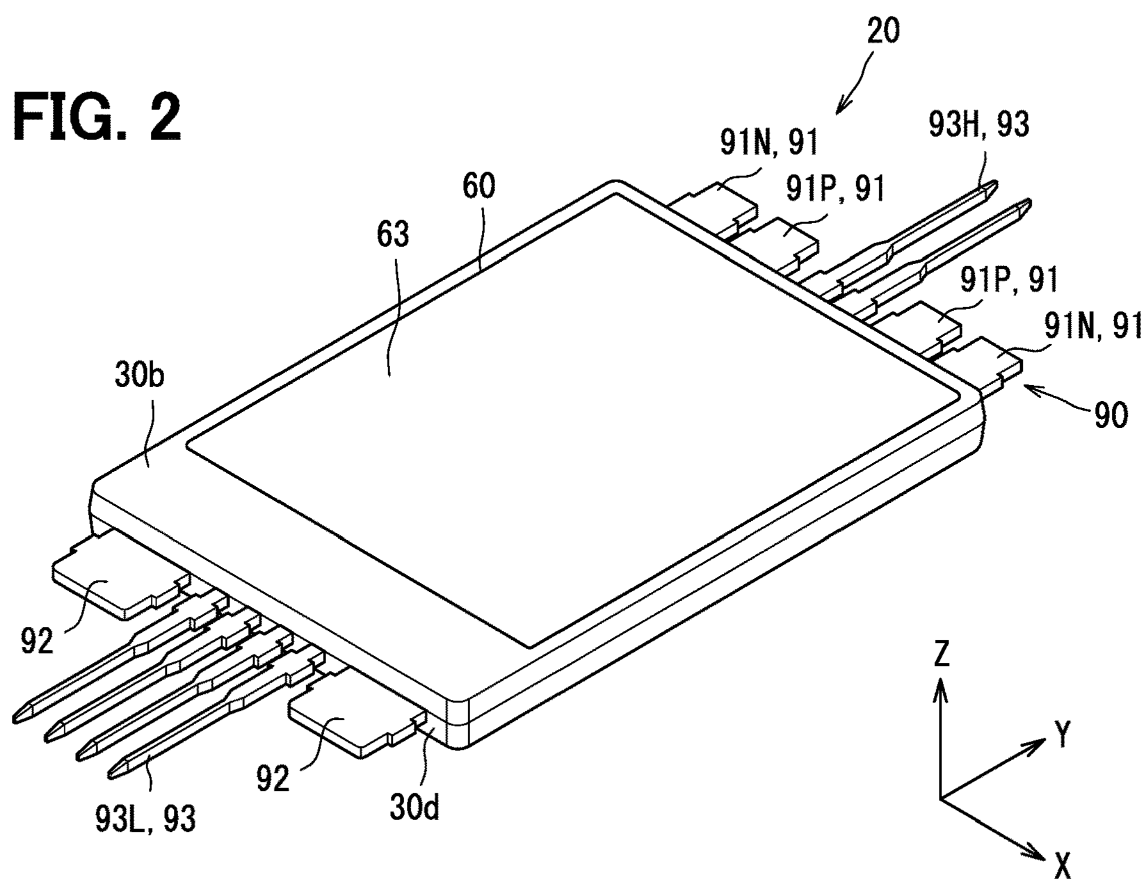
FIG. 2 is a perspective view illustrating the semiconductor device.
Figure 3:
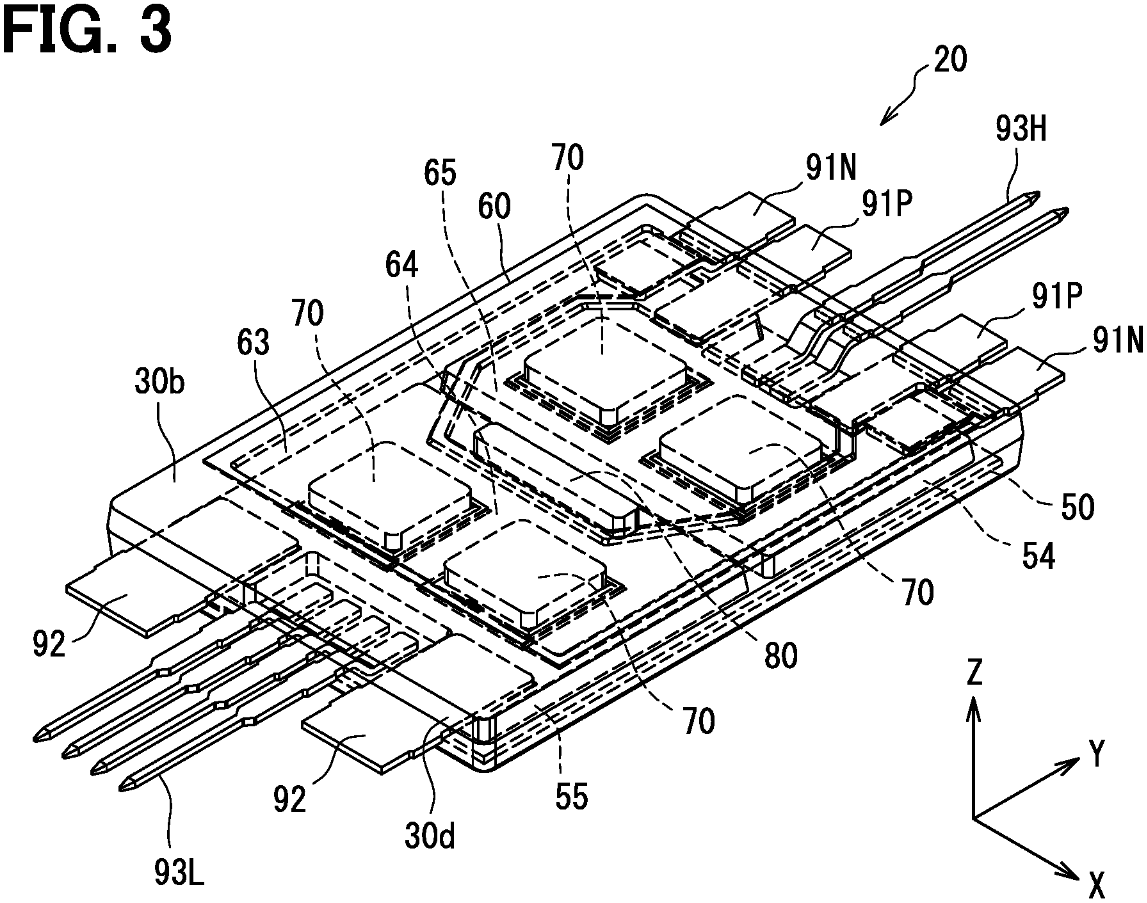
FIG. 3 is a perspective view illustrating the semiconductor device.
Figure 4:
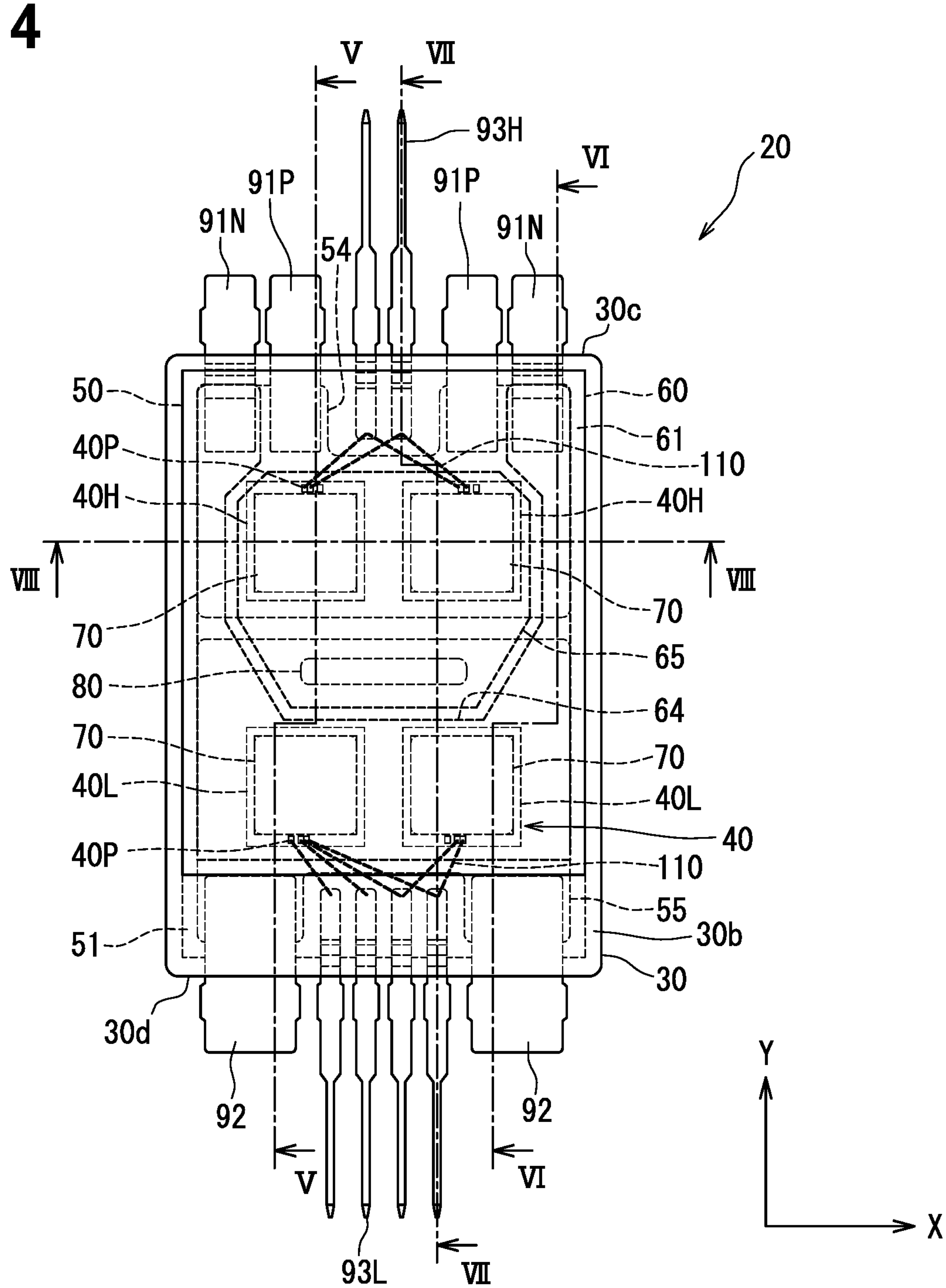
FIG. 4 is a plan view illustrating the semiconductor device.
Figure 5:
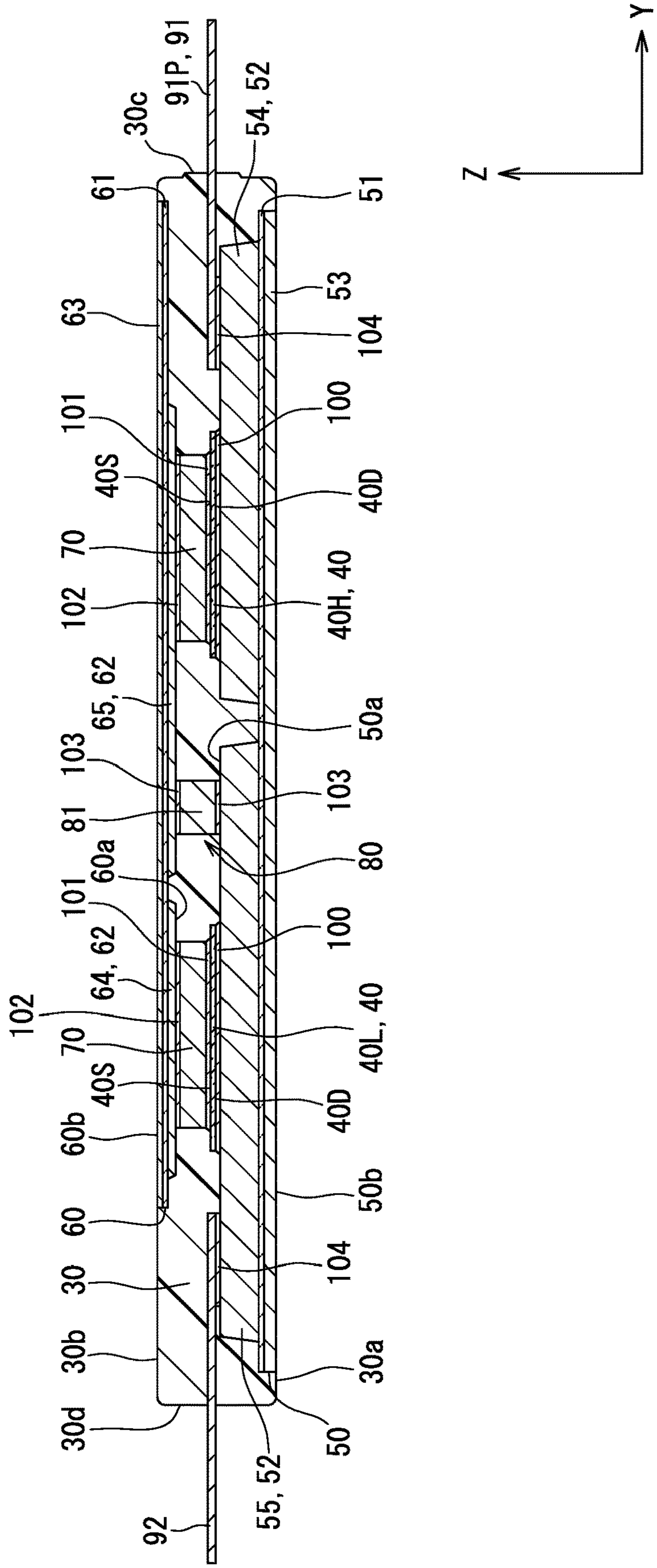
FIG. 5 is a sectional view taken along line V-V of FIG. 4.
Figure 6:
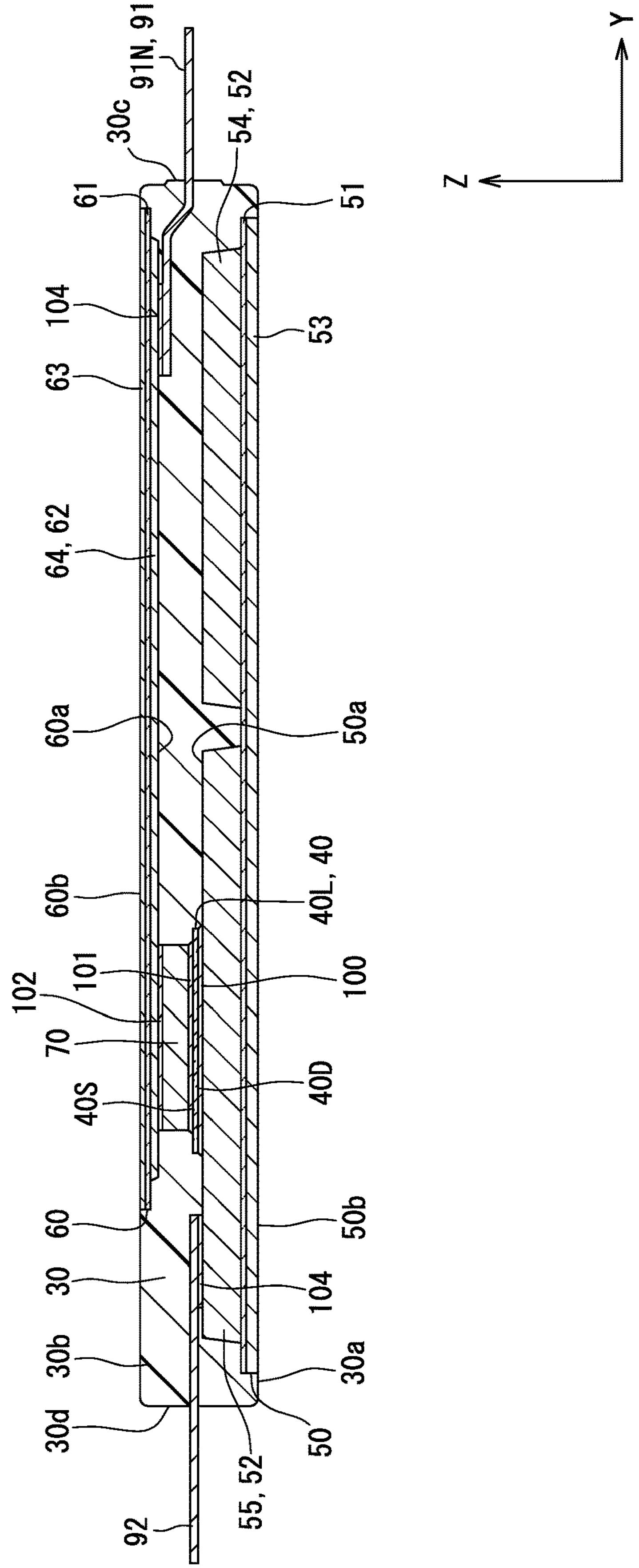
FIG. 6 is a sectional view taken along line VI-VI of FIG. 4.
Figure 7:
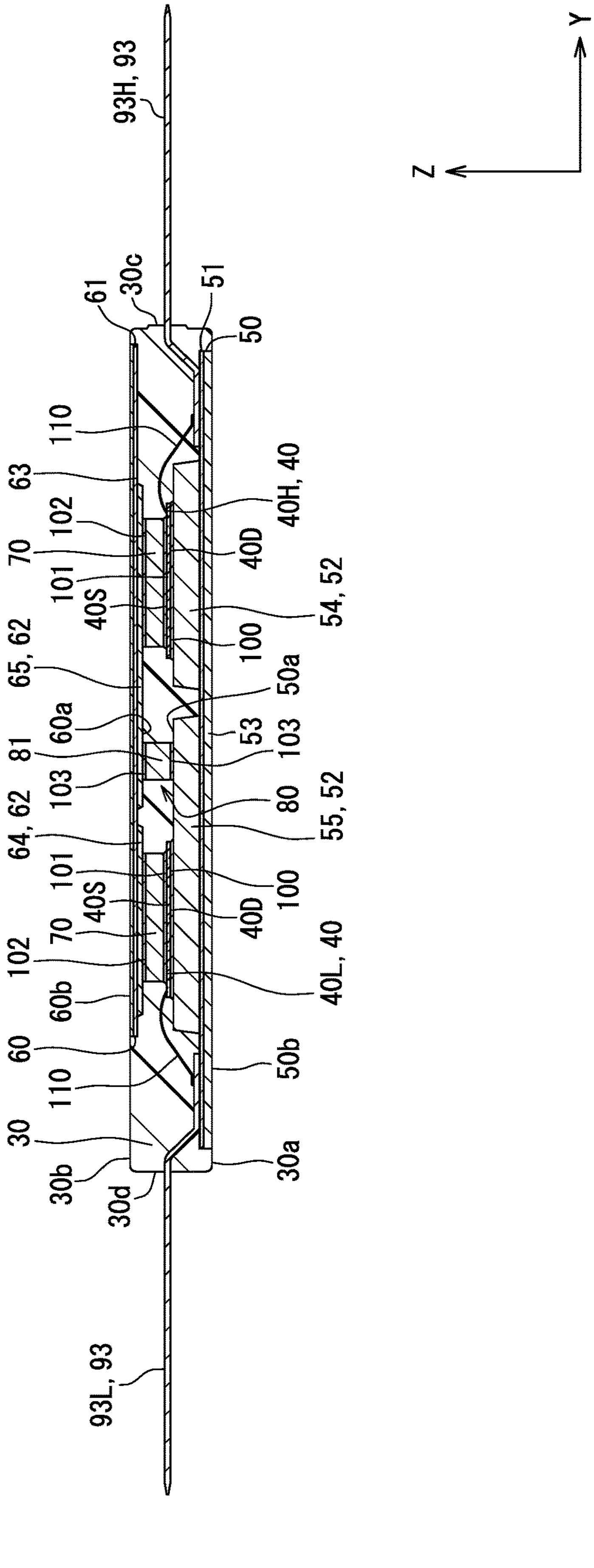
FIG. 7 is a sectional view taken along line VII-VII of FIG. 4.
Figure 8:
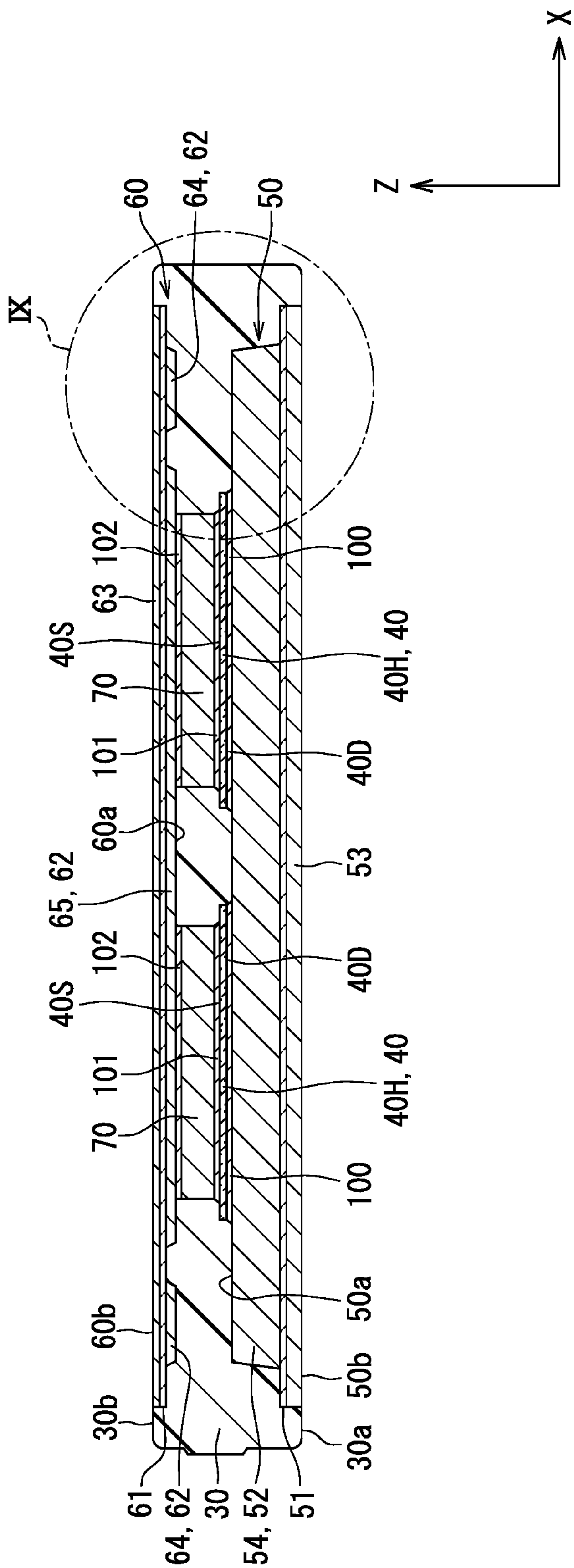
FIG. 8 is a sectional view taken along line VIII-VIII of FIG. 4.
Figure 9:
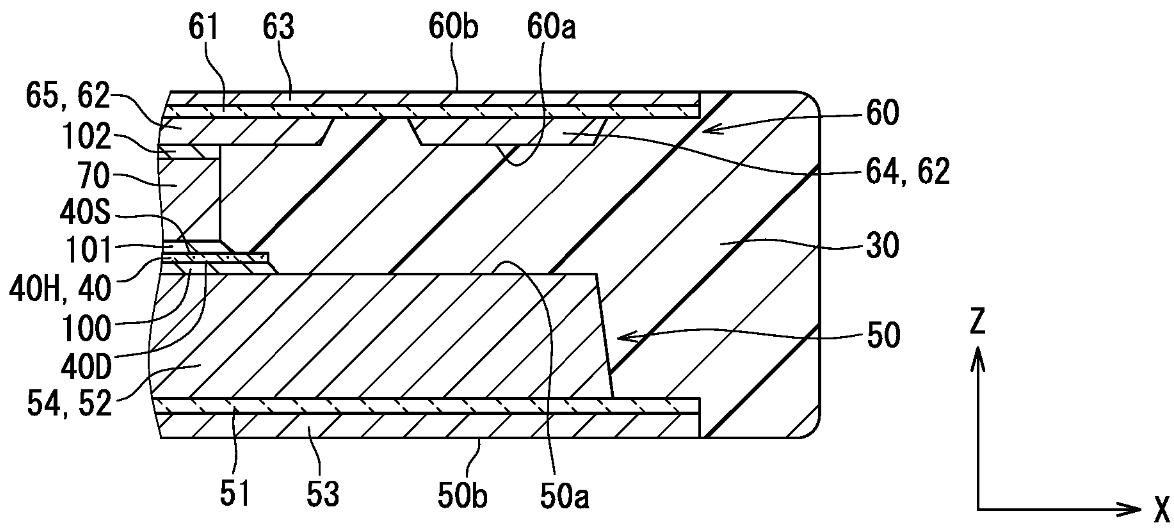
FIG. 9 is an enlarged view of a region IX illustrated in FIG. 8.

Next, a semiconductor device will be described with reference to FIGS. 2 to 13. FIG. 2 is a perspective view illustrating a semiconductor device 20. FIG. 3 is a perspective view illustrating the semiconductor device 20, similarly to the FIG. 2. FIG. 3 is a transparent view illustrating an internal structure. FIG. 4 is a plan view illustrating the semiconductor device 20. FIG. 4 is a transparent view illustrating the internal structure. FIG. 5 is a sectional view taken along line V-V of FIG. 4. FIG. 6 is a sectional view taken along line VI-VI of FIG. 4. FIG. 7 is a sectional view taken along line VII-VII of FIG. 4. FIG. 8 is a sectional view taken along line VIII-VIII of FIG. 4. FIG. 9 is an enlarged view of a region IX denoted by an alternate long and short dashed line in FIG. 8.

Figure 10:
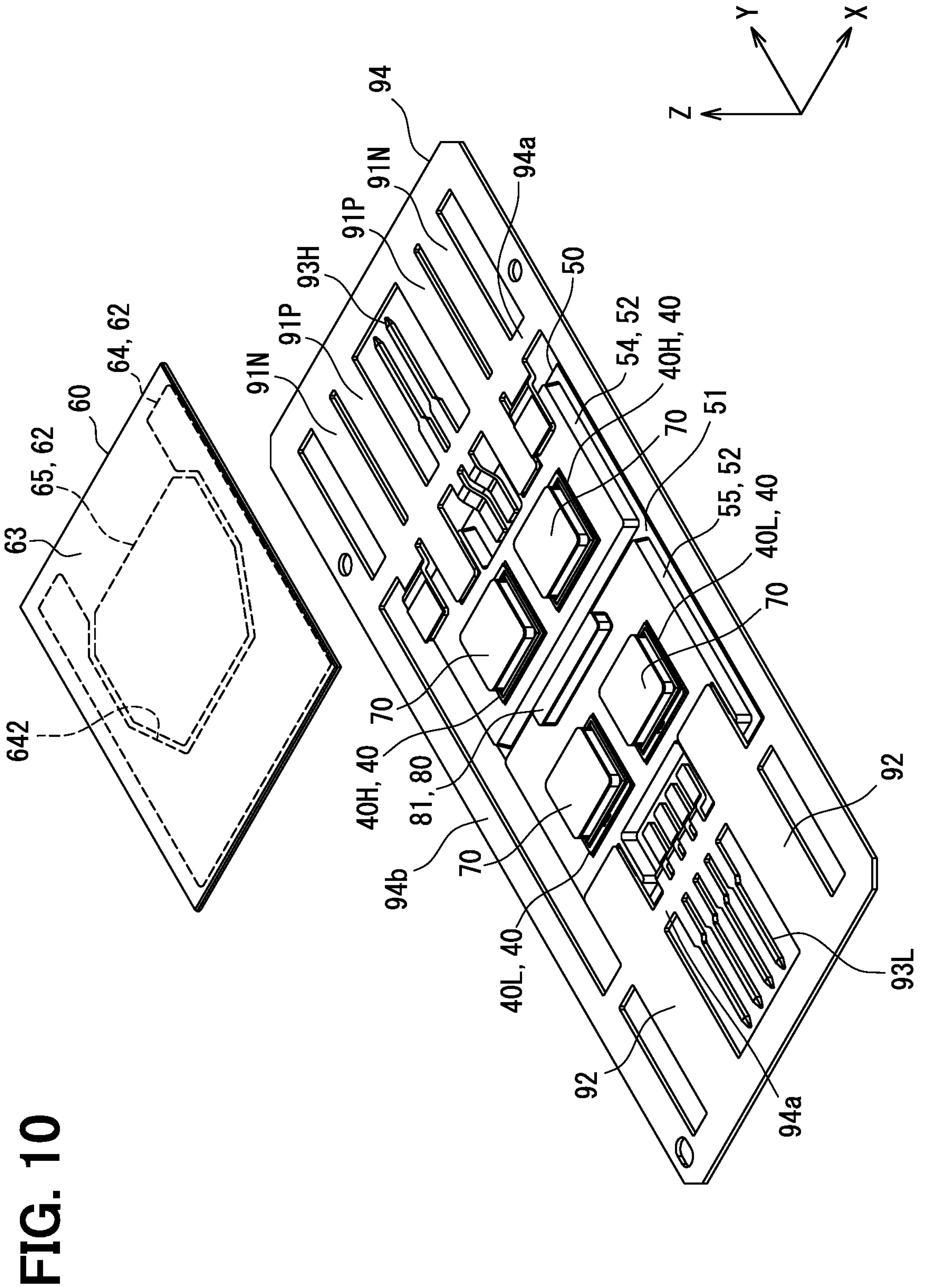
FIG. 10 is an exploded perspective view for explaining the semiconductor device.
Figure 11:
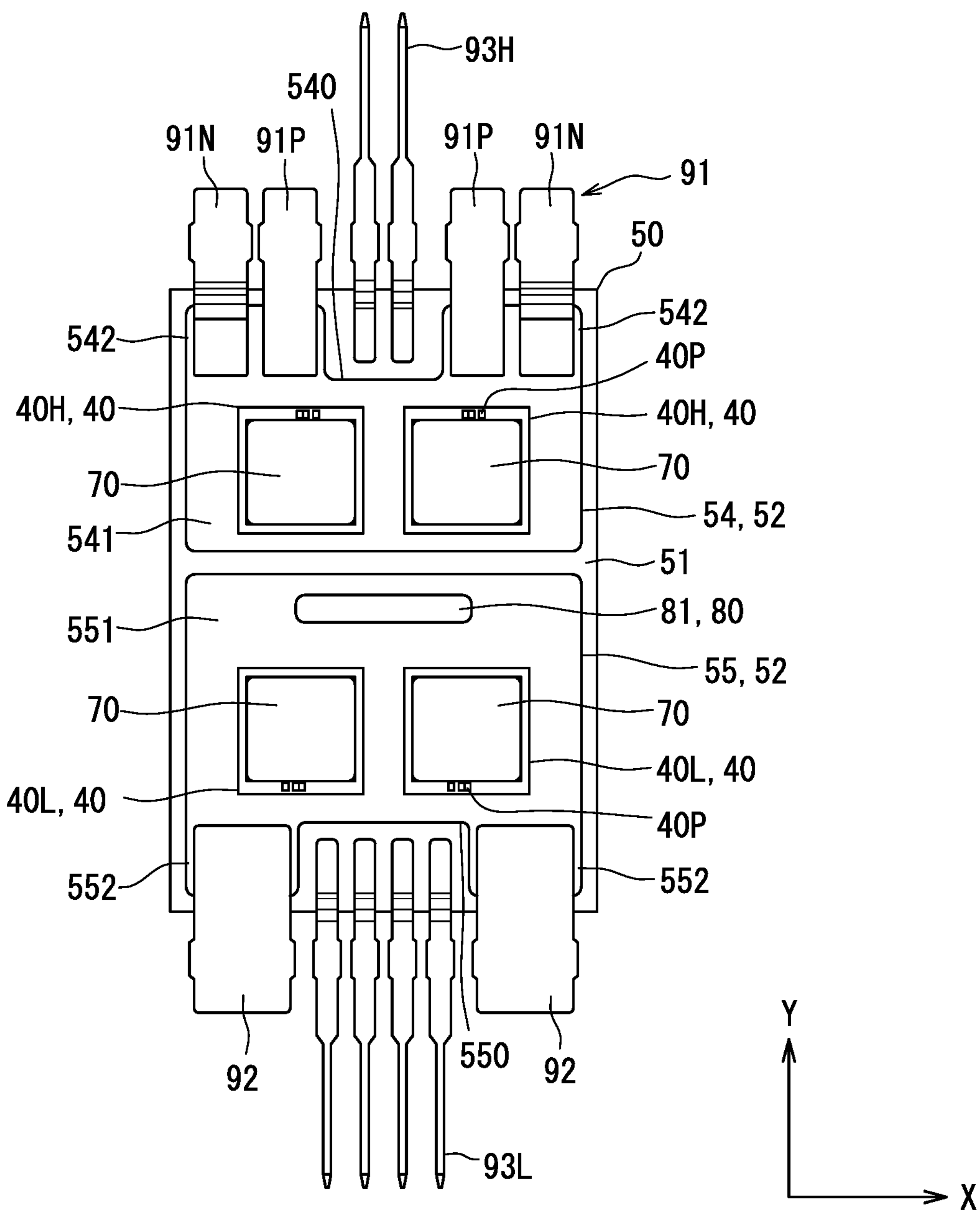
FIG. 11 is a plan view illustrating a state in which a semiconductor element is mounted on a substrate on a drain electrode side.
Figure 12:
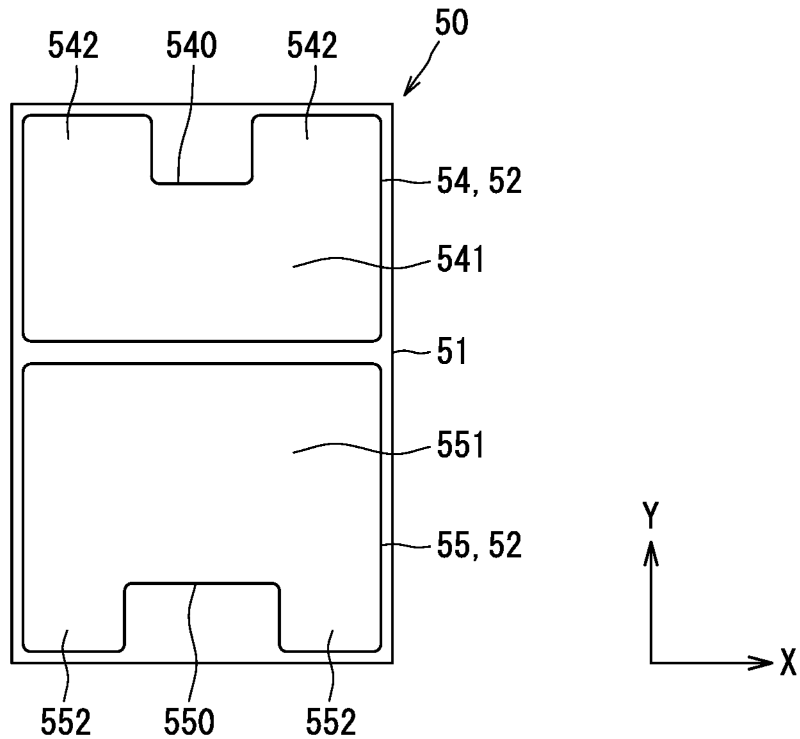
FIG. 12 is a plan view illustrating a circuit pattern of the substrate on the drain electrode side.

FIG. 10 is an exploded perspective view for explaining the semiconductor device 20. In FIG. 10, a lead frame 94 is illustrated for convenience. FIG. 11 is a plan view illustrating a state in which a semiconductor element 40 is mounted on a substrate 50. FIG. 12 is a plan view illustrating a circuit pattern of front-face metal bodies 52 in the substrate 50.

Figure 13:
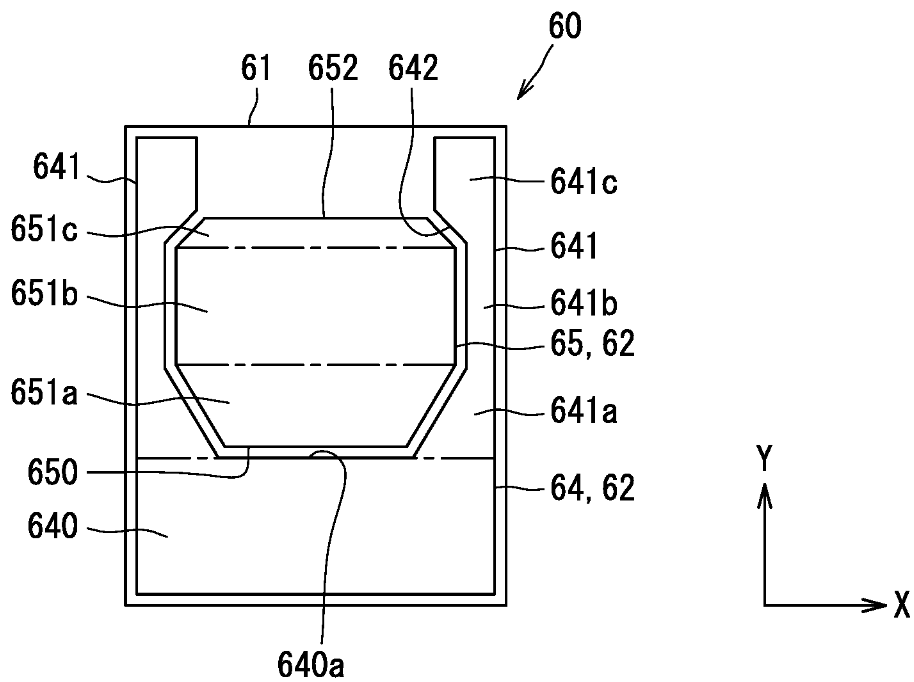
FIG. 13 is a plan view illustrating a circuit pattern of a substrate on a source electrode side.

FIG. 13 is a plan view illustrating a circuit pattern of a front-face metal body 62 in a substrate 60.

Hereinafter, a plate thickness direction of the semiconductor element (i.e., semiconductor substrate) is defined as a Z direction. An arrangement direction of the semiconductor elements constituting the upper arm 9H and the semiconductor elements constituting the lower arm 9L is orthogonal to the Z direction, and this arrangement direction is defined as a Y direction. A direction orthogonal to both of the Z direction and the Y direction is defined as an X direction. Unless otherwise specified, a shape in a plan view when viewed in the Z direction, in other words, a shape along the XY plane defined by the X and Y directions is denoted as a planar shape. The plan view in the Z direction may simply be referred to as a "plan view". "Disposed" or "arranged/arrangement" is not limited to placement made on the mounting face. When placed components have a relationship in which these components are overlapping each other in the plan view, such placement may also be referred to as "disposed" or "arrange/arrangement".

As illustrated in FIGS. 2 to 13, the semiconductor device 20 constitutes one of the upper-lower arm circuits 9 described above, that is, the upper-lower arm circuit 9 for one phase. The semiconductor device 20 includes a sealing body 30, the semiconductor element 40, the substrates 50, 60, a conductive spacer 70, an arm connection portion 80, and external connection terminals 90.

The sealing body 30 seals part of other elements constituting the semiconductor device 20. The rest of the other components are exposed to the outside of the sealing body 30. The sealing body 30 includes, for example, resin. An example of the resin is epoxy resin. The sealing body 30 is molded by, for example, a transfer molding method using resin as a material. Such a sealing body 30 may be referred to as a "sealing resin body", a "mold resin", or a "resin molded body". The sealing body 30 may be formed using, for example, gel. The gel is filled (disposed) in, for example, an opposing region of the pair of substrates 50, 60.

As illustrated in FIGS. 2 to 4, the sealing body 30 has a substantially rectangular shape in the plan view. The sealing body 30 includes a one face 30*a* and a back face 30*b* opposite to the one face 30*a* in the Z direction as surfaces forming an outer contour. The one face 30*a* and the back face 30*b* are, for example, flat faces. The sealing body 30 further includes side faces. Each side face connects the one face 30*a* and the back face 30*b*. The side faces include two side faces 30*c*, 30*d* from which the external connection terminals 90 project. The side face 30*d* is opposite to the side face 30*c* in the X direction.

The semiconductor element 40 includes a switching element and a semiconductor substrate. The semiconductor substrate includes silicon (Si), a wide bandgap semiconductor having a wider bandgap than silicon, or the like. The switching element is formed on the semiconductor substrate. Examples of a wide bandgap semiconductor include silicon carbide (SiC), gallium nitride (GaN), gallium oxide ($Ga_2O_3$), and diamond. The semiconductor element 40 may be referred to as a "power element" or a "semiconductor chip".

The semiconductor element 40 according to the present embodiment includes a semiconductor substrate including SiC, and the above-described n-channel MOSFET 11. The MOSFET 11 is formed on the semiconductor substrate. The MOSFET 11 has a vertical structure such that a main current flows in the plate thickness direction of the semiconductor element 40 (semiconductor substrate), that is, in the Z direction. The semiconductor element 40 includes main electrodes of the switching element on both faces of the semiconductor element 40 in the plate thickness direction, that is, the Z direction. Specifically, as the main electrodes, a drain electrode 40D is provided on one face, and a source electrode 40S is provided on a back face opposite to the one face in the Z direction.

When the diode 12 is a parasitic diode, the source electrode 40S also serves as an anode electrode, and the drain electrode 40D also serves as a cathode electrode. The diode 12 may be formed on a chip separate from the MOSFET 11. The drain electrode 40D is a main electrode (first main electrode) on the high potential side, and the source electrode 40S is a main electrode (second main electrode) on the low potential side. Hereinafter, the drain electrode 40D and the source electrode 40S may be referred to as a "main electrode(s) 40D, 40S".

The semiconductor element 40 has a substantially rectangular shape in the plan view. As illustrated in FIG. 11, the semiconductor element 40 includes a pad 40P formed at a position different from the position of the source electrode 40S on the back face. The source electrode 40S and the pad 40P are exposed from a protective film (not illustrated) formed on the back face of the semiconductor substrate. The drain electrode 40D is formed on substantially the entire face of one face. The source electrode 40S is formed on part of the back face of the semiconductor element 40. In the plan view, the drain electrode 40D is larger in area than the source electrode 40S.

The pad 40P is an electrode for a signal. The pad 40P is electrically separated from the source electrode 40S. The pad 40P is formed at an end opposite in the Y direction to a region where the source electrode 40S are formed. The pad 40P includes a pad for a gate electrode.

The semiconductor device 20 includes a plurality of semiconductor elements 40 each having the above-described configuration. The configurations of the semiconductor elements 40 are common to each other. The plurality of semiconductor elements 40 include a semiconductor element 40H constituting the upper arm 9H and a semiconductor element 40L constituting the lower arm 9L. The semiconductor element 40H and the semiconductor element 40L may be referred to as an "upper arm element" and a "lower arm element", respectively. Each of the semiconductor elements 40H, 40L is an arm element constituting one arm. The semiconductor device 20 according to the present embodiment includes two semiconductor elements 40H and two semiconductor elements 40L. The two semiconductor elements 40H are arranged in the X direction. Similarly, the two semiconductor elements 40L are arranged in the X direction. The semiconductor element 40H and the semiconductor element 40L are arranged in the Y direction. The Y direction is a first direction orthogonal to the Z direction which is the plate thickness direction of the semiconductor element 40. The X direction is a second direction orthogonal to the Z direction and the first direction (Y direction). The semiconductor device 20 includes two rows, each of which is formed by the semiconductor elements 40H and the semiconductor element 40L, along the Y direction.

The semiconductor elements 40 are disposed at positions substantially identical to each other in the Z direction. The drain electrode 40D of each semiconductor element 40 opposes the substrate 50. The source electrode 40S of each semiconductor element 40 opposes the substrate 60.

The substrates 50, 60 are disposed so as to sandwich the plurality of semiconductor elements 40 in the Z direction. The substrates 50, 60 are disposed so that at least parts thereof oppose each other in the Z direction. The substrates 50, 60 include all of the plurality of semiconductor elements 40 (40H, 40L) in the plan view.

The substrate 50 is disposed on the drain electrode 40D side with respect to the semiconductor element 40. The substrate 60 is disposed on the source electrode 40S side with respect to the semiconductor element 40. The substrate 50 is electrically connected to the drain electrode 40D to provide a wiring function as described later. Similarly, the substrate 60 is electrically connected to the source electrode 40S to provide a wiring function as described later. For this reason, the substrate 50, 60 may be referred to as a wiring substrate. The substrate 50 may be referred to as a drain substrate, and the substrate 60 may be referred to as a source substrate. The substrate 50, 60 provides a heat dissipation function of dissipating heat generated at the semiconductor element 40. For this reason, the substrate 50, 60 may be referred to as a heat dissipation member. Among the pair of substrates 50, 60 sandwiching the semiconductor elements 40 in the Z direction, the substrate 50 is a first substrate, and the substrate 60 is a second substrate.

The substrate 50 includes an opposing face 50*a* opposing the semiconductor element 40 and a back face 50*b* opposite to the opposing face 50*a*. The substrate 50 includes an insulating base member 51, a front-face metal body 52, and a back-face metal body 53. In the substrate 50, the insulating base member 51 and the metal bodies 52, 53 are laminated. The substrate 60 includes an opposing face 60*a* opposing the semiconductor element 40 and a back face 60*b* opposite to the opposing face 60*a*. The substrate 60 includes an insulating base member 61, the front-face metal body 62, and a back-face metal body 63. In the substrate 60, the insulating base member 61 and the metal bodies 62, 63 are laminated. In the substrate 50 as the first substrate, the insulating base member 51 is a first insulating base member, the front-face metal body 52 is a first front-face metal body, and the back-face metal body 53 is a first back-face metal body. In the substrate 60 as the second substrate, the insulating base member 61 is a second insulating base member, the front-face metal body 62 is a second front-face metal body, and the back-face metal body 63 is a second back-face metal body. Hereinafter, the front-face metal body 52, 62 and the back-face metal body 53, 63 may be each simply referred to as the metal body 52, 53, 62, 63.

The insulating base member 51 electrically isolates the front-face metal body 52 and the back-face metal body 53. Similarly, the insulating base member 61 electrically isolates the front-face metal body 62 and the back-face metal body 63. The insulating base member 51, 61 may be referred to as an insulating layer. The material of the insulating base member 51, 61 is resin, or ceramic as an inorganic material. As the resin, for example, an epoxy-based resin or a polyimide-based resin can be used. As the ceramic, for example, $Al_2O_3$ (alumina) or $Si_3N_4$ (silicon nitride) can be used. When the insulating base member 51, 61 includes resin, the substrate 50, 60 may be referred to as a metal resin substrate. When the insulating base members 51, 61 includes ceramic, the substrate 50, 60 may be referred to as a metal ceramic substrate.

In the case of the insulating base member 51, 61 using a resin material, an inorganic filler may be contained in the resin in order to improve heat dissipation properties, insulation properties, and the like. The linear expansion coefficient may be adjusted by adding a filler. As the filler, for example, $Al_2O_3$, $SiO_2$ (silicon dioxide), AlN (aluminum nitride), or BN (boron nitride) can be used. The insulating base member 51, 61 may contain only one kind of filler or a plurality of kinds of fillers.

Considering heat dissipation properties and insulation properties, in the case of using a resin-based material, the thickness of each of the insulating base members 51, 61, that is, the length in the Z direction is preferably about 50 μm to 300 μm. In the case of using a ceramic-based material, the thickness of the insulating base member 51, 61 is preferably about 200 μm to 500 μm. In the Z direction, the front face of the insulating base member 51, 61 is an inner face, that is, a face on the semiconductor element 40 side. The back face thereof opposite to the front face in the Z direction is an outer face. The material configurations of the insulating base members 51, 61 may be common (identical) to or different from each other. In the present embodiment, the resin-based insulating base members 51, 61 are adopted, and the material configurations thereof are common to each other. The linear expansion coefficient of the insulating base member 51, 61 is adjusted to substantially the same value as that of the sealing body 30 by adding a filler to the resin. By adding the filler to the resin, the linear expansion coefficients of the insulating base member 51, 61 and the sealing body 30 are values close to that of metal (Cu) constituting the metal body 52, 53, 62, 63.

The metal body 52, 53, 62, 63 is provided, for example, as a metal plate or metal foil. The metal body 52, 53, 62, 63 is formed using as a material a metal having favorable conductivity and thermal conductivity, such as Cu or Al. The thickness of each of the metal bodies 52, 53, 62, 63 is, for example, about 0.1 mm to 3 mm. The front-face metal body 52 is disposed on the front face of the insulating base member 51 in the Z direction. The back-face metal body 53 is disposed on the back face of the insulating base member 51. Similarly, the front-face metal body 62 is disposed on the front face of the insulating base member 61 in the Z direction. The back-face metal body 63 is disposed on the back face of the insulating base member 61. The insulating base members 51, 61 serve opposing faces with respect to the semiconductor element 40 in the Z direction. As illustrated in FIGS. 5 to 9 and the like, in the present embodiment, the front-face metal body 52 is thicker than the back-face metal body 53. The front-face metal body 62 is thicker than the back-face metal body 63. The front-face metal body 52 on the drain electrode 40D side is thicker than the front-face metal body 62 on the source electrode 40S side. Instead of this configuration, the back-face metal body 53, 63 may be made thicker than the corresponding front-face metal body 52, 62. The thicknesses of the front-face metal body 52 and the back-face metal body 53 may be made substantially equal to each other, and the thicknesses of the front-face metal body 62 and the back-face metal body 63 may be made substantially equal to each other.

The front-face metal body 52, 62 is patterned. The front-face metal body 52, 62 provides a wiring, that is, a circuit. Therefore, the front-face metal body 52, 62 may be referred to as a "circuit pattern", a "wiring layer", or a "circuit conductor". The front-face metal body 52, 62 may include a plating film of Ni-based metal, Au, or the like on the metal face. Hereinafter, the pattern of the front-face metal body 52, 62 may be referred to as a "circuit pattern". The front-face metal body 52 and a non-arrangement region in which the front-face metal body 52 is not disposed on the front face of the insulating base member 51 form the opposing face 50*a* of the substrate 50. Similarly, the front-face metal body 62 and a non-arrangement region in which the front-face metal body 62 is not disposed on the front face of the insulating base member 61 form the opposing face 60*a* of the substrate 60.

For example, the substrate 50, 60 may be formed by the following procedure: the front-face metal body 52, 62 patterned into a predetermined shape by pressing, etching, or the like is prepared; and then the obtained front-face metal body 52, 62 is brought into close contact with the laminate having a two-layer structure formed by the insulating base member 51, 61 and the back-face metal body 53, 63. After a laminate having a three-layer structure including the front-face metal body 52, 62, the insulating base member 51, 61, and the back-face metal body 53, 63 is formed, the front-face metal body 52, 62 may be patterned by cutting or etching.

As illustrated in FIG. 11 and the like, the front-face metal body 52 includes a P wiring 54 and a relay wiring 55. The P wiring 54 and the relay wiring 55 are electrically isolated by providing a predetermined interval (gap). The gap is filled with the sealing body 30.

The P wiring 54 is connected to a P terminal 91P to be described later and the drain electrode 40D of the semiconductor element 40H. The P wiring 54 electrically connects the P terminal 91P and the drain electrode 40D of the semiconductor element 40H. The P wiring 54 may be referred to as a "positive electrode wiring" or a "high-potential power supply wiring". The relay wiring 55 is connected to the drain electrode 40D, the arm connection portion 80, and an output terminal 92 of the semiconductor element 40L. The relay wiring 55 electrically connects the arm connection portion 80 and the drain electrode 40D of the semiconductor element 40L. The relay wiring 55 electrically connects the source electrode 40S of semiconductor element 40H and the drain electrode of the semiconductor element 40L to the output terminal 92. In the front-face metal body 52 (first front-face metal body), the P wiring 54 is a first power supply wiring, and the relay wiring 55 is a first relay wiring.

The P wiring 54 and the relay wiring 55 are disposed side by side in the Y direction. In the Y direction, the P wiring 54 is disposed on a power supply terminal 91 side, and the relay wiring 55 is disposed on the output terminal 92 side. In other words, the P wiring 54 is disposed at a position close to the side face 30*c* of the sealing body 30, and the relay wiring 55 is disposed at a position close to the side face 30*d*.

The P wiring 54 includes a cutout 540. The cutout 540 is open to one of four sides of a substantially rectangular shape, whose longitudinal direction is the X direction, in the plan view. The cutout 540 is provided substantially at the center in the X direction of the side opposing the side face 30*c*. The P wiring 54 includes a base portion 541 and a pair of extending portions 542. The base portion 541 and the pair of extending portions 542 define the cutout 540. The P wiring 54 has a substantially U shape (recessed shape) in the plan view.

The base portion 541 is a portion closer to the relay wiring 55 than the cutout 540 and the extending portion 542, and has a substantially rectangular shape in the plan view. The base portion 541 overlaps the semiconductor element 40H in the plan view. That is, the semiconductor element 40H is disposed on the base portion 541. The drain electrode 40D of the semiconductor element 40H is connected to the base portion 541.

The two extending portions 542 extend from the base portion 541 in the same direction, specifically, in the Y direction, toward the side face 30*c* of the sealing body 30. One of the extending portions 542 is continuous with one end or the vicinity thereof of the base portion 541 in the X direction, and the other one is continuous with the other end or the vicinity thereof of the base portion 541. Both ends of the U shape of the P wiring 54, that is, ends of the two extending portions 542 on the side opposite to the base portion 541 are substantially the same position in the Y direction. The pair of extending portions 542 sandwich the cutout 540 in the X direction. In the Y direction, the length of the base portion 541 is greater than the depth of the cutout 540 and the length of the extending portion 542.

The relay wiring 55 includes a cutout 550. The cutout 550 is open to one of four sides of a substantially rectangular shape in the plan view. The cutout 550 is provided substantially at the center in the X direction of the side opposing the side face 30*d*. That is, in the front-face metal body 52, the cutout 540 is provided at one end in the Y direction, and the cutout 550 is provided at the other one end.

The relay wiring 55 includes a base portion 551 and a pair of extending portions 552. The base portion 551 and the pair of extending portions 552 define the cutout 550. The relay wiring 55 has a substantially U shape (recessed shape) in the plan view. The base portion 551 is a portion closer to the P wiring 54 than the cutout 550 and the extending portions 552 are, and has a substantially rectangular shape in the plan view. The base portion 551 overlaps the semiconductor element 40L in the plan view. That is, the semiconductor element 40L is disposed on the base portion 551. The drain electrode 40D of the semiconductor element 40L is connected to the base portion 551.

The two extending portions 552 extend from the base portion 551 in the same direction, specifically, in the Y direction, toward the side face 30*d* of the sealing body 30. One of the extending portions 552 is continuous with one end or the vicinity thereof of the base portion 551 in the X direction, and the other one is continuous with the other end or the vicinity thereof of the base portion 551. Both ends of the U shape of the relay wiring 55, that is, ends of the two extending portions 552 on the side opposite to the base portion 551 are substantially the same position in the Y direction. The pair of extending portions 552 sandwich the cutout 550 in the X direction. In the Y direction, the length of the base portion 551 is greater than the depth of the cutout 550 and the length of the extending portion 552.

On the other hand, as illustrated in FIGS. 10, 13 and the like, the front-face metal body 62 includes an N wiring 64 and a relay wiring 65. The N wiring 64 and the relay wiring 65 are electrically isolated by providing a predetermined interval (gap). The gap is filled with the sealing body 30.

The N wiring 64 is connected to an N terminal 91N to be described later and the source electrode 40S of the semiconductor element 40L. The N wiring 64 electrically connects the N terminal 91N and the source electrode 40S of the semiconductor element 40L. The N wiring 64 may be referred to as an "N wiring". The relay wiring 65 is connected to the source electrode 40S of the semiconductor element 40H and the arm connection portion 80. The relay wiring 65 electrically connects the source electrode 40S of the semiconductor element 40H and the arm connection portion 80. In the front-face metal body 62 (second front-face metal body), the N wiring 64 is a second power supply wiring, and the relay wiring 65 is a second relay wiring.

Figure 15:
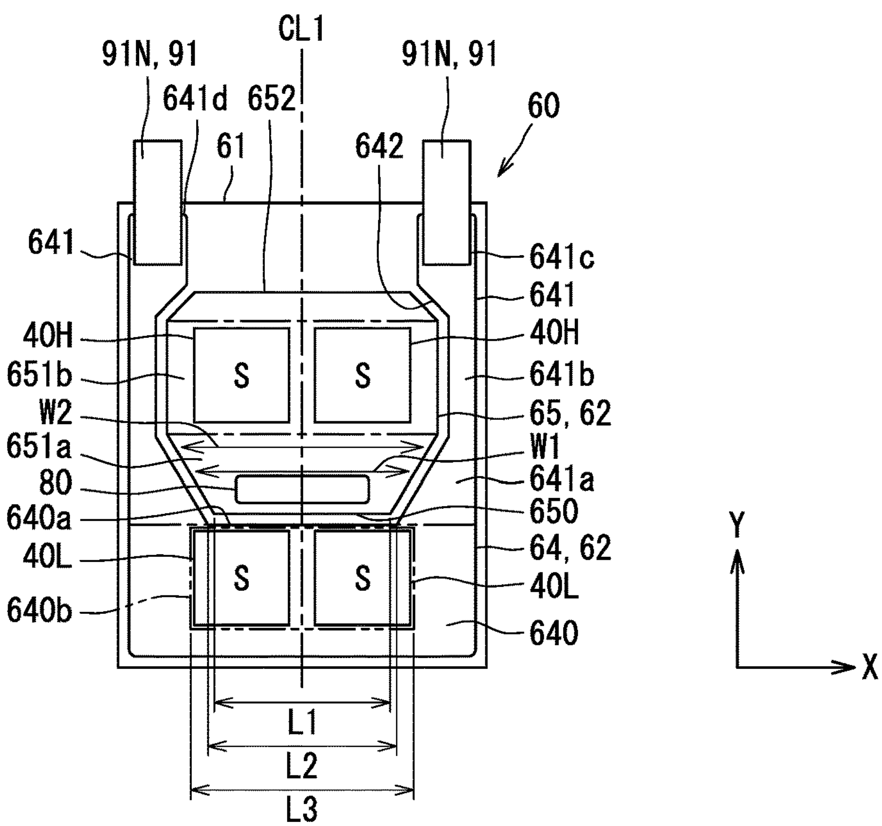
FIG. 15 is a view illustrating an arrangement of a circuit pattern, semiconductor elements and terminals on a source electrode side.

The N wiring 64 includes a base portion 640 and a pair of extending portions 641. The N wiring 64 has a substantially U shape in the plan view. The base portion 640 is disposed side by side with the relay wiring 65 in the Y direction. The base portion 640 is disposed on the side face 30*d* side in the Y direction. The base portion 640 has a substantially rectangular shape, whose longitudinal direction is the X direction, in the plan view. As illustrated in FIG. 15, the base portion 640 overlaps the semiconductor element 40L in the plan view. That is, the semiconductor element 40L is disposed on the base portion 640. The source electrode 40S of the semiconductor element 40L is connected to the base portion 640.

The two extending portions 641 extend from the base portion 640 in the same direction, specifically, in the Y direction, toward the side face 30*c* of the sealing body 30. One of the extending portions 641 is continuous with one end or the vicinity thereof of the base portion 640 in the X direction, and the other one is continuous with the other end or the vicinity thereof of the base portion 640. Both ends of the U shape of the N wiring 64, that is, ends of the two extending portions 641 on the side opposite to the base portion 640 are substantially the same position in the Y direction.

The pair of extending portions 641 forms both ends of the front-face metal body 62 in the X direction. The pair of extending portions 641 is disposed at or near the end of the substrate 60. In the plan view, part of each of the pair of extending portions 641 overlaps the P wiring 54. In the Y direction, the length of the extending portion 641 is greater than the length of the base portion 640. The N wiring 64 includes a cutout 642. The cutout 642 is open to one of four sides of a substantially rectangular shape, whose longitudinal direction is the Y direction, in the plan view. The cutout 642 is provided substantially at the center in the X direction of the side opposing the side face 30*c*. The base portion 640 and the pair of extending portions 641 define the cutout 642.

As described above, the relay wiring 65 is disposed side by side in the Y direction with the N wiring 64, specifically, the base portion 640. In the Y direction, the relay wiring 65 is disposed at a position close to the side face 30*c* of the sealing body 30, and the base portion 640 is disposed at a position close to the side face 30*d*. The relay wiring 65 is disposed between the pair of extending portions 641 in the X direction. The relay wiring 65 is sandwiched between the pair of extending portions 641. The relay wiring 65 is disposed in the cutout 642. The relay wiring 65 is disposed with a predetermined interval (gap) interposed between the relay wiring 65 and the N wiring 64. In the plan view, part of the relay wiring 65 overlaps the P wiring 54, and the other part overlaps the relay wiring 55.

As illustrated in FIG. 15, the relay wiring 65 overlaps the semiconductor element 40H in the plan view. That is, the semiconductor element 40H is disposed on the relay wiring 65. The source electrode 40S of the semiconductor element 40H is connected to the relay wiring 65. A more detailed example of the circuit pattern of the front-face metal body 62 will be described later.

The back-face metal body 53, 63 is electrically isolated from the circuit including the semiconductor element 40 by the insulating base member 51, 61. The back-face metal body 53, 63 may be referred to as a metal base substrate. Heat generated at the semiconductor element 40 is transferred to the back-face metal body 53, 63 via the front-face metal body 52, 62 and the insulating base member 51, 61. The back-face metal body 53, 63 provides a heat dissipation function. The back-face metal body 53, 63 according to the present embodiment has a substantially rectangular shape in the plan view, and the outer contour thereof substantially match the outer contour of the front-face metal body 52, 62. The back-face metal body 53, 63 is so-called a solid conductor disposed on substantially the entire region of the back face of the insulating base member 51, 61. As described above, since the linear expansion coefficients of the insulating base members 51, 61 are adjusted by adding the filler, warpage can be suppressed even if the pattern is changed between the front and back faces. Of course, the back-face metal body 53, 63 may be patterned so as to match the front-face metal body 52, 62 in the plan view.

The back-face metal body 53, 63 according to the present embodiment is disposed in substantially the entire region of the back face of the corresponding insulating base member 51, 61. In order to further enhance the heat dissipation effect, at least one of the back-face metal bodies 53, 63 may be exposed from the sealing body 30. In the present embodiment, the back-face metal body 53 is exposed from the one face 30*a* of the sealing body 30, and the back-face metal body 63 is exposed from the back face 30*b*. The exposed face of the back-face metal body 53 is substantially flush with the one face 30*a*. The exposed face of the back-face metal body 63 is substantially flush with the back face 30*b*. The back-face metal body 53, 63 form the back face 50*b*, 60*b* of the substrate 50, 60.

The conductive spacer 70 provides a spacer function of securing a predetermined interval between the semiconductor element 40 and the substrate 60. For example, the conductive spacer 70 secures a height for electrically connecting the corresponding signal terminal 93 to the pad 40P of the semiconductor element 40. The conductive spacer 70 is positioned in the middle of an electrical conduction path and a thermal conduction path between the source electrode 40S of the semiconductor element 40 and the substrate 60, and provides a wiring function and a heat dissipation function. The conductive spacer 70 includes a metal material having good conductivity and thermal conductivity such as Cu. The conductive spacer 70 may include a plating film on a face thereof. The conductive spacer 70 is a columnar body having a substantially rectangular shape in the plan view and having substantially the same size as the source electrode 40S in the plan view.

The conductive spacer 70 may be referred to as a terminal, a terminal block, or a metal block body. The semiconductor device 20 includes the conductive spacers 70 whose number is identical to the number of the semiconductor elements 40. Specifically, the semiconductor device 20 includes four conductive spacers 70. The conductive spacers 70 are individually connected to the semiconductor element 40.

The arm connection portion 80 electrically connects the relay wirings 55, 65. That is, the arm connection portion 80 electrically connects the upper arm 9H and the lower arm 9L. The arm connection portion 80 is provided between the semiconductor element 40H and the semiconductor element 40L in the Y direction. The arm connection portion 80 is provided in a region where the relay wiring 55 and the relay wiring 65 overlap each other in the plan view. The arm connection portion 80 according to the present embodiment includes a joint portion 81 and a bonding member 103 to be described later.

The joint portion 81 is a metal columnar body provided separately from the front-face metal bodies 52, 62. Such a joint portion 81 may be referred to as a "joint terminal". In the Z direction, the bonding member 103 is interposed between one end of the joint portion 81 and the relay wiring 55, and the bonding member 103 is interposed between the other one end thereof and the relay wiring 65.

Alternatively, the joint portion 81 may be integrally continuous with at least one of the front-face metal bodies 52, 62. That is, the joint portion 81 may be provided integrally with the front-face metal body 52, 62 as part of the substrate 50, 60. The arm connection portion 80 may not include the joint portion 81. In other words, the arm connection portion 80 may only include the bonding member 103.

The external connection terminal 90 is a terminal for electrically connecting the semiconductor device 20 to an external device. The external connection terminal 90 is formed using a metal material having good conductivity such as copper. The external connection terminal 90 is, for example, a plate member. The external connection terminal 90 may be referred to as a "lead". The external connection terminals 90 include the power supply terminal 91, the output terminal 92, and a signal terminal 93. The power supply terminal 91 includes the P terminal 91P and the N terminal 91N. The P terminal 91P, the N terminal 91N, and the output terminal 92 are main terminals electrically connected to the main electrode of semiconductor element 40. The signal terminal 93 includes a signal terminal 93H on the upper arm 9H side and a signal terminal 93L on the lower arm 9L side.

The power supply terminal 91 is an external connection terminal 90 electrically connected to the power supply lines 7, 8 described above. The P terminal 91P is electrically connected to the positive electrode terminal of the smoothing capacitor 5. The P terminal 91P may be referred to as a "positive electrode terminal" or a "high-potential power supply terminal". The P terminal 91P is connected to the P wiring 54 of the front-face metal body 52. That is, the P terminal 91P is connected to the drain electrode 40D of the semiconductor element 40H constituting the upper arm 9H.

The P terminal 91P is connected to one end or the vicinity thereof of the P wiring 54 in the Y direction. The P terminal 91P extends in the Y direction from a connection portion (bonded portion) with the P wiring 54, and projects to the outside of the sealing body 30 from the center or the vicinity thereof in the Z direction on the side face 30*c*. The semiconductor device 20 according to the present embodiment includes two P terminals 91P. As illustrated in FIG. 11, one of the P terminals 91P is connected to one of the pair of extending portions 542, and the other one is connected to the other one of the pair of extending portions 542. The P terminal 91P is disposed at a position close to the cutout 540, that is, at a position on the inner side of each of the extending portions 542 so as to be adjacent to the N terminal 91N in the plan view. The two P terminal 91P are disposed side by side in the X direction. The two P terminal 91P are disposed at positions substantially identical to each other in the Z direction.

The N terminal 91N is electrically connected to the negative electrode terminal of the smoothing capacitor 5. The N terminal 91N may be referred to as a "negative electrode terminal" or a "low-potential power supply terminal". The N terminal 91N is connected to the N wiring 64 of the front-face metal body 62. That is, the N terminal 91N is connected to the source electrode 40S of the semiconductor element 40L constituting the lower arm 9L.

The N terminal 91N is connected to one end or the vicinity thereof of the N wiring 64 in the Y direction. The N terminal 91N extends in the Y direction from a bonded portion with the N wiring 64, and projects to the outside of the sealing body 30 from the center or the vicinity thereof in the Z direction on the side face 30*c*. The semiconductor device 20 includes two N terminals 91N. As illustrated in FIG. 15, one of the N terminals 91N is connected to one of the pair of extending portions 641, and the other one is connected to the other one of the pair of extending portions 641. The two N terminal 91N are disposed side by side in the Y direction. The two N terminal 91N are disposed at positions substantially identical to each other in the Z direction.

The two N terminals 91N are disposed outside the two P terminals 91P in the X direction. In the plan view, one of the N terminals 91N is disposed near one of the P terminals 91P, and the other one of the N terminals 91N is disposed near the other one of the P terminals 91P. The side faces of the N terminal 91N and the P terminal 91P adjacent to each other in the X direction oppose each other in part including a portion projecting from the sealing body 30.

The output terminal 92 is electrically connected to the winding 3*a* (stator coil) of the corresponding phase of the motor generator 3. The output terminal 92 may be referred to as an "O terminal", an "AC terminal", or the like. As illustrated in FIGS. 3 and 7, the output terminal 92 is connected to the relay wiring 55 of the front-face metal body 52 of the substrate 50. That is, the output terminal 92 is connected to the connection point between the upper arm 9H and the lower arm 9L.

The output terminal 92 is connected to one end or the vicinity thereof of the relay wiring 55 in the Y direction. The output terminal 92 extends in the Y direction from a bonded portion with the relay wiring 55, and projects to the outside of the sealing body 30 from the center or the vicinity thereof in the Z direction on the side face 30*d*. The semiconductor device 20 includes two output terminals 92. One of the output terminals 92 is connected to one of the pair of extending portions 552, and the other one of the output terminals 92 is connected to the other one of the pair of extending portions 552. The two output terminals 92 are disposed side by side in the X direction. The two output terminals 92 are disposed at positions substantially identical to each other in the Z direction.

The signal terminal 93 is electrically connected to a drive circuit (driver; not illustrated). The signal terminal 93H is electrically connected to the pad 40P of the semiconductor element 40H via a connection member such as a bonding wire 110. The number of the signal terminals 93H is not particularly limited. It is sufficient that the signal terminal 93H include at least a terminal for applying a drive voltage to at least the gate electrode of the semiconductor element 40H. The semiconductor device 20 according to the present embodiment includes two signal terminals 93H. One of the signal terminals 93H is a terminal for a gate electrode. The pads 40P for the gate electrode of the two semiconductor elements 40H are electrically connected to the signal terminals 93H for the gate electrode. The signal terminal 93H is disposed at a position overlapping the cutout 540 of the P wiring 54 in the plan view. In the signal terminal 93H, a bonded portion with the bonding wire 110 opposes not the front-face metal body 52 but the insulating base member 51. The two signal terminals 93H are disposed laterally side by side in the X direction.

The signal terminal 93H extends in the Y direction from a bonded portion with the bonding wire 110, and projects to the outside of the sealing body 30 from the center or the vicinity thereof in the Z direction on the side face 30*c*. At least part of the projection of the signal terminal 93H extends in the same direction as the power supply terminal 91. The signal terminals 93H are disposed between the two P terminals 91P in the X direction. That is, the external connection terminals 90 projecting from the side face 30*c* are disposed in the order of the N terminal 91N, the P terminal 91P, the two signal terminals 93H, the P terminal 91P, and the N terminal 91N in the X direction.

The signal terminal 93L is electrically connected to the pad 40P of the semiconductor element 40L via a connection member such as the bonding wire 110. The number of the signal terminals 93L is not particularly limited. It is sufficient that the signal terminal 93L include at least a terminal for applying a drive voltage to at least the gate electrode of the semiconductor element 40L. The semiconductor device 20 according to the present embodiment includes four signal terminals 93L. One of the signal terminals 93L is a terminal for the gate electrode. The pads 40P for the gate electrode of the two semiconductor elements 40L are electrically connected to the signal terminals 93L for the gate electrode. The signal terminal 93L is disposed at a position overlapping the cutout 550 of the relay wiring 55 in the plan view. In the signal terminal 93L, a bonded portion with the bonding wire 110 opposes not the front-face metal body 52 but the insulating base member 51. The four signal terminals 93L are disposed laterally side by side in the X direction.

The signal terminal 93L extends in the Y direction from a bonded portion with the bonding wire 110, and projects to the outside of the sealing body 30 from the center or the vicinity thereof in the Z direction on the side face 30*d*. At least part of the projection of the signal terminal 93L extends in the same direction as the output terminal 92. The signal terminals 93L are disposed between the two output terminals 92 in the X direction. That is, the external connection terminal 90 projecting from the side face 30*d* is disposed in the order of the output terminal 92, the four signal terminals 93L, and the output terminal 92 in the X direction.

The drain electrode 40D of the semiconductor element 40 is bonded to the front-face metal body 52 with a bonding member 100 interposed therebetween. The source electrode 40S of the semiconductor element 40 is bonded to the conductive spacer 70 with a bonding member 101 interposed therebetween. The conductive spacer 70 is bonded to the front-face metal body 62 with a bonding member 102 interposed therebetween. The joint portion 81 is bonded to the metal bodies 52, 62 with the bonding member 103 interposed therebetween. Among the external connection terminals 90, the P terminal 91P, the N terminal 91N, and the output terminal 92, which are main terminals, are bonded to the corresponding front-face metal bodies 52, 62 with a bonding member 104 interposed therebetween.

The bonding members 100 to 104 have conductivity. For example, solder can be adopted as the bonding members 100 to 104. An example of the solder is multi-element lead-free solder containing Cu, Ni, and the like, in addition to Sn. Instead of the solder, a sintered bonding member such as sintered silver may be used. The P terminal 91P, the N terminal 91N, and the output terminal 92 may be directly bonded to the corresponding front-face metal bodies 52, 62 without the bonding member 104 interposed therebetween. The P terminal 91P, the N terminal 91N, and the output terminal 92 may be directly bonded to the corresponding front-face metal bodies 52, 62 by ultrasonic bonding, friction stir welding, laser welding, or the like. When the joint portion 81 is provided separately from the substrate 50, 60, the joint portion 81 may be directly bonded to the front-face metal body 52, 62.

As described above, in the semiconductor device 20, the plurality of semiconductor elements 40 constituting the upper-lower arm circuit 9 for one phase is sealed by the sealing body 30. The sealing body 30 integrally seals the plurality of semiconductor elements 40, part of the substrate 50, part of the substrate 60, the plurality of conductive spacers 70, the arm connection portion 80, and part of each of the external connection terminals 90. The sealing body 30 seals the insulating base member 51, 61 and the front-face metal body 52, 62 in the substrate 50, 60.

The semiconductor element 40 is disposed between the substrates 50, 60 in the Z direction. The semiconductor element 40 is sandwiched between the substrates 50, 60 disposed to oppose each other. As a result, the heat of the semiconductor element 40 can be dissipated to both sides in the Z direction. The semiconductor device 20 has a double-sided heat dissipation structure. The back face 50*b* of the substrate 50 is substantially flush with the one face 30*a* of the sealing body 30. The back face 60*b* of the substrate 60 is substantially flush with the back face 30*b* of the sealing body 30. Since the back faces 50*b*, 60*b* are exposed faces, heat dissipation properties can be enhanced.

<Manufacturing Method>

Next, an example of a method of manufacturing the semiconductor device 20 will be described with reference to FIG. 10. In FIG. 10, the substrate 50 and the substrate 60 are illustrated such that the substrates 50, 60 oppose each other for easily understanding assembly thereafter.

First, the semiconductor element 40, the substrates 50, 60, the conductive spacer 70, the joint portion 81, and the lead frame 94 are prepared. As illustrated in FIG. 10, the lead frame 94 includes the external connection terminals 90. The lead frame 94 is formed by performing processing, such as pressing, on a metal plate. The external connection terminals 90 are supported by an outer peripheral frame 94*b* via a tie bar 94*a*.

Next, the semiconductor element 40, the joint portion 81, and the external connection terminals 90 are bonded (connected) to the substrate 50. The conductive spacer 70 is bonded to the semiconductor element 40.

At this time, the lead frame 94 and the semiconductor element 40 are disposed on the substrate 50. The conductive spacer 70 is disposed on the source electrode 40S of the semiconductor element 40. The lead frame 94 is disposed such that part of each of the external connection terminals 90 overlaps the substrate 50 in the plan view. Specifically, the lead frame 94 is disposed such that the P terminal 91P and the N terminal 91N overlap the P wiring 54 of the front-face metal body 52 and the output terminal 92 overlaps the relay wiring 55. In addition, the lead frame 94 is disposed such that the signal terminal 93H overlaps the insulating base member 51 exposed from the cutout 540, and the signal terminal 93L overlaps the insulating base member 51 exposed from the cutout 550.

The drain electrode 40D of the semiconductor element 40 and the front-face metal body 52 are bonded to each other with the bonding member 100 interposed therebetween. The source electrode 40S and the conductive spacer 70 are bonded by the bonding member 101. The joint portion 81 and the front-face metal body 52 are bonded to each other by the bonding member 103. The P terminal 91P and the front-face metal body 52, and the output terminal 92 and the front-face metal body 52 are bonded to each other by the bonding member 104. For example, in the case of solder, bonding can be collectively performed by reflow. FIG. 10 illustrates this bonded state.

Next, the pad 40P of the semiconductor element 40H and the signal terminal 93H are electrically connected by the bonding wire 110. Next, the pad 40P of the semiconductor element 40L and the signal terminal 93L are electrically connected by the bonding wire 110.

Subsequently, the substrate 60 is bonded (connected). The source electrode 40S of the semiconductor element 40 and the front-face metal body 62 are bonded to each other with the bonding member 102 interposed therebetween. The joint portion 81 and the front-face metal body 62 are bonded to each other with the bonding member 103 interposed therebetween. The N terminal 91N and the front-face metal body 62 are bonded to each other with the bonding member 104. For example, in the case of solder, bonding can be collectively performed by reflow.

Next, the sealing body 30 is molded by a transfer molding method. Although not illustrated, in the present embodiment, the sealing body 30 is molded so that the substrates 50, 60 are completely covered, and cutting is performed after molding. The sealing body 30 is cut together with part of the back-face metal body 53, 63 of the substrate 50, 60. With this process, the back face 50*b*, 60*b* is exposed. The back face 50*b* is substantially flush with the one face 30*a* of the sealing body 30, and the back face 60*b* is substantially flush with the back face 30*b*. The sealing body 30 may be molded in a state where the back face 50*b*, 60*b* are pressed against and brought into close contact with the cavity wall face of the molding die. In this case, at the time of completing the molding of the sealing body 30, the back face 50*b*, 60*b* is exposed from the sealing body 30. Therefore, cutting after molding becomes unnecessary.

Next, in the lead frame 94, unnecessary portions such as the tie bar 94*a* and the outer peripheral frame 94*b* are removed. With the above processes, the semiconductor device 20 can be obtained.

<Positional Relationship>

Figure 14:
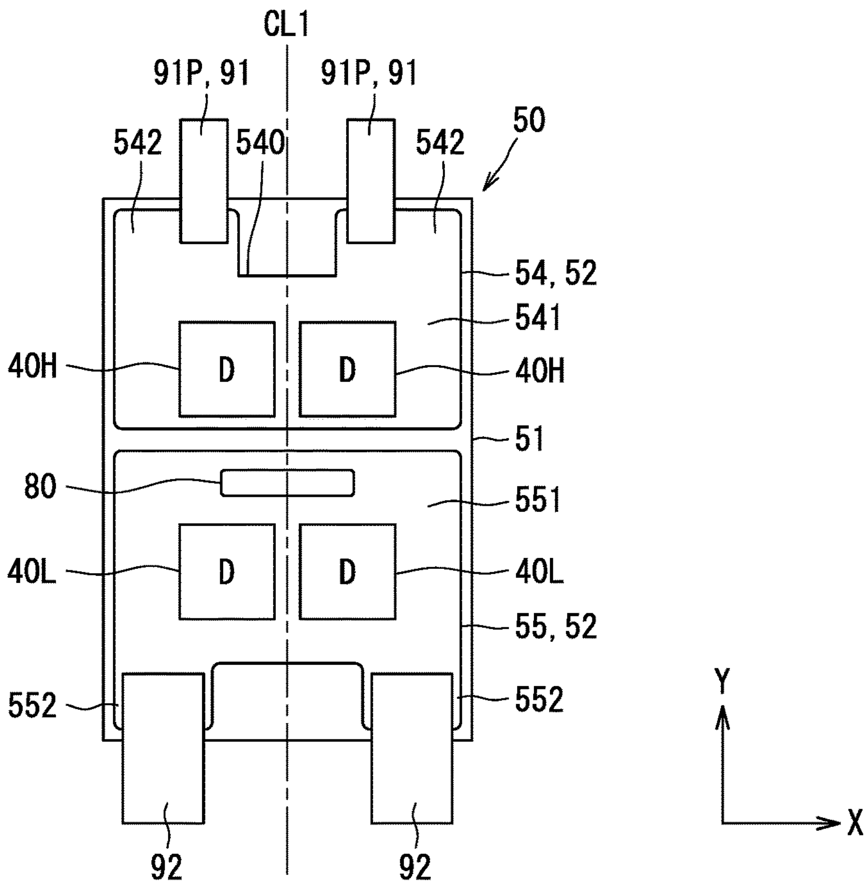
FIG. 14 is a view illustrating an arrangement of a circuit pattern, semiconductor elements and terminals on a drain electrode side.

Next, the positional relationship among the semiconductor element 40, the circuit pattern of the front-face metal bodies 52, 62, the arm connection portion 80, and the external connection terminals 90 connected to the circuit pattern will be described with reference to FIGS. 14 and 15. FIG. 14 is a view illustrating an arrangement of the circuit pattern of the front-face metal bodies 52, the semiconductor elements 40 and terminals. FIG. 15 is a view illustrating an arrangement of the circuit pattern of the front-face metal bodies 62, the semiconductor elements 40 and terminals. In FIGS. 14 and 15, only the external connection terminals 90 connected to the circuit pattern are illustrated for convenience. In FIG. 14, the arrangement regions for the semiconductor elements 40 are denoted by "D" for easily understanding the main electrode (drain electrode 40D) connected to the front-face metal body 52. Similarly, in FIG. 15, the arrangement regions for the semiconductor element 40 are denoted by "S" for easily understanding the main electrode (source electrode 40S) connected to the front-face metal body 62.

An imaginary line CL1 illustrated in FIG. 14 is an imaginary line passing through the midpoint of two semiconductor elements 40 constituting one arm. The imaginary line CL1 passes through a midpoint (center) in the arrangement direction of the two semiconductor elements 40 and extends in the Y direction. The imaginary line CL1 is, for example, a line passing through the midpoint of the two semiconductor elements 40H. Instead of the semiconductor elements 40H, a line passing through a midpoint of the semiconductor elements 40L may be used.

As illustrated in FIG. 14, the arrangement of the two semiconductor elements 40H is substantially line-symmetric with respect to the imaginary line CL1. Similarly, the arrangement of the two semiconductor elements 40L is also substantially line-symmetric with respect to the imaginary line CL1. Here, "substantially line-symmetric" can permit an error of a degree of manufacturing variation. The circuit pattern of the front-face metal bodies 52 are also substantially line-symmetric with respect to the imaginary line CL1. That is, each of the P wiring 54 and the relay wiring 55 is substantially line-symmetric with respect to the imaginary line CL1.

The arrangement of the arm connection portions 80 connected to the relay wiring 55 is also substantially line-symmetric with respect to the imaginary line CL1. The arrangement of the external connection terminals 90 connected to the front-face metal body 52 is also substantially line-symmetric with respect to the imaginary line CL1. Accordingly, the arrangement of two P terminal 91P is also substantially line-symmetric with respect to the imaginary line CL1. The arrangement of two output terminals 92 is also substantially line-symmetric with respect to the imaginary line CL1.

Similarly to FIG. 14, the imaginary line CL1 is also illustrated in FIG. 15. The arrangement of the semiconductor elements 40H, 40L is similar to that in FIG. 14. As illustrated in FIG. 15, the circuit pattern of the front-face metal bodies 62 are also substantially line-symmetric with respect to the imaginary line CL1. That is, each of the N wiring 64 and the relay wiring 65 is substantially line-symmetric with respect to the imaginary line CL1. In the same manner as in FIG. 14, the arrangement of the arm connection portions 80 connected to the relay wiring 65 is also substantially line-symmetric with respect to the imaginary line CL1. The arrangement of two N terminal 91N as the external connection terminals 90 connected to the front-face metal body 62 is also substantially line-symmetric with respect to the imaginary line CL1.

<Circuit Pattern>

Next, the circuit pattern of the front-face metal body 62 will be described in more detail with reference to FIG. 15. An alternate long and short dashed line illustrated in FIG. 15 indicates a boundary of each region.

As described above, the front-face metal body 62 of the substrate 60 includes the N wiring 64 and the relay wiring 65. The N wiring 64 includes the base portion 640 and the pair of extending portions 641. The pair of extending portions 641 extends from the base portion 640 in the Y direction toward the side face 30*c* of the sealing body 30. The N wiring 64 defines an outer contour of the front-face metal body 62. The relay wiring 65 is sandwiched between the pair of extending portions 641. The relay wiring 65 is disposed in the cutout 642 of the N wiring 64.

As illustrated in FIG. 15, the relay wiring 65 includes an end 650 as one end in the Y direction. The end 650 is an end on the base portion 640 side in the Y direction. On the other hand, the base portion 640 of the N wiring 64 includes an opposing side 640*a* with respect to the end 650. The opposing side 640*a* is a portion between the pair of extending portions 641 in the base portion 640. The base portion 640 includes an arrangement region 640*b* for the semiconductor element 40L. The arrangement region 640*b* is defined by the outer contour of the semiconductor element 40L as indicated by an alternate long and double-short dashed line in FIG. 15. The arrangement region 640*b* includes a region overlapping the semiconductor element 40L in the plan view, and also includes a region between elements when the plurality of semiconductor elements 40L is included. "Region between elements" means an opposing region where the semiconductor elements 40L oppose each other in the arrangement direction of the semiconductor elements 40L.

Here, lengths L1, L2, and L3 in the X direction are defined as follows. As illustrated in FIG. 15, the length L1 is the length of the end 650 of the relay wiring 65. The length L2 is the length of the opposing side 640*a* of the base portion 640. The length L3 is the length of the arrangement region 640*b* in the base portion 640. In the present embodiment, the relationship of $L1<L2<L3$ is satisfied.

The relay wiring 65 according to the present embodiment includes a reduced width portion 651*a*. The reduced width portion 651*a* includes the end 650. The reduced width portion 651*a* is a portion within a predetermined range from the end 650 in the Y direction. The length in the X direction, that is, the width of the reduced width portion 651*a* is the smallest at the end 650. In the reduced width portion 651*a*, a width W1 at a freely selected first position is equal to or less than a width W2 at a second position that is farther from the end 650 than the first position is.

The width of the reduced width portion 651*a* may be reduced in a step-by-step manner by a predetermined length in the Y direction, for example. That is, the end in the X direction of the reduced width portion 651*a* may change stepwise. In the present embodiment, the length in the X direction of the reduced width portion 651*a* becomes shorter as it is closer to the base portion 640. That is, the width of the reduced width portion 651*a* is continuously reduced toward the base portion 640. The arm connection portion 80 is disposed in the reduced width portion 651*a*.

The relay wiring 65 may include only the reduced width portion 651*a* including the end 650. In this case, the semiconductor elements 40H are also disposed in the reduced width portion 651*a*. The relay wiring 65 according to the present embodiment includes a constant width portion 651*b*. The constant width portion 651*b* is continuous with the reduced width portion 651*a* and is a portion having a constant width over a predetermined range in the Y direction. The semiconductor elements 40H are disposed in the constant width portion 651*b*.

The relay wiring 65 according to the present embodiment further includes a reduced width portion 651*c*. The reduced width portion 651*c* includes an end 652 opposite to the end 650. The reduced width portion 651*c* is opposite to the reduced width portion 651*a* and is continuous with the constant width portion 651*b*. The width of the reduced width portion 651*c* is minimum at the end 652. In the reduced width portion 651*c*, a width at a freely selected first position is equal to or less than a width at a second position that is farther from the end 652 than the first position is. In the present embodiment, the width of the reduced width portion 651*c* is continuously reduced toward the end 652. In the relay wiring 65, the width of the reduced width portion 651*a*, 651*c* becomes smaller as the distance from the constant width portion 651*b* increases.

In the present embodiment, the interval between the N wiring 64 and the relay wiring 65 is substantially constant over the entire opposing region. The extending portion 641 of the N wiring 64 is patterned such that an interval from the relay wiring 65 is substantially constant. Each of the extending portions 641 includes an enlarged width portion 641*a*, a constant width portion 641*b*, and an enlarged width portion 641*c*.

The enlarged width portion 641*a* is continuous with the base portion 640 and is a portion within a predetermined range in the Y direction from the boundary with the base portion 640. The length in the X direction, that is, the width of the enlarged width portion 641*a* is the greatest at the boundary with the base portion 640. In the enlarged width portion 641*a*, a width at a freely selected first position is equal to or more than a width at a second position that is farther from the base portion 640 than the first position is. The width of the enlarged width portion 641*a* according to the present embodiment continuously increases toward the base portion 640. The constant width portion 641*b* is continuous with the enlarged width portion 641*a* and is a portion having a constant width over a predetermined range in the Y direction. The constant width portion 641*b* opposes the constant width portion 651*b* of the relay wiring 65.

The enlarged width portion 641*c* is opposite to the enlarged width portion 641*a* and is continuous with the constant width portion 641*b*. The enlarged width portion 641*c* extends to a position closer to the side face 30*c* than the reduced width portion 651*c* is. The enlarged width portion 641*c* includes a distal end 641*d* of the extending portion 641. The width of the enlarged width portion 641*c* is maximum at the distal end 641*d*. In the enlarged width portion 641*c*, a width at a freely selected first position is equal to or more than a width at a second position that is farther from the distal end 641*d* than the first position is. In the present embodiment, the width of the enlarged width portion 641*c* continuously increases toward the distal end 641*d* at an opposing portion with respect to the reduced width portion 651*c*. In the enlarged width portion 641*c*, a portion further on the distal end 641*d* side than the opposing portion has a constant width. In the N wiring 64, part of the enlarged width portion 641*c* and the enlarged width portion 641*a* are widened as the distance from the constant width portion 641*b* increases.

<Current Path>

Figure 16:
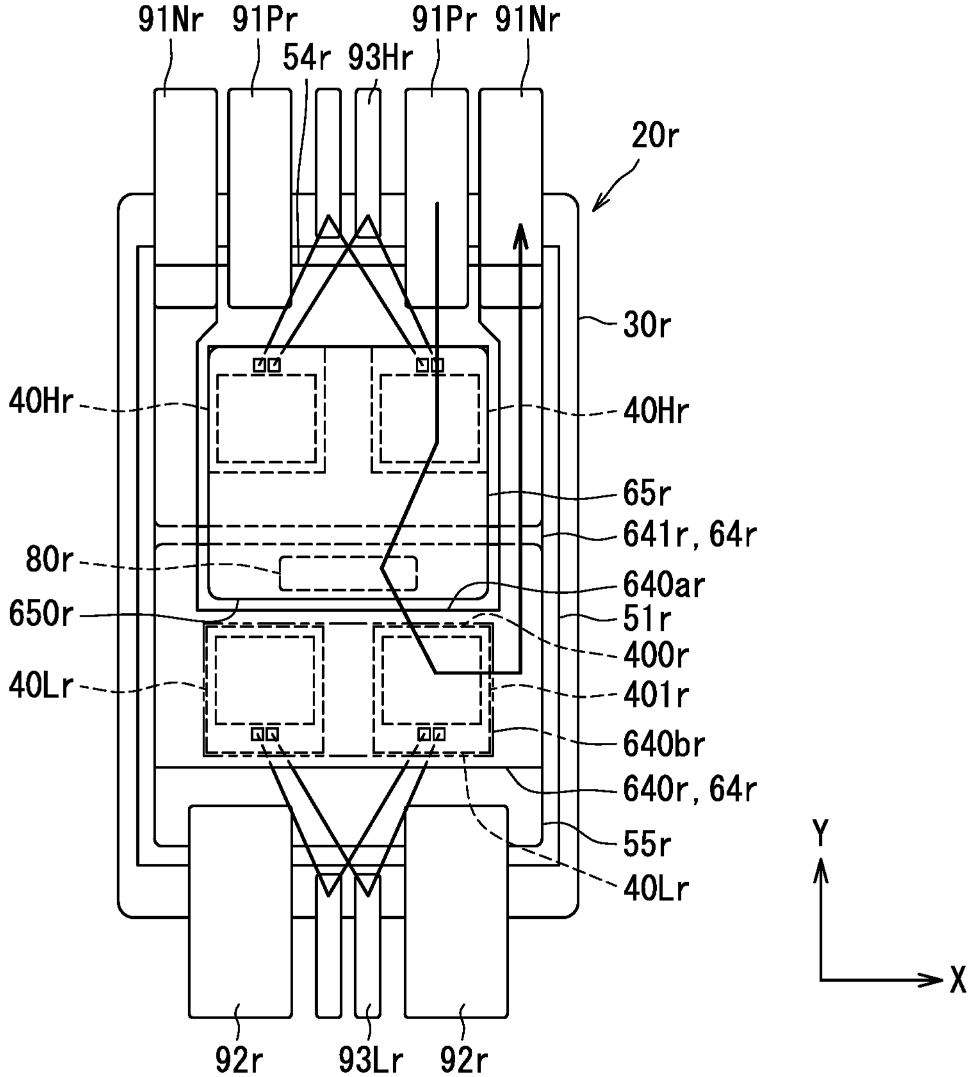
FIG. 16 is a plan view illustrating a current loop of a reference example.
Figure 17:
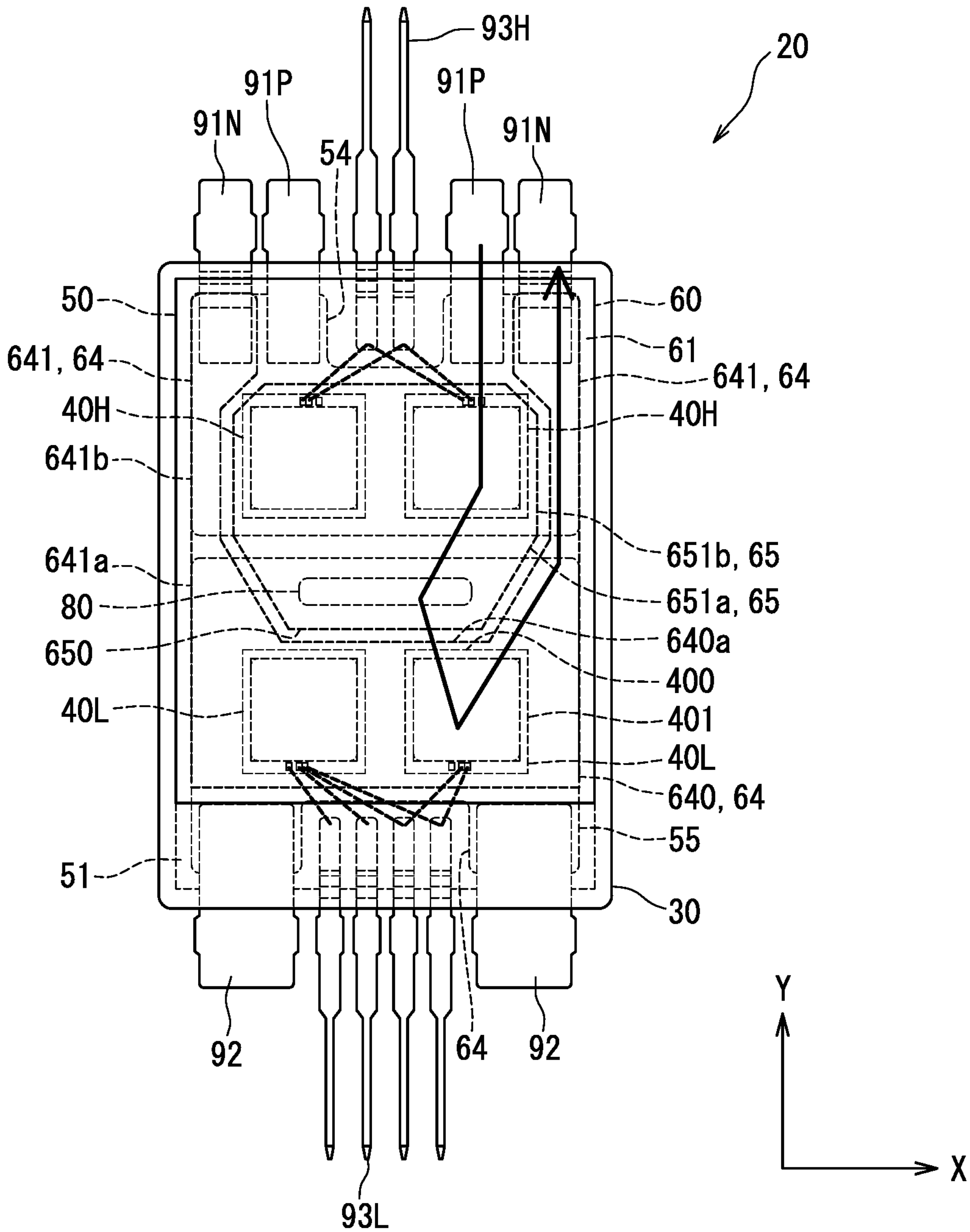
FIG. 17 is a plan view illustrating a current loop.
Figure 18:
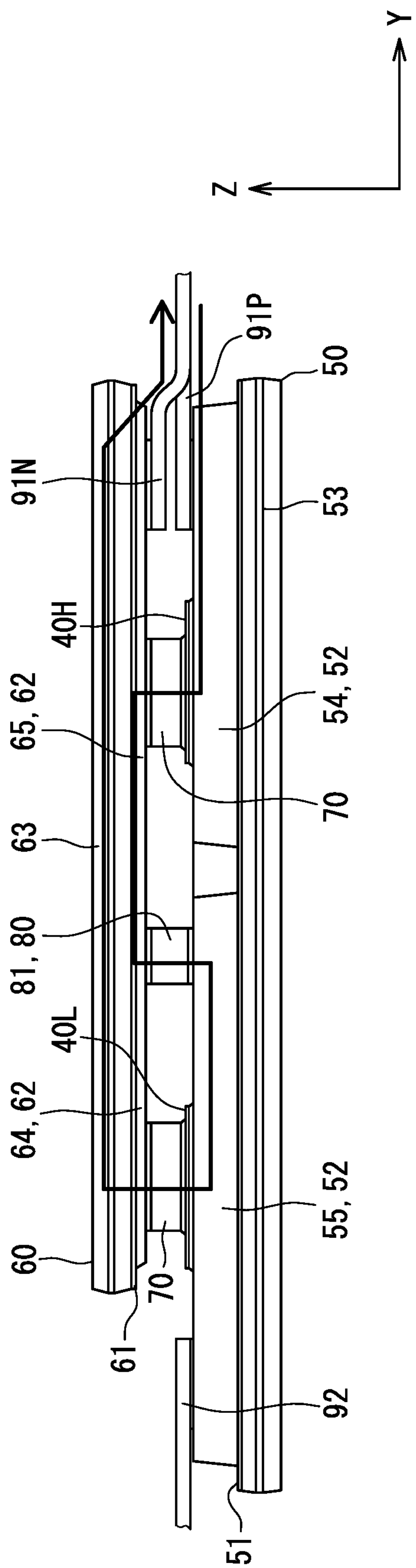
FIG. 18 is a side view illustrating a current loop.

Next, current paths will be described with reference to FIGS. 16 to 20. FIG. 16 is a view illustrating a P-N current loop of a reference example. In the reference example, "r" is added to the end of the reference sign of a related component of the semiconductor device 20, and the sign thus obtained is used as the reference sign of each component. The configuration of the reference example is substantially the same as that of the semiconductor device 20 except that the number of signal terminals 93Lr and the patterns of an N wiring 64*r* and a relay wiring 65*r* are different. FIG. 17 is a view illustrating a P-N current loop of the semiconductor device 20 according to the present embodiment. FIG. 18 is a view illustrating the P-N current loop in a side view of the semiconductor device 20 as viewed from the X direction. The P-N current loop refers to a loop shape of a current path from the P terminal 91P to the N terminal 91N.

In examining the inductance, consideration is made on the P-N current loop flowing from the P terminal 91P, through the P wiring 54, the semiconductor element 40H, the relay wiring 65, the arm connection portion 80, the relay wiring 55, the semiconductor element 40L, and the N wiring 64, to the N terminal 91N. To such an end, the P terminal 91P to the N terminal 91N are indicated by continuous solid lines for easily understanding the P-N current loop. In practice, the semiconductor element 40H, 40L is controlled so as not to be turned on simultaneously. For convenience, only a current path for one of the semiconductor elements 40H and one of the semiconductor elements 40L is illustrated, but the same applies to the other one of the semiconductor elements 40H and the other one of the semiconductor elements 40L.

Figure 19:
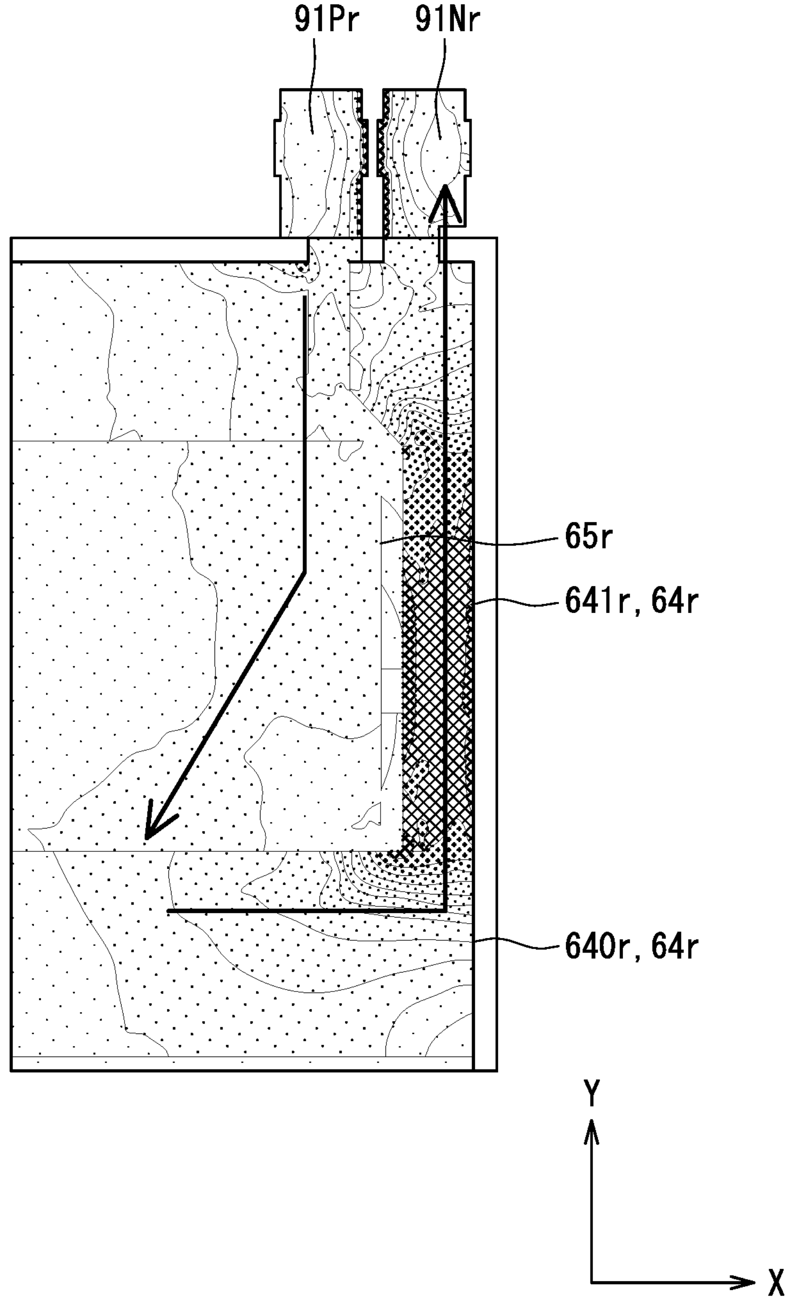
FIG. 19 is a view illustrating a current density of a reference example.
Figure 20:
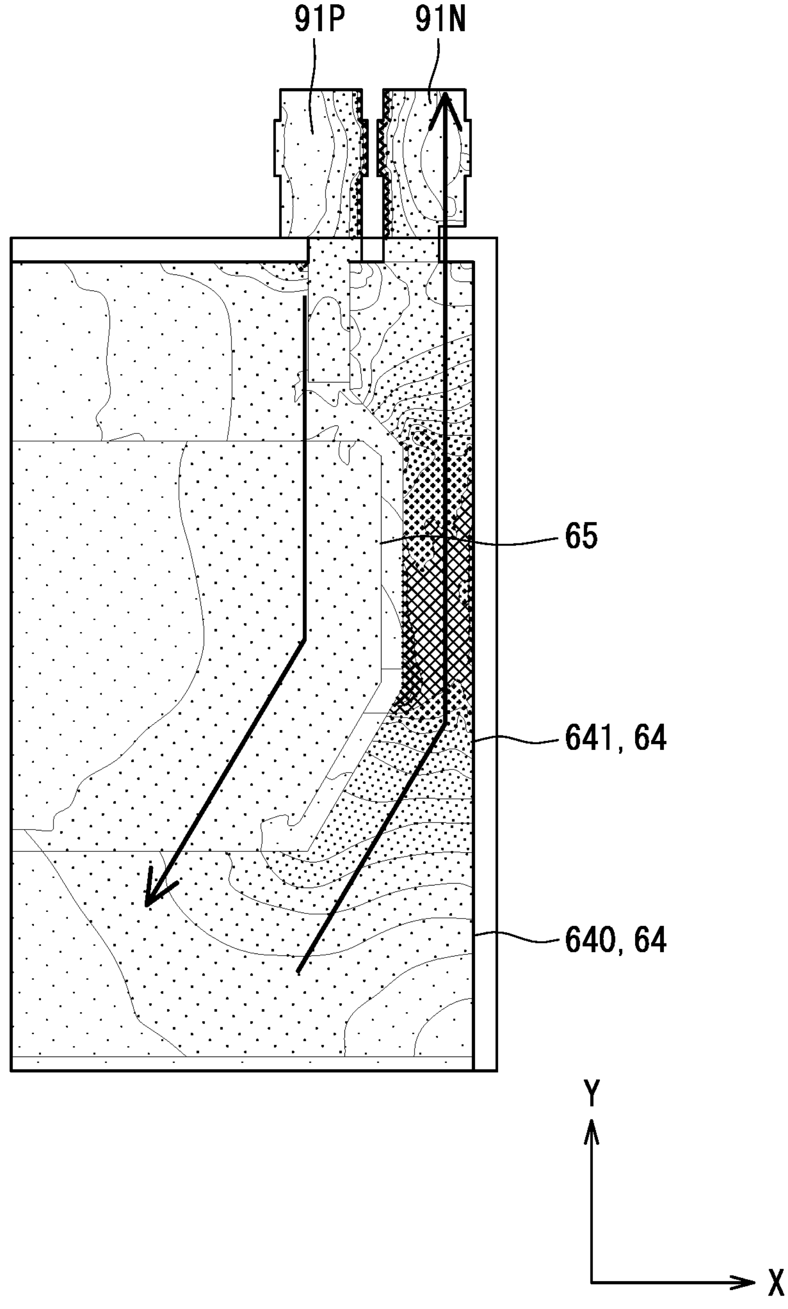
FIG. 20 is a view illustrating a current density of a present embodiment.

FIGS. 19 and 20 illustrate results of electromagnetic field simulation. FIG. 19 illustrates the current density of the reference example illustrated in FIG. 18. FIG. 20 illustrates the current density of the configuration according to the present embodiment illustrated in FIG. 16. The conditions for the electromagnetic field simulation were common to each other except that the circuit pattern of the front-face metal body 62 was different. In FIGS. 19 and 20, the lower the current density, the sparser (lighter in color), and the higher the current density, the denser (darker in color).

As illustrated in FIG. 16, in a semiconductor device 20*r* of the reference example, the relay wiring 65*r* has a substantially rectangular shape in the plan view. The length of an end 650*r* of the relay wiring 65*r* is substantially equal to the length of an arrangement region 640*br* for a semiconductor element 40Lr in the base portion 640*r*. The length of an opposing side 640*ar* in the base portion 640*r* is greater than the arrangement region 640*br*. Therefore, as indicated by solid line arrows in FIG. 16, a current enters the semiconductor element 40Lr having a substantially rectangular shape in the plan view from one side 400*r* thereof, and a current exits from another side 401*r*. The side 400*r* is an opposing side with respect to the relay wiring 65*r*. The side 401*r* is a side opposite to the side where the two semiconductor elements 40Lr oppose each other. As described above, since the current flows outward in the X direction from the semiconductor element 40Lr, the P-N current loop is large. From the simulation result illustrated in FIG. 19, the current clearly flows outward in the X direction from the semiconductor element 40Lr to the base portion 640*r*.

On the other hand, in the semiconductor device 20 according to the present embodiment, the N wiring 64 and the relay wiring 65 are patterned to satisfy a predetermined positional relationship with the semiconductor element 40L as described above. Due to this positional relationship, as illustrated in FIG. 17, the N wiring 64 (extending portion 641) also exists above one side 400 of the semiconductor element 40L in the plan view. The side 400 is an opposing side with respect to the relay wiring 65. Accordingly, a current enters from the side 400 of the semiconductor element 40L, and a current exits from the same side 400. In the current flowing from the semiconductor element 40L to the N terminal 91N, the Y-direction component increases particularly at or near the semiconductor element 40L. From the simulation result illustrated in FIG. 20, the current clearly flows from the semiconductor element 40L while having the Y-direction component.

In this manner, the current flowing through the N wiring 64 approaches the relay wiring 65. Thus, the current path provided by the N wiring 64, that is, the current path between the semiconductor element 40L and the N terminal 91N is shortened. Therefore, the P-N current loop is small as compared with that of the reference example. As illustrated in FIG. 18, the P-N current loop is also small in the Z direction. The P wiring 54 and the N wiring 64 oppose each other in the Z direction. The relay wiring 55 and the N wiring 64 oppose each other in the Z direction.

Summary of First Embodiment

When the inductance of the main circuit wiring is large, the surge voltage increases. When the thickness of the semiconductor element is increased to secure a withstand voltage, a steady loss increases. In order to reduce the steady loss, the large element area is required. Alternatively, the surge voltage can also be reduced by reducing the switching speed. In this case, the output to the motor generator becomes small. As described above, when the inductance is large, the physical size of the semiconductor element is large, or the output is small.

When the members through which the currents flow in mutually opposite directions are arranged to oppose each other, inductance can be reduced by an effect of cancelling out the magnetic flux generated by the current. When the P-N current loop of the main circuit wiring is smaller, the members through which the current flows in opposite directions approach each other, and the effect of canceling out the magnetic flux is enhanced. As a result, inductance can be reduced.

In the present embodiment, the semiconductor elements 40H, 40L are disposed side by side in the Y direction, and the arm connection portion 80 is disposed between the semiconductor elements 40H, 40L. Among the main terminals, the power supply terminals 91 (91P, 91N) are drawn out in the same direction. In the Y direction, the P wiring 54 is disposed on the power supply terminal 91 side, and the relay wiring 55 is disposed on the opposite side. In the Y direction, the relay wiring 65 is disposed on the power supply terminal 91 side, and the base portion 640 of the N wiring 64 is disposed on the opposite side. The extending portion 641 of the N wiring 64 is extended toward the power supply terminal 91 so as to sandwich the relay wiring 65.

Such a configuration makes the P-N current loop small. Accordingly, the inductance of the main circuit wiring can be reduced. For example, inductance can be reduced by juxtaposing the P terminal 91P and the N terminal 91N. The relay wiring 65 and the N wiring 64 are also disposed (juxtaposed) at a predetermined interval. With this arrangement, inductance can be reduced. The extending portion 641 of the N wiring 64 opposes the P wiring 54. With this arrangement, inductance can be reduced.

In the present embodiment, the front-face metal body 52 of the substrate 50 and the front-face metal body 62 of the substrate 60 provide a wiring function for the semiconductor element 40. The front-face metal body 52, 62 is sealed by the sealing body 30. Since it is not necessary to secure the creepage distance, the N wiring 64 and the relay wiring 65 can be disposed close to each other. With this configuration, the effect of canceling out a magnetic flux, and inductance can be further reduced.

As illustrated in FIG. 15, the relationship of L1<L2<L3 is satisfied, where L1 represents the length of the end 650 of the relay wiring 65, L2 represents the length of the opposing side 640*a* of the base portion 640, and L3 represents the length of the arrangement region 640*b* for the semiconductor element 40L in the base portion 640. By satisfying this dimensional relationship, as described above, a current enters from one side 400 of the semiconductor element 40 L, and a current exits from the same side 400. In the current flowing from the semiconductor element 40L to the N terminal 91N, the Y-direction component increases particularly at or near the semiconductor element 40L. Accordingly, the current path provided by the N wiring 64, that is, the current path between the semiconductor element 40L and the N terminal 91N is shortened, and the P-N current loop becomes small. Therefore, the inductance of the main circuit wiring can be further reduced.

As the frequency of the current is higher, the current concentrates on the opposing sides between the extending portion 641 of the N wiring 64 and the relay wiring 65 due to the skin effect. As a result, the P-N current loop can be further reduced, and thus inductance can be further reduced.

In the present embodiment, as illustrated in FIG. 15, the relay wiring 65 includes the reduced width portion 651*a*. With this configuration, in the extending portion 641, the width of the portion opposing the reduced width portion 651*a* can be increased. Therefore, heat generation due to energization can be suppressed without changing the physical sizes of the front-face metal body 62 and thus the substrate 60. In other words, heat generation can be suppressed while reducing inductance.

Particularly in the present embodiment, the length in the X direction of the reduced width portion 651*a* becomes shorter as it is closer to the base portion 640. That is, the width of the reduced width portion 651*a* is continuously reduced toward the base portion 640. The reduced width portion 651*a* of the relay wiring 65 has a tapered shape. With this configuration, the interval between the relay wiring 65 and the extending portion 641 is easily made constant. Therefore, the extending portion 641 can be brought closer to the relay wiring 65, and the P-N current loop can be made small. In addition, the width of the extending portion 641 can be widened, and heat generation can be suppressed.

In the present embodiment, the relay wiring 65 includes the constant width portion 651*b*. The semiconductor elements 40H are disposed in the constant width portion 651*b*. The relay wiring 65 including the reduced width portion 651*a* and the constant width portion 651*b* has a shape the same as or similar to that of a baseball home base in the plan view. With this configuration, the width of the extending portion 641 can be increased as compared with the configuration in which the semiconductor element 40H is disposed in the reduced width portion 651*a*. Therefore, heat generation due to energization can be suppressed without changing the physical sizes of the front-face metal body 62 and thus the substrate 60. In other words, heat generation can be suppressed while reducing inductance.

In the present embodiment, the semiconductor device 20 includes two semiconductor elements 40H and two semiconductor elements 40L. The two semiconductor elements 40H are disposed side by side in the X direction. Similarly, the two semiconductor elements 40L are disposed side by side in the X direction. In this manner, the semiconductor elements 40 constituting one arm are juxtaposed in the direction (X direction) orthogonal to the arrangement direction in which the semiconductor elements 40H and 40L are arranged (Y direction). In the X direction, the pair of extending portions 641 sandwich the relay wiring 65. This arrangement makes it possible to suppress the current bias.

The semiconductor device 20 may include one N terminal 91N whose distal end is branched into two so as to be individually connected to the pair of extending portions 641. In the present embodiment, the semiconductor device 20 includes two N terminals 91N, and the N terminals 91N are individually connected to the pair of extending portions 641. With this configuration, the other external connection terminals 90 can be easily disposed between the two N terminals 91N. Since the external connection terminals 90 disposed therebetween need not be avoided, the physical size can be reduced.

The semiconductor device 20 may include only one P terminal 91P. In the present embodiment, the semiconductor device 20 includes two P terminals 91P. Terminals are disposed in the order of the N terminal 91N, the P terminal 91P, the signal terminal 93H, the P terminal 91P, and the N terminal 91N in the X direction. The P terminal 91P and the N terminal 91N are juxtaposed on both end sides in the X direction. Therefore, the P-N current loop can be easily reduced. Since the external connection terminals 90 are disposed with regularity in the X direction, line symmetry is easily secured for the semiconductor elements 40, the circuit pattern of the front-face metal bodies 52, 62, and the external connection terminals 90, as described above. This arrangement makes it possible to suppress the current bias.

In the present embodiment, the P terminal 91P and the N terminal 91N project from the side face 30*c* of the sealing body 30, and the output terminal 92 projects from the side face 30*d*. In this manner, the P terminal 91P and the N terminal 91N connected to the smoothing capacitor 5 are drawn out in the same direction, and the output terminal 92 is drawn out in the opposite direction. Thus, the connectivity with the smoothing capacitor 5 and the connectivity with the motor generator 3 can be improved. Inductance can be reduced by juxtaposing the P terminal 91P and the N terminal 91N. Such a terminal arrangement makes the P-N current loop small.

<Modifications>

Figure 21:
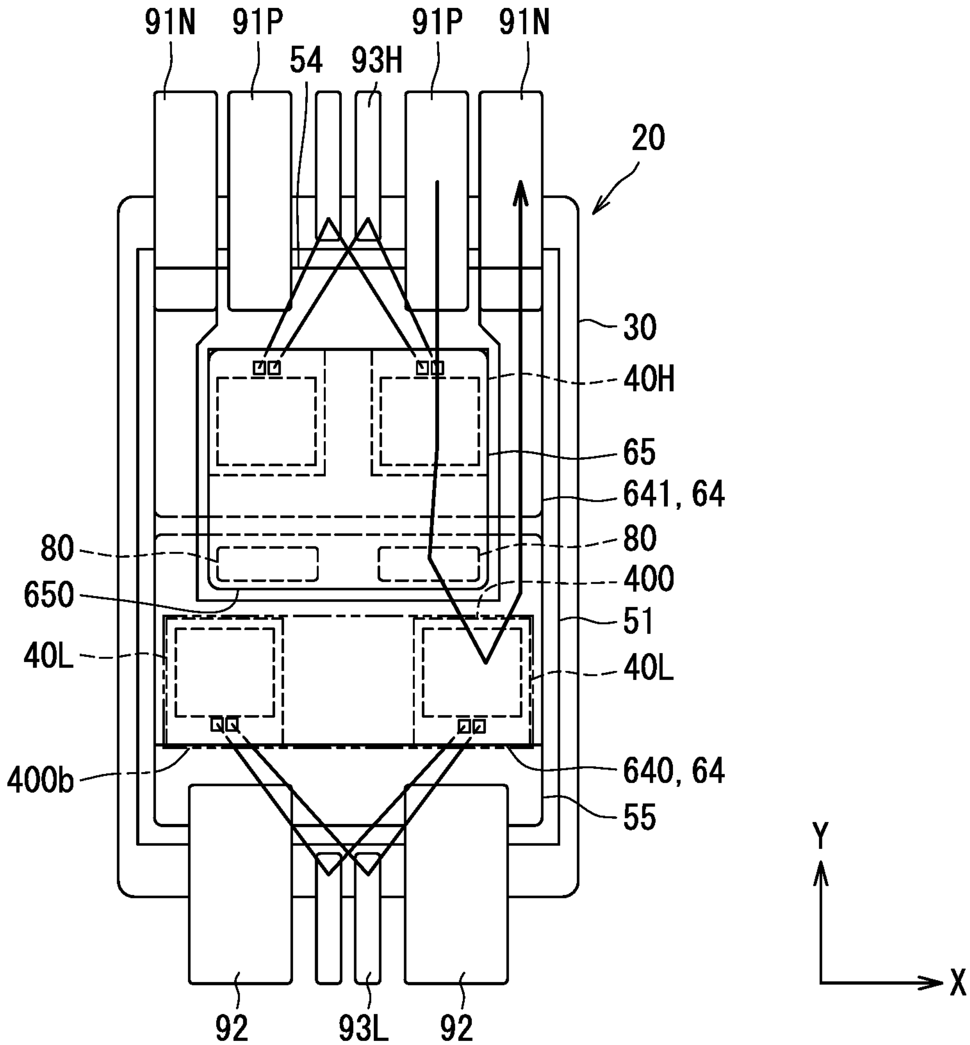
FIG. 21 is a plan view illustrating a modification.
Figure 22:
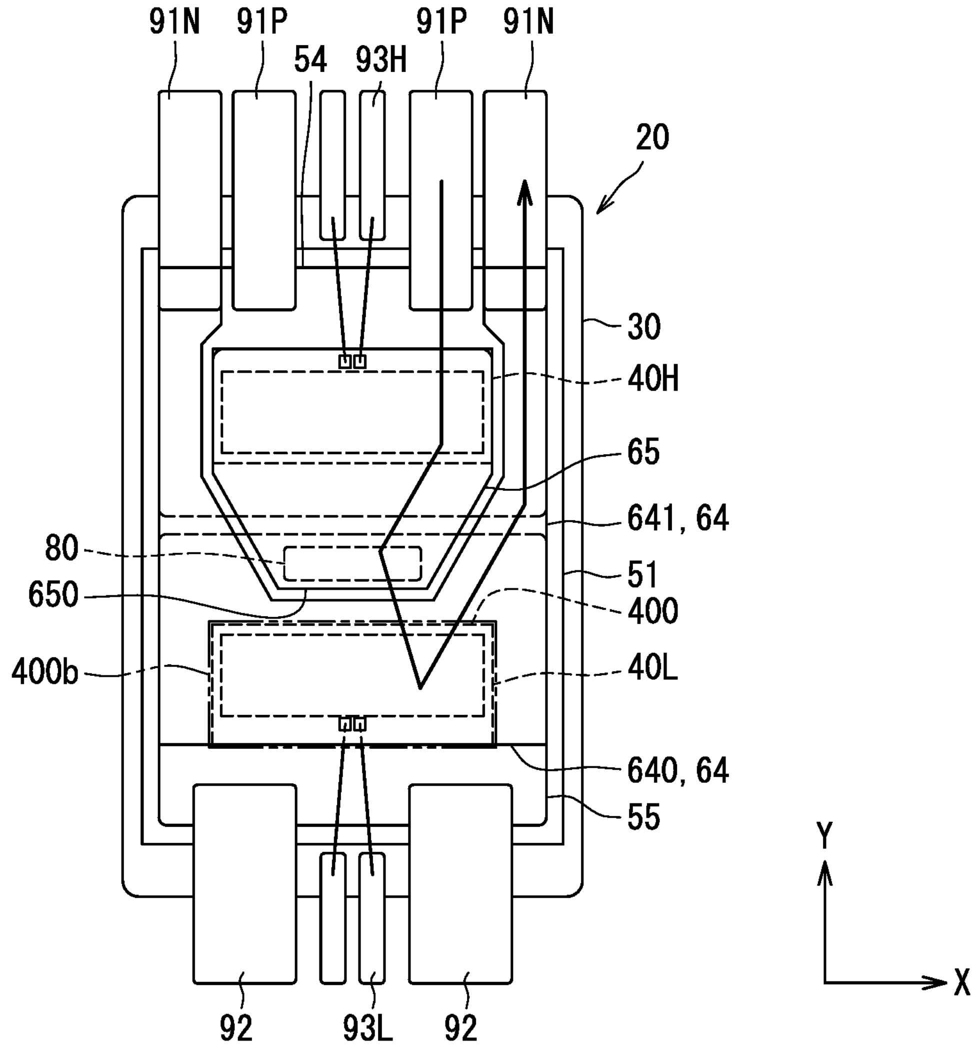
FIG. 22 is a plan view illustrating a modification.

As an example in which a plurality of semiconductor elements 40H and a plurality of semiconductor elements 40L are provided, a case in which two semiconductor elements 40H and two semiconductor elements 40L are provided has been described. However, the present disclosure is not limited thereto. Three or more may be provided. For example, three semiconductor elements 40H may be disposed side by side in the X direction, and three semiconductor elements 40L may be disposed side by side in the X direction. The arrangement of the circuit pattern of the front-face metal bodies 62 and the semiconductor elements 40 are not limited to that in the above-described examples. For example, the configuration may be as illustrated in FIGS. 21 and 22. In FIGS. 21 and 22, the sealing body 30 on the back face 30*b* side of the insulating base member 51 is omitted for convenience. The insulating base member 61 and the back-face metal body 63 of the substrate 60 are omitted in the drawing. Similarly to FIG. 17, the P-N current loop is denoted by a solid line arrow. In FIGS. 21 and 22, the semiconductor device 20 includes two signal terminals 93L.

In FIG. 21, the semiconductor device 20 includes two arm connection portions 80. The relay wiring 65 has a substantially rectangular shape in the plan view. The two arm connection portions 80 are disposed side by side in the X direction in the vicinity of the end 650. The interval between the two semiconductor elements 40L is larger than that in the above example (see FIG. 17). The length of the arrangement region 640*b* for the semiconductor element 40L is greater than that in the above example. With this configuration, the relationship of L1<L2<L3 is satisfied. Accordingly, a current enters from the side 400 of the semiconductor element 40L, and a current exits from the same side 400. Even with such a configuration, the current path provided by the N wiring 64 is shortened, and the P-N current loop can be made smaller. However, in the configuration illustrated in FIG. 17, the width of the N wiring 64, particularly, the width of the extending portion 641 can be increased. In the case of the configuration illustrated in FIG. 17, it is sufficient that the number of the arm connection portions 80 be one.

In FIG. 22, the semiconductor device 20 includes only one semiconductor element 40H and one semiconductor element 40L. In this example, the arrangement region 640*b* matches the outer contour of the semiconductor element 40L. The length of each of the semiconductor elements 40H, 40L in the X direction is greater than that in the above example (see FIG. 17). With this configuration, the relationship of L1<L2<L3 is satisfied. Accordingly, a current enters from the side 400 of the semiconductor element 40L, and a current exits from the same side 400. Even with such a configuration, the current path provided by the N wiring 64 is shortened, and the P-N current loop can be made smaller.

Figure 23:
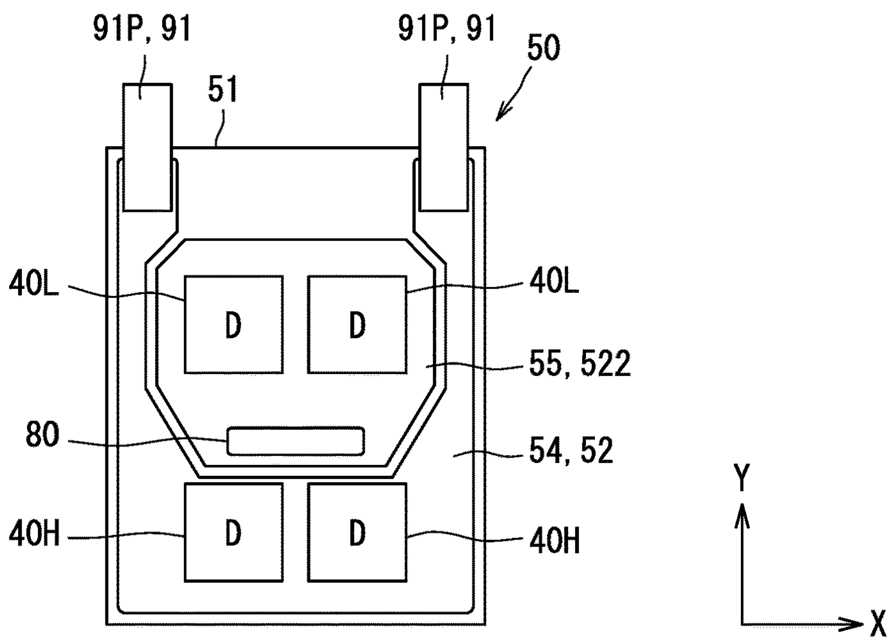
FIG. 23 is a plan view illustrating a circuit pattern of a substrate on a drain electrode side in a modification.
Figure 24:
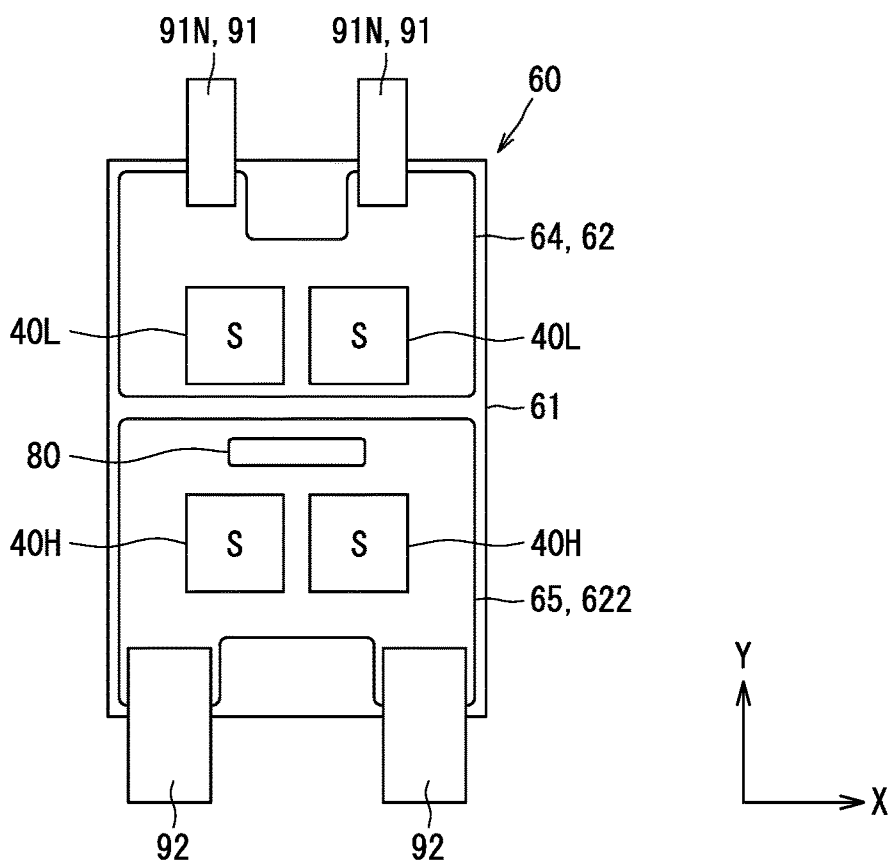
FIG. 24 is a plan view illustrating a circuit pattern of a substrate on a source electrode side in the modification.

The arrangement of the external connection terminals 90 is not limited to that in the above-described example. For example, the P terminal 91P may be disposed on the outer side in the X direction, and the N terminal 91N may be disposed on the inner side in the X direction. In this case, as illustrated in FIGS. 23 and 24, the semiconductor elements 40 and the circuit pattern are also reversed. FIG. 23 illustrates the substrate 50. FIG. 24 illustrates the substrate 60.

As illustrated in FIG. 23, the circuit pattern of the front-face metal body 52 of the substrate 50 is the same as the circuit pattern of the front-face metal body 62 of the substrate 60 illustrated in FIG. 15. The P wiring 54 has the same pattern as the N wiring 64 illustrated in FIG. 15. The semiconductor element 40H is disposed on the N wiring 64. The relay wiring 55 has the same pattern as the relay wiring 65 illustrated in FIG. 15. The semiconductor element 40L and the arm connection portion 80 are disposed on the relay wiring 55.

As illustrated in FIG. 24, the circuit pattern of the front-face metal body 62 of the substrate 60 is the same as the circuit pattern of the front-face metal body 52 of the substrate 50 illustrated in FIG. 14. The N wiring 64 has the same pattern as the P wiring 54 illustrated in FIG. 14. The semiconductor element 40L is disposed on the N wiring 64. The relay wiring 65 has the same pattern as the relay wiring 55 illustrated in FIG. 14. The semiconductor element 40H and the arm connection portion 80 are disposed on the relay wiring 65.

In the case of the configurations illustrated in FIGS. 23 and 24, the first and second relationships described above are reversed. The semiconductor element 40L is a first element, and the semiconductor element 40H is a second element. The source electrode 40S is a first main electrode, and the drain electrode 40D is a second main electrode. The substrate 60 is a first substrate, and the substrate 50 is a second substrate. The insulating base member 61 is a first insulating base member, the front-face metal body 62 is a first front-face metal body, and the back-face metal body 63 is a first back-face metal body. The insulating base member 51 is a second insulating base member, the front-face metal body 52 is a second front-face metal body, and the back-face metal body 53 is a second back-face metal body.

Second Embodiment

This embodiment is a modification based on the preceding embodiment, and the description of the preceding embodiment can be incorporated. In order to restrain the transient current imbalance at the time of switching, as will be described in the present embodiment, a front-face metal body in which a plurality of semiconductor elements is connected in parallel may have a predetermined structure.

<Semiconductor Device>

Figure 25:
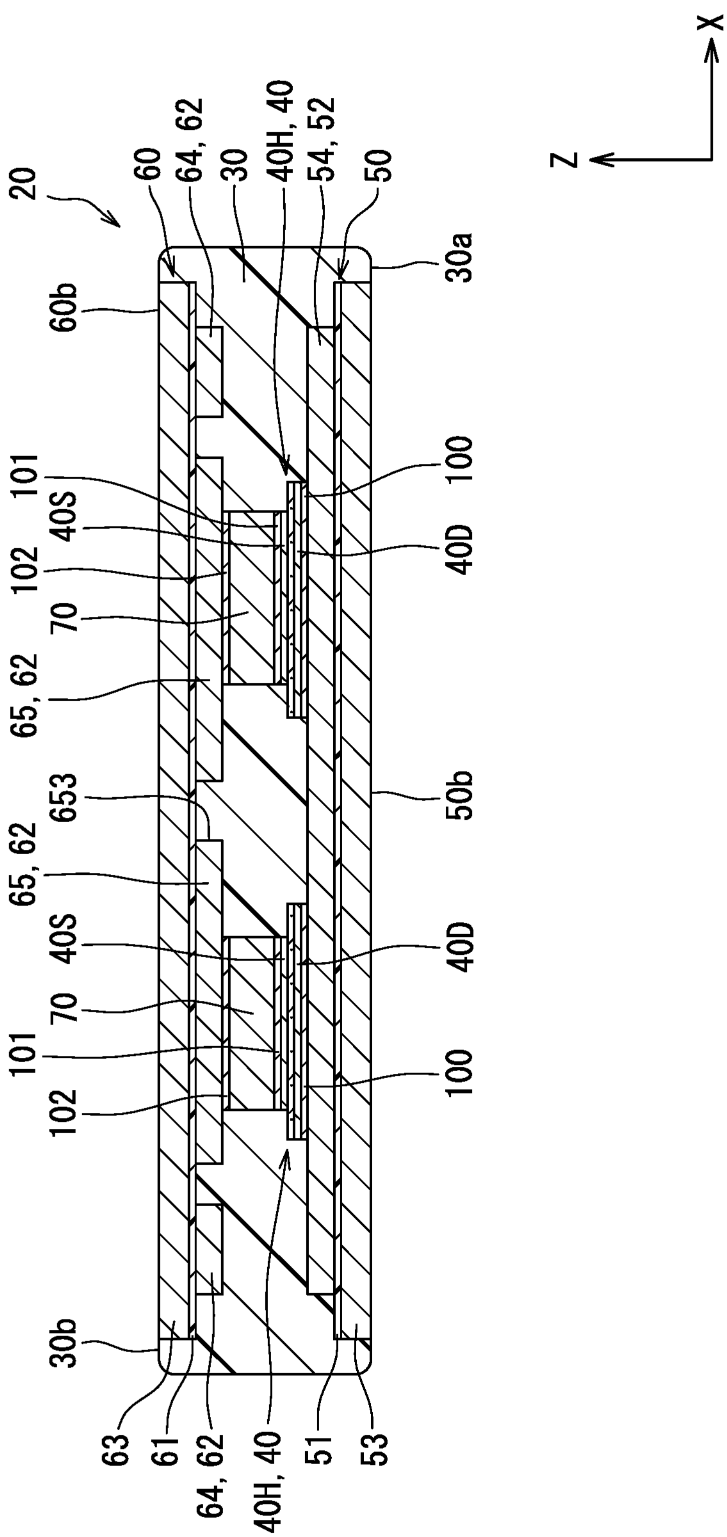
FIG. 25 is a sectional view illustrating a semiconductor device according to a second embodiment.

First, the semiconductor device 20 according to the present embodiment will be described with reference to FIG. 25. FIG. 25 is a sectional view illustrating the semiconductor device 20 according to the present embodiment. FIG. 25 corresponds to FIG. 8.

The semiconductor device 20 according to the present embodiment has a configuration that is the same as or similar to the configuration described in the preceding embodiment (see FIGS. 2 to 15). The semiconductor device 20 constitutes the upper-lower arm circuit 9 for one phase. As illustrated in FIG. 25, the semiconductor device 20 includes a plurality of semiconductor elements 40 including two semiconductor elements 40H as upper arm elements, substrates 50, 60 disposed so as to sandwich the semiconductor elements 40 in the Z direction, and the sealing body 30. The front-face metal body 52 of the substrate 50 is connected to the drain electrode 40D as the first main electrode on the high potential side of the semiconductor element 40. The front-face metal body 62 of the substrate 60 is connected to the source electrode 40S as the second main electrode on the low potential side of the semiconductor element 40. Although not illustrated, the semiconductor device 20 includes two semiconductor elements 40L which are lower arm elements.

The front-face metal body 62 is substantially line-symmetric with respect to the imaginary line CL1 as in the preceding embodiment. In the present embodiment, as illustrated in FIG. 25, the relay wiring 65 of the front-face metal body 62 includes a slit 653. As will be described later, the N wiring 64 includes a slit 643.

<Effect of Restraining Transient Current Imbalance>

Figure 26:
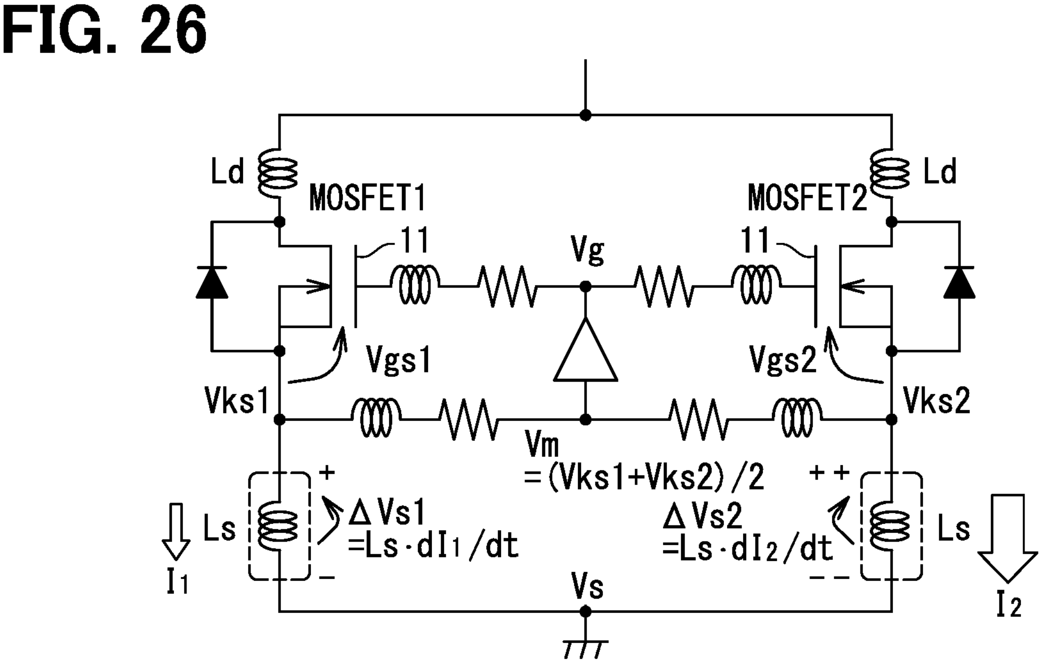
FIG. 26 is a diagram for explaining an effect of an inductance Ls.
Figure 27:
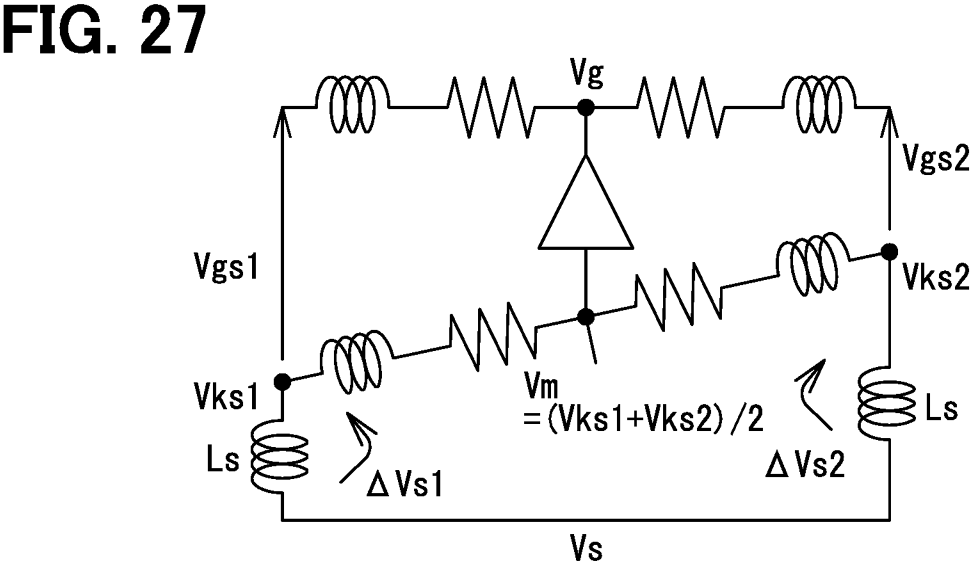
FIG. 27 is a diagram for explaining an effect of the inductance Ls.

Next, an effect of restraining the transient current imbalance at the time of switching will be described with reference to FIGS. 26 and 27. FIG. 26 is an equivalent circuit diagram of two semiconductor elements 40 (MOSFETs 11) constituting one arm. FIG. 27 is a conceptual diagram illustrating the potential in an easy-to-understand manner (potential diagram).

In FIG. 26, one of the MOSFETs 11 connected in parallel is denoted by "MOSFET 1", and the other one is denoted by "MOSFET 2". The inductance of the wiring on the drain electrode side (hereinafter, referred to as drain wiring) is denoted by "Ld", and the inductance of the wiring on the source electrode side (hereinafter, the source wiring) is denoted by "Ls". The gate potential is denoted by Vg, the potential of the source electrode of the MOSFET 1 is denoted by Vks1, the potential of the source electrode of the MOSFET 2 is denoted by Vks1, and the common source potential is denoted by Vs. A midpoint potential between the potential Vks1 and a potential Vks2 is denoted by "Vm". The midpoint potential Vm is constant. $Vm=(Vks1+Vks2)/2$.

The gate voltage of the MOSFET 1 is denoted by "Vgs1", and the gate voltage of the MOSFET 2 is denoted by "Vgs2". The current flowing through the MOSFET 1 by turn-on is denoted by "I1", and the voltage generated between both ends of the inductance Ls when the current I1 flows is denoted by "ΔVs1". Similarly, the current flowing through the MOSFET 2 by turn-on is denoted by "I2", and the voltage generated between both ends of the inductance Ls when the current I2 flows is denoted by "ΔVs2". $\Delta Vs1=Ls\times dI1/dt$. $\Delta Vs2=Ls\times dI2/dt$.

It is assumed that the current I2 larger than the current I1 ($I2>I1$) flows due to variation in characteristics of the MOSFET 11 as illustrated in FIG. 26. At this time, the voltage ΔVs generated in the inductance Ls satisfies $\Delta Vs1<\Delta Vs2$. That is, as illustrated in FIG. 27, the potential Vks2 of the source electrode increases with respect to the midpoint potential Vm, and the potential Vks1 decreases. Therefore, the gate voltage Vgs1>the gate voltage Vgs2. Since the gate voltage Vgs2 is reduced, the current I2 decreases. As described above, the inductance Ls of the source wiring has a function of restraining transient current imbalance at the time of switching due to the variability in characteristics of the semiconductor elements 40 (MOSFETs 11) connected in parallel.

However, when the inductance Ls of the source wiring is small, the function of restraining the transient current imbalance described above is impaired. Thus, the switching loss is biased, requiring that a margin be taken in the thermal design.

<Circuit Pattern of Substrate>

Figure 28:
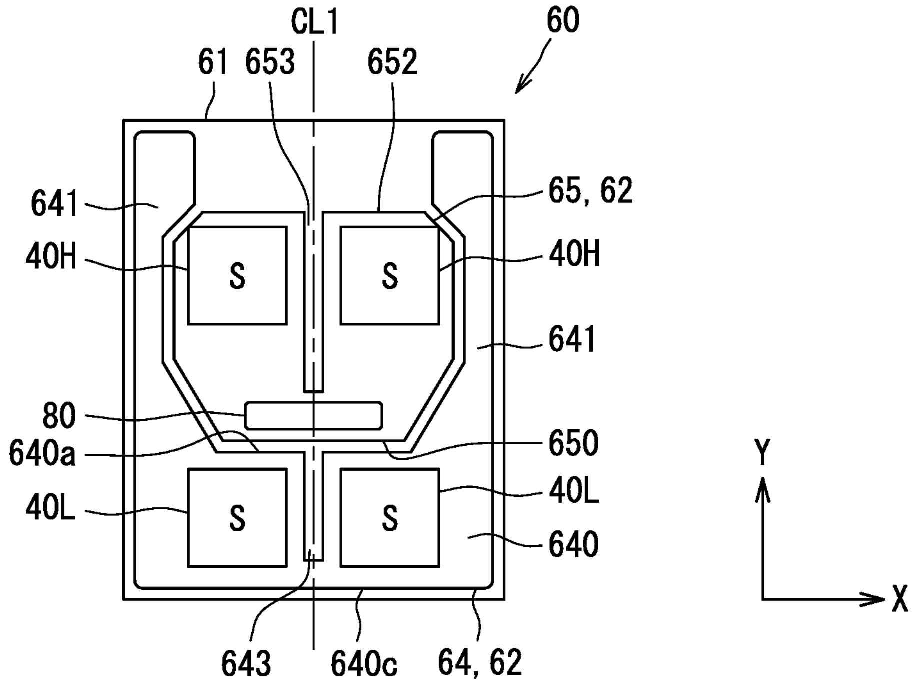
FIG. 28 is a plan view illustrating a circuit pattern of the substrate on the source electrode side.

Next, the circuit pattern of the front-face metal body 62 in the semiconductor device 20 according to the present embodiment will be described with reference to FIG. 28. FIG. 28 corresponds to FIG. 15. In FIG. 28, similarly to FIG. 15, the source electrode 40S is denoted by "S" in order to clarify the main electrode to be connected.

The N wiring 64 and the relay wiring 65 are source wirings to which the source electrode 40S of the semiconductor element 40 is to be connected. The N wiring 64 is different from the pattern of the preceding embodiment in that the slit 643 is provided. Similarly, the relay wiring 65 is different from the pattern of the preceding embodiment in that the slit 653 is provided. The configurations of the N wiring 64 and the relay wiring 65 are the same as those described in the preceding embodiment except that the slits 643, 653 are provided.

The slit 643 passes through the N wiring 64 in its thickness direction (Z direction). The slit 643 is provided at a position overlapping the opposing region of the two semiconductor elements 40L in the base portion 640. "Opposing region" means a region where the semiconductor elements 40L oppose each other in the arrangement direction of the semiconductor elements 40L. In other words, the slit 643 is provided between the semiconductor elements 40L as the lower arm elements in the plan view in the Z direction. The slit 643 is provided between electrical connection portions with the semiconductor elements 40L in the base portion 640. The slit 643 extends from between the semiconductor elements 40L in the Y direction, the arrangement direction of the semiconductor elements 40H, 40L. The slit 643 is open to the opposing side 640*a* of the base portion 640. The slit 643 is provided at a substantially central position of the N wiring 64 in the X direction.

As described above, the slit 643 extends from the source electrode 40S of the semiconductor element 40L to the side in which the N terminal 91N as the main terminal is disposed in the Y direction, that is, the current flowing side. The slit 643 is open to an end 640*c* of the base portion 640. The slit 643 is provided to the vicinity of the lower end of the opposing region of the semiconductor elements 40L. The slit 643 demarcates the N wiring 64 into a region to which one of the semiconductor elements 40L is connected and a region to which the other one is connected. The slit 643 separates current paths of the source electrodes 40S of the semiconductor elements 40L, that is, source current paths.

The slit 653 passes through the relay wiring 65 in its thickness direction (Z direction). The slit 653 is provided at a position overlapping the opposing region of the two semiconductor elements 40H in the relay wiring 65. That is, the slit 653 is provided between the semiconductor elements 40H in the plan view. The slit 653 is provided between electrical connection portions with the semiconductor elements 40H in the relay wiring 65. The slit 653 extends in the Y direction from between the semiconductor elements 40H. The slit 653 is open to the end 652. The slit 653 extends from the end 652 to the vicinity of the arm connection portion 80 across a portion between the semiconductor elements 40H (opposing region). The slit 653 is provided at a substantially central position of the relay wiring 65 in the X direction.

As described above, the slit 653 extends from the source electrode 40S of the semiconductor element 40H to the arm connection portion 80 side in the Y direction. The slit 653 extends from the source electrode 40S of the semiconductor element 40H to the current flowing side. The slit 653 is not open to the end 650. The slit 653 is provided to the front of the arm connection portion 80. The slit 653 demarcates the relay wiring 65 into a region to which one of the semiconductor elements 40H is connected and a region to which the other one is connected. The slit 653 separates current paths of the source electrodes 40S of the semiconductor elements 40H, that is, source current paths.

Summary of Second Embodiment

Figure 29:
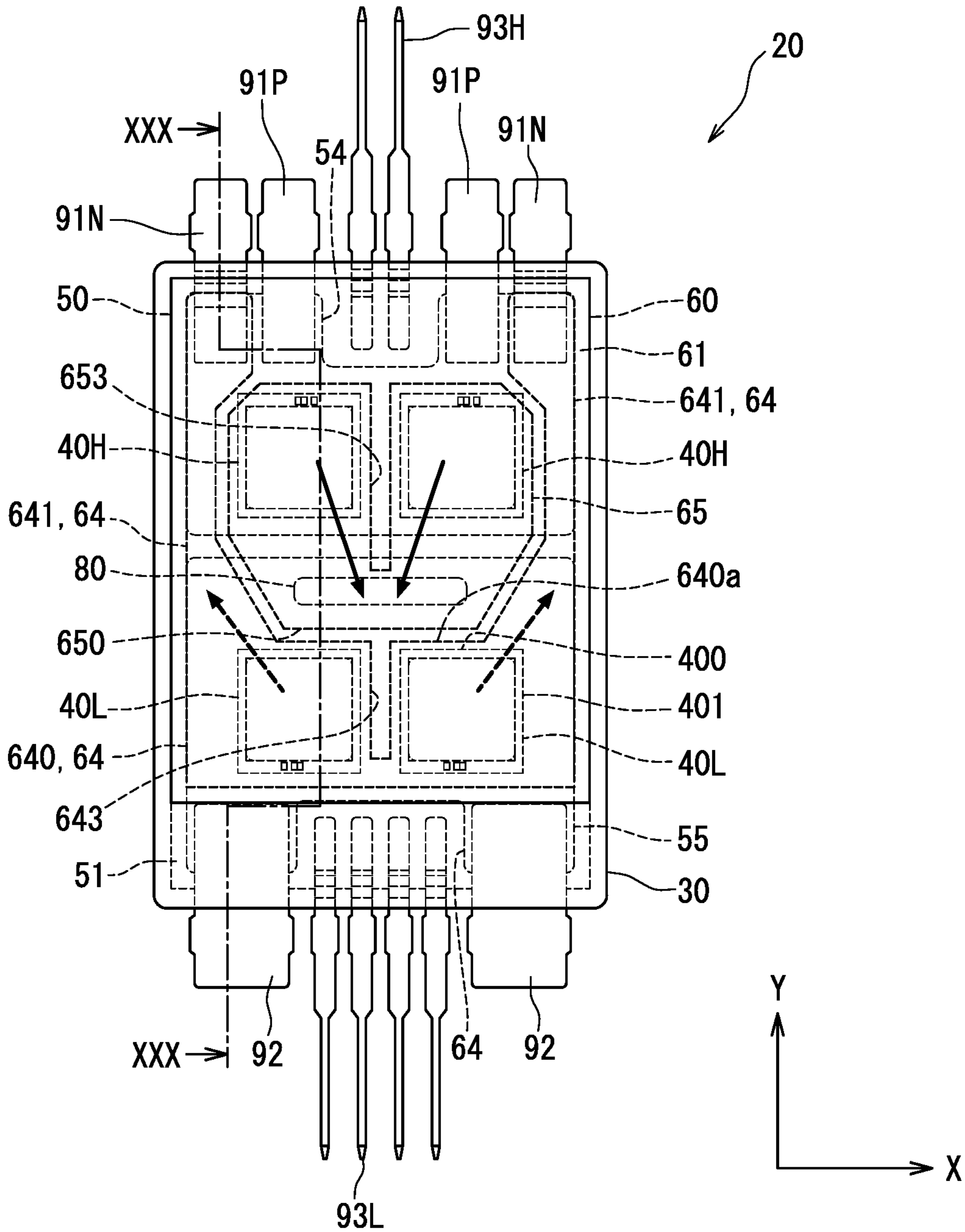
FIG. 29 is a view illustrating a current path.

FIG. 29 illustrates the source current path. A solid line arrow denotes a source current path on the semiconductor element 40H side, and a dashed line arrow denotes a source current path on the semiconductor element 40L side. As described above, in the present embodiment, the slits 643, 653 are provided in the front-face metal body 62 to which the source electrode 40S as main electrode on the low potential side is connected.

The slit 643 is provided between the adjacent semiconductor elements 40L in the N wiring 64 to which the semiconductor elements 40L are connected in parallel. The slit 643 demarcates the N wiring 64 and separates source current paths of the semiconductor elements 40L. The slit 643 thus configured makes it possible to suppress the current output from the source electrode 40S of the semiconductor element 40L (source current) from joining together near the source electrode 40S. That is, the junction of the source currents becomes away from the source electrode 40S in the plan view. Therefore, in the parallel circuit of the two semiconductor elements 40L (MOSFETs 11), the inductance Ls of the source wiring can be made large as compared with that in the configuration in which the slit 643 is not provided. Since the inductance Ls is large, transient current imbalance at the time of switching can be suppressed even if there is a variation (deviation) in the characteristics of the two semiconductor elements 40L. Transient current imbalance can be restrained while maintaining high integration of the semiconductor elements 40L by providing the slit 643.

Similarly, the relay wiring 65 includes the slit 653. The slit 653 is provided between two semiconductor elements 40H. The slit 653 demarcates the relay wiring 65 and separates the source current paths of the semiconductor elements 40H. The slit 653 thus configured makes it possible to suppress the current output from the source electrode 40S of the semiconductor element 40H (source current) from joining together near the source electrode 40S. That is, the junction of the source currents becomes away from the source electrode 40S in the plan view. Therefore, in the parallel circuit of the two semiconductor elements 40H, the inductance Ls of the source wiring can be made large as compared with that in the configuration in which the slit 653 is not provided. Since the inductance Ls is large, the transient current imbalance at the time of switching can be suppressed even if there is a variation (deviation) in the characteristics of the two semiconductor elements 40H. Transient current imbalance can be restrained while maintaining high integration of the semiconductor elements 40H by providing the slit 653.

In the present embodiment, the slit 643 extends from between the adjacent semiconductor elements 40L toward the N terminal 91N in the Y direction. The slit 643 extends from the source electrode 40S of the semiconductor element 40L to the current flowing side. Accordingly, the source current paths of the semiconductor elements 40L can be separated over a longer distance. Therefore, in the parallel circuit of the semiconductor elements 40L, the inductance Ls of the source wiring can be made larger. That is, the effect of restraining the transient current imbalance can be enhanced.

Similarly, the slit 653 extends from between the adjacent semiconductor elements 40H toward the arm connection portion 80 in the Y direction. The slit 653 extends from the source electrode 40S of the semiconductor element 40H to the current flowing side. Accordingly, the source current paths of the semiconductor elements 40L can be separated over a longer distance. Therefore, in the parallel circuit of the semiconductor elements 40H, the inductance Ls of the source wiring can be made larger. That is, the effect of restraining the transient current imbalance can be enhanced.

Figure 30:
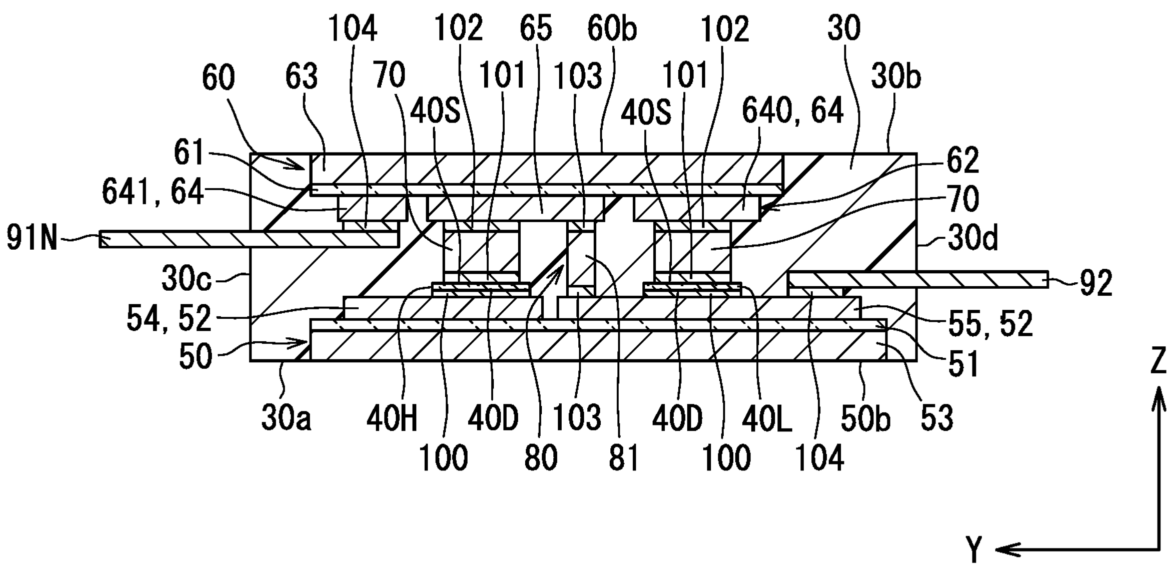
FIG. 30 is a sectional view illustrating an arm connection portion.

FIG. 30 is a sectional view taken along line XXX-XXX of FIG. 29. In the present embodiment, the joint portion 81, the bonding member 103 that connects the joint portion 81 and the relay wiring 55, and the bonding member 103 that connects the joint portion 81 and the relay wiring 65 constitute the arm connection portion 80 that electrically connects the relay wirings 55, 65. The joint portion 81 is a member separate from the substrates 50, 60. The arm connection portion 80 electrically connects the relay wiring 65 connected to the source electrode 40S of the semiconductor element 40H and the relay wiring 55 connected to the drain electrode 40D of the semiconductor element 40L.

<Modifications>

In the above example, an example in which a plurality of the semiconductor elements 40 includes two semiconductor elements 40H and two semiconductor elements 40L has been described, but the present disclosure is not limited thereto. The plurality of the semiconductor elements 40 may include two for one of the semiconductor elements 40H, 40L and include one for the other. In this case, it is sufficient that a slit be provided in the wiring in which the plurality of semiconductor elements 40 are connected in parallel to form one arm among the two wirings (64, 65) of the front-face metal body 62. For example, in the case of a configuration including two semiconductor elements 40H and one semiconductor element 40L, the slit 643 need not be provided in the N wiring 64, and it is sufficient that the slit 653 be provided in the relay wiring 65 to which the semiconductor element 40H is connected. As described above, the plurality of semiconductor elements 40 may include two arm elements of at least one of the semiconductor elements 40H, 40L.

The number of semiconductor elements 40 connected in parallel is not limited to two. Three or more semiconductor elements 40 may be connected in parallel to form one arm. For example, in the case of a configuration including the three semiconductor elements 40H, it is sufficient that the slit 653 be provided at each portion between the semiconductor elements 40H adjacent in the plan view with respect to the three semiconductor elements 40H disposed side by side in the X direction. It is sufficient that the plurality of semiconductor elements 40 include a plurality of arm elements of at least one of the semiconductor elements 40H, 40L. A plurality of both arm elements may be included, that is, a plurality of semiconductor elements 40H and a plurality of semiconductor elements 40L may be included.

The arrangement of the N terminals 91N is not limited to that in the above-described example. For example, the P terminals 91P may project from the side face 30*c* of the sealing body 30, and the N terminals 91N may project from the side face 30*d*. In this case, the pattern of the N wiring 64 has a shape similar to, for example, those of the P wiring 54 and the relay wiring 55. That is, the extending portion 641 extends from the base portion 640 to the side face 30*d* side of the sealing body 30. Also in this configuration, it is sufficient that the slit 643 be provided at least between the semiconductor elements 40L. The inductance Ls can be further increased by forming the slit 643 so as to extend from the opposing region of the semiconductor elements 40L to the N terminal 91N side outside the opposing region.

The single slit 643, 653 is provided between the semiconductor elements 40, but the present disclosure is not limited thereto. The plurality of slits may be provided for at least one of the slits 643, 653.

The example in which the slit 643, 653 is open to one of the ends of the front-face metal body 62 has been described, but the present disclosure is not limited thereto. For example, in the example illustrated in FIGS. 31 and 32, the slit 643 extends in the Y direction from the opposing side 640*a* of the base portion 640 to the end 640*c*. The slit 643 divides the base portion 640 and thus the N wiring 64 into two. The slit 643 crosses the opposing region of the semiconductor elements 40L. One of the semiconductor elements 40L is arranged in one of the divided N wirings 64, and the other one of the semiconductor elements 40L is arranged in the other of the N wirings 64. Similarly, the slit 653 extends in the Y direction from the end 652 to the end 650 of the relay wiring 65. The slit 653 divides the relay wiring 65 into two. One of the semiconductor elements 40H is arranged in one of the divided relay wirings 65, and the other one of the semiconductor elements 40H is arranged in the other of the relay wirings 65.

Figure 33:
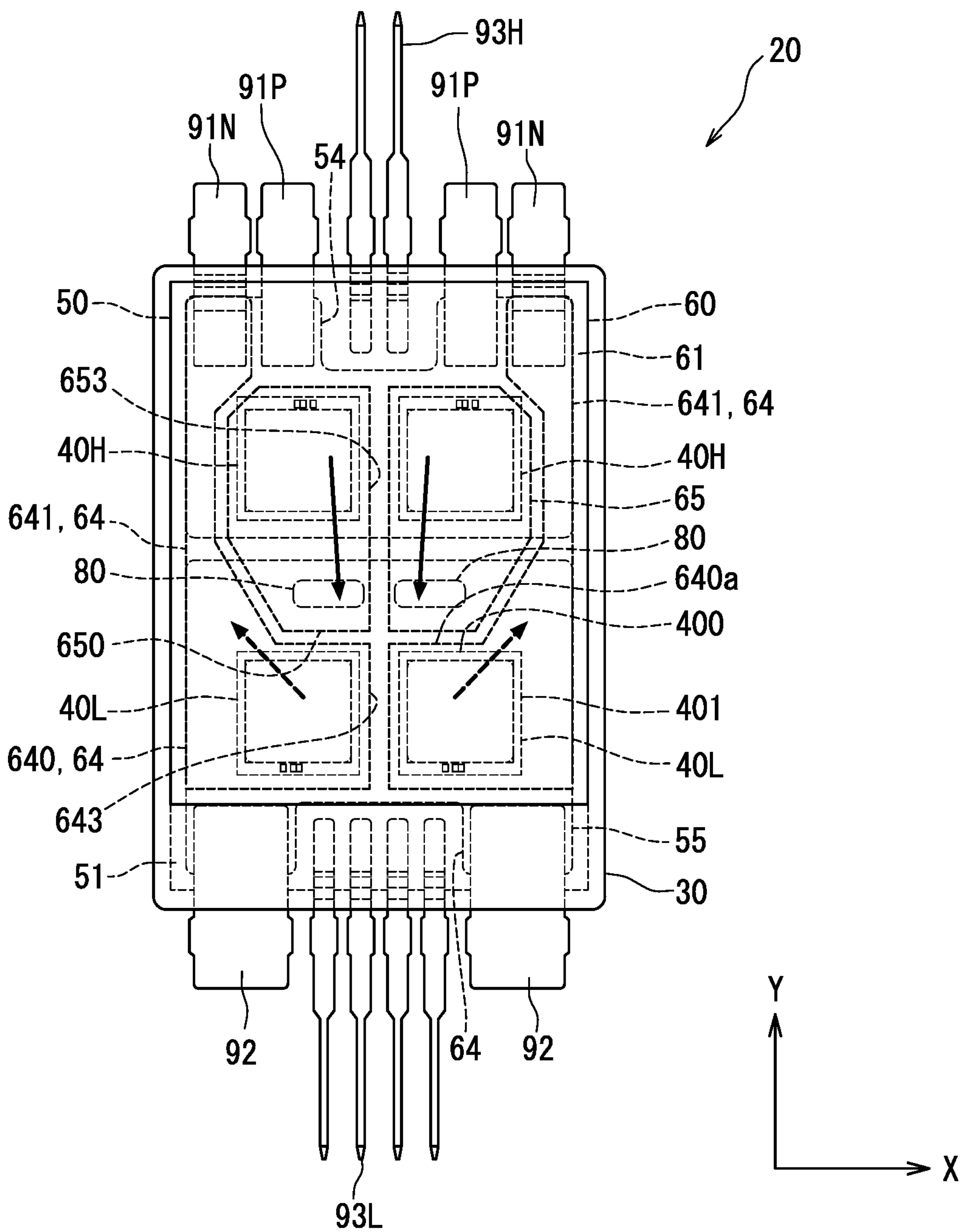
FIG. 33 is a view illustrating a current path.

The slits 643, 653 are continuous with each other and form one slit extending in the Y direction. The front-face metal body 62 is substantially line-symmetric with respect to the imaginary line CL1. FIG. 33 illustrates the source current path. A solid line arrow denotes a source current path on the semiconductor element 40H, and a dashed line arrow denotes a source current path on the semiconductor element 40L. As described above, the slit 643 divides the N wiring 64 into two. Accordingly, one source current of the semiconductor element 40L and the other one source current do not join together on the substrate 60. Since the junction of the source currents is farther away, the inductance Ls of the source wiring can be further increased.

Figure 31:
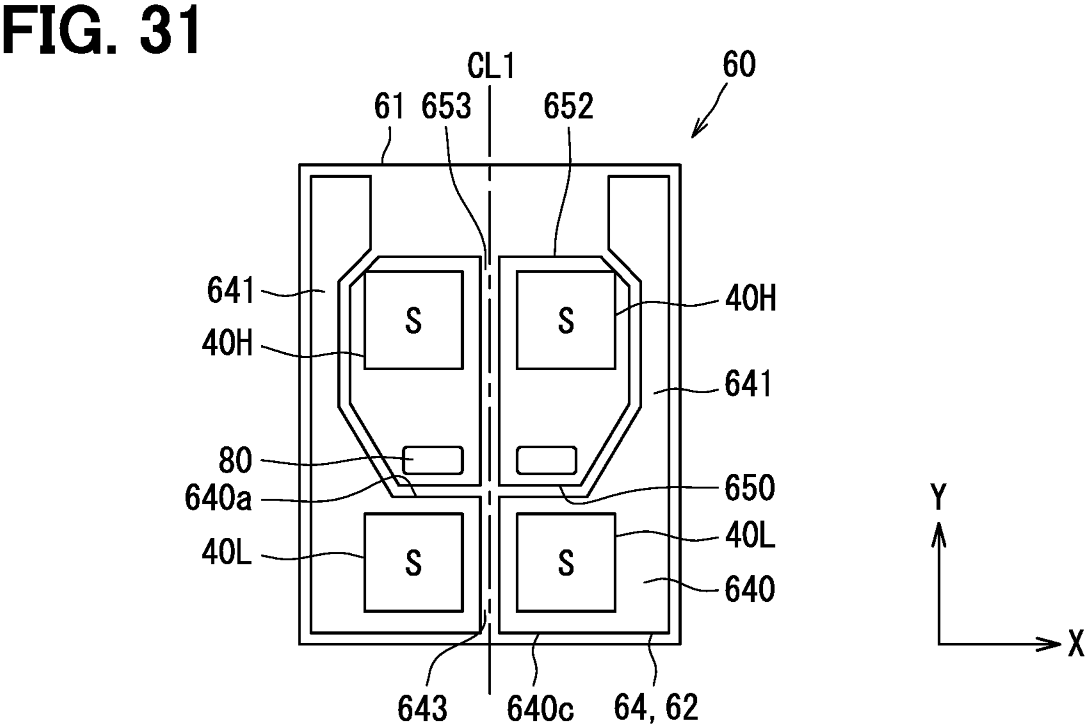
FIG. 31 is a plan view illustrating a modification of the substrate on the source electrode side.
Figure 32:
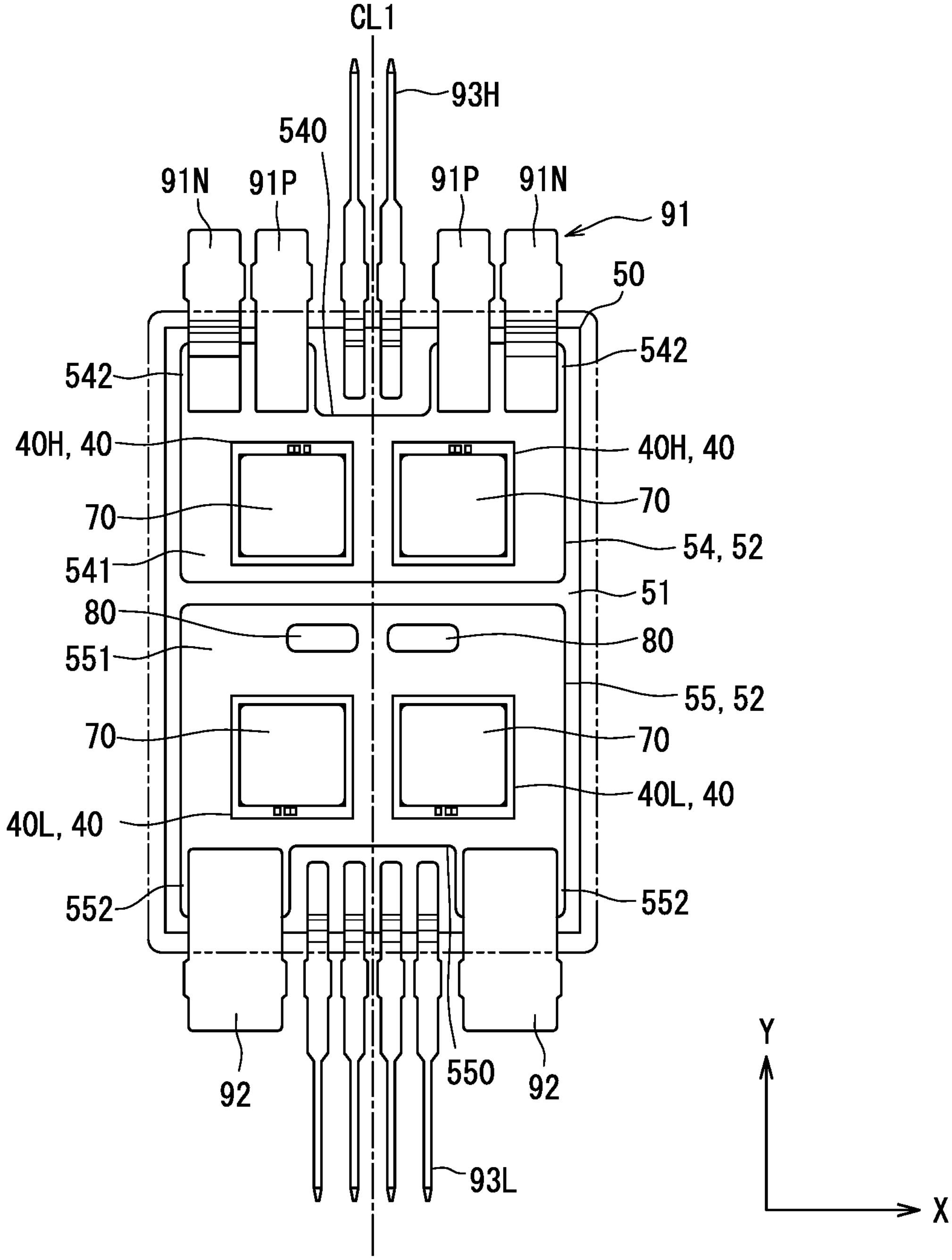
FIG. 32 is a plan view illustrating a state in which a semiconductor element is mounted on the substrate on the drain electrode side.

Similarly, the slit 653 divides the relay wiring 65 into two. Accordingly, one source current of the semiconductor element 40H and the other one source current do not join together on the substrate 60. Since the junction of the source currents is farther away, the inductance Ls of the source wiring can be further increased. As described above, the effect of restraining the transient current imbalance can be enhanced. FIGS. 31, 32, and 33 are views illustrating a modification. FIG. 31 corresponds to FIG. 28. FIG. 32 corresponds to FIG. 11. FIG. 33 corresponds to FIG. 29.

In the examples illustrated in FIGS. 31 to 33, the arm connection portions 80 are divided into the same number as the relay wiring 65 in accordance with the division of the relay wiring 65. The arm connection portion 80 individually connects the relay wirings 65. With this configuration, since the source currents do not join together also in the arm connection portion 80, the inductance Ls can be further increased.

Figure 34:
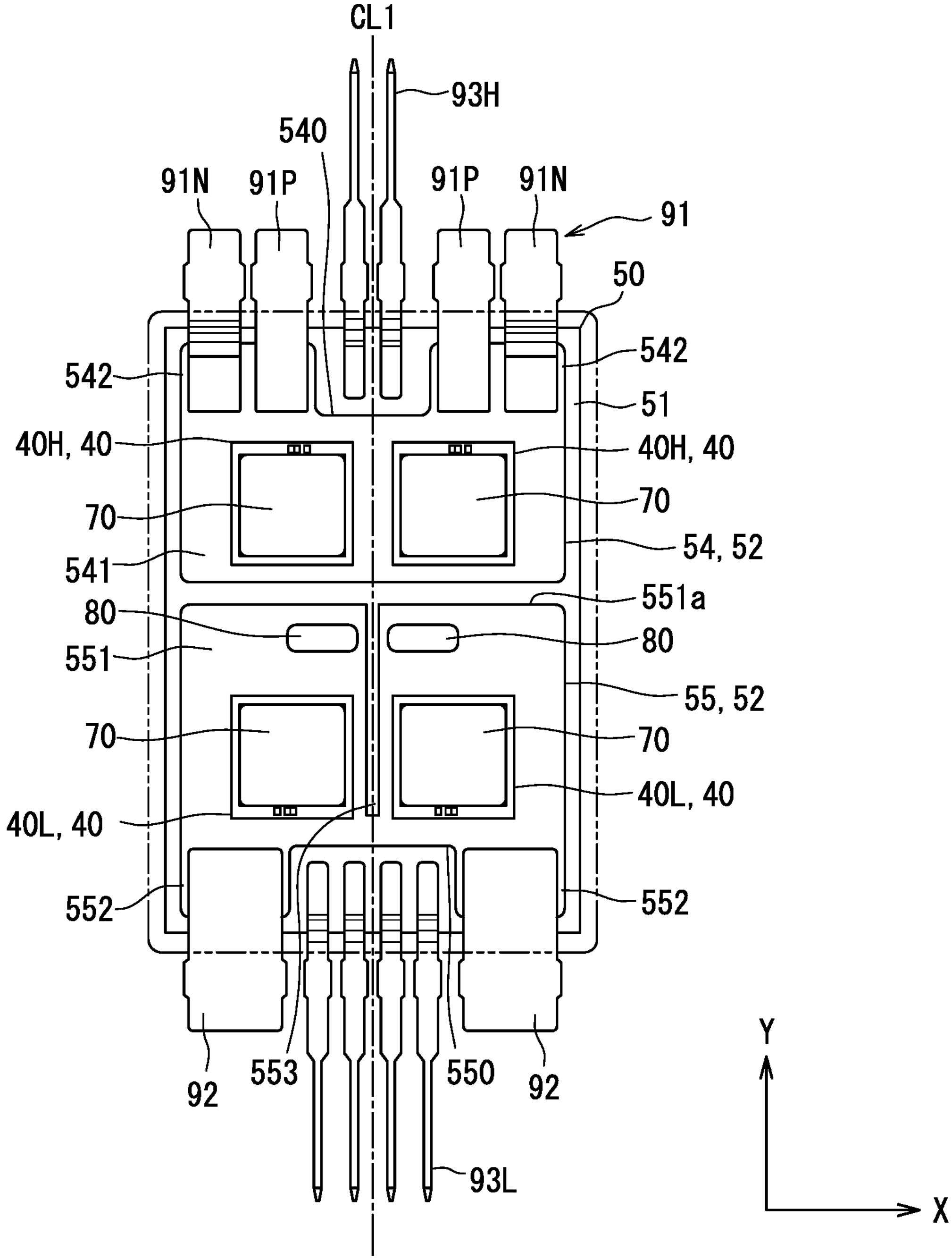
FIG. 34 is a plan view illustrating a modification of the substrate on the source electrode side.
Figure 35:
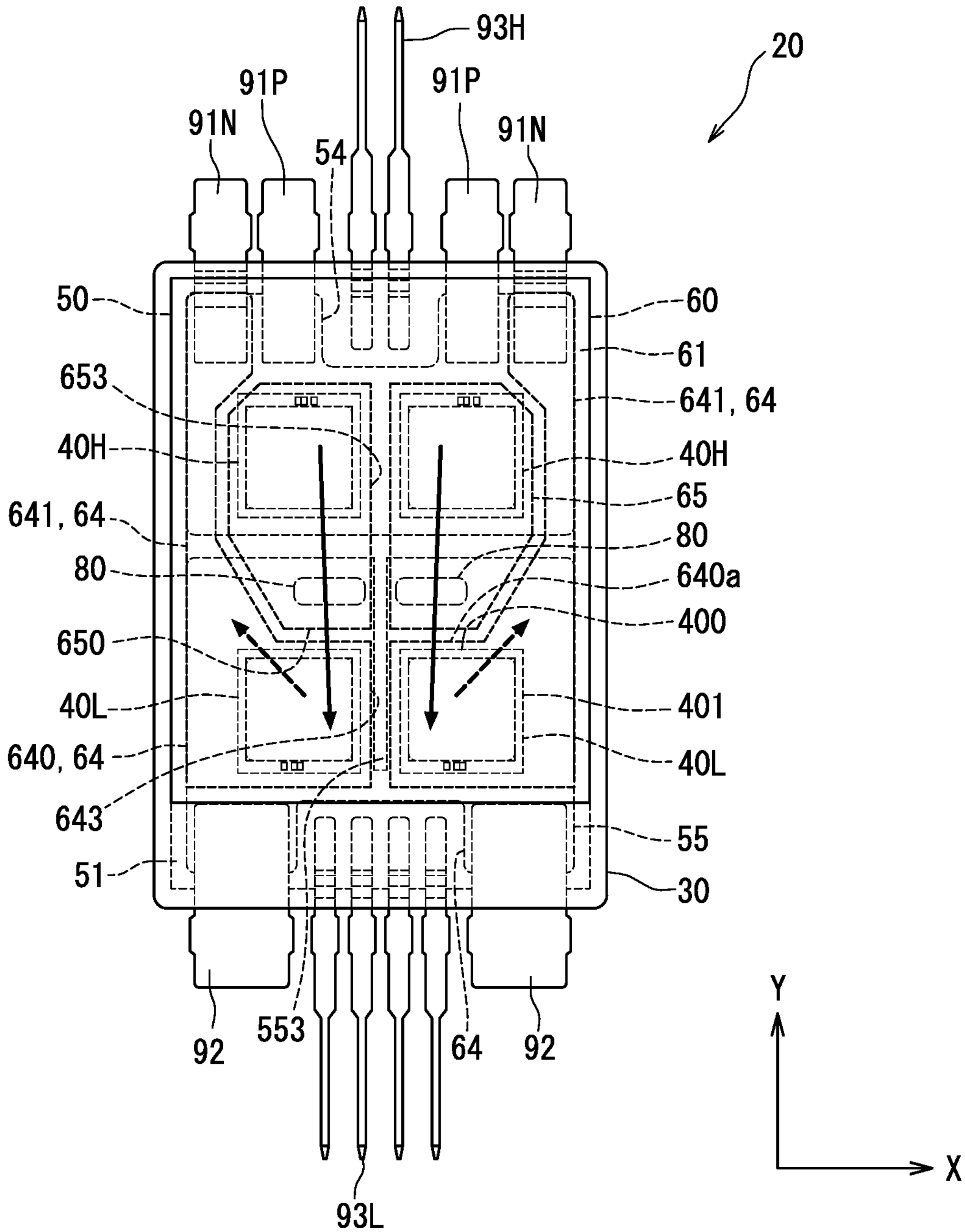
FIG. 35 is a view illustrating a current path.

In the configuration of the above-described modification, a slit may be further provided in the front-face metal body 52 of the substrate 50. As illustrated in FIGS. 34 and 35, the relay wiring 55 of the front-face metal body 52 includes a slit 553. The slit 553 is open to an end 551*a* of the relay wiring 55. The end 551*a* opposes the P wiring 54 in the Y direction. The slit 553 extends in the Y direction, crosses the arm connection portion 80 divided into two, and reaches the opposing region of (a portion between) the semiconductor elements 40L. The slit 553 is provided to the vicinity of the lower end of the opposing region of the semiconductor elements 40L.

When such a configuration is adopted, as illustrated in FIG. 35, the first current path by one set of the semiconductor elements 40H, 40L and the second current path by another set of the semiconductor elements 40H, 40L are almost completely separated in the semiconductor device 20. The junction of the currents is provided outside the N terminal 91N. Therefore, the inductance Ls of the source wiring can be further increased. FIGS. 34 and 35 are views illustrating a modification. FIG. 34 corresponds to FIG. 32. FIG. 35 corresponds to FIG. 33. Note that the semiconductor device 20 may include an N bus bar that connects the plurality of N terminals 91N. In this case, currents join together at the N bus bar. For example, the smoothing capacitor 5 side may include the N bus bar connecting the N terminals 91N.

The example in which the arm connection portion 80 includes the joint portion 81 and the bonding member 103 disposed on both end sides of the joint portion 81 has been described. However, the present disclosure is not limited thereto. In the example illustrated in FIG. 36, the joint portion 81 is provided integrally with the substrate 60. The joint portion 81 is provided as a protrusion extending in the Z direction from the relay wiring 65. Similarly to the joint portion 81, the conductive spacer 70 is also provided integrally with the front-face metal body 62 as a protrusion.

Figure 36:
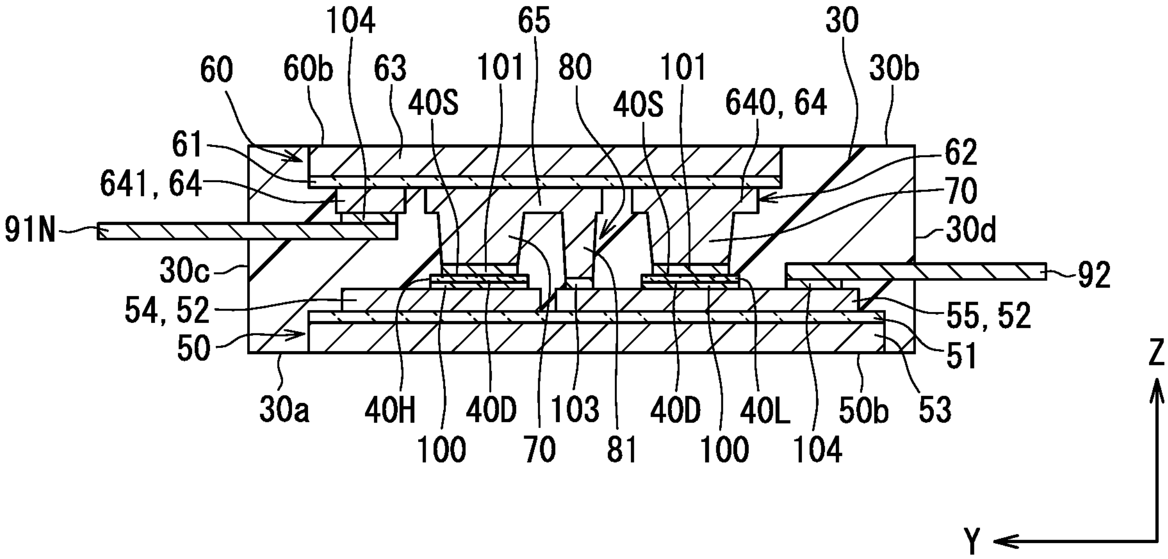
FIG. 36 is a sectional view illustrating a modification of the arm connection portion.

The front-face metal body 62 having the protrusion may be formed by, for example, pressing a deformed metal plate to pattern the metal plate and bonding the patterned metal plate to the insulating base member 61. The front-face metal body 62 having the protrusion may be formed by etching thick Cu. The protrusion may be formed by directly bonding a metal body separate from the substrate 60 to the front-face metal body 62. In the configuration illustrated in FIG. 36, the joint portion 81 that is a protrusion of the relay wiring 65 and the bonding member 103 interposed between the distal end of the joint portion 81 and the relay wiring 55 constitute the arm connection portion 80. FIG. 36 corresponds to FIG. 30.

Figure 37:
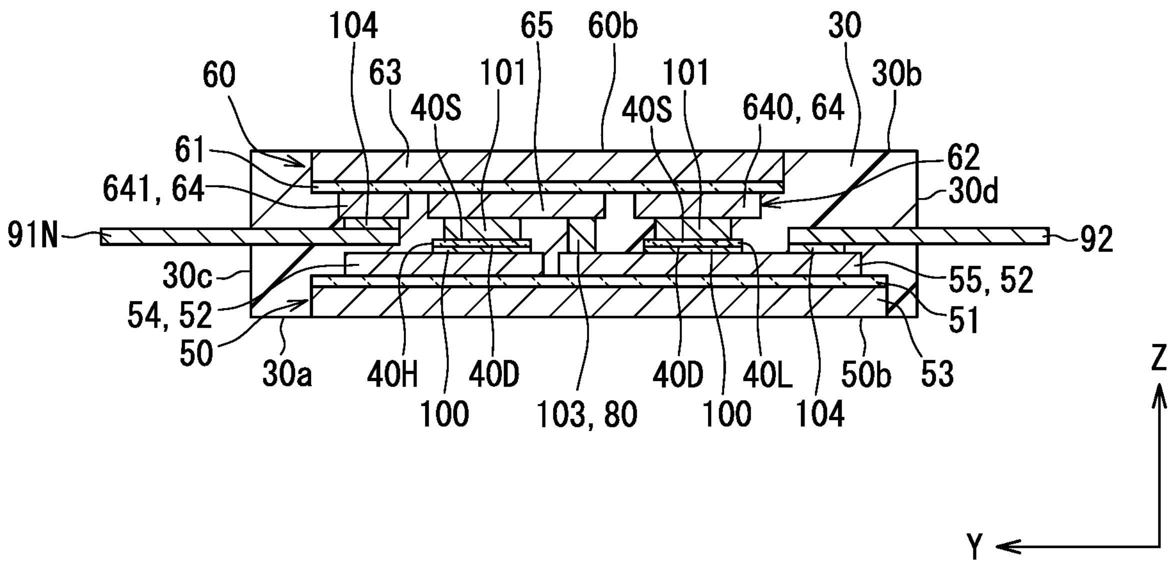
FIG. 37 is a sectional view illustrating a modification of the arm connection portion.

In the example illustrated in FIG. 37, the joint portion 81 is eliminated. The bonding member 103 electrically connects the relay wirings 55, 65. The bonding member 103 constitutes the arm connection portion 80. In FIG. 37, the conductive spacer 70 is also eliminated. The source electrode 40S of the semiconductor element 40 is connected to the front-face metal body 62 with the bonding member 101 interposed therebetween. Although not illustrated, the arm connection portion 80 may include only the joint portion 81 without including the bonding member 103. In this case, the joint portion 81 is directly bonded to the relay wirings 55, 65.

Figure 38:
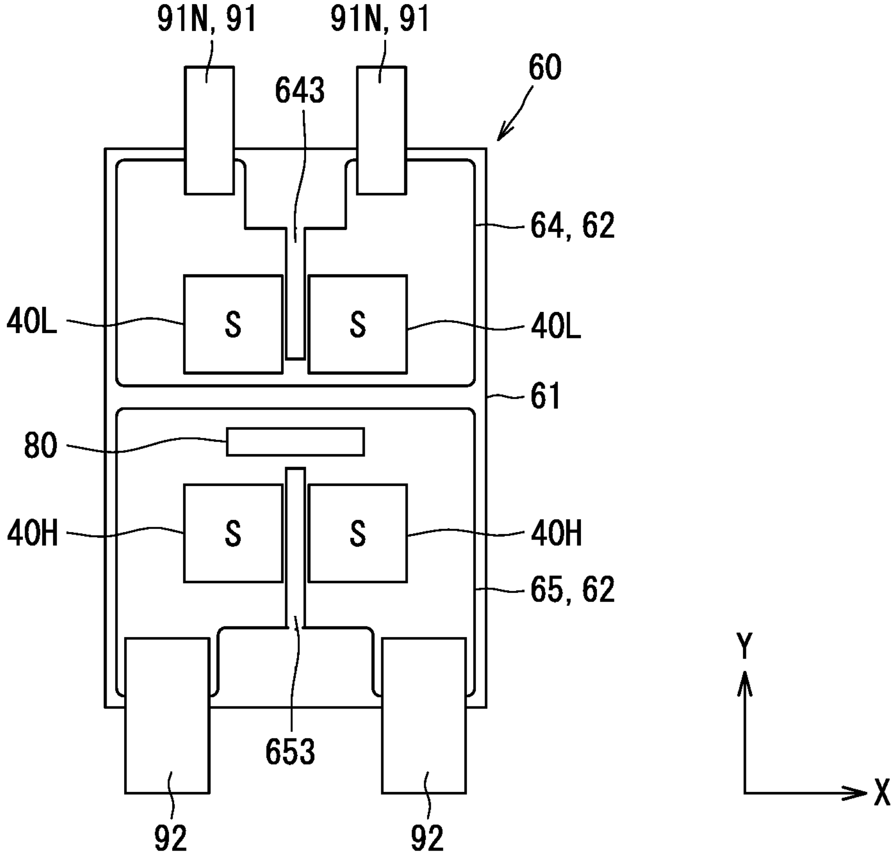
FIG. 38 is a plan view illustrating a circuit pattern of the substrate on the source electrode side in a modification.

The circuit pattern of the substrates 50, 60 is not limited to that in the above-described examples. The substrate 60 illustrated in FIG. 38 illustrates an example in which the slits 643, 653 are applied to the circuit pattern illustrated in FIG. 24. In the example illustrated in FIG. 38, the slit 643 is provided between the adjacent semiconductor elements 40L. The slit 643 extends from between the semiconductor elements 40L toward the N terminal 91N in the Y direction, that is, to the source current flowing side. The slit 653 is provided between the adjacent semiconductor elements 40H. The slit 653 extends from between the semiconductor elements 40H toward the arm connection portion 80 in the Y direction.

In the present embodiment, the arrangement of the external connection terminals 90 is not limited to that in the illustrated examples. The P terminals 91P may be connected to the P wiring 54, for example, at both ends in the X direction. The N terminals 91N may be connected to the N wiring 64, for example, at both ends in the X direction. In this case, the N terminals 91N may be connected to the extending portion 641. The extending portion 641 may be eliminated from the N wiring 64, and the N terminals 91N may be connected to the base portion 640. The output terminals 92 may be connected to the relay wiring 55, for example, at both ends in the X direction.

The configuration described in the present embodiment can be combined with any of the configurations described in the first embodiment and the modifications thereof.

Third Embodiment

This embodiment is a modification based on the preceding embodiment, and the description of the preceding embodiment can be incorporated. In order to effectively release the heat of the semiconductor element, as will be described in the present embodiment, the thickness above the semiconductor element and the thickness below the semiconductor element may satisfy a predetermined relationship.

<Warpage at High Temperature>

Figure 39:
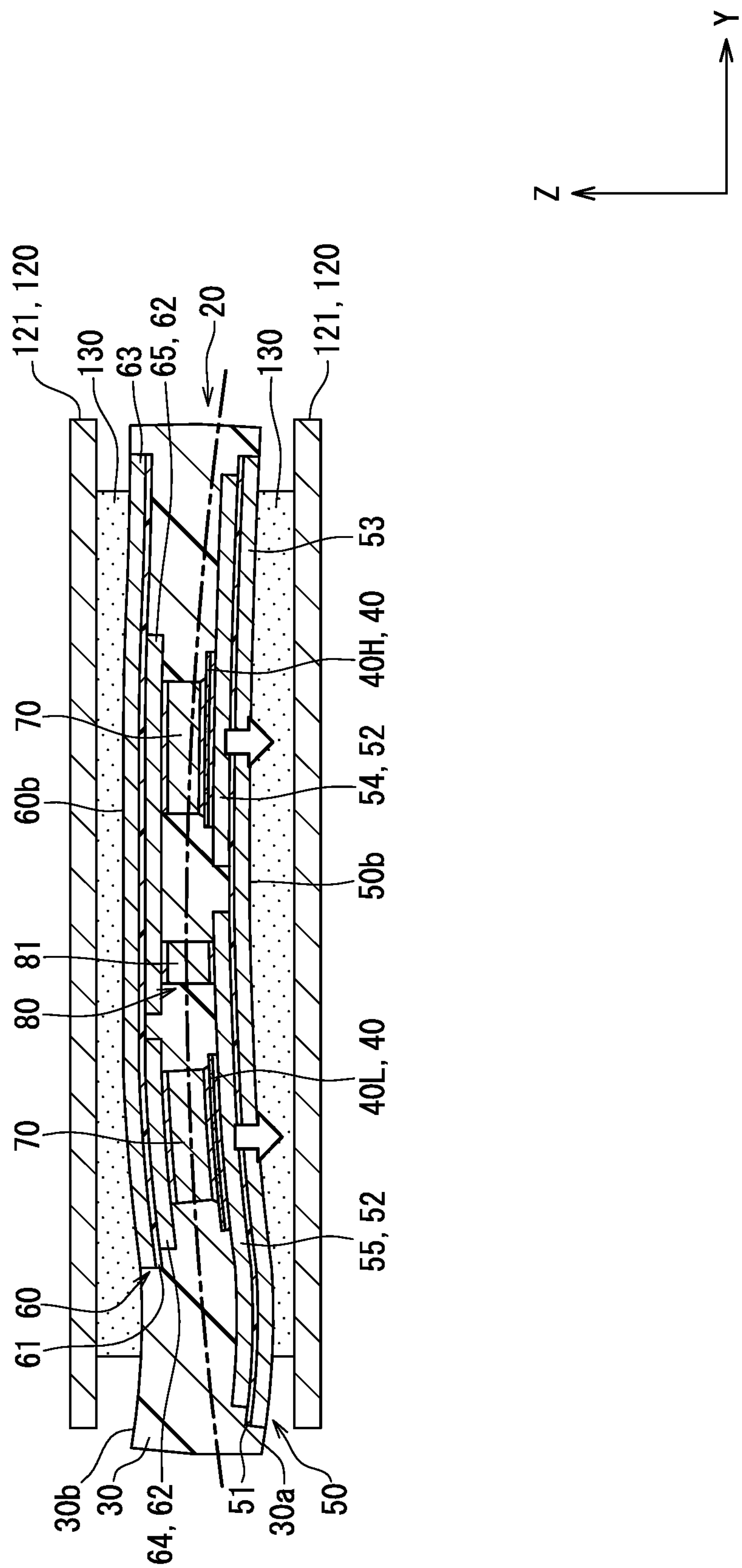
FIG. 39 is a sectional view illustrating warpage at high temperature.

As a result of intensive studies, the following has become clear. Warpage may occur in the semiconductor device 20 as illustrated in FIG. 39 even when the insulating base members 51, 61 each including resin are adopted and the linear expansion coefficient is brought close to that of the metal body 52, 53, 62, 63 by addition of a filler. FIG. 39 illustrates a state of the semiconductor device 20 during operation of the semiconductor element 40, that is, at high temperature. The alternate long and short dashed line in the drawing is a reference line indicating the direction of warpage.

The configuration illustrated in FIG. 39 is similar to the configuration described in the preceding embodiment (see FIG. 5). In FIG. 39, the external connection terminals 90 are omitted for convenience. In FIG. 39, the semiconductor device 20 and a heat exchange unit 121 of a cooler 120 are disposed side by side in the Z direction that is a predetermined direction. The heat exchange unit 121 is disposed on both sides of the semiconductor device 20 in the Z direction so as to sandwich the semiconductor device 20. A heat conductive member 130 such as silicone gel is disposed between each of the heat exchange units 121 and the semiconductor device 20. The cooler 120 cools the semiconductor device 20 by circulating the refrigerant in the flow path of the heat exchange unit 121. As the refrigerant flowing through the flow path, a phase-changing refrigerant such as water or ammonia, or a non-phase-changing refrigerant such as ethylene glycol-based medium can be used. The heat conductive member 130 may be referred to as a "thermal interface material (TIM)". The heat conductive member 130 follows the opposing faces between the heat exchange unit 121 and the semiconductor device 20, and fills a gap between the opposing faces.

As described above, in the semiconductor element 40, the drain electrode 40D as the main electrode on the high potential side has a larger electrode area than the source electrode 40S as the main electrode on the low potential side. The conductive spacer 70 is interposed between the source electrode 40S and the substrate 60, whereas the conductive spacer 70 is not interposed between the drain electrode 40D and the substrate 50. That is, the heat transfer path from the semiconductor element 40 to the substrate 50 is smaller in thermal resistance than the heat transfer path from the semiconductor element 40 to the substrate 60. In the semiconductor device 20 having such a configuration, effective heat dissipation to the substrate 50 side is required.

As illustrated in FIG. 39, when warpage recessing on the substrate 50 side and protruding toward the substrate 60 occurs, an opposing distance between the back face 50*b* of the substrate 50, which is an exposed face, and the heat exchange unit 121 becomes long, and the interposed heat conductive member 130 becomes thick. These changes cause an increase of the thermal resistance between the substrate 50 and the heat exchange unit 121, making it difficult to transfer (exchange) heat between the semiconductor device 20 and the cooler 120 (heat exchange unit 121). In order to effectively release the heat of the semiconductor element 40, that is, to efficiently cool the semiconductor device 20, the state of warpage illustrated in FIG. 39 is not preferable. FIG. 39 illustrates an example of the double-sided cooling structure in which the coolers 120 (heat exchange units 121) are disposed on both sides of the semiconductor device 20. However, there is a similar problem also for a single-sided cooling structure in which the cooler 120 is disposed only on the substrate 50 side in the Z direction.

<Configuration of Semiconductor Device>

Figure 40:
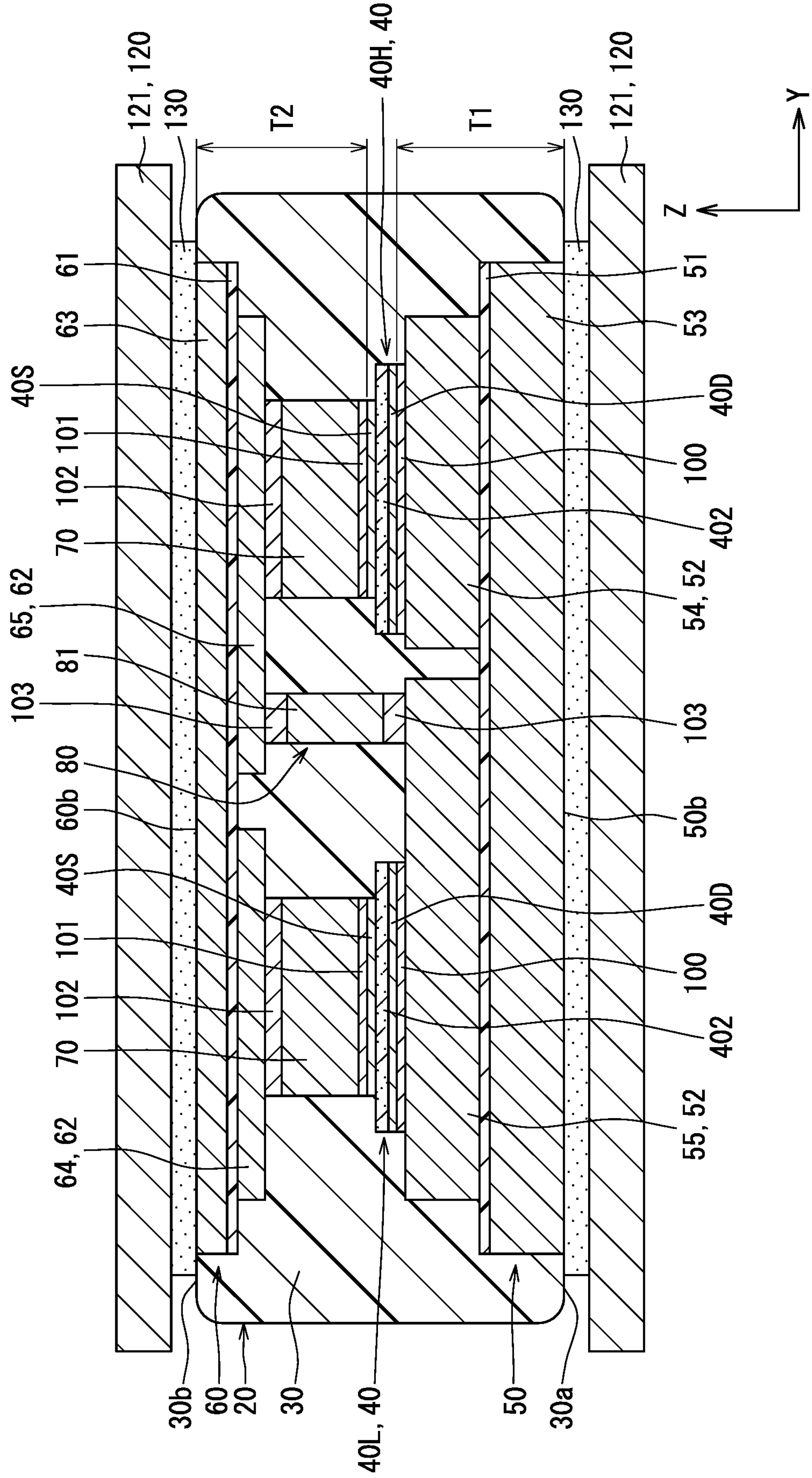
FIG. 40 is a sectional view illustrating a semiconductor device according to a third embodiment.

As a result of intensive studies, the following has become clear. The warpage of the semiconductor device 20 can be controlled by using the magnitude relationship between the thickness of the part on the substrate 50 side with respect to the semiconductor element 40 and the thickness of the part on the substrate 60 side with respect to the semiconductor element 40 in the semiconductor device 20. The semiconductor device 20 according to the present embodiment has a configuration based on this finding. FIG. 40 is a sectional view illustrating the semiconductor device 20 according to the present embodiment. FIG. 40 illustrates an ideal state of the semiconductor device 20 free of warpage.

The semiconductor device 20 according to the present embodiment has a configuration that is the same as or similar to the configuration described in the preceding embodiment (see FIGS. 2 to 13). Similarly to FIG. 39, FIG. 40 illustrates the heat exchange unit 121 of the cooler 120 and the heat conductive member 130 together with the semiconductor device 20. That is, FIG. 40 illustrates a semiconductor module 140 including the semiconductor device 20, the cooler 120, and the heat conductive member 130. As an example, the semiconductor module 140 has a double-sided cooling structure in which the semiconductor device 20 is sandwiched between the pair of heat exchange units 121. The semiconductor device 20 is disposed side by side with the cooler 120 (heat exchange unit 121) in the Z direction that is a predetermined direction. The coolers 120 are disposed on both sides of the semiconductor device 20.

The back-face metal body 53, 63 is exposed from the sealing body 30 as the back face 50*b*, 60*b* of the substrate 50, 60. One of the heat exchange units 121 of the cooler 120 is disposed to oppose the one face 30*a* of the sealing body 30 and the back face 50*b*, and the other one of the heat exchange units 121 is disposed to oppose the back face 30*b* of the sealing body 30 and the back face 60*b*. Heat conductive members 130 are disposed between the opposing faces of the semiconductor device 20 and the heat exchange unit 121. The heat conductive member 130 is in close contact with the semiconductor device 20 and the heat exchange unit 121.

The semiconductor device 20 is configured such that a relationship of T1 T2, where T1 represents a thickness of a part on the substrate 50 side than the semiconductor element 40, and T2 represents a thickness of a part on the substrate 60 side than the semiconductor element 40. The other configurations are similar to the configurations described in the preceding embodiments (see FIG. 5). The thickness T2 is the total of the respective thicknesses of the bonding member 101, the conductive spacer 70, the bonding member 102, and the substrate 60. The thickness T1 is the total of the respective thicknesses of the bonding member 100 and the substrate 50. In order to satisfy the relationship of T1≥T2, the substrate 50 is thicker than the substrate 60. The substrate 50 is thicker than the conductive spacer 70. In the substrate 50, the metal body 52, 53 is thicker than the insulating base member 51. In the substrate 60, the metal bodies 62, 63 are thicker than the insulating base member 61. The configuration of the portion excluding the thickness relationship is similar to the configuration described in the first embodiment.

<Simulation Results>

Figure 41:
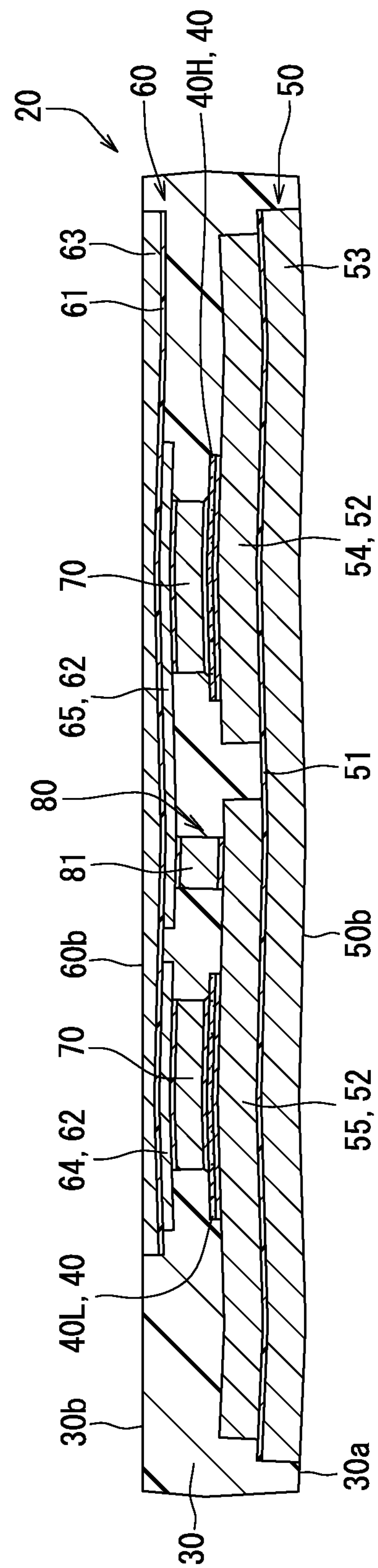
FIG. 41 is a sectional view illustrating the semiconductor device at room temperature.
Figure 42:
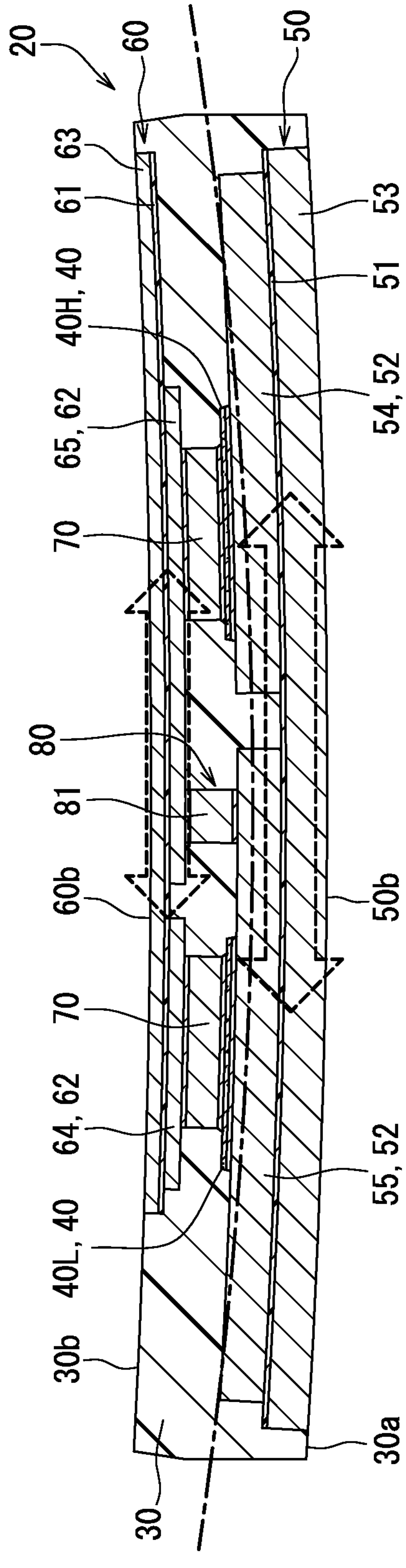
FIG. 42 is a sectional view illustrating the semiconductor device at high temperature.
Figure 43:
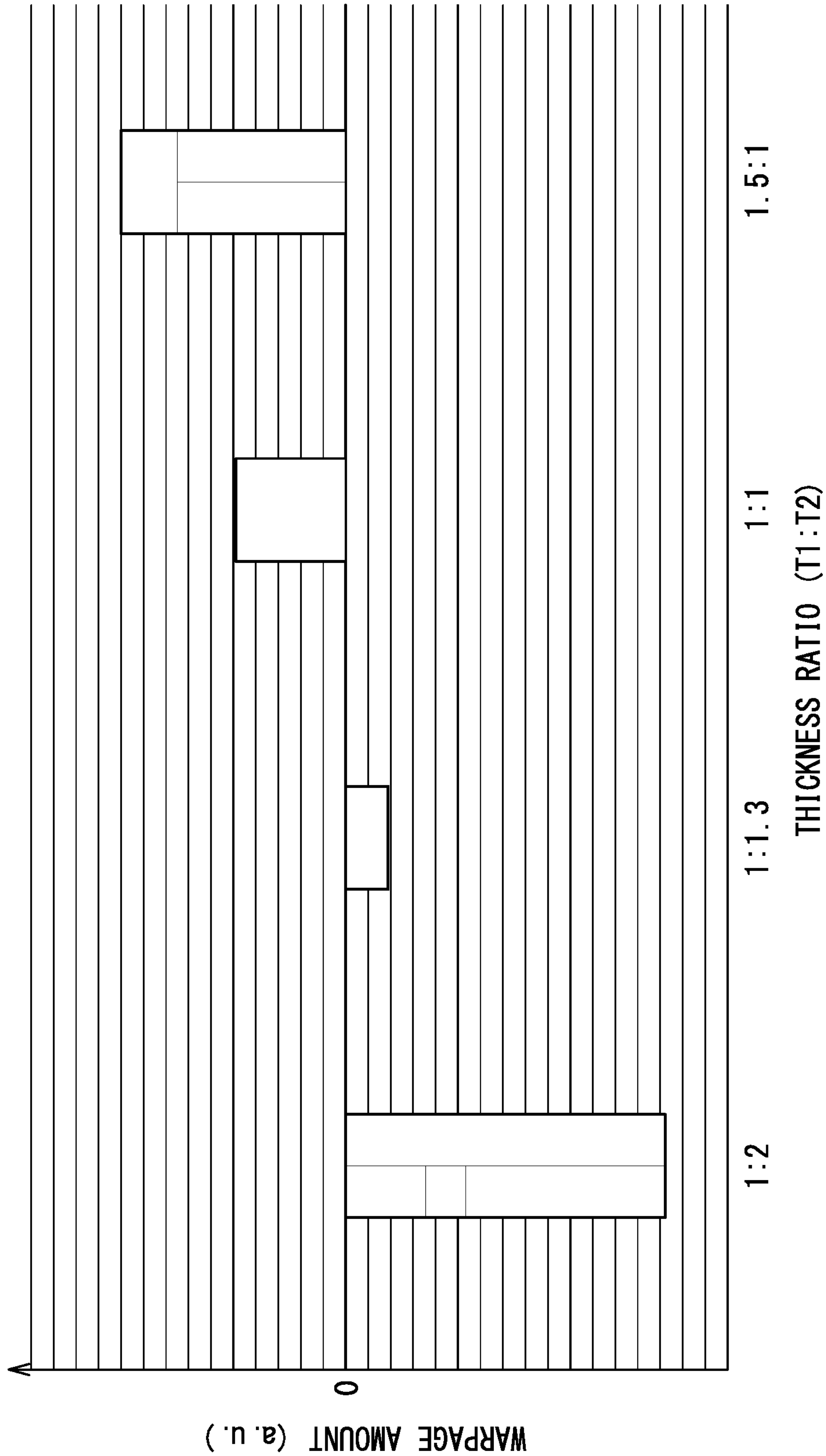
FIG. 43 is a chart indicating the relationship between the ratio of thicknesses T1 and T2 and the amount of warpage.

FIGS. 41 to 43 illustrate results of thermal stress simulation. FIG. 41 illustrates a state of the semiconductor device 20 illustrated in FIG. 40 at room temperature (RT). FIG. 42 illustrates a state of the semiconductor device 20 illustrated in FIG. 40 at high temperature. "At high temperature" is when the semiconductor element 40 generates heat by energization, that is, when the semiconductor element 40 operates. As illustrated in FIGS. 41 and 42, the semiconductor device 20 warps at high temperature. In the present embodiment, since the relationship of T1 T2 is satisfied as described above, the amount of expansion on the substrate 50 side is greater than the amount of expansion on the substrate 60 side as denoted by a dashed line arrow in FIG. 42. The reason for the above is that the linear expansion coefficient of Cu constituting the metal body 52, 53, 62, 63 is the greatest, and the substrate 50 is thick. With this configuration, warpage occurs. This warpage protrudes toward the substrate 50 as the first substrate and is recessed on the substrate 60 side as the second substrate. The alternate long and short dashed line in FIG. 42 is a reference line indicating the direction of warpage.

FIG. 43 indicates the relationship between the ratio of the thickness T1 to the thickness T2 and the amount of warpage at high temperature. In this simulation, the semiconductor element 40, the conductive spacer 70, and the bonding members 100, 101, 102 were set to be the same (common), and the thicknesses of the substrate 50 and the substrate 60 were adjusted so that the thickness ratio of T1:T2 was set to a predetermined value. The material configurations were the same (common). In FIG. 43, the vertical axis represents the amount of warpage, which is an arbitrary unit (a.u.). The amount of warpage above 0 indicates that the warpage protrudes toward the substrate 50 and is recessed toward the substrate 60. The amount of warpage below 0 indicates that the warpage is recessed toward the substrate 50 and protrudes toward the substrate 60. The ratio of T1:T2 was set to four levels of 1:2, 1:1.3, 1:1, and 1.5:1.

As indicated in FIG. 43, in the case of T1:T2=1:2, warpage recessed toward the substrate 50 and protruding toward the substrate 60 occurred, and the amount of warpage protruding toward the substrate 60 was the largest among the four levels. In the case of T1:T2=1:1.3, warpage recessed toward the substrate 50 and protruding toward the substrate 60 occurred, and the amount of warpage protruding toward the substrate 60 was smaller than that in the case of T1:T2=1:2. When the ratio was set to T1:T2=1:1, warpage turned into that protruding toward the substrate 50 and recessed toward the substrate 60. When the ratio was set to T1:T2=1.5:1, warpage protruding toward the substrate 50 and recessed toward the substrate 60 occurred, and the amount of warpage protruding toward the substrate 50 was the largest among the four levels.

As described above, the following has become clear. In the case of T1<T2, warpage recessed toward the substrate 50 and protruding toward the substrate 60 occurs. In the case of T1≥T2, warpage recessed toward the substrate 50 and protruding toward the substrate 60 occurs. That is, the following has become clear. By satisfying the relationship of T1≥T2, warpage occurring at high temperature can be controlled to be warpage protruding toward the substrate 50 and recessed toward the substrate 60. The following has also become clear. The amount of warpage protruding toward the substrate 60 increases as T2 increases with respect to T1, and the amount of warpage protruding toward the substrate 50 increases as T1 increases with respect to T2.

Summary of Third Embodiment

In the present embodiment, the semiconductor device 20 satisfies the above-described relationship of thickness T1≥the thickness T2. The thickness T1 on the side where the conductive spacer 70 is not interposed between the semiconductor element 40 and the substrate 50 is equal to or greater than the thickness T2 on the side where the conductive spacer 70 is interposed between the semiconductor element 40 and the substrate 60. As a result, during operation of the semiconductor element 40 (at high temperature), warpage protruding toward the substrate 50 and recessed toward the substrate 60 occurs in the semiconductor device 20. Therefore, the opposing distance between the semiconductor device 20 and the cooler 120 (heat exchange unit 121) on the substrate 50 side having a high contribution ratio with respect to the heat dissipation properties can be narrowed as compared with the configuration satisfying the relationship of the thickness T1<the thickness T2. Since the opposing distance is narrowed, the thermal resistance between the semiconductor device 20 and the cooler 120 is reduced. In this manner, heat generated at the semiconductor element 40 can be efficiently released to the outside of the semiconductor device 20. In other words, the cooling efficiency of the semiconductor device 20 can be enhanced.

Specifically, the thickness of the heat conductive member 130 interposed between the semiconductor device 20 and the cooler 120 is small as compared with that of the configuration satisfying the relationship of the thickness T1<the thickness T2. This thickness relationship cause a decrease of the thermal resistance between the semiconductor device 20 and the cooler 120, making it easy to exchange heat between the semiconductor device 20 and the cooler 120. Therefore, heat generated at the semiconductor element 40 can be efficiently released to the outside of the semiconductor device 20.

In the present embodiment, the back-face metal body 53 is exposed from the sealing body 30. Heat dissipation properties can be enhanced as compared with a configuration in which the back-face metal body 53 is covered with the sealing body 30. Similarly, the back-face metal body 63 is exposed from the sealing body 30. Heat dissipation properties can be enhanced as compared with a configuration in which the back-face metal body 63 is covered with the sealing body 30.

<Modifications>

Although the example of the double-sided heat dissipation structure has been described, the present disclosure is not limited thereto. The semiconductor device 20 is desired to efficiently release heat mainly from the substrate 50 side. Therefore, the cooler 120 (heat exchange unit 121) may be disposed only on the substrate 50 side in the Z direction with respect to the semiconductor device 20. Even in such a single-sided heat dissipation structure, warpage protruding toward the substrate 50 at high temperature by satisfying the relationship of T1≥T2. In this manner, the thermal resistance between the semiconductor device 20 and the cooler 120 is reduced. Therefore, heat generated at the semiconductor element 40 can be efficiently released.

The example in which both the back-face metal bodies 53, 63 are exposed from the sealing body 30 has been described, but the present disclosure is not limited thereto. For example, only the back-face metal body 53 may be exposed.

The example in which the semiconductor device 20 include the semiconductor element 40H constituting the upper arm 9H and the semiconductor element 40L constituting the lower arm 9L has been described, but the present disclosure is not limited thereto. Only the semiconductor element 40 constituting one of the arms may be provided. The semiconductor device 20 may include, for example, only one semiconductor element 40. It is sufficient that the semiconductor device 20 include the semiconductor element 40, a pair of substrates 50, 60 disposed so as to sandwich the semiconductor element 40, and the conductive spacer 70 interposed between the semiconductor element 40 and the substrate 60.

Figure 44:
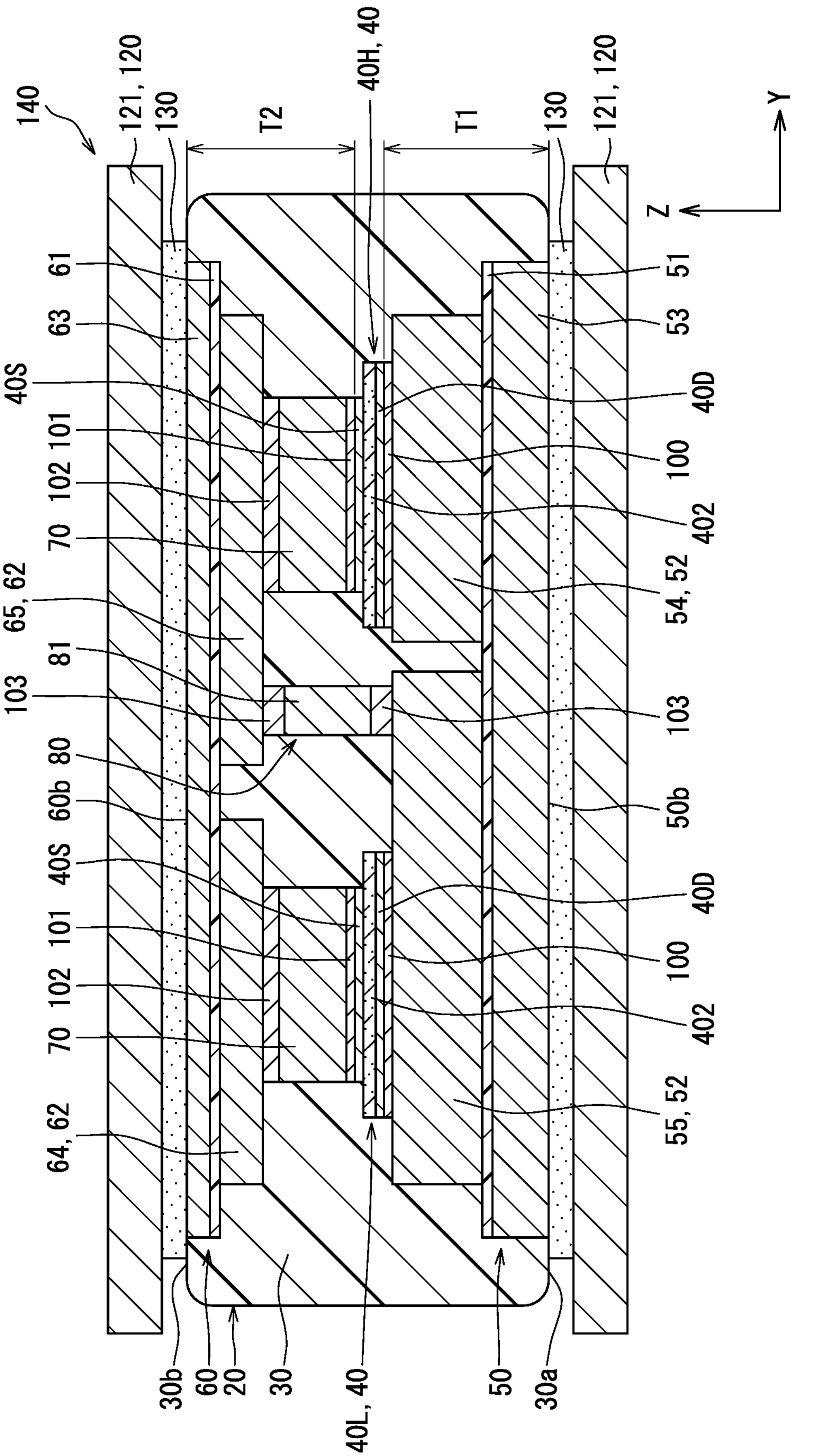
FIG. 44 is a sectional view illustrating a modification.

In the substrate 50, the relationship between the thicknesses of the metal bodies 52, 53 is not particularly mentioned. For example, as illustrated in FIG. 44, the front-face metal body 52 may be thicker than the back-face metal body 53. The drain electrode 40D as a first main electrode of the semiconductor element 40 is bonded to the front-face metal body 52. The thermal resistance between the front-face metal body 52 and the semiconductor element 40 is small. By thickening the front-face metal body 52 close to the semiconductor element 40, heat generated at the semiconductor element 40 can be effectively diffused. That is, heat generated at the semiconductor element 40 can be efficiently released. FIG. 44 is a sectional view illustrating a modification. FIG. 44 corresponds to FIG. 41.

As illustrated in FIG. 44, the front-face metal body 62 may be thicker than the back-face metal body 63. By thickening the front-face metal body 62 close to the semiconductor element 40, heat generated at the semiconductor element 40 can be effectively diffused.

Figure 45:
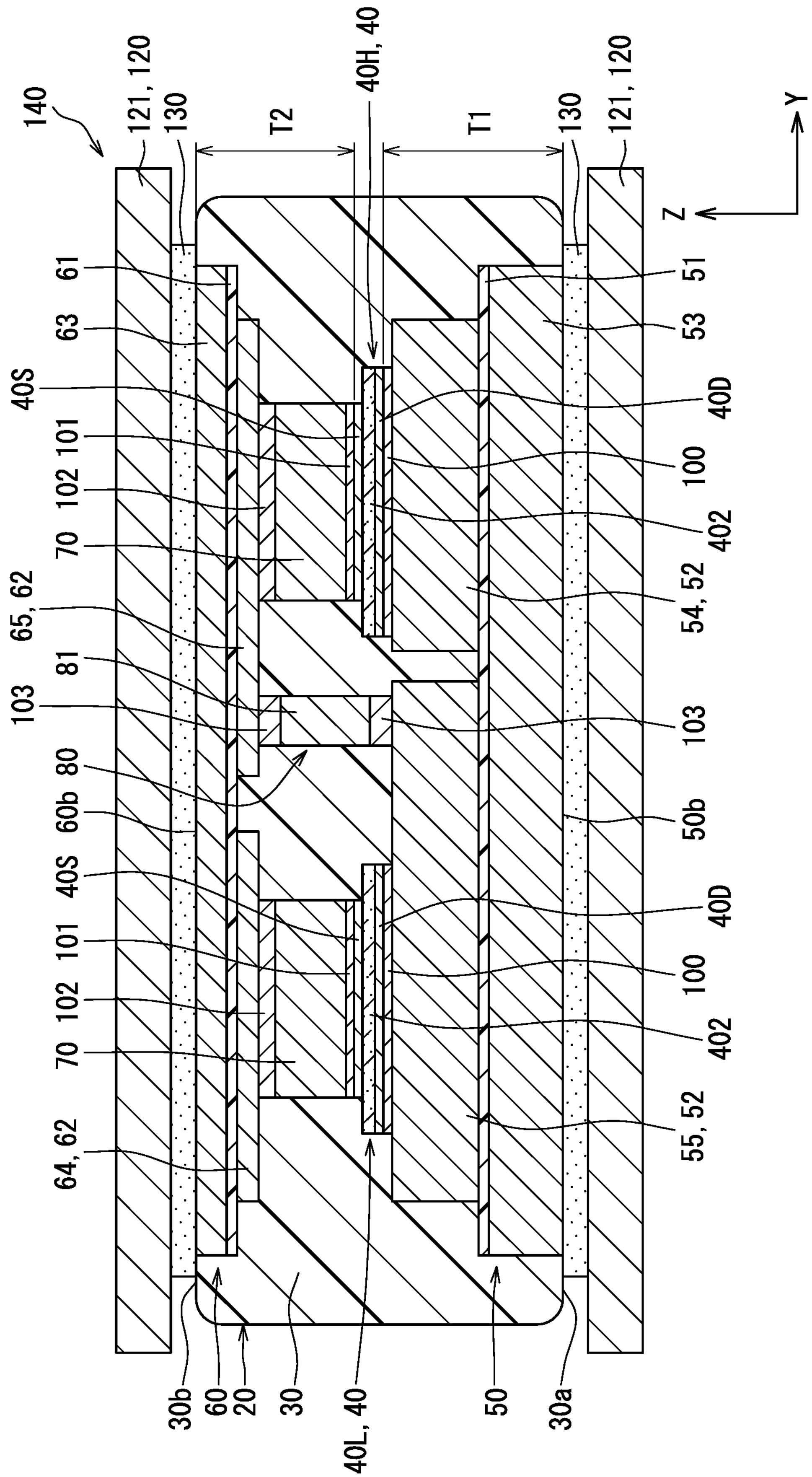
FIG. 45 is a sectional view illustrating a modification.

As described above, the heat of the semiconductor element 40 having the main electrodes on both faces is transferred mainly to the substrate 50 side having small thermal resistance. For this reason, as illustrated in FIG. 45, the front-face metal body 62 may be thinner than the back-face metal body 63. As a result, the thickness of the substrate 60 can be reduced, and thus the physical size of the semiconductor device 20 can be downsized. Since a thick metal body becomes unnecessary, the cost can be reduced. FIG. 45 is a sectional view illustrating a modification. FIG. 45 corresponds to FIG. 44. In FIG. 45, the front-face metal body 52 is thicker than the back-face metal body 53, and the front-face metal body 62 is thinner than the back-face metal body 63. Therefore, while heat of the semiconductor element 40 can be efficiently released, the physical size can be reduced, and cost can be reduced.

The configuration described in the present embodiment can be combined with any of the configurations described in the first embodiment, the second embodiment, and the modifications thereof.

Fourth Embodiment

This embodiment is a modification based on the preceding embodiment, and the description of the preceding embodiment can be incorporated. In order to enhance the connection reliability, as will be described in the present embodiment, the substrate and the signal terminal may satisfy a predetermined positional relationship.

<Semiconductor Device>

Figure 46:
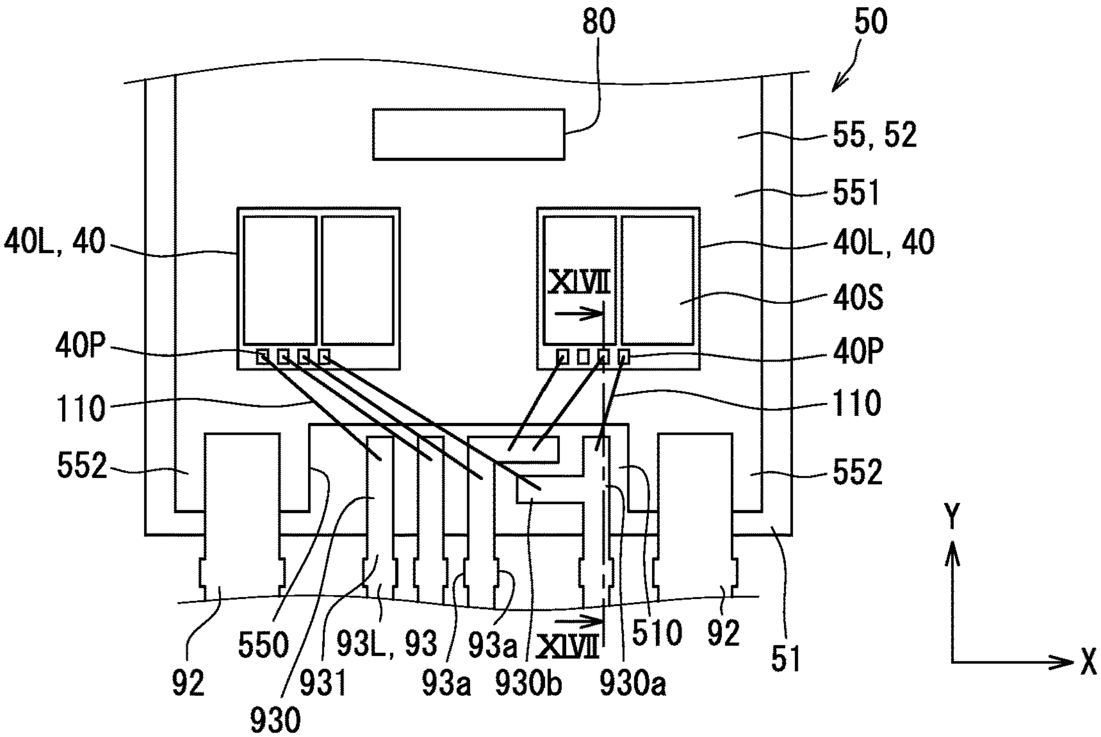
FIG. 46 is an enlarged plan view of a signal terminal and its periphery in a semiconductor device according to a fourth embodiment.
Figure 47:
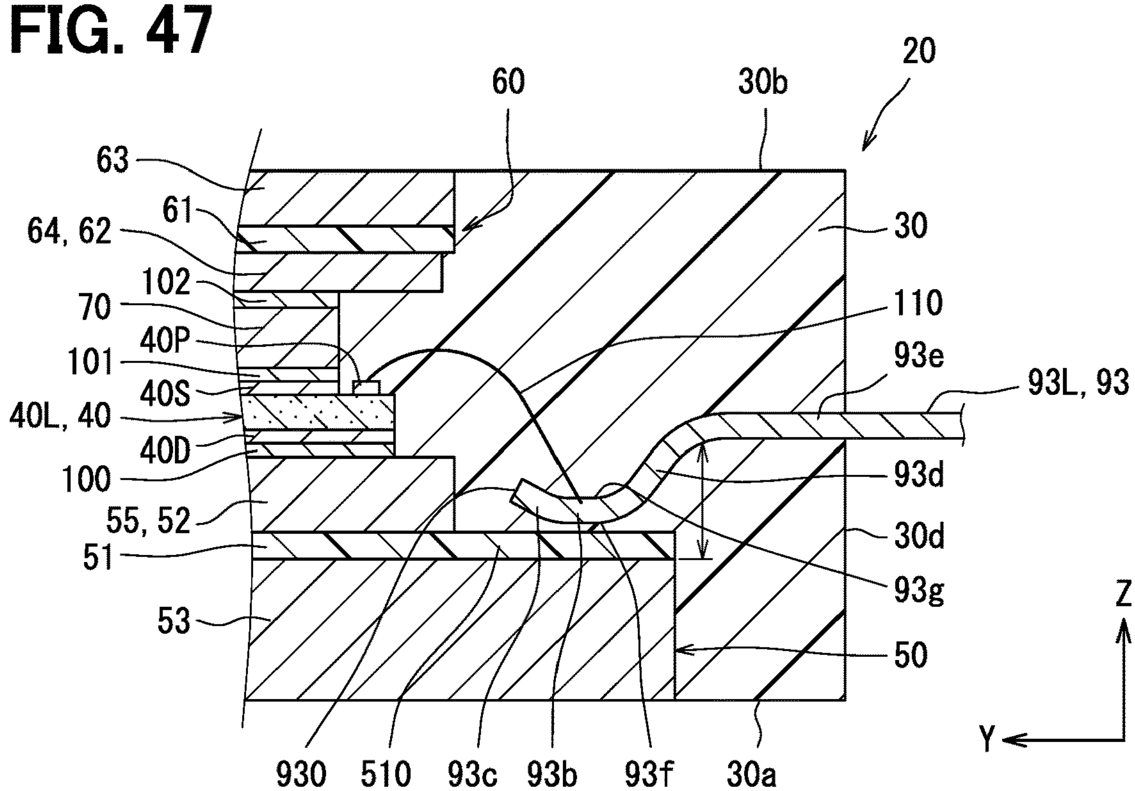
FIG. 47 is a sectional view taken along line XLVII-XLVII of FIG. 46.

First, the semiconductor device 20 according to the present embodiment will be described with reference to FIGS. 46 and 47. FIG. 46 illustrates a periphery of the signal terminal 93 in the semiconductor device 20 according to the present embodiment. In FIG. 46, in order to illustrate the positional relationship between the substrate 50 and the signal terminal 93, some of the elements of the semiconductor device 20 are omitted. FIG. 47 is a sectional view taken along line XLVII-XLVII of FIG. 46. In FIGS. 46 and 47, the signal terminal 93L on the lower arm 9L side will be described as an example.

The semiconductor device 20 according to the present embodiment has a configuration that is the same as or similar to the configuration described in the preceding embodiment (see FIGS. 2 to 13). As illustrated in FIG. 46, the semiconductor device 20 includes two semiconductor elements 40L. The semiconductor element 40L includes the drain electrode 40D as a first main electrode on one face, and includes the source electrode 40S as a second main electrode and the pad 40P for signals on a back face. The semiconductor device 20 includes four signal terminals 93L. Each of the signal terminals 93L extends in the Y direction and projects outward from the side face 30*d* of the sealing body 30. The four signal terminals 93L are disposed side by side in the X direction between the output terminals 92 in the plan view in the Z direction.

<Shape and Arrangement of Signal Terminal>

Next, the shape, arrangement, and the like of the signal terminal 93 will be described with reference to FIGS. 46 and 47.

As illustrated in FIG. 46, each signal terminal 93L includes an overlapping portion 930 overlapping the substrate 50 in the plan view and a non-overlapping portion 931 not overlapping the substrate 50. The overlapping portion 930 opposes the substrate 50 in the Z direction.

The overlapping portion 930 is a portion of the signal terminal 93L within a predetermined range from the end on the semiconductor element 40L side. The non-overlapping portion 931 is a portion excluding the overlapping portion 930. The overlapping portion 930 overlaps the insulating base member 51 of the substrate 50 to which the drain electrode 40D is electrically connected. The entire region of the overlapping portion 930 overlaps the insulating base member 51. The overlapping portion 930 overlaps an exposed portion 510 exposed from the front-face metal body 52 in the insulating base member 51. As described above, the signal terminal 93L extends onto the substrate 50. That is, the signal terminal 93L is inserted and disposed so as to reach a position overlapping the substrate 50 in the plan view.

In two among the four signal terminals 93L, the overlapping portion 930 includes a main portion 930*a* and a projection 930*b*. The other two signal terminals 93L do not have the projection 930*b*. The main portion 930*a* extends in the Y direction that is the main extending direction of the signal terminal 93L. The projection 930*b* is continuous with the main portion 930*a* and projects from the main portion 930*a*. The projection 930*b* extends in a direction different from the main portion 930*a*. The projection 930*b* may be referred to as an "branching portion". As a planar shape of the main portion 930*a*, various shapes such as a substantially L shape, a substantially Y shape, and a substantially T shape in the plan view can be adopted. In the example illustrated in FIG. 46, one of the signal terminals 93L has a substantially L shape in the plan view, and the other one signal terminal 93L has a substantially T shape in the plan view.

As described in the preceding embodiment (see FIG. 11), the relay wiring 55 of the front-face metal body 52 includes the cutout 550. The overlapping portion 930 of the signal terminal 93L overlaps a portion exposed from the cutout 550 in the insulating base member 51. The four signal terminals 93L are disposed side by side in the X direction between the output terminals 92 in the plan view. Each signal terminal 93L includes a tie bar mark 93*a*. As described in the preceding embodiment (see FIG. 10), the tie bar mark 93*a* is a mark remaining on the side face of the signal terminal 93L when the tie bar 94*a* of the lead frame 94 is cut off. The tie bar mark 93*a* may be referred to as a "severing mark". Each signal terminal 93L includes the tie bar mark 93*a* on both side faces in the X direction. The tie bar mark 93*a* is provided at a position outside the sealing body 30 in the non-overlapping portion 931.

As illustrated in FIG. 47, each signal terminal 93L includes a bonded portion 93*b*, a distal end 93*c*, a bent portion 93*d*, and an extending portion 93*e*. The bonded portion 93*b* is a portion to which the bonding wire 110 as a connection member is bonded. The bonded portion 93*b* preferably includes a portion substantially parallel to the XY plane. The bonded portion 93*b* is a portion of the signal terminal 93L closest to the surface of the insulating base member 51 (exposed portion 510). The bonded portion 93*b* according to the present embodiment is detached with respect to the surface of the insulating base member 51. The bonded portion 93*b* is not in contact with the insulating base member 51, and the sealing body 30 enters a gap between the lower face of the bonded portion 93*b* and the surface of the insulating base member 51 to fill the gap. The bonding wire 110 electrically connects the pad 40P formed on the same plane as the source electrode 40S and the signal terminal 93L.

The distal end 93*c* is a portion closer to the distal end side, that is, closer to the semiconductor element 40 (40L) side than the bonded portion 93*b* is. The distal end 93*c* is disposed above the bonded portion 93*b*, that is, at a position away from the surface of the insulating base member 51 in the Z direction. The distal end 93*c* is lifted upward as it goes away from the bonded portion 93*b*. The distal end 93*c* has a round shape in the ZY section. The bent portion 93*d* is provided between the bonded portion 93*b* and the extending portion 93*e* that is a portion closer to the rear end than the bonded portion 93*b* is. The bent portion 93*d* is bent so that the extending portion 93*e* is positioned above the bonded portion 93*b*, that is, at a position away from the surface of the insulating base member 51. By bending, the bent portion 93*d* has a sectional area smaller than that of the other portions of the signal terminal 93, specifically, the bonded portion 93*b*, the distal end 93*c*, and the extending portion 93*e*. That is, the bent portion 93*d* is thinner than the other portions. The extending portion 93*e* is a portion closer to the rear end than the bonded portion 93*b* is. The extending portion 93*e* extends in the Y direction and is disposed inside and outside the sealing body 30.

At least part of the bonded portion 93*b*, the distal end 93*c*, and the bent portion 93*d* is included in the overlapping portion 930 described above. At least part of the extending portion 93*e* is included in the non-overlapping portion 931. In the present embodiment, the entire region of the extending portion 93*e* is included in the non-overlapping portion 931. Each signal terminal 93L is formed by press punching. In the signal terminal 93L, an opposing face with respect to the insulating base member 51 is a press round face 93*f*, and a back face of the opposing face is a burr face 93*g* on which burrs are generated by punching. The configuration other than the above is the same as the configuration described in the first embodiment.

<Method of Connecting Bonding Wire>

Figure 48:
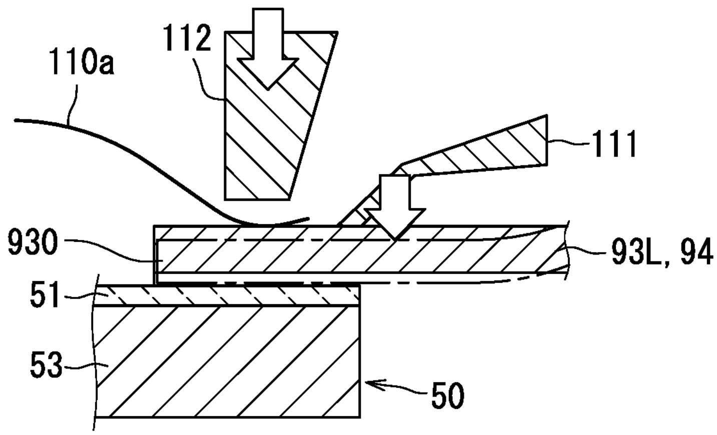
FIG. 48 is a view for explaining wire bonding.

Next, a method of connecting the signal terminal 93 having the above-described structure and the bonding wire 110 will be described with reference to FIG. 48. FIG. 48 is a view for explaining wire bonding. A reference sign 111 illustrated in FIG. 48 denotes a jig for holding the signal terminal 93L. A reference sign 112 denotes a tool for ultrasonic bonding. The tool 112 may be referred to as an "ultrasonic bonding device". An alternate long and short dashed line illustrated in FIG. 48 denotes the position of the signal terminal 93L bent by being pressed by the jig 111.

As illustrated in FIG. 48, first, the overlapping portion 930 of the signal terminal 93L is positioned so as to overlap the insulating base member 51, and a wire 110*a* is set at a portion to be bonded. Then, the signal terminal 93L is elastically deformed by pressurization in the Z direction by using the jig 111, and the overlapping portion 930 is brought into contact with the surface of the insulating base member 51. The jig 111 presses the overlapping portion 930 of the signal terminal 93L or the vicinity thereof.

Then, ultrasonic bonding is performed by the tool 112 in a state where the signal terminal 93L is in contact with the insulating base member 51. Since the insulating base member 51 receives the signal terminal 93L, preparation of a separate receiving jig is not required. When the ultrasonic bonding is completed and the tool 112 and the jig 111 are move away from the signal terminal 93L, the signal terminal 93L is released from the elastic deformation state and returns to the position before pressurization. The signal terminal 93L is part of the lead frame 94. Since the signal terminal 93L is supported by the outer peripheral frame 94*b* by the tie bar 94*a*, the signal terminal 93L returns to the original position when the pressurizing force is released.

In the above description, the signal terminal 93L has been described as an example. However, the above configuration may be applied to the signal terminal 93H on the upper arm 9H side. Both the signal terminals 93H, 93L may have the above-described configuration. In the configuration described in the preceding embodiment (see FIG. 11), each of the signal terminals 93H, 93L overlaps the exposed portion of the insulating base member 51. The P wiring 54 of the front-face metal body 52 includes the cutout 540, and the signal terminal 93H overlaps the surface of the insulating base member 51 exposed from the cutout 540.

Summary of Fourth Embodiment

In the present embodiment, the signal terminal 93 (93L) overlaps the exposed portion 510 of the insulating base member 51. However, the signal terminal 93 is not bonded to the exposed portion 510. That is, the signal terminal 93 is not fixed to the insulating base member 51 and thus to the substrate 50. In this manner, the signal terminal 93 can absorb dimensional variation within tolerance of each element constituting the semiconductor device 20, assembly variation when each element is assembled, and the like. Therefore, concentration of stress on the electrical connection portion (bonded portion) of the signal terminal 93 with the semiconductor element 40 can be suppressed at the time of molding the sealing body 30. As a result, the semiconductor device 20 with high connection reliability can be provided.

In the present embodiment, the signal terminal 93 is inserted and disposed so as to reach a position overlapping the substrate 50, that is, a position above the substrate 50. By adopting such an arrangement, the signal terminal 93 approaches the pad 40P of the semiconductor element 40 (40L) in the Y direction. Therefore, the length of the bonding wire 110 as a connection member can be shortened as compared with a configuration in which the signal terminal 93 is disposed only at a position not overlapping the substrate 50. Since the length of the bonding wire 110 can be shortened, occurrence of wire sweep, a short circuit due to wire sweep, disconnection of the wire, and the like can be suppressed at the time of molding the sealing body 30 by a transfer molding method or the like.

In the present embodiment, the overlapping portion 930 of the signal terminal 93 is detached with respect to the surface of the exposed portion 510 of the insulating base member 51. The sealing body 30 is interposed between the lower face of the overlapping portion 930 and the surface of the exposed portion 510. The sealing body 30 is also interposed between the bonded portion 93*b* and the exposed portion 510. With this configuration, even if the manufacturing variation is large in the plate thickness direction, the variation can be absorbed. Since the signal terminal 93 is positioned above the insulating base member 51, an insulation distance from the back-face metal body 53 can be easily secured.

In the present embodiment, the front-face metal body 52 includes the cutout 550 (540). The cutout 550 is open to an end in the Y direction that is one direction orthogonal to the Z direction. The overlapping portion 930 of the signal terminal 93 overlaps the surface of the exposed portion 510 exposed from the cutout 550. As described above, by providing the cutout 550 in the front-face metal body 52 of the substrate 50, an increase in the physical size of the substrate 50 can be restrained while securing an insulation distance between the front-face metal body 52 and the signal terminal 93.

In the present embodiment, the non-overlapping portion 931 of the signal terminal 93 includes the tie bar mark 93*a*. As described above, the signal terminal 93L is part of the lead frame 94, and is supported by the outer peripheral frame 94*b* via the tie bar 94*a*. Therefore, the signal terminal 93 is bent by pressurization to be brought into contact with the exposed portion 510 of the insulating base member 51, and the bonding wire 110 can be bonded by ultrasonic bonding in this contact state. Then, the pressurizing force is released after the bonding is completed, so that the signal terminal 93 returns to the original position.

In the present embodiment, the signal terminal 93 includes the bent portion 93*d* between the bonded portion 93*b* and the extending portion 93*e*. Due to the bent portion 93*d*, the extending portion 93*e* is disposed at a position farther from the exposed portion 510 (insulating base member 51) in the Z direction than the bonded portion 93*b* is. By providing the bent portion 93*d* in this manner, an insulation distance between the signal terminal 93 and the back-face metal body 53 can be secured while suppressing an increase in physical size in the Z direction.

In the present embodiment, the signal terminal 93 includes the distal end 93*c*. The distal end 93*c* is farther from the exposed portion 510 (insulating base member 51) in the Z direction than the bonded portion 93*b* is. In this manner, the distal end of the signal terminal 93 can be suppressed from scratching the insulating base member 51 at the time of bonding (ultrasonic bonding) or the like described above. That is, deterioration of insulation performance can be suppressed. Particularly in the present embodiment, since the distal end 93*c* is lifted upward as being away from the bonded portion 93*b*, the distal end 93*c* is less likely to come into contact with the insulating base member 51. Since the distal end 93*c* has a round shape in the ZY section, the insulating base member 51 can be suppressed from being scratched even if the distal end comes into contact with the insulating base member 51.

When the opposing face is the burr face 93*g*, the insulating base member 51 is scratched, and the insulation performance may be deteriorated. In the present embodiment, the signal terminal 93 is configured such that a side of the opposing face with respect to the exposed portion 510 serves as the press round face 93*f*, and a back face side of the opposing face is the burr face 93*g*. This configuration makes it possible to suppress a decrease in the insulation performance of the insulating base member 51.

<Modifications>

Figure 49:
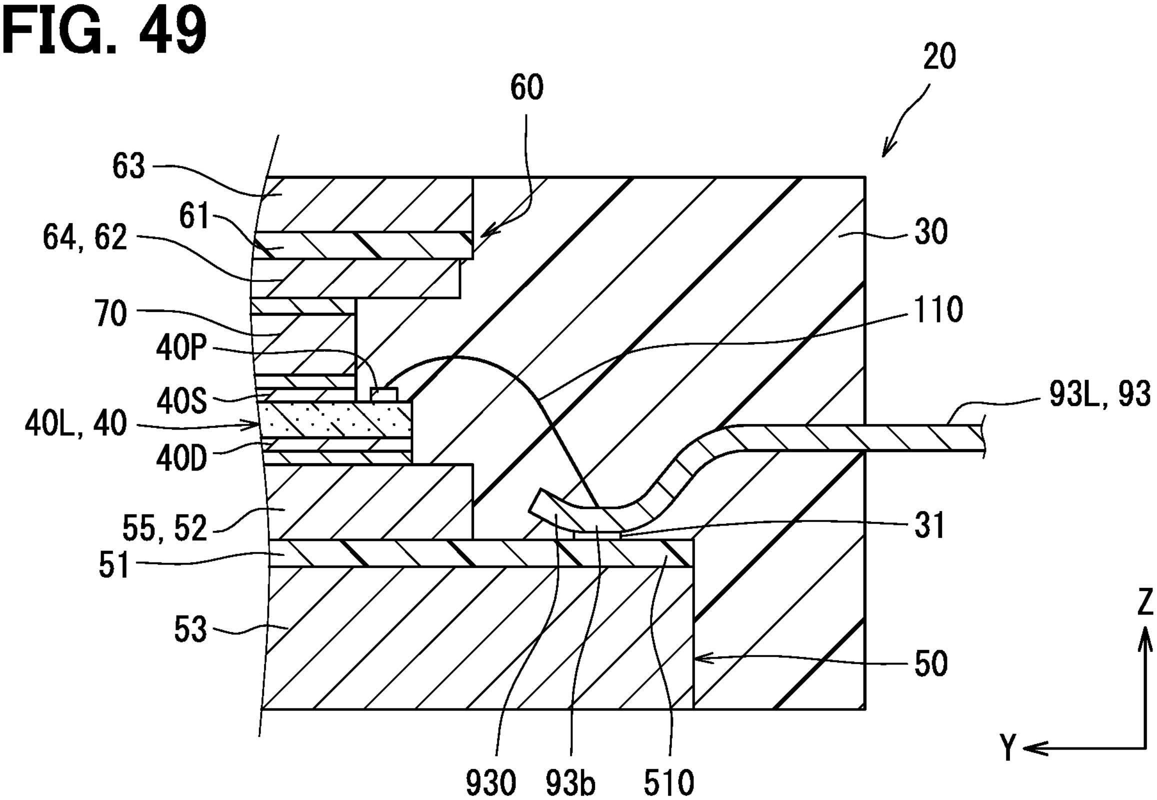
FIG. 49 is a sectional view illustrating a modification.

The configuration in which the signal terminal 93 and the exposed portion 510 are not bonded to each other is not limited to that in the above-described example. For example, In FIG. 49, the overlapping portion 930 of the signal terminal 93 is detached above the insulating base member 51 with a gap having a slight height such that the sealing body does not enter between the overlapping portion 930 and the surface of the exposed portion 510. The sealing body 30 includes a gap 31 between the lower face of the overlapping portion 930 and the surface of the exposed portion 510. The signal terminal 93 is not fixed to the insulating base member 51 (exposed portion 510). Therefore, effects that is the same as or similar to those of the configuration illustrated in FIG. 47 can be obtained. FIG. 49 is a sectional view illustrating a modification and corresponds to FIG. 47.

Figure 50:
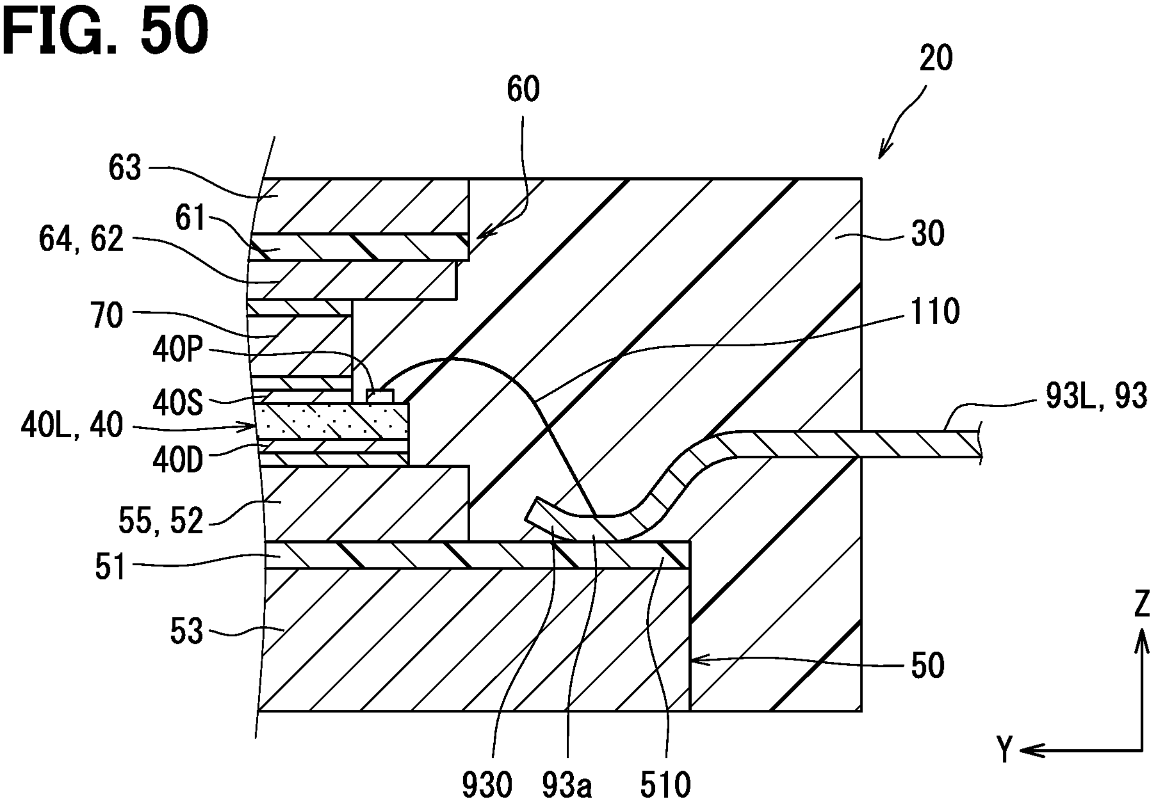
FIG. 50 is a sectional view illustrating a modification.

In FIG. 50, the overlapping portion 930 of the signal terminal 93 is in contact with the surface of the exposed portion 510. The signal terminal 93 is in contact with but not fixed to the insulating base member 51 (exposed portion 510). Therefore, effects that is the same as or similar to those of the configuration illustrated in FIG. 47 can be obtained. FIG. 50 is a sectional view illustrating a modification and corresponds to FIG. 47. The bonded portion **93*b* may be disposed such that part of the lower face of the bonded portion 93*b* is in contact with the insulating base member 51**, and the other part thereof is not in contact therewith.

Figure 51:
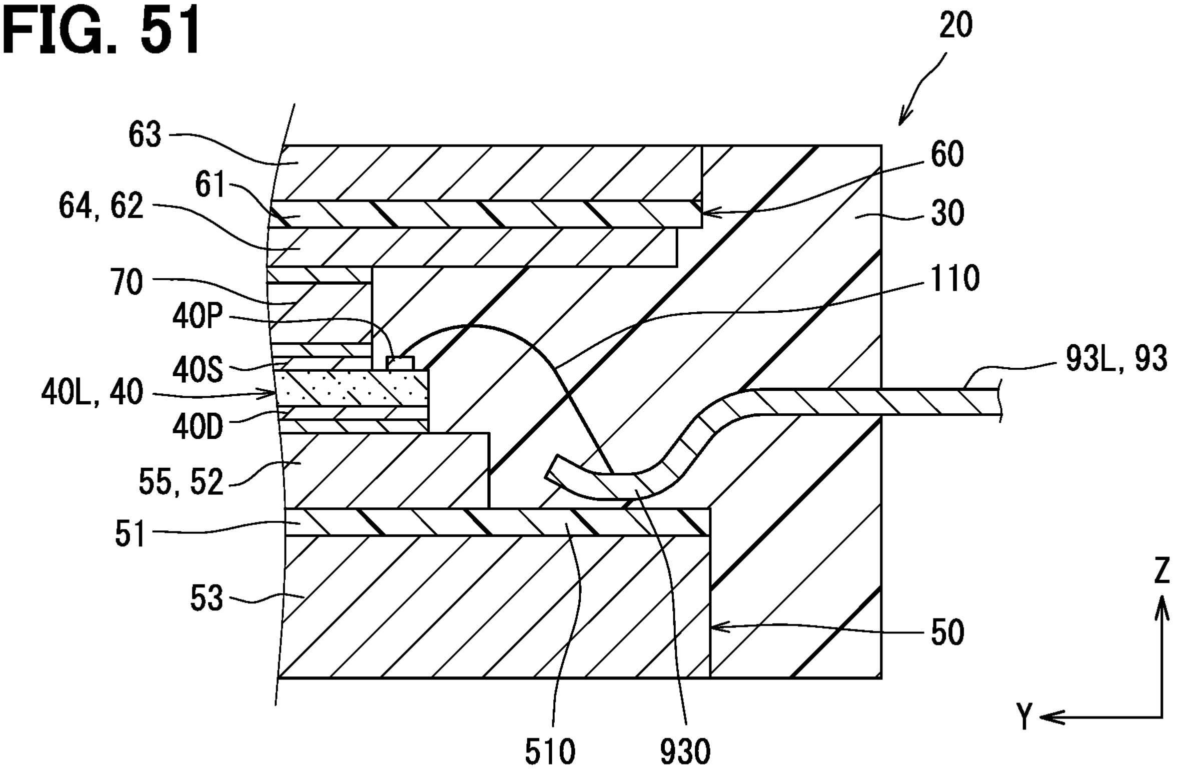
FIG. 51 is a sectional view illustrating a modification.

In the example illustrated in FIG. 47, the substrate 60 is disposed so as not to overlap the signal terminal 93 in the plan view. That is, the substrate 60 is not disposed above the signal terminal 93. When such an arrangement is adopted, the physical size of the substrate 60 can be reduced. In addition, an insulation distance between the front-face metal body 62 and the signal terminal 93 can be easily secured. However, the positional relationship between the signal terminal 93 and the substrate 60 is not limited to that in the example illustrated in FIG. 47. For example, as illustrated in FIG. 51, the overlapping portion 930 of the signal terminal 93 also overlaps the substrate 60. The front-face metal body 62 of the substrate 60 overlaps the overlapping portion 930 and the exposed portion 510 of the insulating base member 51 in the plan view. This arrangement makes it possible to improve heat dissipation properties. FIG. 51 is a sectional view illustrating a modification and corresponds to FIG. 47.

Figure 52:
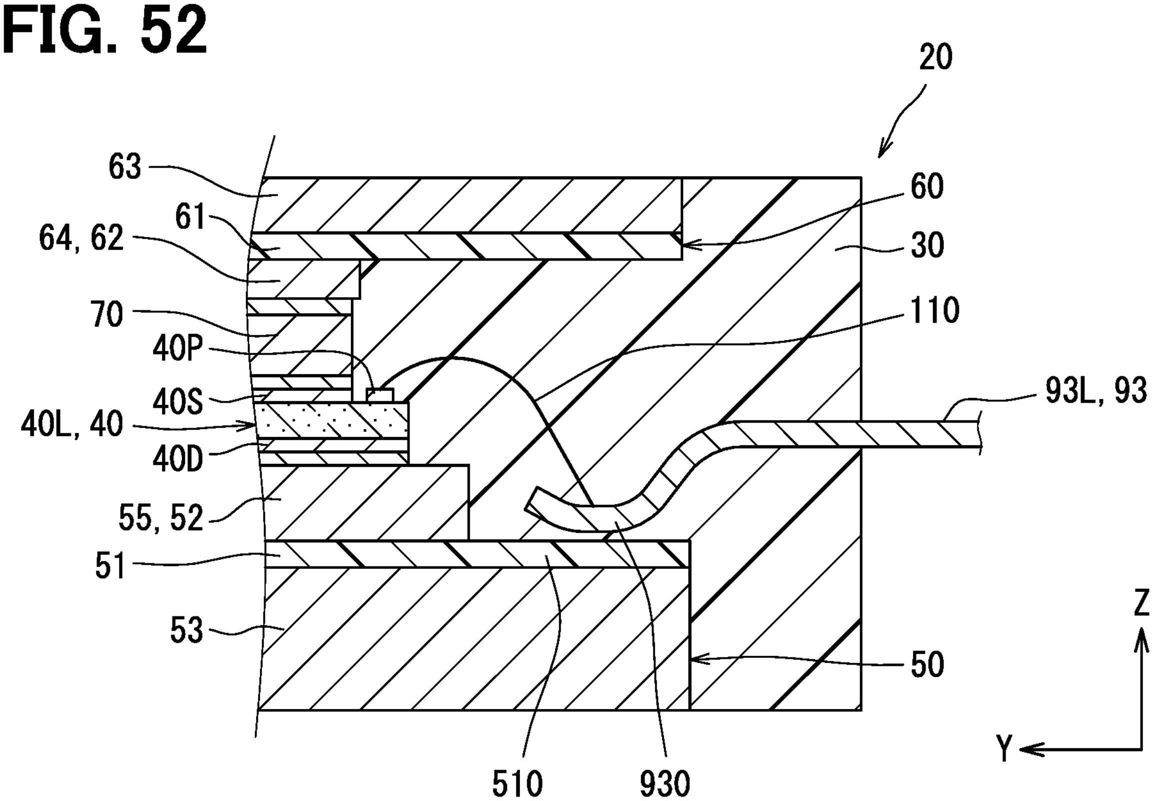
FIG. 52 is a sectional view illustrating a modification.

In FIG. 52, in contrast with FIG. 51, the front-face metal body 62 is patterned so as not to overlap the overlapping portion 930 of the signal terminal 93. The insulating base member 61 and the back-face metal body 63 are positioned above the overlapping portion 930. With this arrangement, the size of the front-face metal body 62 is reduced, and thus the insulation distance between the front-face metal body 62 and the signal terminal 93 can be easily secured. Since the back-face metal body 63 is large, heat dissipation properties can be enhanced. FIG. 52 is a sectional view illustrating a modification and corresponds to FIG. 47.

Figure 53:
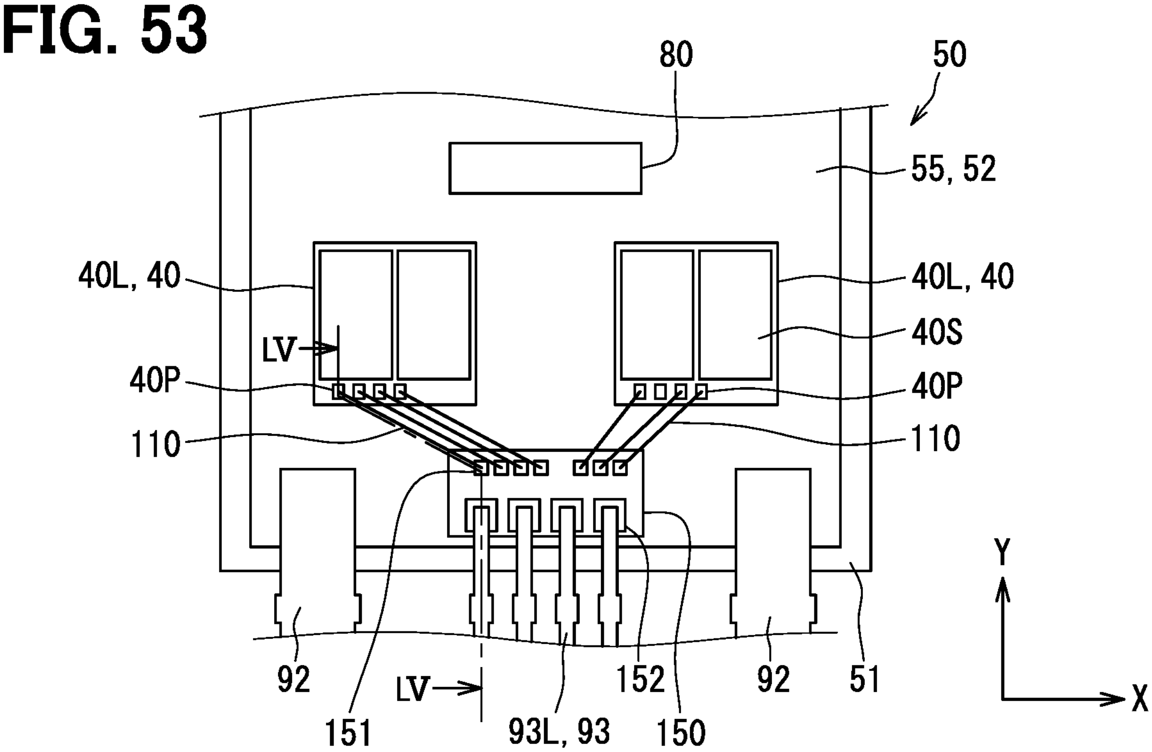
FIG. 53 is a plan view illustrating a modification.
Figure 54:
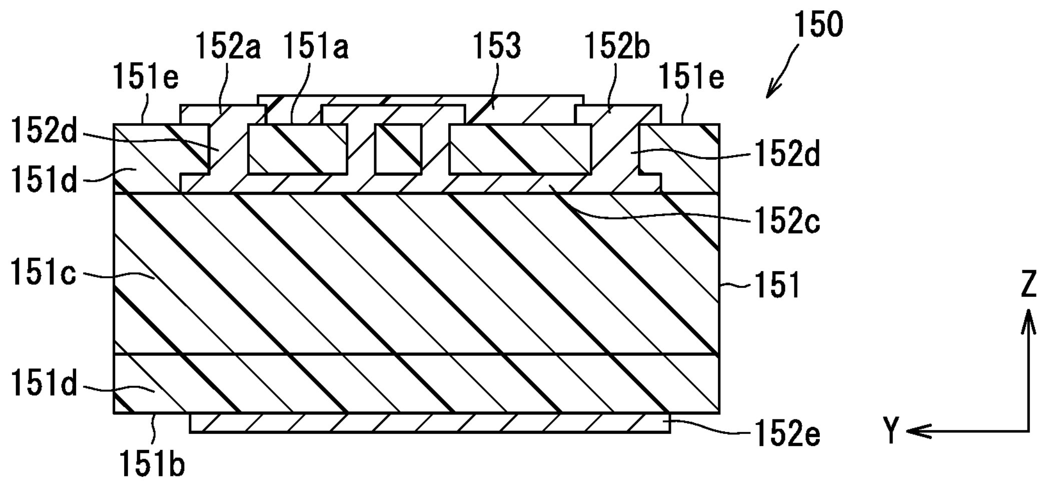
FIG. 54 is a sectional view illustrating a relay substrate.
Figure 55:
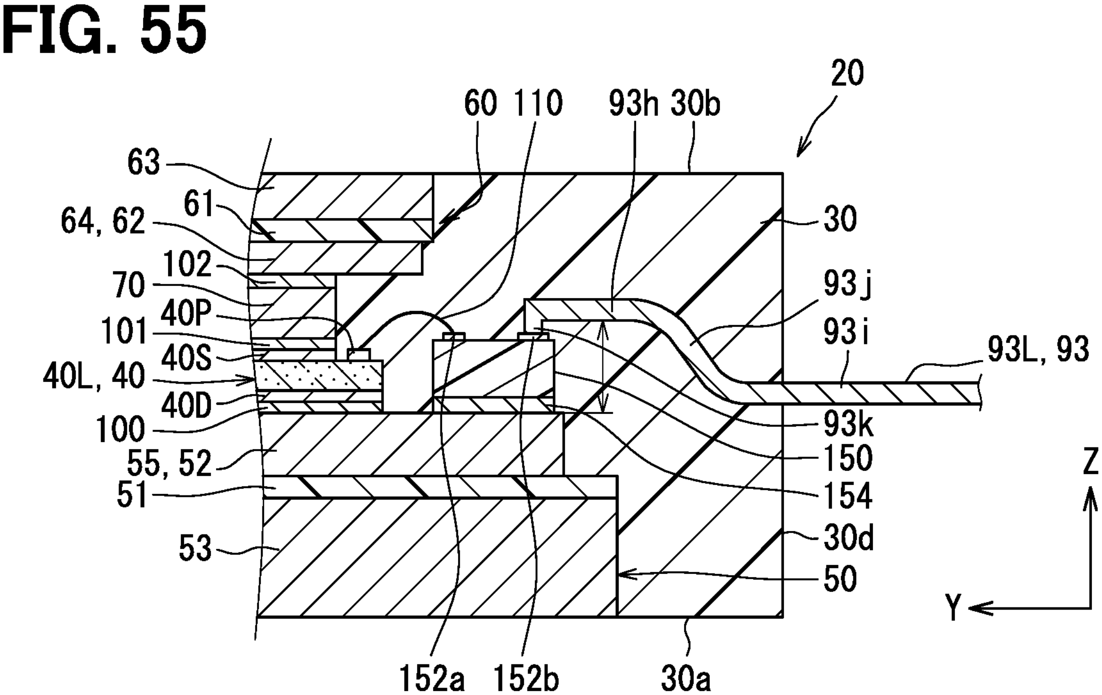
FIG. 55 is a sectional view taken along line LV-LV of FIG. 53.

The example in which the length of the bonding wire 110 (connection member) can be shortened by inserting the signal terminal 93 onto the substrate 50 has been described. Alternatively, the length of the bonding wire 110 may be shortened by using a relay substrate 150 illustrated in FIGS. 53 to 55. FIG. 53 is a plan view illustrating a modification and corresponds to FIG. 46. In FIG. 53, in order to illustrate the positional relationship between the substrate 50, the signal terminal 93, and the relay substrate 150, some of the elements of the semiconductor device 20 are omitted. FIG. 54 is a sectional view illustrating a relay substrate. FIG. 55 is a sectional view taken along line LV-LV of FIG. 53. Here, the relay wiring 55 and the signal terminal 93L are illustrated as an example, but the same or similar configurations can be adopted for the P wiring 54 and the signal terminal 93H.

The semiconductor device 20 further includes the relay substrate 150. As illustrated in FIGS. 53 and 55, the relay substrate 150 is disposed on the front-face metal body 52 (relay wiring 55) of the substrate 50. As illustrated in FIG. 54, the relay substrate 150 includes an insulating base member 151 and a conductor portion 152 disposed on the insulating base member 151. Part of the conductor portion 152 provides a wiring function. The relay substrate 150 may be referred to as a “printed board” or a “wiring board”.

The conductor portion 152 includes lands **152*a*, 152*b*. The lands 152*a*, 152*b* are exposed on one face of the relay substrate 150. Specifically, the lands 152*a*, 152*b* are exposed from a solder resist 153 provided on one face 151*a* of the insulating base member 151. The land 152*a* is electrically connected to the pad 40P via the bonding wire 110. The signal terminal 93 overlaps the substrate 50 in the plan view. The signal terminal 93 is connected to the land 152*b***.

The conductor portion 152 includes a wiring **152*c* and a via conductor 152*d* other than the lands 152*a*, 152*b*. At least part of the wiring 152*c* is an inner layer wiring disposed inside the insulating base member 151. The land 152*a* and the land 152*b* are electrically connected via the wiring 152*c* and the via conductor 152*d*. The plurality of lands 152*a* include two lands 152*a* individually connected to the pads 40P for the gate electrodes of the two semiconductor elements 40. The two lands 152*a* for the gate electrode are electrically connected to one land 152*b* for the gate electrode via the wiring 152*c* and the via conductor 152*d***.

As described above, when the relay substrate 150 is used, the object to which the bonding wire 110 is connected (land **152*a*) can be brought close to the pad 40P. Accordingly, the length of the bonding wire 110 that electrically connects the pad 40P and the signal terminal 93 can be shortened. The wiring 152*c* can be freely routed in the relay substrate 150. Accordingly, in the configuration in which the semiconductor elements 40 are connected in parallel, intersection of the bonding wires 110 can be avoided. Therefore, the wires can be suppressed from coming into contact with each other at the time of molding the sealing body 30. With the fine wiring technique for a printed board, the physical size reduction, the degree of which is the same or similar to that of the configuration illustrated in FIG. 47**, can be achieved.

The conductor portion 152 includes a fixing land **152*e*. The fixing land 152*e* is a land for fixing the relay substrate 150 to the substrate 50. The fixing land 152*e* does not provide an electrical connection function, that is, a wiring function. The fixing land 152*e* is disposed on a back face 151*b* of the insulating base member 151. The fixing land 152*e* (relay substrate 150) is bonded to the front-face metal body 52 with a bonding member 154 interposed therebetween. As the bonding member 154**, for example, solder can be used.

As described above, the relay substrate 150 is fixed to the front-face metal body 52, and thus wire bonding can be stably performed. As the bonding member 154, solder containing Ni balls may be used. In this case, the thickness of the bonding member 154 can be controlled by using the Ni balls. Inclination of the relay substrate 150 can be restrained.

The wiring function provided by the conductor portion 152 is electrically separated from the front-face metal body 52 by the insulating base member 151. For example, the insulating base member 151 may have a non-arrangement region 151c in which the conductor portion 152 is not disposed in the Z direction and an arrangement region 151d in which the conductor portion 152 is disposed in the Z direction. In the Z direction, the non-arrangement region 151c is provided at the center of the insulating base member 151, and the arrangement region 151d is provided on the face layers on both sides. The non-arrangement region 151c may be referred to as a "core layer". With the insulating base member 151 including the non-arrangement region 151c as described above, the conductor portion 152 that is disposed on the one face 151a side and provides the wiring function can be electrically separated from the fixing land 152e and thus the front-face metal body 52.

The solder resist 153 has low adhesion to the sealing body 30. Peeling of the sealing body 30 due to thermal stress progresses starting from the outer peripheral end of the relay substrate 150. For example, the insulating base member 151 may include an exposed portion 151e exposed from the solder resist 153. The exposed portion 151e is provided at the outer peripheral edge of the one face 151a of the insulating base member 151. The insulating base member 151 has high adhesion to the sealing body 30 as compared with the solder resist 153. In the exposed portion 151e, the sealing body 30 is in close contact with the relay substrate 150. This configuration makes it possible to suppress peeling of the sealing body 30 from the relay substrate 150. Since the sealing body 30 is in close contact with the outer peripheral edge portion, the conductor portion 152 including the lands 152a, 152b exposed from the solder resist 153 can be protected.

As illustrated in FIG. 55, the signal terminal 93 (93L) includes a first extending portion 93h, a second extending portion 93i, and a bent portion 93j. The first extending portion 93h and the second extending portion 93i extend in the Y direction. The first extending portion 93h is disposed inside the sealing body 30. The second extending portion 93i is disposed over the inside and the outside of the sealing body 30. The bent portion 93j is provided between the first extending portion 93h and the second extending portion 93i. The first extending portion 93h is a portion closer to the distal end than the bent portion 93j is. The second extending portion 93i is a portion closer to the rear end than the bent portion 93j is.

The signal terminal 93 may include a protrusion 93k. The protrusion 93k is provided near the distal end of the signal terminal 93. The protrusion 93k protrudes from the first extending portion 93h toward the land 152b in the Z direction. The protrusion 93k is bonded to the land 152b. In the signal terminal 93, the distal end of the first extending portion 93h and the protrusion 93k overlap the land 152b in the plan view in the Z direction. A portion where the distal end of the first extending portion 93h and the protrusion 93k are in continuous with each other is a thick portion, and the other portion of the signal terminal 93 is a thin portion. With the protrusion 93k provided in this manner, the signal terminal 93 (first extending portion 93h) is away from the front-face metal body 52. Therefore, an insulation distance between the signal terminal 93 and the front-face metal body 52 can be easily secured.

Figure 56:
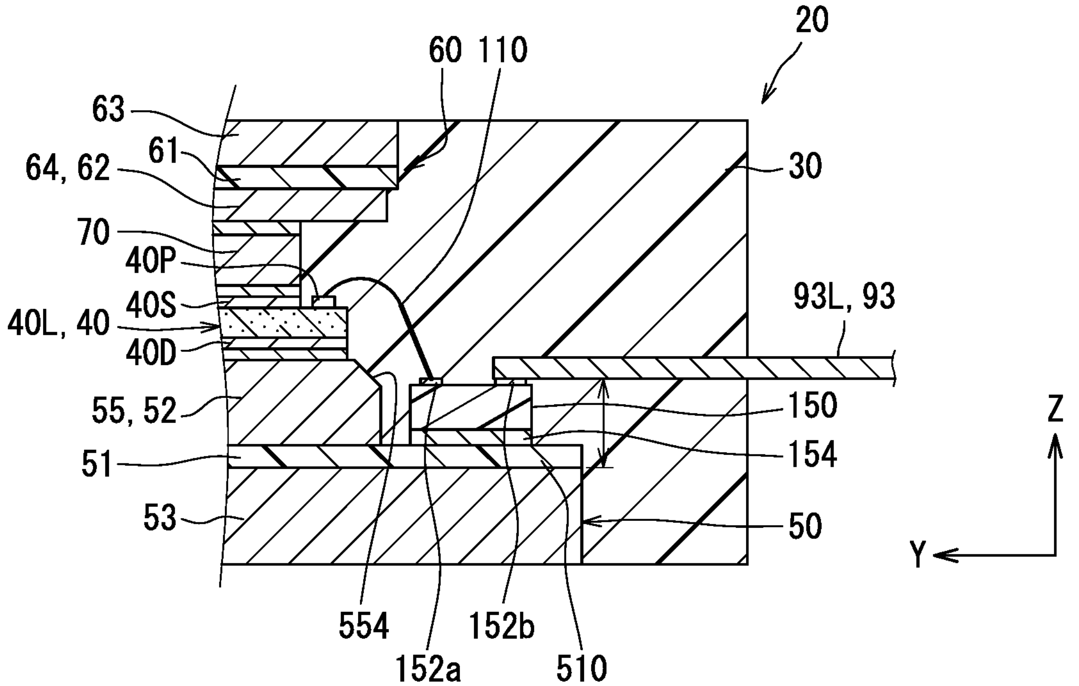
FIG. 56 is a sectional view illustrating a modification.

FIG. 56 illustrates another example different from FIG. 54. FIG. 56 corresponds to FIG. 54. In FIG. 56, the relay substrate 150 is fixed to the exposed portion 510 of the insulating base member 51. In this case, the insulation distance between the signal terminal 93 and the back-face metal body 53 can be secured due to the thicknesses of the bonding member 154 and the relay substrate 150. When the solder containing Ni balls is used as the bonding member 154, a predetermined thickness can be secured. Therefore, an insulation distance can be easily secured. Inclination of the relay substrate 150 can be restrained.

The front-face metal body 52 (relay wiring 55) includes, for example, the cutout 550 as illustrated in FIG. 46, thereby exposing the insulating base member 51. The front-face metal body 52 may, for example, include a chamfered portion 554. The chamfered portion 554 is provided at least on a face, which intersects an imaginary straight line connecting the semiconductor element 40 and the relay substrate 150, among end faces defining the cutout 550. The chamfered portion 554 is provided at the upper end of the end face. In this manner, an insulation distance between the bonding wire 110 and the front-face metal body 52 can be secured.

The example in which the semiconductor device 20 includes the substrate 60 electrically connected to the source electrode 40S has been described. That is, the example of the semiconductor device 20 having the double-sided heat dissipation structure including the pair of substrates 50, 60 has been described. However, the present disclosure is not limited to this example. The present disclosure can also be applied to the semiconductor device 20 having a single-sided heat dissipation structure including only the substrate 50 to which the drain electrode 40D (first main electrode) is connected. The example in which both the back-face metal bodies 53, 63 are exposed from the sealing body 30 has been described, but the present disclosure is not limited thereto.

The example in which the semiconductor device 20 include the semiconductor element 40H constituting the upper arm 9H and the semiconductor element 40L constituting the lower arm 9L has been described, but the present disclosure is not limited thereto. Only the semiconductor element 40 constituting one of the arms may be provided. The semiconductor device 20 may include, for example, only one semiconductor element 40.

The configuration described in the present embodiment can be combined with any of the configurations described in the first embodiment, the second embodiment, the third embodiment, and the modifications thereof.

Fifth Embodiment

This embodiment is a modification based on the preceding embodiment, and the description of the preceding embodiment can be incorporated. In order to achieve both securing of insulation reliability and physical size reduction, as will be described in the present embodiment, the connection portion between the metal member and the front-face metal body with the bonding member interposed therebetween may have a predetermined structure.

<Semiconductor Device>

Figure 57:
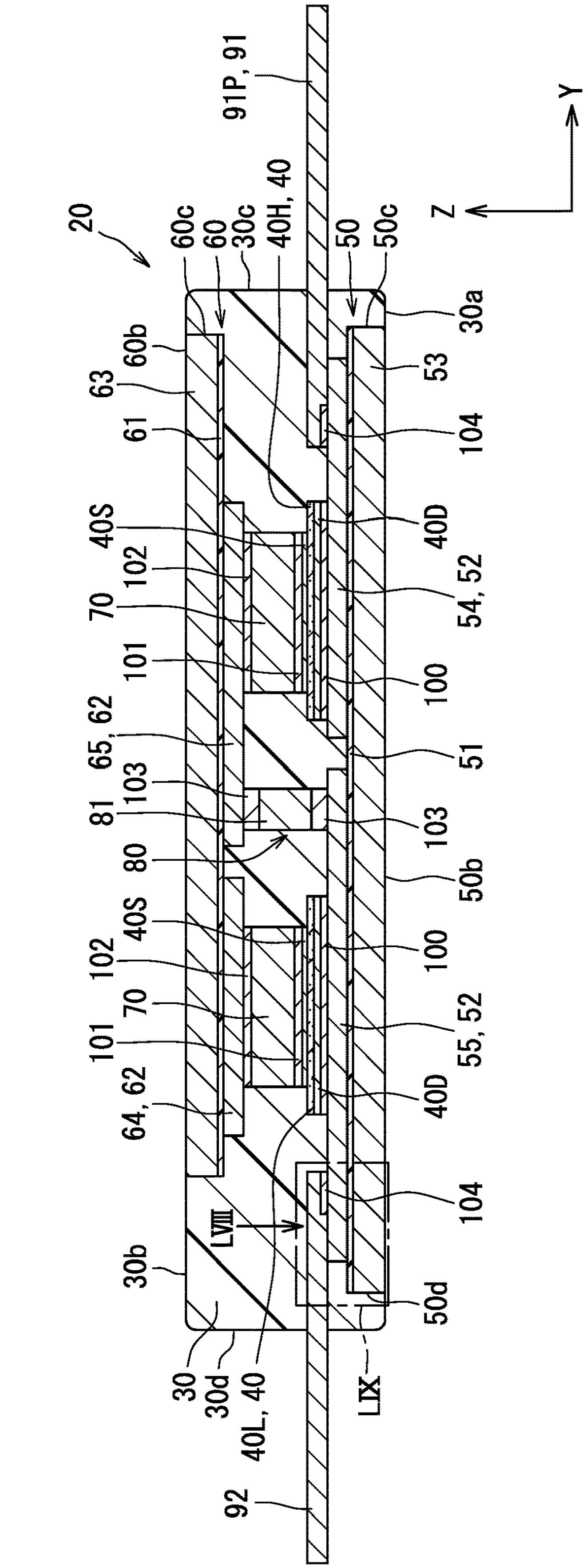
FIG. 57 is a sectional view illustrating a semiconductor device according to a fifth embodiment.

First, the semiconductor device 20 according to the present embodiment will be described with reference to FIG. 57. FIG. 57 corresponds to FIG. 5.

The semiconductor device 20 according to the present embodiment has a configuration that is the same as or similar to the configuration described in the preceding embodiment (see FIGS. 2 to 13). As illustrated in FIG. 57, the semiconductor device 20 includes the semiconductor elements 40 (40H, 40L), the substrates 50, 60 disposed so as to sandwich the semiconductor elements 40 in the Z direction, and the sealing body 30. The front-face metal body 52 of the substrate 50 is connected to the drain electrode 40D as the main electrode of the semiconductor element 40. The front-face metal body 52 is connected to the P terminal 91P as a main terminal and the output terminal 92 via a bonding member 104. The front-face metal body 62 of the substrate 60 is electrically connected to the source electrode 40S as the main electrode of the semiconductor element 40. The front-face metal body 62 is connected to the N terminal 91N (not illustrated) as a main terminal via a bonding member 104. The sealing body 30 seals the semiconductor elements 40, the substrates 50, 60, and part of each of the main terminal, and a bonding member 104.

<Bonding Structure of Main Terminal>

Figure 58:
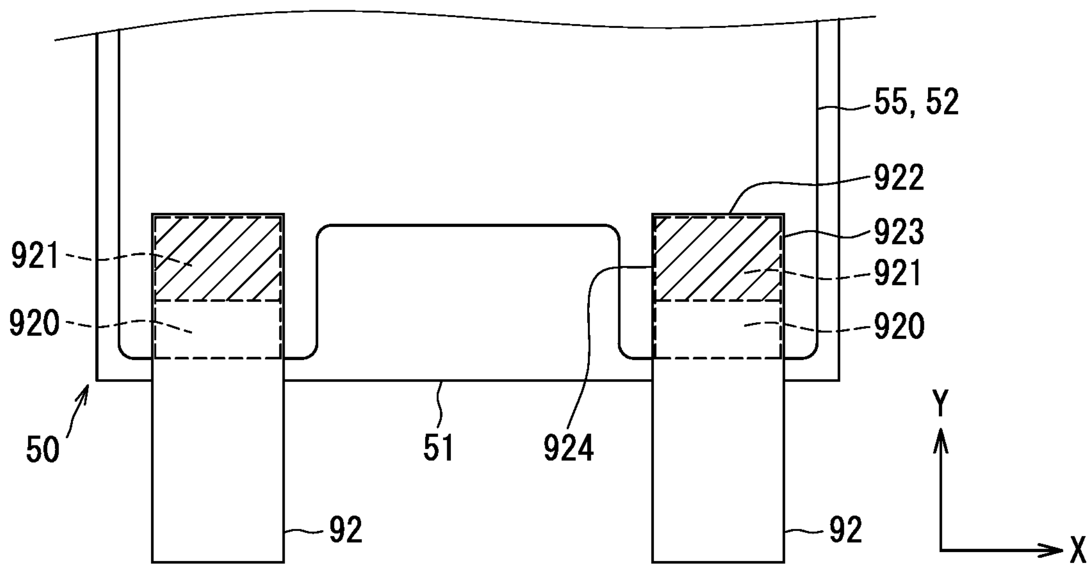
FIG. 58 is a plan view as viewed from an LVIII direction illustrated in FIG. 57.
Figure 59:
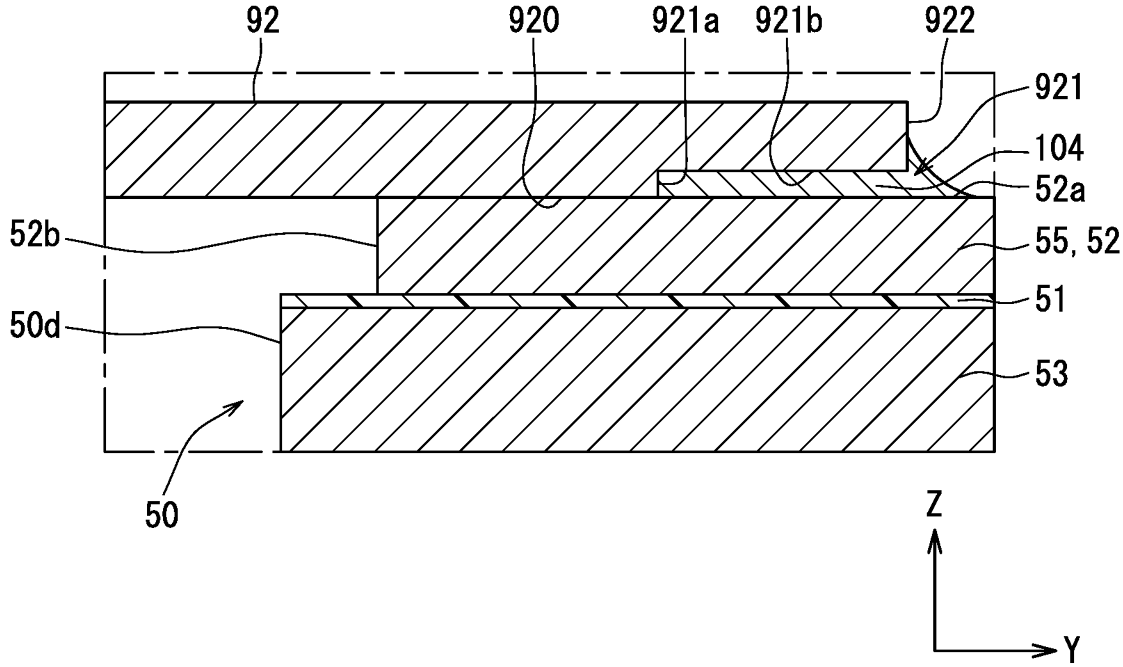
FIG. 59 is an enlarged view of a region LVIX illustrated in FIG. 57.
Figure 60:
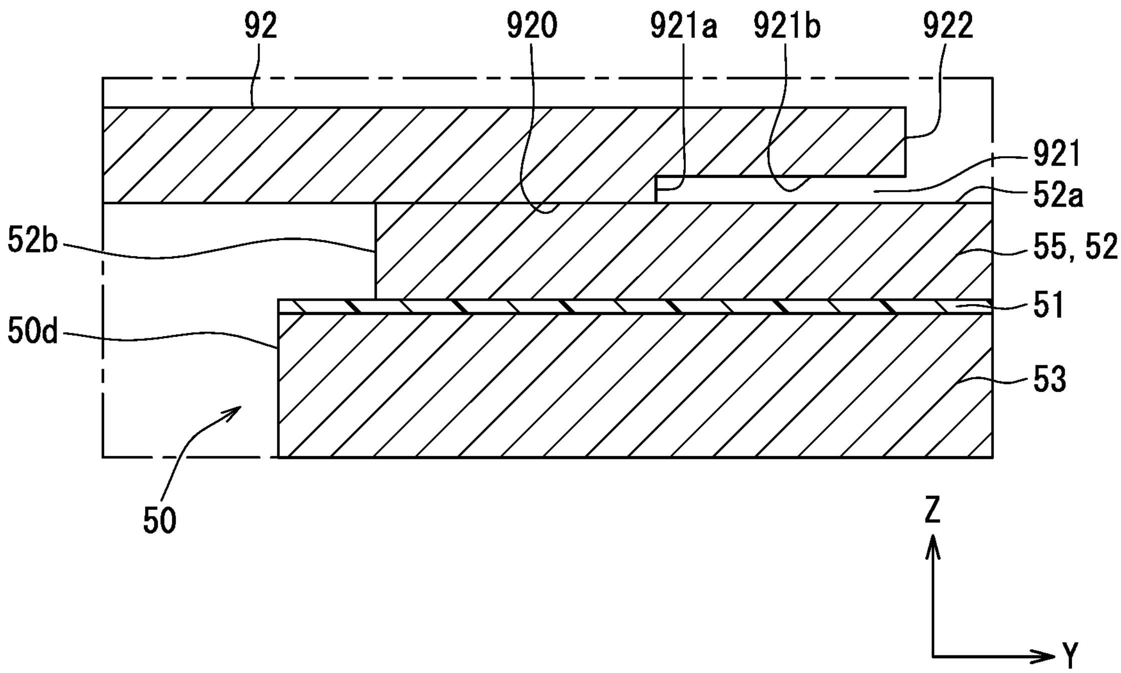
FIG. 60 is a view in which a bonding member is omitted from FIG. 59.

Next, a bonding structure of the main terminals will be described with reference to FIGS. 57 to 60. FIG. 58 is a plan view of a periphery of the output terminal 92 as viewed from an LVIII direction illustrated in FIG. 57. In FIG. 58, hatching is applied in part for ensuring clarity. FIG. 59 is an enlarged view of a region LVIX denoted by an alternate long and short dashed line in FIG. 57. FIG. 60 is a view illustrating a state in which the bonding member 104 is eliminated from FIG. 59. In FIGS. 59 and 60, the sealing body 30 is omitted for convenience.

As illustrated in FIG. 57, a bonding structure of the P terminal 91P as a main terminal and the output terminal 92 to the substrate 50 is different from the configuration described in the preceding embodiment (see FIG. 5). Although not illustrated, a bonding structure of the N terminal 91N as a main terminal is also different. The other configurations are the same as or similar to the configurations described in the preceding embodiments. Hereinafter, the output terminal 92 will be described as an example. The bonding member 104 spreads and wets the metal surface at the time of bonding. As an example, the bonding member 104 is solder.

As illustrated in FIG. 57, the substrate 50 includes ends 50*c*, 50*d* in the Y direction. The end 50*c* is an end on the side face 30*c* side of the sealing body 30, and the end 50*d* is an end on the side face 30*d* side. The output terminal 92 extends in the Y direction across the end 50*d* of the substrate 50. In the plan view in the Z direction, part of the output terminal 92 overlaps the front-face metal body 52 (relay wiring 55), and the other part do not overlap the front-face metal body 52 (relay wiring 55). As illustrated in FIGS. 58 to 60, the output terminal 92 includes an opposing face 920 and a receiving portion 921.

The opposing face 920 is a portion of the lower face of the output terminal 92 opposing the front-face metal body 52 (relay wiring 55) of the substrate 50 in the Z direction. The opposing face 920 is macroscopically a flat face, and is ideally in contact with an upper face 52*a* of the front-face metal body 52 on the entire face. The opposing face 920 microscopically includes minute recesses and protrusions on the surface, and at least part thereof is in contact with the upper face 52*a*. The opposing face 920 may be referred to as a "metal touch face". The opposing face 920 is a portion within a predetermined range in the Y direction from a position overlapping with an end 52*b* of the front-face metal body 52 in the plan view. The end 52*b* is an end face (side face) on the side face 30*d* side of the sealing body 30 in the Y direction, and is continuous with the upper face 52*a*. The end 52*b* forms part of the end 50*d*. The opposing face 920 has a substantially rectangular shape in the plan view.

The receiving portion 921 is provided adjacent to the opposing face 920 and provides a space for receiving the bonding member 104. The receiving portion 921 is, for example, a recess recessed in a direction away from the upper face 52*a* with respect to the opposing face 920. The receiving portion 921 that is a recess is a face including the Z direction component. The receiving portion 921 includes a side face 921*a* continuous with the opposing face 920 and a bottom face 921*b* continuous with the side face 921*a*. The side face 921*a* is, for example, a face substantially parallel to the Z direction. The receiving portion 921 is open to a distal end face 922 that is a side face on the distal end side of the output terminal 92 in the Y direction. The receiving portion 921 is open to side faces 923, 924 on both sides of the output terminal 92 in the X direction. The receiving portion 921 is provided in a predetermined range from the distal end face 922 of the output terminal 92 in the Y direction. The receiving portion 921 has a substantially rectangular shape in the plan view. The receiving portions 921 are arranged side by side in the X direction.

The output terminal 92 receives the bonding member 104 in the receiving portion 921 in a state where the opposing face 920 is in contact with the front-face metal body 52. The bonding member 104 may be disposed only in the receiving portion 921, or part of the bonding member 104 may be disposed outside the receiving portion 921 as illustrated in FIG. 59. In FIG. 59, the bonding member 104 forms a fillet with respect to the distal end face 922. The output terminal 92 is connected (bonded) to the front-face metal body 52 via the bonding member 104 disposed in the receiving portion 921.

<Method of Bonding Main Terminal>

The bonding structure between the output terminal 92 and the front-face metal body 52 is formed, for example, as follows. In a state where the bonding member 104 (solder) is disposed in the receiving portion 921, an upper portion of the opposing face 920 of the output terminal 92 is pressurized in the Z direction toward the substrate 50 such that the opposing face 920 comes into strong contact with the upper face 52*a*. Reflow is performed in a state where the opposing face 920 is in strong contact with the upper face 52*a*. Therefore, at the time of reflow, the bonding member 104 does not spread and wet the opposing face 920 side, or even if the bonding member 104 spreads and wets the opposing face 920 side, the bonding member 104 enters the recesses of the minute recesses and protrusions on the surface of the opposing face 920 at most.

Summary of Fifth Embodiment

In the present embodiment, the opposing face 920 of the output terminal 92 that is a metal member comes into contact with (metal-touches) the upper face 52*a* of the front-face metal body 52. Accordingly, overflow of the bonding member 104 from the receiving portion 921 to the opposing face 920 side can be suppressed. Thus, spreading and wetting of the bonding member 104 in an unintended direction can be suppressed, and insulation reliability can be secured. The output terminal 92 that is a single member includes both the receiving portion 921 and the opposing face 920. As a result, the semiconductor device 20 that can offer both insulation reliability and physical size reduction can be provided.

In the configuration including the substrate 50, when the bonding member 104 spreads and wets the end 52*b* (end face) of the front-face metal body 52 and thus on the insulating base member 51, a portion having the potential identical to that of the front-face metal body 52 spreads, and the distance to the back-face metal body 53 becomes short. The bonding member 104 may come into contact with the back-face metal body 53. In the present embodiment, the opposing face 920 is provided at a position closer to the end 50*d* of the substrate 50, that is, the end 52*b* of the front-face metal body 52 than the receiving portion 921 is. By disposing the opposing face 920 on the end 52*b* side, the bonding member 104 can be suppressed from spreading and wetting the surface of the output terminal 92 and/or the front-face metal body 52 and reaching the end 52*b* and thus the insulating base member 51. Accordingly, insulation reliability can be enhanced without increasing the physical size.

As described above, the metal member including the opposing face and the receiving portion can also be applied to the P terminal 91P and the N terminal 91N, which are other main terminals. The P terminal 91P is connected to the front-face metal body 52 (P wiring 54) of the substrate 50 via the bonding member 104. Since the opposing face of the P terminal 91P is into contact with the front-face metal body 52, overflow of the bonding member 104 from the receiving portion of the P terminal 91P toward the opposing face can be suppressed. As illustrated in FIG. 57, by providing the opposing face on the end 50*c* side of the substrate 50, the bonding member 104 can be suppressed from spreading and wetting the end of the front-face metal body 52 and the insulating base member 51.

The N terminal 91N is connected to the front-face metal body 62 (N wiring 64) of the substrate 60 via the bonding member 104. Since the opposing face of the N terminal 91N is into contact with the front-face metal body 62, overflow of the bonding member 104 from the receiving portion of the N terminal 91N toward the opposing face can be suppressed. By providing the opposing face on the end 60*c* side of the substrate 60 illustrated in FIG. 57, the bonding member 104 can be suppressed from spreading and wetting the end of the front-face metal body 62 and the insulating base member 61. The end 60*c* is an end face (side face) on the side face 30*c* side of the sealing body 30 in the Y direction.

<Modifications>

Figure 61:
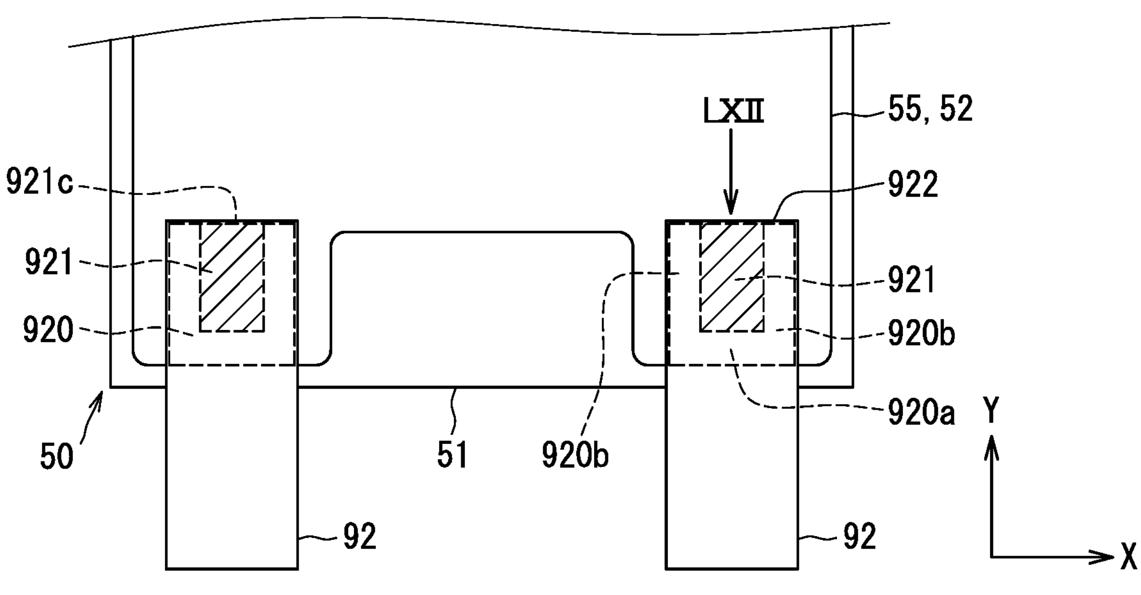
FIG. 61 is a plan view illustrating a modification.
Figure 62:
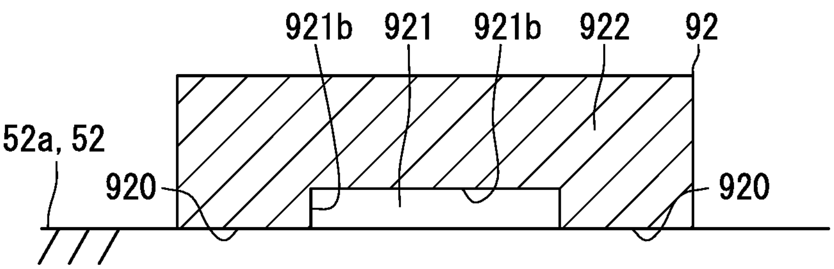
FIG. 62 is a plan view as viewed from a LXII direction illustrated in FIG. 61.

The arrangement of the opposing face 920 and the receiving portion 921 is not limited to that in the above-described example. For example, the configurations illustrated in FIGS. 61 and 62 may be adopted. FIG. 61 is a plan view illustrating a modification and corresponds to FIG. 58. FIG. 62 is a plan view as viewed from a LXII direction illustrated in FIG. 61. In this example, the receiving portion 921 is not open to the side faces 923, 924 but is open only to the distal end face 922. The receiving portion 921 includes an opening 921*c* at the distal end face 922 that is a side face.

The opposing face 920 includes a first opposing portion 920*a* and a second opposing portion 920*b*. The first opposing portion 920*a* is provided on the side opposite to the opening 921*c* with respect to the receiving portion 921. In the Y direction that is the extending direction of the output terminal 92, the first opposing portion 920*a* is adjacent to the receiving portion 921. The second opposing portion 920*b* is adjacent to the receiving portion in the X direction. In the example illustrated in FIGS. 61 and 62, the opposing face 920 includes a pair of the second opposing portions 920*b*. The pair of second opposing portion 920*b* sandwich the receiving portion 921 in the X direction. The opposing face 920 has a substantially U shape in the plan view. Since the opposing face 920 is disposed on three sides with respect to the receiving portion 921, the overflow direction of the bonding member 104 from the receiving portion 921 can be limited to one direction on the opening 921*c* side. In this manner, insulation reliability can be further enhanced.

The opposing face 920 may include only one second opposing portion 920*b*. In this case, the opposing face 920 has a substantially L shape in the plan view. Since the opposing face 920 is disposed on two sides with respect to the receiving portion 921, the overflow direction of the bonding member 104 from the receiving portion 921 can be limited against the arrangement of FIG. 58. In this manner, insulation reliability can be enhanced.

Figure 63:
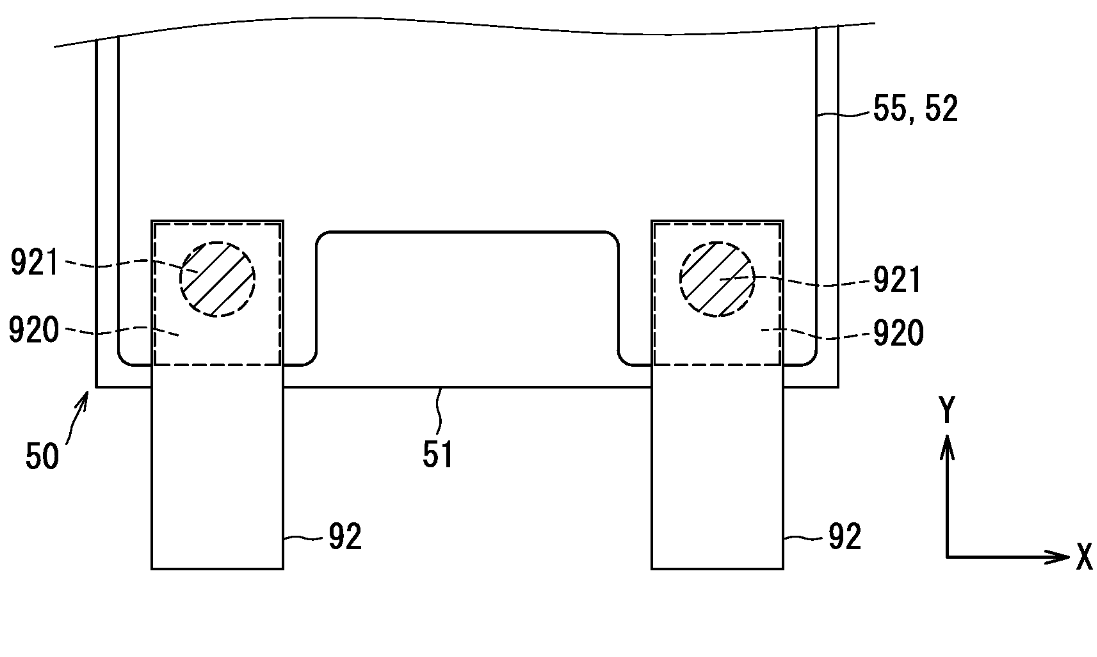
FIG. 63 is a plan view illustrating a modification.

Although the example in which the receiving portion 921 is open to the side face of the output terminal 92 has been described, the present disclosure is not limited thereto. The planar shape of the receiving portion 921 is not limited to a substantially rectangular shape. For example, as illustrated in FIG. 63, the receiving portion 921 not including an opening on a side face may be provided. FIG. 63 is a plan view illustrating a modification and corresponds to FIG. 58. In FIG. 63, the receiving portion 921 has a substantially rectangular shape in the plan view. The receiving portion 921 is a hole that is open to the lower face of the output terminal 92. The receiving portion 921 illustrated in FIG. 63 is a non-through hole. Similarly to the receiving portion 921 described above, the receiving portion 921 that is a non-through hole includes the side face 921*a* continuous with the opposing face 920 and the bottom face 921*b*. Alternatively, a through hole that is open to the upper face of the output terminal 92 may be adopted. The receiving portion 921 that is a through hole does not include the bottom face 921*b* but include the side face 921*a*.

Figure 64:
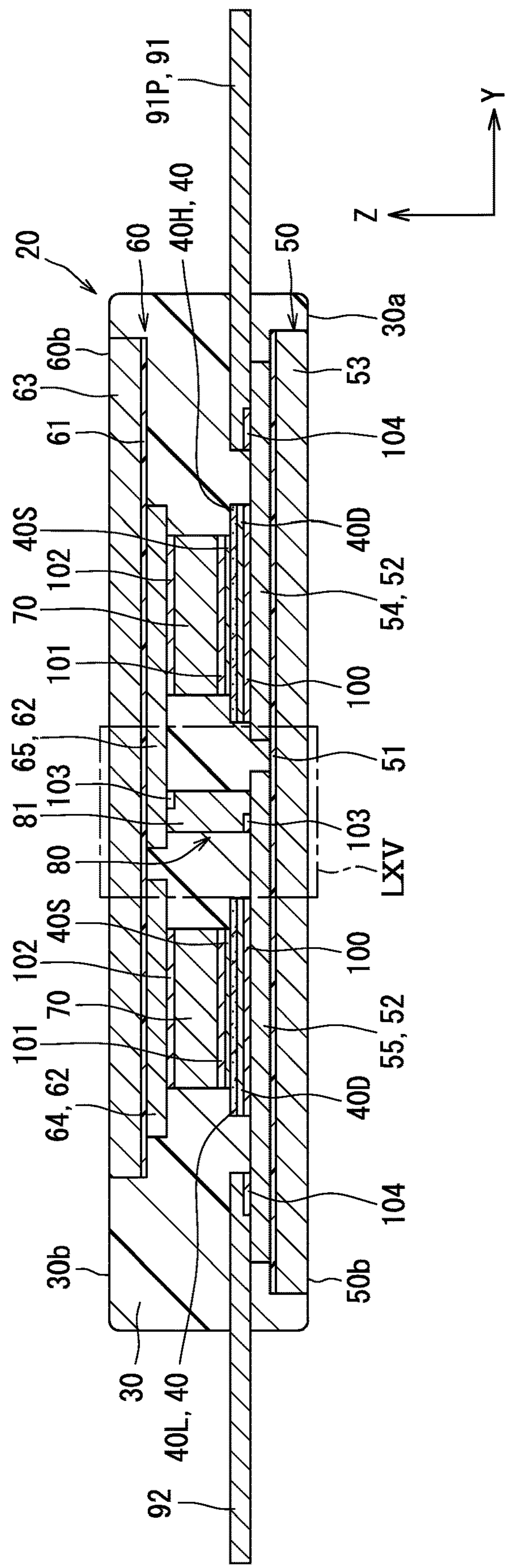
FIG. 64 is a sectional view illustrating a modification.
Figure 65:
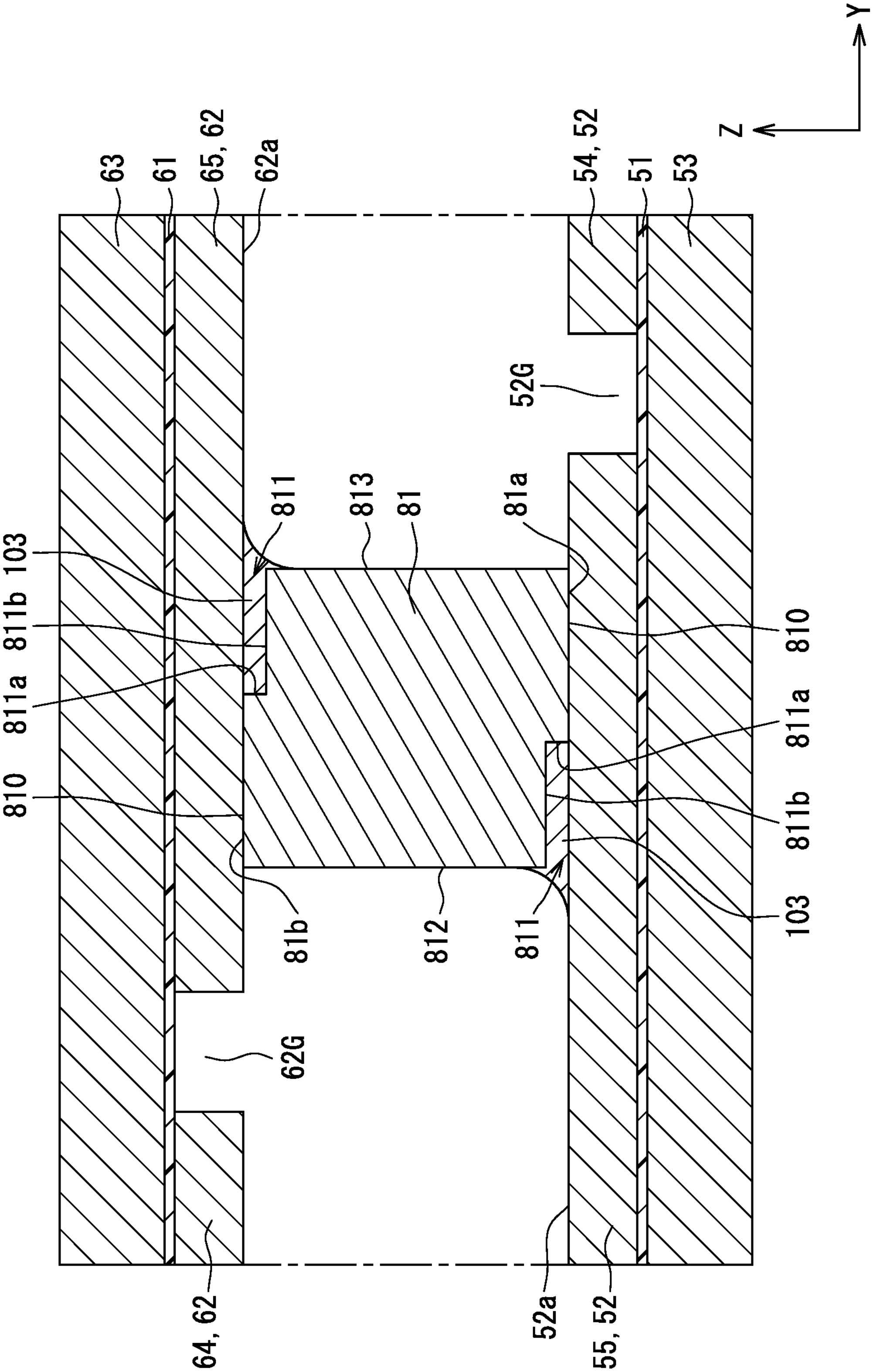
FIG. 65 is an enlarged view of a region LXV illustrated in FIG. 64.

The metal member including the opposing face and the receiving portion is not limited to the main terminal. For example, as illustrated in FIGS. 64 and 65, in the semiconductor device 20 constituting the upper-lower arm circuit 9, an opposing face and a receiving portion may be provided in the joint portion 81. FIG. 64 is a sectional view illustrating a modification and corresponds to FIG. 57. FIG. 65 is an enlarged view of a region LXV denoted by an alternate long and short dashed line in FIG. 64. In FIG. 65, the sealing body 30 is omitted for convenience.

As described in the preceding embodiments, the semiconductor device 20 includes the semiconductor element 40H as the first semiconductor element constituting the upper arm 9H and the semiconductor element 40L as the second semiconductor element constituting the lower arm 9L. The joint portion 81 electrically connects the source electrode 40S of the semiconductor element 40H and the drain electrode 40D of the semiconductor element 40L. The joint portion 81 is a metal columnar body extending in the Z direction. An end 81*a* of the joint portion 81 is connected to the relay wiring 55 as the first wiring of the substrate 50 via the bonding member 103. An end 81*b* opposite to the end 81*a* is connected to the relay wiring 65 as the third wiring of the substrate 60 via the bonding member 103. The front-face metal body 52 includes the P wiring 54 as a second wiring provided with a predetermined interval from the relay wiring 55. The front-face metal body 62 includes a N wiring 64 as a fourth wiring provided with a predetermined interval from the relay wiring 65.

In the example illustrated in FIGS. 64 and 65, an opposing face 810 and a receiving portion 811 are provided at each of the ends 81*a*, 81 *b* of the joint portion 81. The configurations of the opposing face 810 and the receiving portion 811 are similar to those of the opposing face 920 and the receiving portion 921 described above. At the end 81*a*, the opposing face 810 opposes the upper face 52*a* of the front-face metal body 52 (relay wiring 55). The opposing face 810 is in contact with the upper face 52*a*. The receiving portion 811 is a recess recessed with respect to the opposing face 810. The receiving portion 811 includes a side face 811*a* continuous with the opposing face 810 and a bottom face 811*b*. The receiving portion 811 receives the bonding member 103.

The opposing face 810 and the receiving portion 811 are provided side by side in the Y direction. The opposing face

810 is provided on a side of a gap 52G between wirings separating the relay wiring 55 and the P wiring 54. In other words, the opposing face 810 is provided at a position close to the P wiring 54 that is a wiring different from the relay wiring 55 to which the joint portion 81 is connected. The receiving portion 811 is open to a side face 812 of the joint portion 81 in the Y direction, and is not open to a side face 813 opposite to the side face 812. The receiving portion 811 may be open only to the side face 812 or may be open to three side faces, including two side faces adjacent to the side face 812.

In this manner, the opposing face 810 of the joint portion 81 comes into contact (metal touch) with the front-face metal body 52. Accordingly, overflow of the bonding member 103 from the receiving portion 811 to the opposing face 810 side can be suppressed. Therefore, the semiconductor device 20 that can offer both insulation reliability and physical size reduction can be provided.

When the bonding member 103 spreads and wets the inside of the gap 52G between wirings in the front-face metal body 52, a portion having the potential identical to the relay wiring 55 becomes large, and the distance to the P wiring 54 becomes short. The bonding member 103 may come into contact with the P wiring 54. On the other hand, in the above example, the opposing face 810 is provided at a position closer to the P wiring 54, that is, the gap 52G between wirings than the receiving portion 811 is. This configuration makes it possible to suppress the bonding member 103 from reaching the gap 52G between wirings. Accordingly, insulation reliability can be enhanced without increasing the physical size.

The configuration of the end 81*b* is the same as or similar to that on the end 81*a* side. At the end 81*b*, the opposing face 810 opposes an upper face 62*a* of the front-face metal body 62 (relay wiring 65). The opposing face 810 is in contact with the upper face 52*a*. The receiving portion 811 is a recess. The receiving portion 811 receives the bonding member 103. The opposing face 810 and the receiving portion 811 are provided side by side in the Y direction. The opposing face 810 is provided on a side of a gap 62G between wirings separating the relay wiring 65 and the N wiring 64. In other words, the opposing face 810 is provided at a position close to the N wiring 64 that is a wiring different from the relay wiring 65 to which the joint portion 81 is connected. The receiving portion 811 is open to the side face 813 of the joint portion 81 in the Y direction, and is not open to the side face 812. The receiving portion 811 may be open only to the side face 813 or may be open to three side faces, including two side faces adjacent to the side face 813.

In this manner, the opposing face 810 of the joint portion 81 comes into contact (metal touch) with the front-face metal body 62. Accordingly, overflow of the bonding member 103 from the receiving portion 811 to the opposing face 810 side can be suppressed. Therefore, the semiconductor device 20 that can offer both insulation reliability and physical size reduction can be provided. The opposing face 810 is provided at a position closer to the N wiring 64, that is, the gap 62G between wirings than the receiving portion 811 is. This configuration makes it possible to suppress the bonding member 103 from reaching the gap 62G between wirings. Accordingly, insulation reliability can be enhanced without increasing the physical size.

Figure 66:
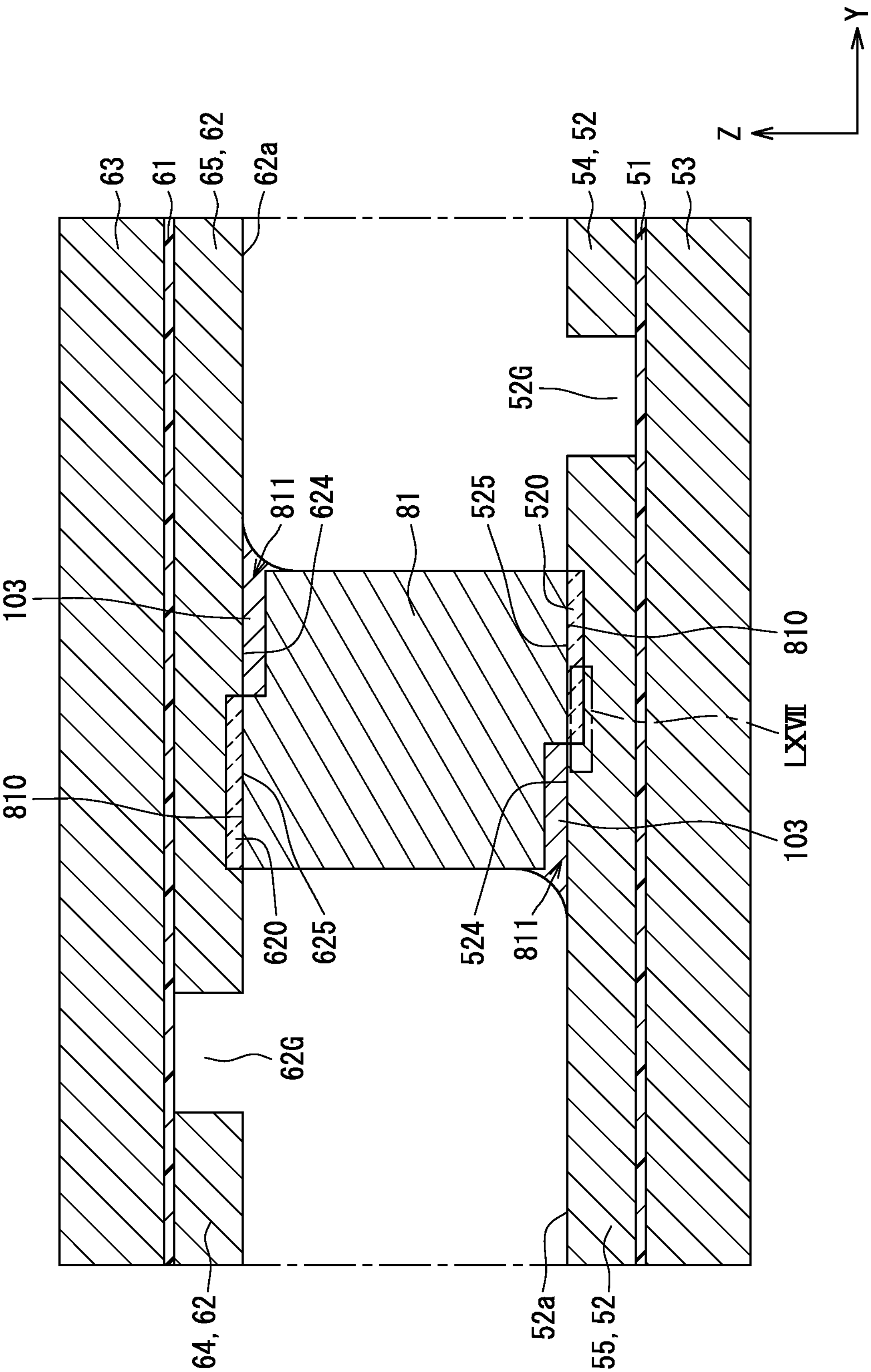
FIG. 66 is a sectional view illustrating a modification.
Figure 67:
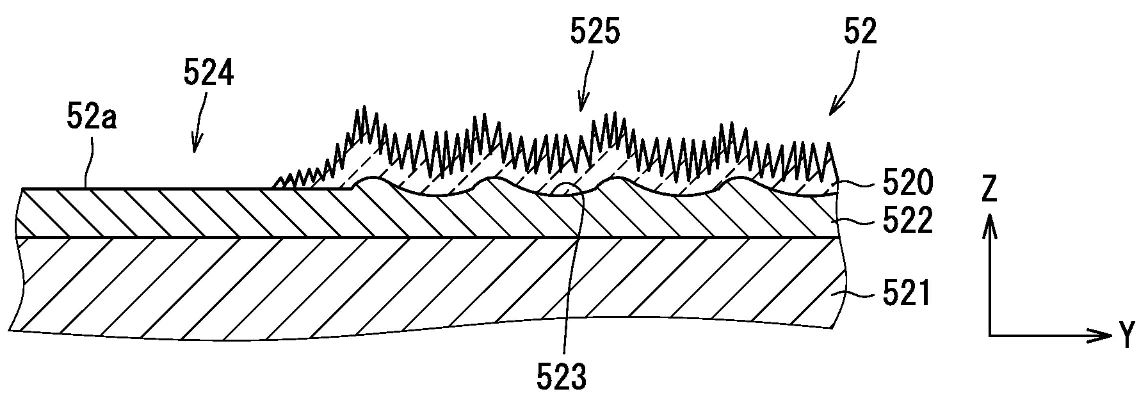
FIG. 67 is an enlarged view of a region LXVII illustrated in FIG. 66.

In the above example, the overflow of the bonding member was suppressed by the contact of the front-face metal body by the opposing face of the metal member. The function of suppressing overflow may be enhanced by further adding an uneven oxide film formed by laser irradiation to this configuration. An example is illustrated in FIGS. 66 and 67. FIG. 66 is a sectional view corresponding to FIG. 65, and the sealing body 30 is omitted for convenience. FIG. 67 is an enlarged view of a region LXVII denoted by an alternate long and short dashed line in FIG. 66, and illustrates only the front-face metal body 52.

In the example illustrated in FIG. 66, an uneven oxide film 520, 620 is provided on the front-face metal body 52, 62 so as to correspond the joint portion 81. Hereinafter, the uneven oxide film 520 will be described as an example. As illustrated in FIG. 67, the front-face metal body 52 includes a base material 521, a metal film 522 and the uneven oxide film 520 provided on the surface of the base material 521. The base material 521 forms a main part of the front-face metal body 52. The base material 521 is formed using, for example, a Cu-based material. The metal film 522 includes a material having higher wettability to solder than the base material 521. The metal film 522 is formed over the entire region of the upper face 52*a*. The metal film 522 according to the present embodiment is formed over the entire region of the surface of the base material 521. The uneven oxide film 520 is locally formed on the upper face 52*a*.

The uneven oxide film 520 is locally formed on the metal film 522 in the upper face 52*a* by irradiating the metal film 522 with laser light. The metal film 522 includes a lower base film containing Ni (nickel) as a main component and an upper base film containing Au (gold) as a main component. In the present embodiment, an electroless Ni plating film containing P (phosphorus) is adopted as the lower base film. Consider the case where the bonding member 103 is solder. Of the metal film 522 exposed from the uneven oxide film 520, the upper base film (Au) at the portion with which the bonding member 103 is in contact diffuses into the solder during reflow. Of the metal film 522, the upper base film (Au) at the portion where the uneven oxide film 520 is formed is removed by irradiation with laser light when the uneven oxide film 520 is formed. The uneven oxide film 520 is an oxide film containing Ni as a main component. For example, the breakdown of the components constituting the uneven oxide film 520 is as follows: 80% of $Ni_2O_3$, 10% of NiO, and 10% of Ni.

A dent 523 on the surface of the metal film 522 is formed by irradiation of pulsed laser light. One dent 523 is formed per pulse. The uneven oxide film 520 is formed by melting, vaporizing, and depositing a face layer portion of the metal film 522 by irradiation of laser light. The uneven oxide film 520 is an oxide film derived from the metal film 522. The uneven oxide film 520 is a film of an oxide of metal (Ni) as a main component of the metal film 522. The uneven oxide film 520 is formed to follow the recesses and protrusions of the surface of the metal film 522 having the dent 523. On the surface of the uneven oxide film 520, recesses and protrusions are formed at a pitch finer than the width of the dent 523. That is, very fine recesses and protrusions (roughened portion) are formed.

The uneven oxide film 520 can be formed in accordance with the following steps. First, the upper face 52*a* of the front-face metal body 52 including the metal film 522 formed on the base material 521 is irradiated with pulsed laser light to melt and evaporate the surface of the metal film 522. The pulsed laser light is adjusted so as to have an energy density of more than 0 J/cm$^2$ and 100 J/cm$^2$ or less and a pulse width of 1 microsecond or less. In order to satisfy this condition, a YAG laser, a $YVO_4$ laser, a fiber laser, or the like can be adopted. For example, in the case of a YAG laser, it is sufficient that the energy density be 1 J/cm$^2$ or more. In the case of electroless Ni plating, the metal film 522 can be processed even with an energy density of about 5 J/cm$^2$, for example.

At this time, scan is performed with laser light and a plurality of positions are sequentially irradiated with the laser light by relatively moving the light source of the laser light and the front-face metal body 52. By irradiating the surface of the metal film 522 with laser light to melt and vaporize the surface, the dent 523 is formed on the surface of the metal film 522. In the metal film 522, the average thickness of the portion irradiated with the laser light is smaller than the average thickness of the portion not irradiated with the laser light. The plurality of dents 523 formed corresponding to the spot of the laser light is continuous with each other and formed into, for example, scale-like shape. "Spot" means an irradiation range per pulse. For example, scan is performed with laser light such that spots of the laser light adjacent to each other in the X direction overlap in part and spots of the laser light adjacent in the Y direction overlap in part.

Next, the melted portion of the metal film 522 is solidified. Specifically, the melted and vaporized metal film 522 is deposited on a portion irradiated with laser light or a peripheral portion thereof. By depositing the melted and vaporized metal film 522 in this manner, the uneven oxide film 520 is formed on the surface of the metal film 522.

In FIG. 66, in the upper face 52*a* of the front-face metal body 52, the uneven oxide film 520 is not provided in a first region 524 overlapping the receiving portion 811 of the joint portion 81 in the plan view. The uneven oxide film 520 is selectively provided in a second region 525 overlapping the opposing face 810. The configurations of the front-face metal body 62 and the uneven oxide film 620 are similar to those of the front-face metal body 52 and the uneven oxide film 520. In the upper face 62*a* of the front-face metal body 62, the uneven oxide film 620 is not provided in a first region 624 overlapping the receiving portion 811 of the joint portion 81 in the plan view. The uneven oxide film 620 is selectively provided in a second region 625 overlapping the opposing face 810.

The oxide film (uneven oxide film 520, 620) has low wettability to the bonding member 103 than the metal film. Since the uneven oxide film 520, 620 has fine recesses and protrusions on the surface, the contact area with the bonding member 103 is reduced, and part of the bonding member 103 becomes spherical by surface tension. That is, the contact angle increases. Accordingly, wettability to the bonding member 103 is low. Therefore, the effect of wettability reduction by the uneven oxide film 520, 620 and the effect of contact by the opposing face 810 make it possible for the bonding member 103 to pass between the opposing face 810 and the second region 525, 625. Accordingly, overflow of the bonding member 103 can be effectively suppressed. Since laser light is used to form the uneven oxide film 520, 620 as described above, patterning is easy.

Figure 68:
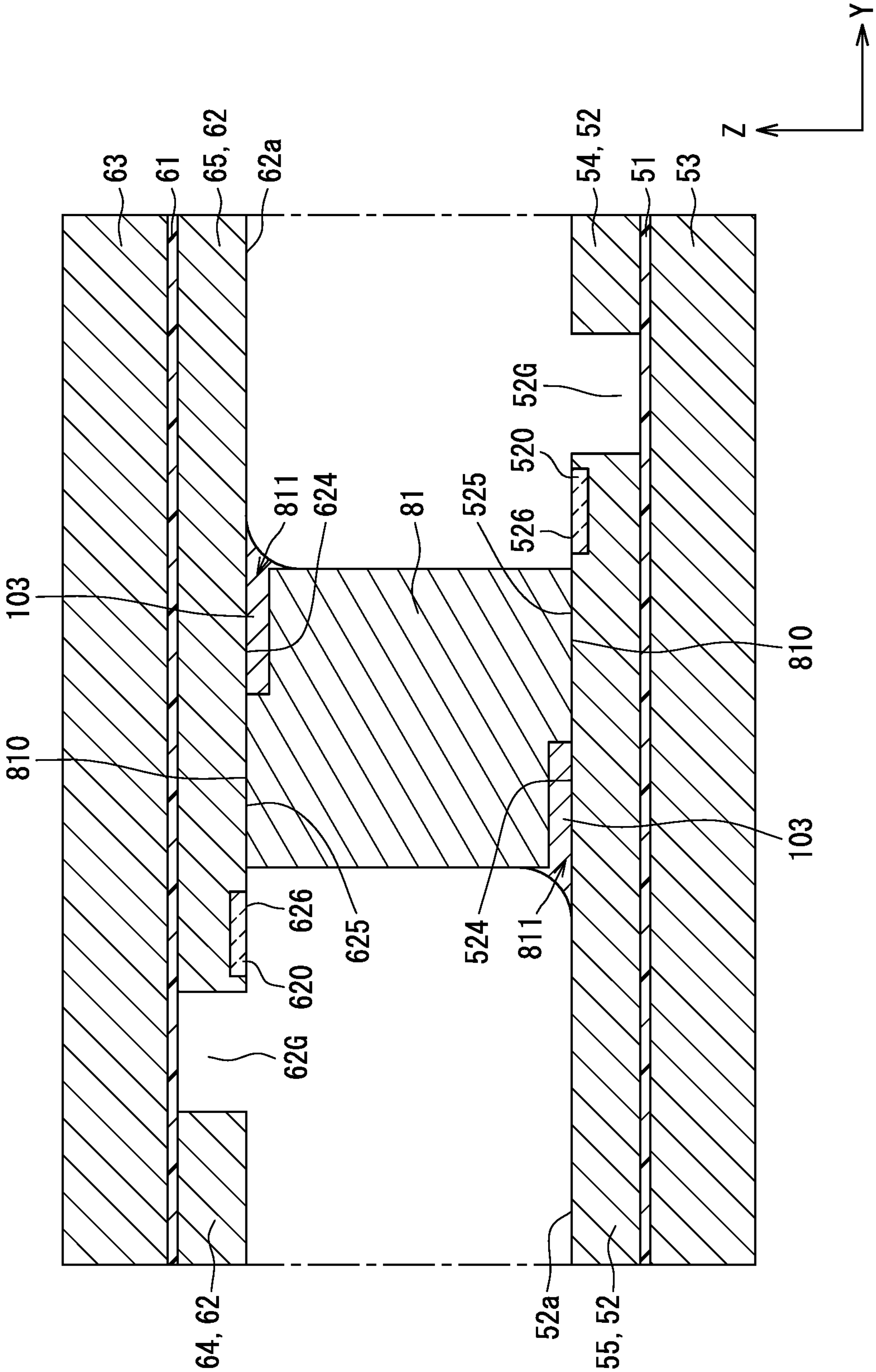
FIG. 68 is a sectional view illustrating a modification.

As illustrated in FIG. 68, the uneven oxide film 520, 620 may be provided in a peripheral region 526, 626. The peripheral region 526 is a region around the second region 525 in the plan view, and is a region excluding the first region 524. The peripheral region 626 is a region around the second region 625 in the plan view, and is a region excluding the first region 624. Even if the bonding member 103 accidentally passes immediately below the opposing face 810 of the joint portion 81, the uneven oxide film 520, 620 can dam up the bonding member 103. Very fine recesses and protrusions formed on the surface of the uneven oxide film 520, 620 allow the sealing body 30 to be entangled, thereby producing an anchor effect. The contact area with the sealing body 30 increases. Therefore, the adhesive force of the front-face metal body 52, 62 to the sealing body 30 can be enhanced.

The uneven oxide film 520, 620 may be provided in the second region 525, 625 and the peripheral region 526, 626. Only one of the uneven oxide films 520, 620 may be provided. The uneven oxide film 520, 620 may be used for a bonded portion with a main terminal that is a metal member, that is, a bonded portion with the P terminal 91P, the N terminal 91N, or the output terminal 92.

The example in which the semiconductor device 20 includes the substrate 60 electrically connected to the source electrode 40S (second main electrode) has been described. That is, the example of the semiconductor device 20 having the double-sided heat dissipation structure including the pair of substrates 50, 60 has been described. However, the present disclosure is not limited to this example. The present disclosure can also be applied to the semiconductor device 20 having a single-sided heat dissipation structure including only the substrate 50 to which the drain electrode 40D (first main electrode) is connected. In the semiconductor device 20 including the pair of substrates 50, 60, the above structure may be applied only to the bonded portion between one of the substrates 50, 60 and the metal member. The example in which both the back-face metal bodies 53, 63 are exposed from the sealing body 30 has been described, but the present disclosure is not limited thereto.

An example in which the semiconductor device 20 includes the semiconductor elements 40H, 40L, but the present disclosure is not limited thereto. Only the semiconductor element 40 constituting one of the arms may be provided. The semiconductor device 20 may include, for example, only one semiconductor element 40.

The configuration described in the present embodiment can be combined with any of the configurations described in the first embodiment, the second embodiment, the third embodiment, the fourth embodiment, and the modifications thereof.

Sixth Embodiment

This embodiment is a modification based on the preceding embodiment, and the description of the preceding embodiment can be incorporated. In order to enhance the reliability of the semiconductor device, as will be described in the present embodiment, the physical properties of the sealing body and the physical properties of the insulating base member may satisfy a predetermined relationship.

<Semiconductor Device and Heat Dissipation Structure>

Figure 69:
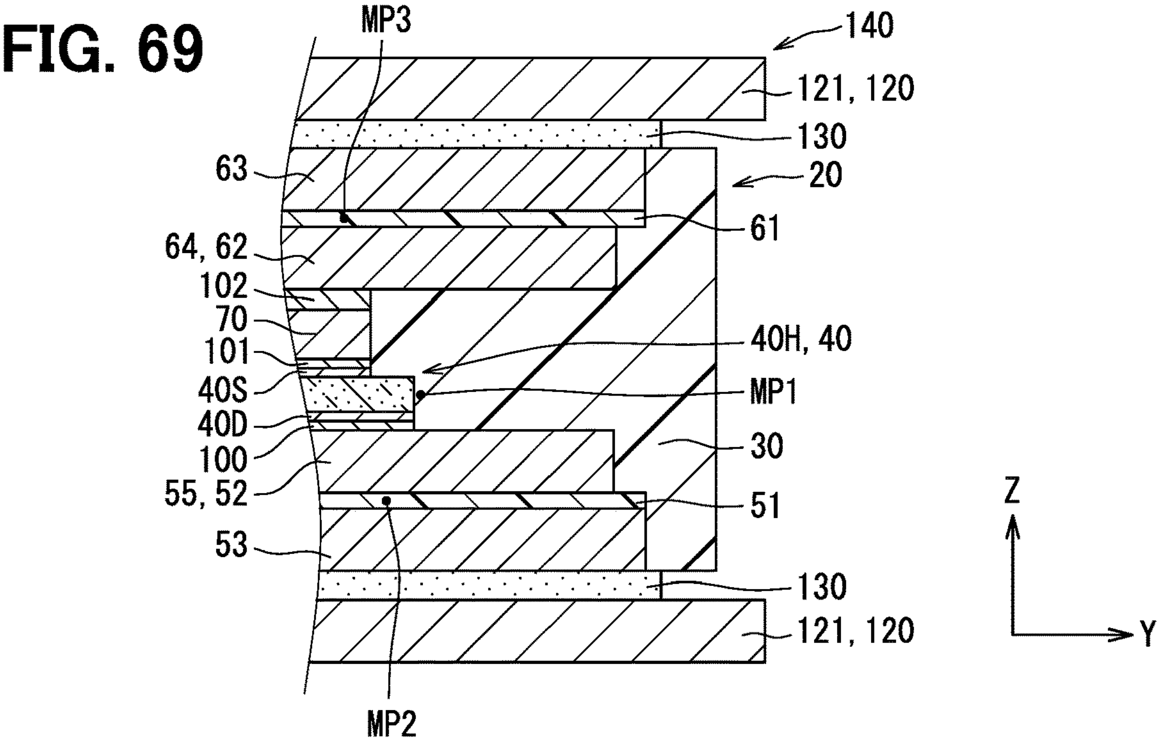
FIG. 69 is a sectional view illustrating a semiconductor device according to a sixth embodiment.

The semiconductor device 20 according to the present embodiment will be described with reference to FIG. 69. FIG. 69 is a sectional view illustrating the semiconductor device 20 according to the present embodiment. FIG. 69 is an enlarged view of a portion of FIG. 5. In FIG. 69, the external connection terminals 90 are omitted for convenience.

The semiconductor device 20 according to the present embodiment has a structure that is the same as or similar to the structure described in the preceding embodiment (see FIGS. 2 to 13). As illustrated in FIG. 69, the semiconductor device 20 includes the semiconductor element 40 (40H), the substrates 50, 60 disposed so as to sandwich the semiconductor element 40 in the Z direction, and the sealing body 30. The front-face metal body 52 of the substrate 50 is connected to the drain electrode 40D as the main electrode of the semiconductor element 40. The front-face metal body 62 of the substrate 60 is connected to the source electrode 40S as the main electrode of the semiconductor element 40. The back-face metal body 53, 63 is exposed from the sealing body 30. The insulating base member 51, 61 contains resin. The sealing body 30 contains resin. Although not illustrated, the semiconductor device 20 includes the semiconductor element 40L which is a lower arm element.

FIG. 69 illustrates the heat exchange unit 121 of the cooler 120 and the heat conductive member 130 such as heat dissipation gel together with the semiconductor device 20. That is, FIG. 69 illustrates the semiconductor module 140 including the semiconductor device 20, the cooler 120, and the heat conductive member 130. As an example, the semiconductor module 140 has a double-sided cooling structure in which the semiconductor device 20 is sandwiched between the pair of heat exchange units 121. The semiconductor device 20 is disposed side by side with the cooler 120 (heat exchange unit 121) in the Z direction that is a predetermined direction. The coolers 120 are disposed on both sides of the semiconductor device 20.

The back-face metal body 53, 63 is exposed from the sealing body 30 as the back face 50*b*, 60*b* of the substrate 50, 60. One of the heat exchange units 121 of the cooler 120 is disposed to oppose the one face 30*a* of the sealing body 30 and the back face 50*b*, and the other one of the heat exchange units 121 is disposed to oppose the back face 30*b* of the sealing body 30 and the back face 60*b*. Heat conductive members 130 are disposed between the opposing faces of the semiconductor device 20 and the heat exchange unit 121. The heat conductive member 130 is in close contact with the semiconductor device 20 and the heat exchange unit 121.

<Relationship Between Glass Transition Points>

Next, the relationship between the glass transition points of the sealing body 30 and the insulating base members 51 and 61 will be described with reference to FIGS. 69 and 70.

Figure 70:
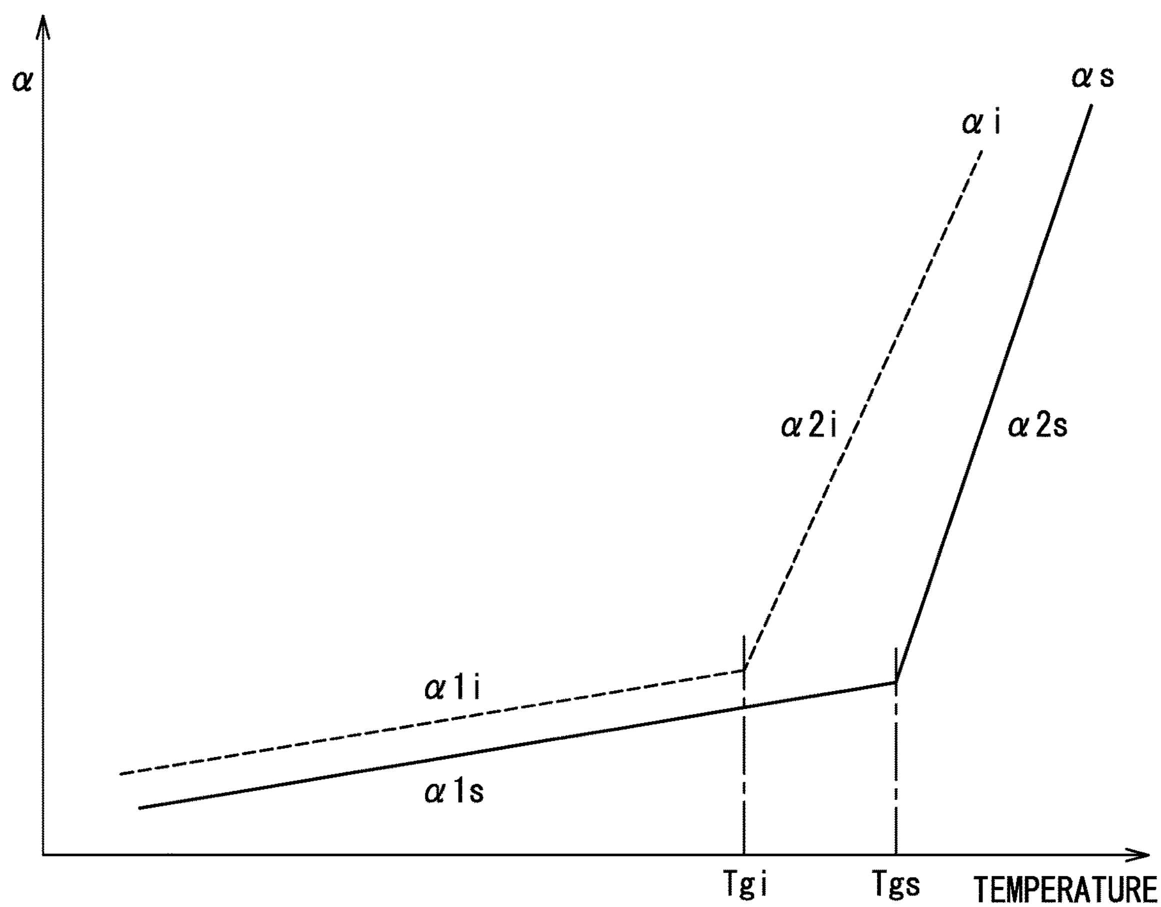
FIG. 70 is a graph indicating a relationship between a glass transition point and a linear expansion coefficient for a sealing body and an insulating base member.

FIG. 70 is a graph indicating an example of the relationship between a glass transition point Tgs and a linear expansion coefficient $\alpha s$ of the sealing body 30, and a glass transition point Tgi and a linear expansion coefficient $\alpha i$ of the insulating base member 51, 61. In FIG. 70, the vertical axis represents a linear expansion coefficient $\alpha$, and the horizontal axis represents temperature. In FIG. 70, a solid line indicates the linear expansion coefficient $\alpha s$ of the sealing body 30, and a dashed line indicates the linear expansion coefficient $\alpha i$ of the insulating base member 51, 61. Among the linear expansion coefficients $\alpha s$, $\alpha 1s$ represents a linear expansion coefficient at a temperature lower than the glass transition point Tgs, that is, a linear expansion coefficient in an $\alpha 1$ region. On the other hand, $\alpha 2s$ represents a linear expansion coefficient at a temperature higher than the glass transition point Tgs, that is, a linear expansion coefficient in an $\alpha 2$ region. The same applies to the linear expansion coefficients $\alpha i$, where $\alpha 1i$ represents a linear expansion coefficient in the $\alpha 1$ region, and $\alpha 2s$ represents a linear expansion coefficient in the $\alpha 2$ region.

As illustrated in FIG. 69, the sealing body 30 is in close contact with the semiconductor element 40. The insulating base member 51, 61 is thermally connected to the semiconductor element 40 via the bonding member 100, 101, 102 and the front-face metal body 52, 62. Therefore, during the operation of the semiconductor element 40 (during heat generation), the temperature of a peripheral position MP1 of the semiconductor element 40 in the sealing body 30 is higher than the temperature of the position MP2, MP3 overlapping the semiconductor element 40 in the insulating base member 51, 61. Thus, the sealing body 30 has a higher temperature than the insulating base member 51, 61.

When the temperature of the sealing body 30 exceeds the glass transition point Tgs, the Young's modulus decreases, and the sealing function of the sealing body 30 decreases. Due to the deterioration of the sealing function, thermal stress may concentrate on the drain electrode 40D, the source electrode 40S, and bonded portions thereof, leading to occurrence of a crack or the like. That is, the connection reliability may be lowered. On the other hand, in the present embodiment, as illustrated in FIG. 70, the relationship of Tgs>Tgi is satisfied.

<Relationship Between Linear Expansion Coefficients>

Figure 71:
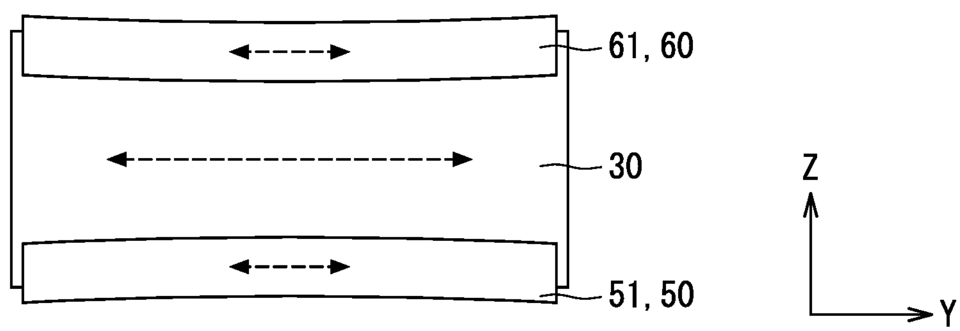
FIG. 71 is a diagram illustrating warpage of a reference example.
Figure 72:
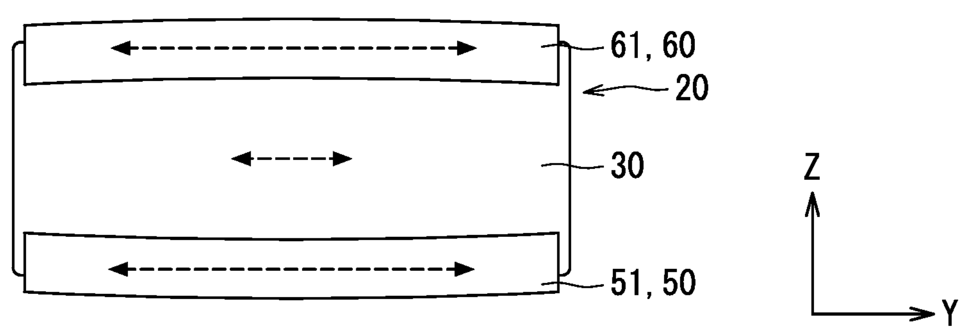
FIG. 72 is a view illustrating warpage at high temperature.

Next, the relationship between the linear expansion coefficients of the sealing body 30 and the insulating base member 51, 61 will be described with reference to FIGS. 70 to 72. FIGS. 71 and 72 are conceptual diagrams illustrating warpage of the semiconductor device 20. In FIGS. 71 and 72, only the resin elements constituting the semiconductor device 20, that is, only the sealing body 30 and the insulating base members 51, 61 are illustrated.

When the linear expansion coefficient $\alpha s$ of the sealing body 30 is greater than the linear expansion coefficient $\alpha i$ of the insulating base member 51, 61 during operation of the semiconductor element 40 (during heat generation), the amount of expansion of the sealing body 30 becomes greater than the amount of expansion of the insulating base member 51, 61 as denoted by dashed line arrows in FIG. 71. That is, the amount of expansion is large at the center in the Z direction, and the amounts of expansion are small at both ends. Therefore, the semiconductor device 20 changes into a shape recessed at both ends in the Z direction.

In the present embodiment, as illustrated in FIG. 70, the relationship of $\alpha i \geq \alpha s$ is satisfied. Specifically, the relationship of $\alpha 1i > \alpha 1s$ is satisfied in the $\alpha 1$ region, and the relationship of $\alpha 2i > \alpha 2s$ is satisfied in the $\alpha 2$ region. As described above, since the relationship of Tgs>Tgi is satisfied, the relationship of $\alpha i \geq \alpha s$ is satisfied in the entire region of operating temperature range. Accordingly, during the operation of the semiconductor element 40 (during heat generation), the amount of expansion of the insulating base member 51, 61 is greater than the amount of expansion of the sealing body 30 as denoted by dashed line arrows in FIG. 72. That is, the amount of expansion is small at the center in the Z direction, and the amounts of expansion are large at both ends. Therefore, as illustrated in FIG. 72, the shape of the semiconductor device 20 protrudes at both ends in the Z direction.

Summary of Sixth Embodiment

According to the present embodiment, the glass transition point Tgs of the sealing body 30 is greater than the glass transition point Tgi of the insulating base member 51, 61. Accordingly, the temperature of the sealing body 30 that has a higher temperature during operation of the semiconductor element 40 is unlikely to exceed the glass transition point Tgs. The temperature of the sealing body 30 does not exceed the glass transition point Tgs or slightly exceeds the glass transition point Tgs. Therefore, the Young's modulus of the sealing body 30 decreases, and deterioration of the sealing function can be suppressed. Suppression of deterioration of the sealing function makes it possible to suppress concentration of stress on the drain electrode 40D and the source electrode 40S, both of which serve as main electrodes, and bonded portions thereof. In other words, connection reliability can be enhanced.

The glass transition point Tgs of the sealing body 30 may be made substantially equal to the glass transition point Tgi of the insulating base member 51, 61. Compared with the case of Tgs<Tgi, the temperature of the sealing body 30 that becomes higher during heat generation is less likely to exceed the glass transition point Tgs.

The linear expansion coefficient αi of the insulating base member 51, 61 is greater than the linear expansion coefficient αs of the sealing body 30. Accordingly, the amount of expansion of the insulating base member 51, 61 becomes greater than the amount of expansion of the sealing body 30 during the operation of the semiconductor element 40. That is, the amount of expansion is small at the center in the Z direction, and the amounts of expansion are large at both ends. Thus, the semiconductor device 20 is warped so as to protrude outward in the Z direction. Therefore, the opposing distance between the semiconductor device 20 and the cooler 120 (121) is reduced, and the thermal resistance between the semiconductor device 20 and the cooler 120 is reduced. Specifically, the thickness of the heat conductive member 130 is reduced, and the thermal resistance is reduced. Since the heat of the semiconductor element 40 can be efficiently released, the semiconductor element 40 can be suppressed from being overheated. In other words, heat dissipation properties can be enhanced.

The linear expansion coefficient αi of the insulating base member 51, 61 may be made substantially equal to the linear expansion coefficient αs of the sealing body 30. In this case, the amount of expansion becomes substantially equal between the center and both ends in the Z direction, making it possible to suppress the semiconductor device 20 from changing into a recessed shape in which both ends in the Z direction are recessed. In other words, an increase in thermal resistance between the semiconductor device 20 and the cooler 120 due to being formed in to recessed shape.

In this manner, satisfaction of the relationships of Tgs≥Tgi and αi≥αs enables the provision of the semiconductor device 20 with high reliability.

<Modifications>

Although the example of the semiconductor device 20 having the double-sided heat dissipation structure including the pair of substrates 50, 60 has been described, the present disclosure is not limited thereto. The present disclosure can also be applied to the semiconductor device 20 having a single-sided heat dissipation structure including only the substrate 50 to which the drain electrode 40D (first main electrode) is connected.

An example in which the semiconductor device 20 includes the semiconductor elements 40H, 40L, but the present disclosure is not limited thereto. Only the semiconductor element 40 constituting one of the arms may be provided. The semiconductor device 20 may include, for example, only one semiconductor element 40.

The configuration described in the present embodiment can be combined with any of the configurations described in the first embodiment, the second embodiment, the third embodiment, the fourth embodiment, the fifth embodiment, and the modifications thereof.

Seventh Embodiment

This embodiment is a modification based on the preceding embodiment, and the description of the preceding embodiment can be incorporated. In order to suppress the sealing body from being peeled, the front-face metal body may have a predetermined structure as will be described in the present embodiment.

<Semiconductor Device>

Figure 73:
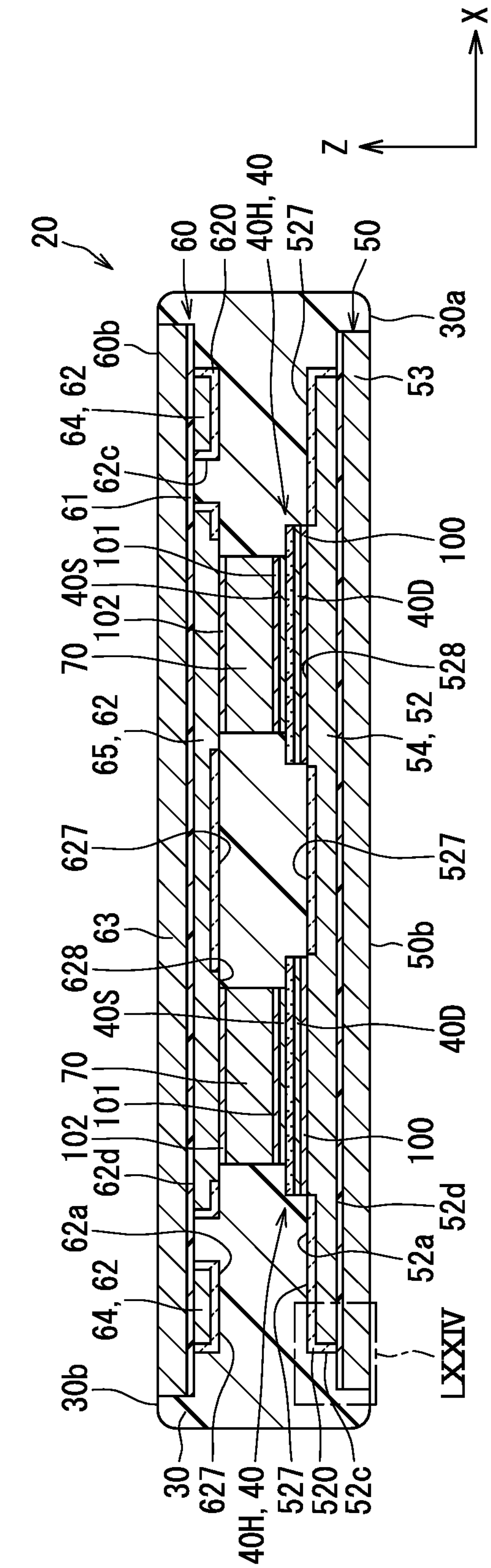
FIG. 73 is a sectional view illustrating a semiconductor device according to a seventh embodiment.

FIG. 73 is a sectional view illustrating the semiconductor device 20 according to the present embodiment. FIG. 73 corresponds to FIG. 8.

The semiconductor device 20 according to the present embodiment has a configuration that is the same as or similar to the configuration described in the preceding embodiment (see FIGS. 2 to 13). As illustrated in FIG. 73, the semiconductor device 20 includes two semiconductor elements 40 (40H), the substrates 50, 60 disposed so as to sandwich the semiconductor elements 40 in the Z direction, and the sealing body 30. The front-face metal body 52 of the substrate 50 is connected to the drain electrode 40D as the main electrode of the semiconductor element 40 via the bonding member 100. The front-face metal body 62 of the substrate 60 is electrically connected to the source electrode 40S as the main electrode of the semiconductor element 40 via the bonding member 102. The sealing body 30 seals the semiconductor elements 40, the substrates 50, 60, and bonding members 100, 102. In the substrate 50, 60, the back-face metal body 53, 63 is exposed from the sealing body 30. Although not illustrated, the semiconductor device 20 includes two semiconductor element 40L.

As illustrated in FIG. 73, the front-face metal body 52, 62 has a roughened portion 527, 627 and a non-roughened portion 528, 628.

<Uneven Oxide Film>

Figure 74:
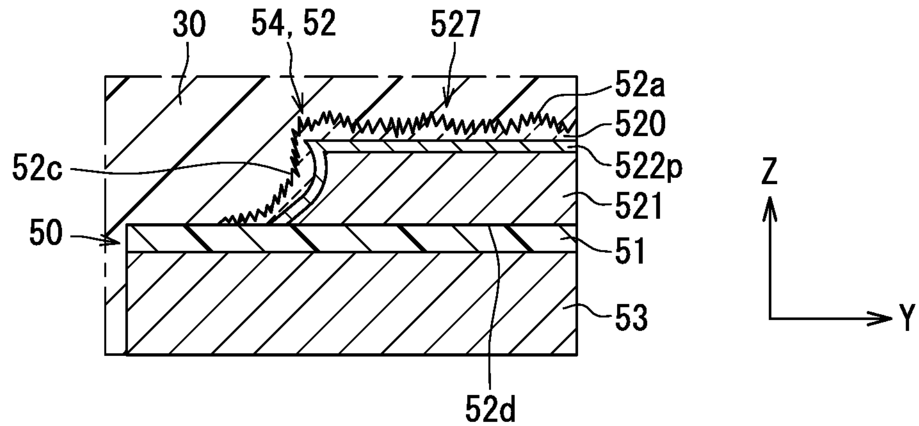
FIG. 74 is an enlarged view of a region LXXIV in FIG. 73.
Figure 75:
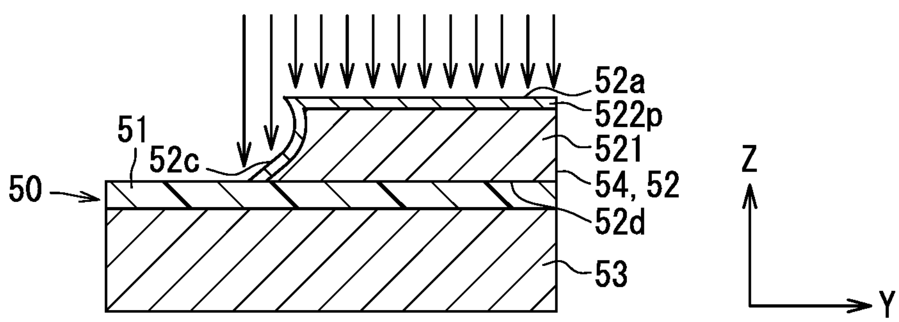
FIG. 75 is a view illustrating a method of forming a roughened portion.

Next, the uneven oxide film 520 constituting the roughened portion 527 will be described in detail with reference to FIGS. 74 and 75. FIG. 74 is an enlarged view of a region LXXIV in FIG. 73. FIG. 75 is a view illustrating a method of forming a roughened portion.

The front-face metal body 52, 62 has the uneven oxide film 520, 620, similarly to the configuration described in the modification of the fifth embodiment (see FIGS. 66 and 67). The uneven oxide film 520, 620 provides the roughened portion 527, 627 on the surface of the front-face metal body 52, 62. In the surface of the front-face metal body 52, 62, a portion where the uneven oxide film 520, 620 is not formed provides the non-roughened portion 528, 628. Hereinafter, the front-face metal body 52 will be described as an example.

As illustrated in FIG. 74, the front-face metal body 52 includes the base material 521, a plating film 522*p* and the uneven oxide film 520 provided on the surface of the base material 521. The base material 521 forms a main part of the front-face metal body 52. The base material 521 is formed using, for example, a Cu-based material. The plating film 522*p* includes a material having higher wettability to the bonding member 100 such as solder than the base material 521. The plating film 522*p* is formed over the entire region of the upper face 52*a* and the entire region of a side face 52*c* of the front-face metal body 52. The side face 52*c* is a face connecting the upper face 52*a* and a lower face 52*d* opposing the insulating base member 51 in the front-face metal body 52.

As described in the modification of the fifth embodiment, the uneven oxide film 520 is formed by irradiating the plating film 522*p* with laser light. In the present embodiment, the upper face 52*a* and the side face 52*c* of the front-face metal body 52 are irradiated with laser light. The roughened portion 527 provided by the uneven oxide film 520 is a portion of the upper face 52*a* excluding the non-roughened portion 528. As an example, the roughened portion 527 is formed over the entire region of the side face 52*c*. At the end of the front-face metal body 52, the roughened portion 527 is continuously provided from the side face 52*c* to the upper face 52*a*. The roughened portion 527 is provided on part of the upper face 52*a* and the side face 52*c*. The roughened portion 527 may be provided only at an edge portion of the upper face 52*a*. The non-roughened portion 528 is provided on part of the upper face 52*a* and includes at least an arrangement region (bonding region) for the bonding member 100. The non-roughened portion 528 may be provided only in the bonding region or may include a region other than the bonding region. The roughened portion 527 is provided on part of the side face 52*c*. The roughened portion 527 may be provided only at part of the side face 52*c*. For example, the roughened portion 527 may be provided only on part of the side face 52*c* so that the uneven oxide film 520 does not come into contact with the insulating base member 51.

The plating film 522*p* includes a lower base film containing Ni (nickel) as a main component and an upper base film containing Au (gold) as a main component. In the present embodiment, an electroless Ni plating film containing P (phosphorus) is adopted as the lower base film. Consider the case where the bonding member 100 is solder. Of the plating film 522*p* exposed from the uneven oxide film 520, the upper base film (Au) at the portion with which the bonding member 100 is in contact diffuses into the solder during reflow. Of the plating film 522*p*, the upper base film (Au) at the portion where the uneven oxide film 520 is formed is removed by irradiation with laser light when the uneven oxide film 520 is formed. The uneven oxide film 520 is an oxide film containing Ni as a main component. At the end of the front-face metal body 52, the uneven oxide film 520 is continuously provided from the side face 52*c* to the upper face 52*a*.

As described in the modification of the fifth embodiment, the uneven oxide film 520 is formed by melting, vaporizing, and depositing a face layer portion of the plating film 522*p* by irradiation with laser light. The uneven oxide film 520 is an oxide film derived from the plating film 522*p*. The uneven oxide film 520 is a film of an oxide of metal (Ni) as a main component of the plating film 522*p*. Fine recesses and protrusions (roughened portions) are always formed on the surface of the uneven oxide film 520. The uneven oxide film 520 has a continuous uneven surface.

In the present embodiment, in the front-face metal body 52, the area of the lower face 52*d* is greater than the area of the upper face 52*a*. Accordingly, as illustrated in FIG. 74, the lower face 52*d* overhang from the upper face 52*a*. That is, at least part of the side face 52*c* is positioned outside the upper face 52*a* in the plan view in the Z direction. Therefore, as illustrated in FIG. 75, the uneven oxide film 520 can be formed at the upper face 52*a* and the side face 52*c* by irradiating the upper face 52*a* and the side face 52*c* with laser light in the Z direction.

Summary of Seventh Embodiment

In the configuration in which the plating film 522*p* is provided at the upper face 52*a* and the side face 52*c* of the front-face metal body 52, the sealing body 30 is likely to be peeled from the end of the front-face metal body 52, that is, the side face 52*c* due to thermal stress. On the other hand, in the present embodiment, the roughened portion 527 is provided in the portion of the upper face 52*a* excluding the non-roughened portion 528 and the side face 52*c*. As a result, the adhesive force of the side face 52*c* of the front-face metal body 52 with the sealing body 30 is high as compared with that in the configuration not including the roughened portion 527. Therefore, the sealing body 30 can be suppressed from being peeled at the side face 52*c* of the front-face metal body 52. Suppression of peeling enables suppression of thermal stress concentration on a bonded portion such as the bonding member 100 in the front-face metal body 52. As a result, the semiconductor device 20 with high reliability can be provided.

The front-face metal body 62 has a configuration that is the same as or similar to the front-face metal body 52. The front-face metal body 62 includes the roughened portion 627 on a portion of the upper face 62*a* excluding the non-roughened portion 628 and a side face 62*c*. With this configuration, the sealing body 30 can be suppressed from being peeled at the side face 62*c* of the front-face metal body 62.

In the present embodiment, the roughened portion 527, 627 is continuously provided over the side face 52*c*, 62*c* and the upper face 52*a*, 62*a*. With this configuration, the sealing body 30 can be suppressed from being peeled at or near the end of the front-face metal body 52, 62.

As the roughening treatment for forming the roughened portion 527, 627, roughening plating, sandblasting, chemical liquid treatment, and the like can be adopted. In the present embodiment, laser roughening is adopted. The uneven oxide film 520, 620 is formed by irradiating the plating film with laser light. The front-face metal body 52, 62 has the uneven oxide film 520, 620 at the roughened portion 527, 627.

The surface of the uneven oxide film 520, 620 has continuous recesses and protrusions, allowing the sealing body 30 to be entangled to produce an anchor effect. The contact area with the sealing body 30 increases. Accordingly, the adhesive force of the roughened portion 527, 627 to the sealing body 30 can be enhanced. The uneven oxide film 520, 620 has low wettability to the bonding member 100, 102, as compared with the plating film (plating film 522*p*). Since the uneven oxide film 520, 620 has fine recesses and protrusions on the surfaces, the contact area with the bonding member 100, 102 is reduced, respectively, and part of the bonding member 100, 102 becomes spherical by surface tension. That is, the contact angle increases. Therefore, overflow of the bonding members 100, 102 can be suppressed. As described above, adoption of the uneven oxide film 520, 620 makes it possible to enhance the adhesive force to the sealing body 30 and to suppress overflow of the bonding member 100, 102 from the bonded portion.

In the present embodiment, the area of the front-face metal body 52, 62 is greater in the lower face 52*d*, 62*d* than in the upper face 52*a*, 62*a*. The lower face 52*d*, 62*d* overhangs with respect to the upper face 52*a*, 62*a*. Therefore, the side face 52*c*, 62*c* can easily be subjected to physical roughening from the Z direction. In the case of the laser roughening described above, the uneven oxide film 520, 620 can be formed not only on the upper face 52*a*, 62*a* but also on the side face 52*c*, 62*c*, by irradiating these faces with the laser light in the Z direction.

<Modifications>

Figure 76:
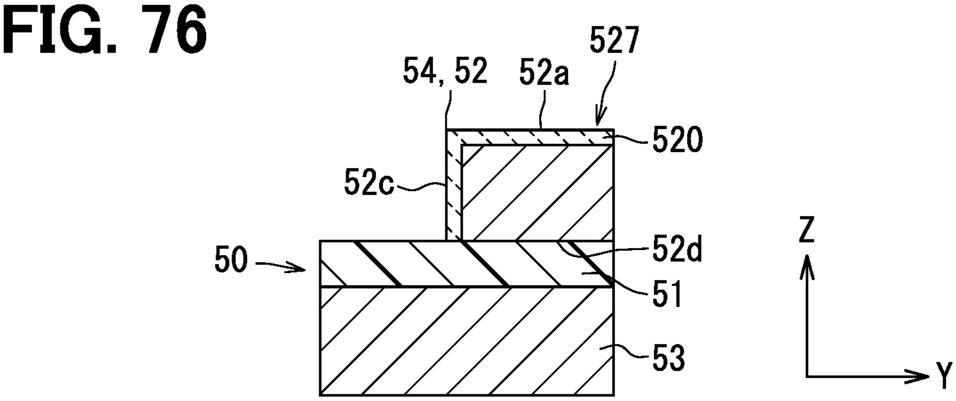
FIG. 76 is a sectional view illustrating a modification.

The shape of a side face of the front-face metal body 52, 62 is not limited to that in that in the above-described examples. When the front-face metal body 52, 62 is patterned by pressing, etching, cutting, or the like, the side face can be processed into a predetermined shape. FIG. 76 is a sectional view illustrating a modification for a shape of the side face. In FIG. 76, the front-face metal body 52 is illustrated as an example, and the plating film 522*p* is omitted for convenience. Although not illustrated, the same or similar configuration can be adopted for the front-face metal body 62.

In the example illustrated in FIG. 76, the front-face metal body 52 includes the side face 52*c* substantially parallel to the Z direction. That is, the area of the front-face metal body 52 is substantially constant in the Z direction. In order to physically roughen such a front-face metal body 52, for example, it is sufficient that roughening be performed separately on the upper face 52*a* and the side face 52*c*. In the case of laser roughening, the side face 52*c* is irradiated with laser light from a direction different from the irradiation direction of the laser light with respect to the upper face 52*a*, for example, a direction inclined with respect to the Z direction. In this manner, the uneven oxide film 520 can be provided on the side face 52*c*.

Figure 77:
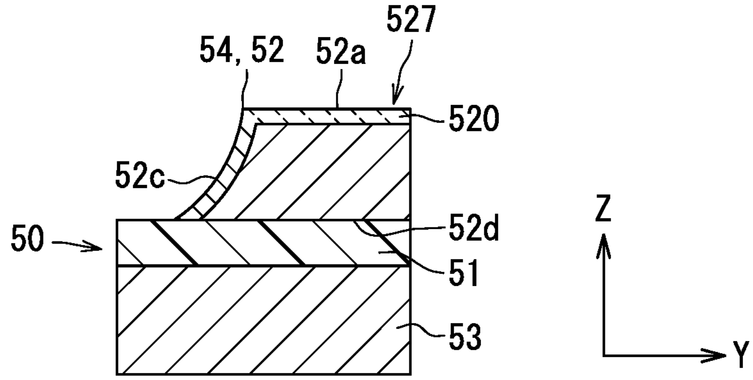
FIG. 77 is a sectional view illustrating a modification.

FIG. 77 is a sectional view illustrating a modification for a shape of the side face and corresponds to FIG. 76. In the example illustrated in FIG. 77, the area of the front-face metal body 52 orthogonal to the Z direction increases toward the lower face 52*d*. The side face 52*c* has a round shape. In this case, the entire region of the side face 52*c* is positioned outside the upper face 52*a* in the plan view. Therefore, physical roughening, for example, laser roughening, of the side face 52*c* from the Z direction can be performed more easily in this configuration than in the configuration illustrated in FIG. 75.

Figure 78:
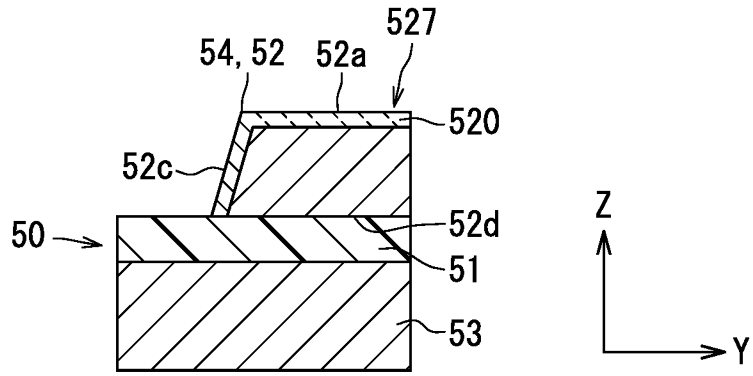
FIG. 78 is a sectional view illustrating a modification.

FIG. 78 is a sectional view illustrating a modification for a shape of the side face and corresponds to FIG. 76. Also in the example illustrated in FIG. 78, the area of the front-face metal body 52 orthogonal to the Z direction increases toward the lower face 52*d*. The front-face metal body 52 has, for example, a substantially trapezoidal shape in the ZY plane. In this case, the entire region of the side face 52*c* is positioned outside the upper face 52*a* in the plan view, and the side face 52*c* is thus easy to be physically roughened from the Z direction.

Although the example of the semiconductor device 20 having the double-sided heat dissipation structure including the pair of substrates 50, 60 has been described, the present disclosure is not limited thereto. The present disclosure can also be applied to the semiconductor device 20 having a single-sided heat dissipation structure including only the substrate 50 to which the drain electrode 40D (first main electrode) is connected. In the semiconductor device 20 including the pair of substrates 50, 60, the structure of the roughened portion including the above-described side face may be applied only to one of the substrates 50, 60.

An example in which the semiconductor device 20 includes the semiconductor elements 40H, 40L, but the present disclosure is not limited thereto. Only the semiconductor element 40 constituting one of the arms may be provided. The semiconductor device 20 may include, for example, only one semiconductor element 40.

The configuration described in the present embodiment can be combined with any of the configurations described in the first embodiment, the second embodiment, the third embodiment, the fourth embodiment, the fifth embodiment, the sixth embodiment, and the modifications thereof.

Eighth Embodiment

This embodiment is a modification based on the preceding embodiment, and the description of the preceding embodiment can be incorporated. In order to reduce inductance, as will be described in the present embodiment, the thickness of the front-face metal body and the interval between the wirings may satisfy a predetermined relationship.

<Semiconductor Device>

Figure 79:
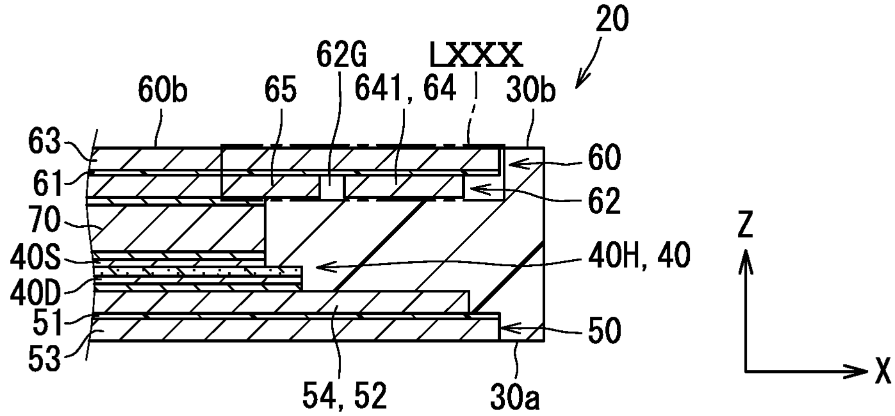
FIG. 79 is a sectional view illustrating a semiconductor device according to an eighth embodiment.

Next, the circuit pattern of the front-face metal body 52, 62 in the semiconductor device 20 according to the present embodiment will be described with reference to FIG. 79. FIG. 79 is a sectional view illustrating the semiconductor device 20 according to the present embodiment. FIG. 79 illustrates part of the configuration described in the preceding embodiment (see FIG. 8).

The semiconductor device 20 according to the present embodiment has a configuration that is the same as or similar to the configuration described in the preceding embodiment (see FIGS. 2 to 13). As illustrated in FIG. 79, the semiconductor device 20 includes the semiconductor element 40 (40H), the substrates 50, 60 disposed so as to sandwich the semiconductor element 40 in the Z direction, and the sealing body 30. The front-face metal body 52 of the substrate 50 is electrically connected to the drain electrode 40D as the main electrode of the semiconductor element 40. The front-face metal body 62 of the substrate 60 is electrically connected to the source electrode 40S as the main electrode of the semiconductor element 40. The sealing body 30 seals the semiconductor element 40, the substrates 50, 60, and bonding members 100, 102. In the substrate 50, 60, the back-face metal body 53, 63 is exposed from the sealing body 30. Although not illustrated, the semiconductor device 20 includes the semiconductor element 40L which is the lower arm 9L.

<Relationship Between Interval Between Wiring Lines and Thickness>

Figure 80:
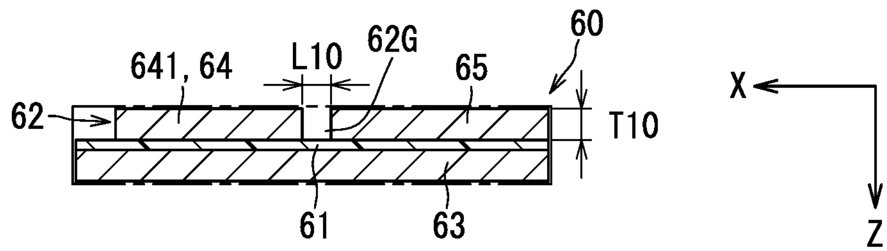
FIG. 80 is an enlarged view of a region LXXX in FIG. 79.

Next, the relationship between the interval between wirings and the thickness will be described with reference to FIGS. 79 and 80. FIG. 80 is an enlarged view of a region LXXX in FIG. 79. In FIG. 80, only the substrate 60 is illustrated.

The front-face metal body 52, 62 has the gap 52G, 62G between wirings, similarly to the configuration described in the preceding embodiment (see FIG. 65). As illustrated in FIGS. 79 and 80, the gap 62G between wirings separates the N wiring 64 from the adjacent relay wiring 65. The gap 62G between wirings is a predetermined gap provided between wirings having different potentials in the front-face metal body 62.

As illustrated in FIG. 80, in the present embodiment, an interval L10 between the N wiring 64 and the relay wiring 65 is equal to or less than a thickness T10 ($L10 \leq T10$) of the front-face metal body 62. The interval L10 is a length of the gap 62G between wirings, that is, a distance between the pattern of the N wiring 64 and the pattern of the relay wiring 65. In FIGS. 79 and 80, the interval L10 and the thickness T10 in the front-face metal body 62 satisfy the relationship of $L10 < T10$. Although not illustrated, the substrate 50 including the front-face metal body 52 has a configuration that is the same as or similar to the substrate 60. In the front-face metal body 52, the interval L10 between the P wiring 54 and the relay wiring 55 is equal to or less than the thickness T10 ($L10 \leq T10$) of the front-face metal body 52.

<Simulation Results>

Figure 81:
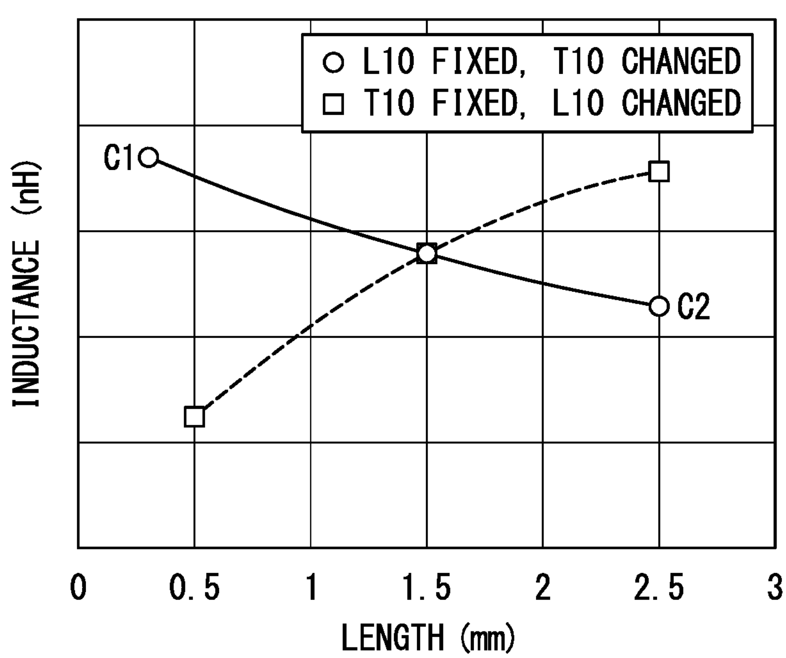
FIG. 81 is a graph indicating a relationship between inductance, and an interval and a thickness.
Figure 82:
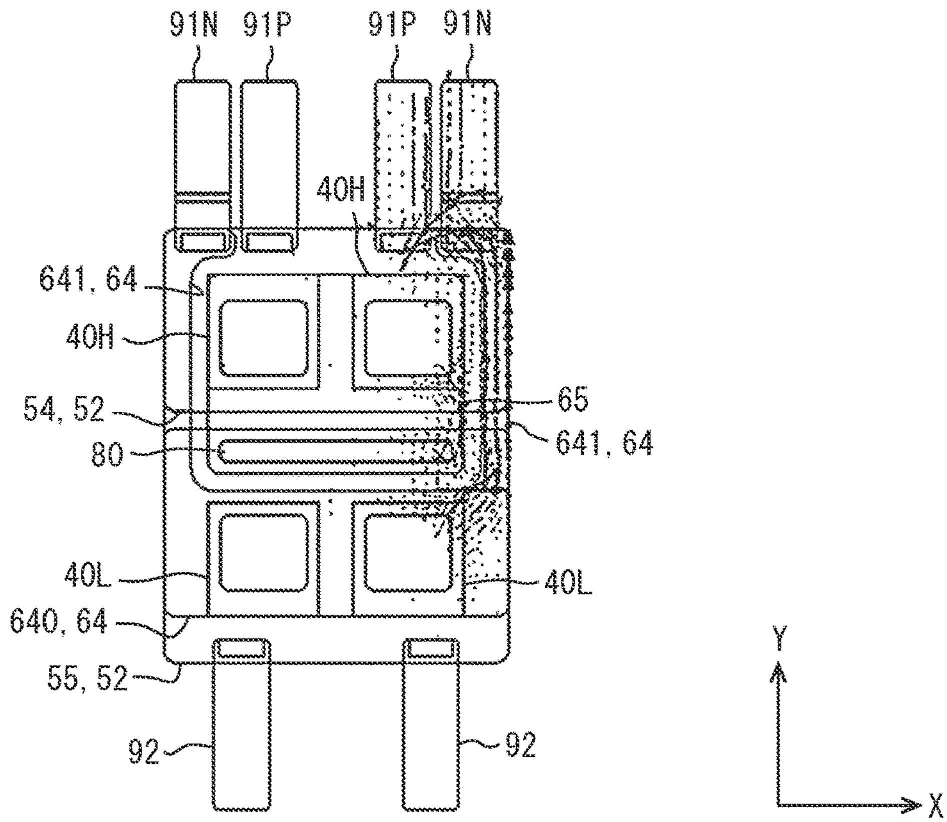
FIG. 82 is a view illustrating a simulation result in a case where interval<thickness.
Figure 83:
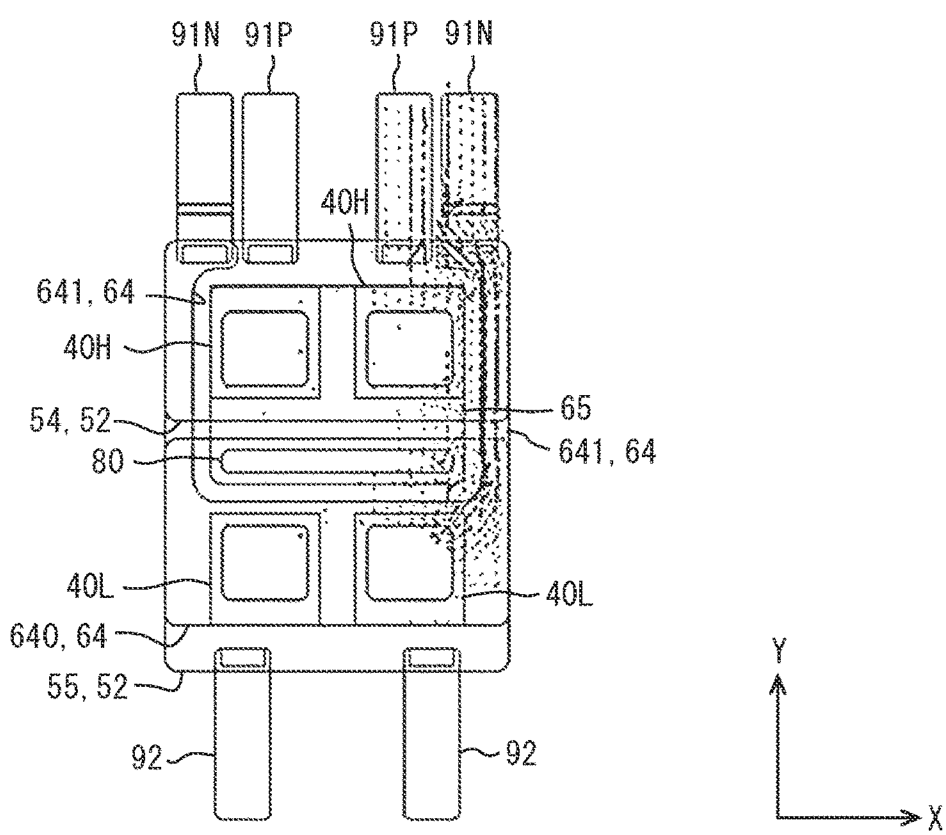
FIG. 83 is a view illustrating a simulation result in the case of interval>thickness.

FIGS. 81 to 83 illustrate results of electromagnetic field simulation. FIG. 81 is a graph summarizing simulation results in the relationship between a length (interval and thickness) and inductance. The circles (o) in measurement points indicate the results of the three levels (0.3 mm, 1.5 mm, 2.5 mm) of the thickness T10 when the interval L10 is fixed at 1.5 mm. A solid line in the graph indicates a change in inductance accompanying a change in the thickness T10 when the interval L10 is fixed. The squares (□) in measurement points indicate the results of the three levels (0.5 mm, 1.5 mm, 2.5 mm) of the interval L10 when the thickness T10 is fixed at 1.5 mm. A dashed line in the graph indicates a change in inductance accompanying a change in the interval L10 when the thickness T10 is fixed. The length represented by the horizontal axis illustrated in FIG. 81 indicates the length of the thickness T10 when the interval L10 is fixed, and indicates the length of the interval L10 when the thickness T10 is fixed.

FIG. 82 is a view illustrating a simulation result in the case of L10>T10. FIG. 82 indicates simulation results under a first condition C1 indicated in FIG. 81. Specifically, FIG. 82 indicates simulation results in the case of the interval L10=1.5 mm and the thickness T10=0.3 mm. FIG. 83 is a view illustrating a simulation result in the case of L10<T10. FIG. 83 indicates simulation results under a second condition C2 indicated in FIG. 81. Specifically, FIG. 83 indicates simulation results in the case of the interval L10=1.5 mm and the thickness T10=2.5 mm. In the simulation, conditions other than the interval L10 and the thickness T10 are common.

From the result indicated in FIG. 81, inductance can be clearly reduced in a range satisfying the relationship of L10≤T10. In particular, inductance can be effectively reduced in a range satisfying the relationship of L10<T10.

As illustrated in FIG. 82, in the case of L10>T10, the current is distributed in the width direction of the extending portion 641 of the N wiring 64, but flows biasedly to the end side of the front-face metal body 62 (substrate 60). Accordingly, the P-N current loop (see FIG. 17) described in the preceding embodiment is large. The current path flowing through the extending portion 421, which is away from the relay wiring 65, weakens the effect of canceling out the magnetic flux due to the current of the reverse direction component. FIG. 82 indicates that inductance is large as compared with the case of satisfying the relationship of L10≤T10.

As illustrated in FIG. 83, in the case of L10<T10, the current flows biasedly to the end on the relay wiring 65 side in the width direction of the extending portion 641. Accordingly, the P-N current loop is small. The current path flowing through the extending portion 421, which is close to the relay wiring 65, strengthen the effect of canceling out the magnetic flux due to the current of the reverse direction component. FIG. 83 indicates that inductance is small as compared with the case of satisfying the relationship of L10>T10.

Summary of Eighth Embodiment

In the present embodiment, the front-face metal body 52 includes the P wiring 54 as the first wiring and the relay wiring 55 as the second wiring having a potential different from that of the first wiring. The relationship of L10≤T10 is satisfied, where L10 represents an interval between the P wiring 54 and the relay wiring 55, and T10 represents a thickness of the front-face metal body 52. Similarly, the front-face metal body 62 includes the N wiring 64 as the first wiring and the relay wiring 65 as the second wiring having a potential different from that of the first wiring. The relationship of L10≤T10 is satisfied, where L10 represents an interval between the N wiring 64 and the relay wiring 65, and T10 represents a thickness of the front-face metal body 62.

When the relationship of L10≤T10 is satisfied, a narrow interval between the adjacent wirings enhances the effect of mutually cancelling out the magnetic flux due to the current flowing through the first wiring and the magnetic flux due to the current flowing through the second wiring. Accordingly, inductance can be reduced. The sectional area of the current path increases due to thick front-face metal body, and thus the inductance can be reduced. As described above, the semiconductor device 20 according to the present embodiment can reduce inductance. In particular, satisfaction of the relationship of L10<T10 enhance the above-described effect, making it possible to reduce inductance more effectively.

<Modifications>

Although the example of the semiconductor device 20 having the double-sided heat dissipation structure including the pair of substrates 50, 60 has been described, the present disclosure is not limited thereto. The present disclosure can also be applied to the semiconductor device 20 having a single-sided heat dissipation structure including only the substrate 50 to which the drain electrode 40D (first main electrode) is connected. In the configuration including the pair of substrates 50, 60, only one of the front-face metal bodies 52, 62 may satisfy the relationship of L10≤T10 described above. In other words, in at least one substrate electrically connected to the main electrode of the semiconductor element, it is sufficient that the front-face metal body have the first wiring and the second wiring and satisfy the relationship of L10≤T10. The example in which the relationship of L10≤T10 is satisfied in the entire opposing region in which the N wiring 64 as the first wiring and the relay wiring 65 as the second wiring oppose each other having a potential different from that of the first wiring has been described. However, the present disclosure is not limited thereto. It is sufficient that the relationship of L10≤T10 be satisfied in at least part of the opposing region. The same applies to an opposing region in which the P wiring 54 as the first wiring and the relay wiring 55 as the second wiring oppose each other having a potential different from that of the first wiring.

An example in which the semiconductor device 20 includes the semiconductor elements 40H, 40L, but the present disclosure is not limited thereto. Only the semiconductor element 40 constituting one of the arms may be provided. The semiconductor device 20 may include, for example, only one semiconductor element 40.

The configuration described in the present embodiment can be combined with any of the configurations described in the first embodiment, the second embodiment, the third embodiment, the fourth embodiment, the fifth embodiment, the sixth embodiment, the seventh embodiment, and the modifications thereof.

Ninth Embodiment

This embodiment is a modification based on the preceding embodiment, and the description of the preceding embodiment can be incorporated. In order to improve heat dissipation properties and reliability, the shape of the side face of the substrate may be formed into a predetermined shape as will be described in the present embodiment.

<Semiconductor Device>

Figure 84:
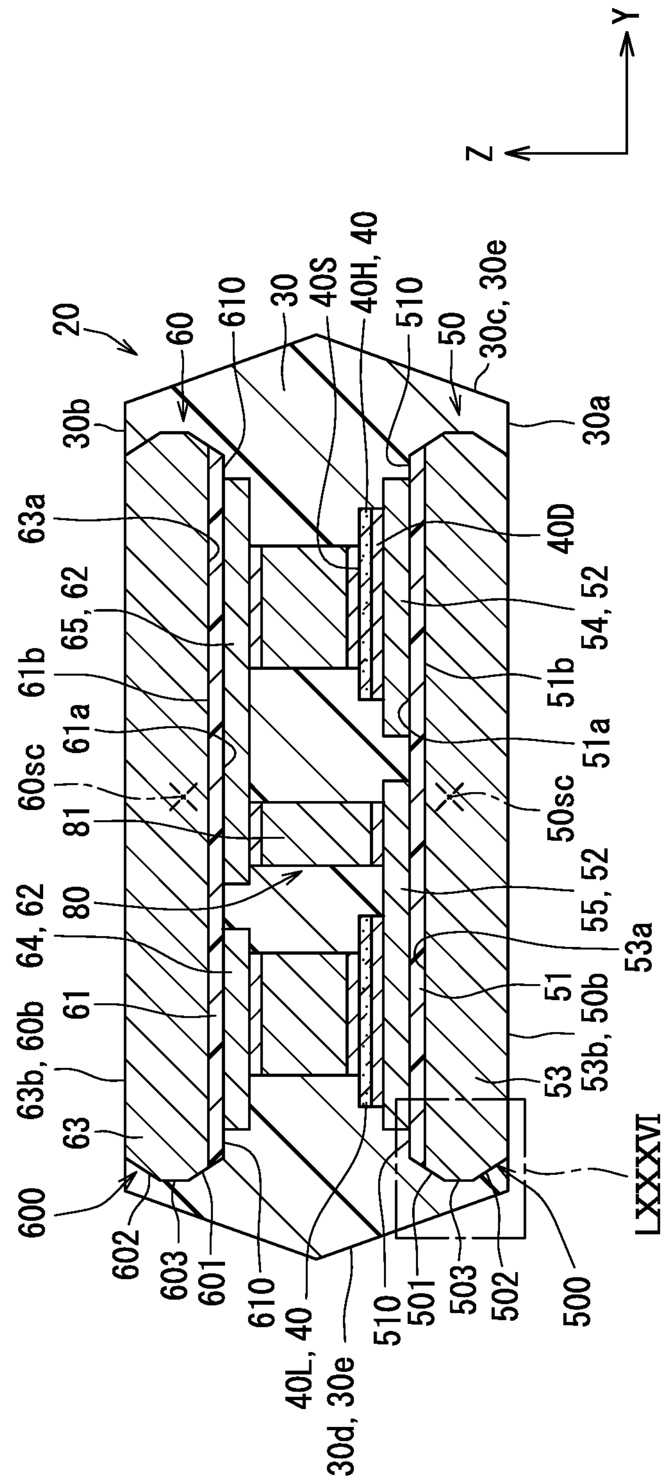
FIG. 84 is a sectional view illustrating a semiconductor device according to a ninth embodiment.

First, the semiconductor device 20 according to the present embodiment will be described with reference to FIG. 84. FIG. 84 is a sectional view corresponding to FIG. 5. In FIG. 84, illustration of the external connection terminals 90 is omitted for convenience.

The semiconductor device 20 according to the present embodiment has a configuration that is the same as or similar to the configuration described in the preceding embodiment (see FIGS. 2 to 13). As illustrated in FIG. 84, the semiconductor device 20 includes the semiconductor elements 40 (40H, 40L), the substrates 50, 60 disposed so as to sandwich the semiconductor elements 40 in the Z direction, and the sealing body 30. The front-face metal body 52 of the substrate 50 is electrically connected to the drain electrode 40D as the main electrode of the semiconductor element 40. The front-face metal body 62 of the substrate 60 is electrically connected to the source electrode 40S as the main electrode of the semiconductor element 40. The sealing body 30 seals the semiconductor element 40, the substrates 50, 60, and bonding members 100, 102.

<Substrate>

Figure 85:
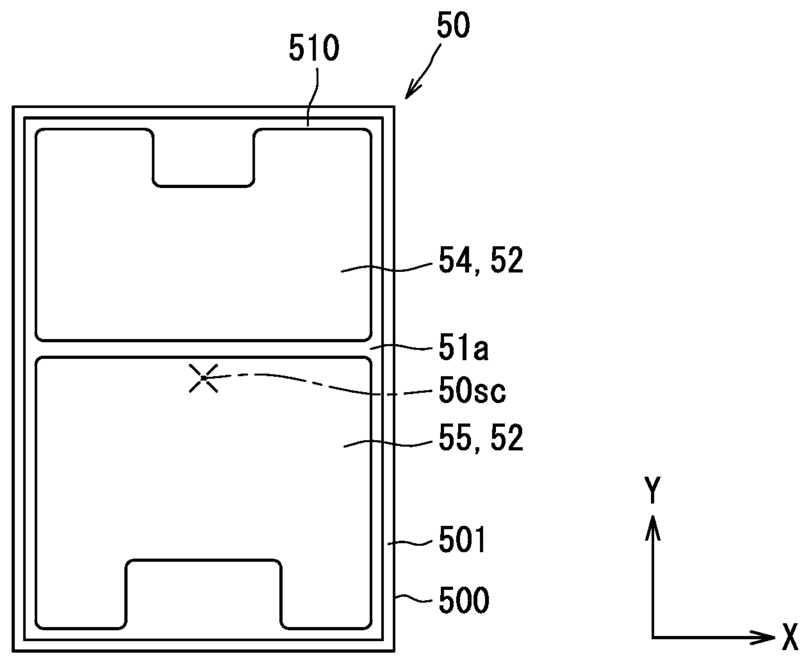
FIG. 85 is a plan view illustrating a center of the substrate.
Figure 86:
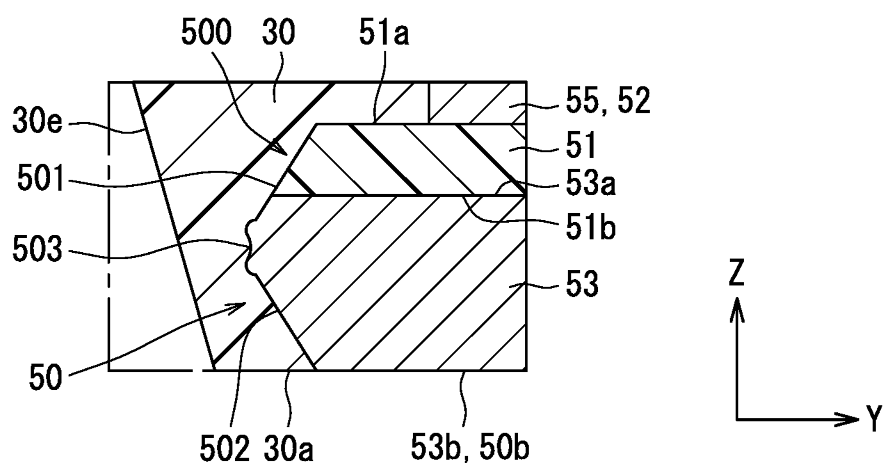
FIG. 86 is an enlarged view of a region LXXXVI in FIG. 84.

Next, the substrates 50, 60 will be described with reference to FIGS. 84 to 86. FIG. 85 is a plan view illustrating a center of the substrate. FIG. 85 corresponds to FIG. 12. FIG. 86 is an enlarged view of a region LXXXVI denoted by an alternate long and short dashed line in FIG. 84. Hereinafter, "inner side", "inside" or "inward" and "outer side", "outside", "outside" indicate a relative positional relationship with a center 50*sc*, 60*sc* of the substrate 50, 60 as a reference position in the plan view in the Z direction. The side closer to the center is the inner side, and the side farther from the center is the outer side. FIG. 85 illustrates the center 50*sc* of the substrate 50 as an example. FIG. 84 is a sectional view illustrating the centers 50*sc*, 60*sc* for convenience of description.

In the substrate 50, 60 according to the present embodiment, the insulating base member 51, 61 contains resin. The front-face metal body 52, 62 is disposed on a front face 51*a*, 61*a* of the insulating base member 51, 61. The front-face metal body 52, 62 is patterned as described in the preceding embodiments. As a result of the patterning, the insulating base member 51, 61 includes the exposed portion 510 or an exposed portion 610 exposed from the front-face metal body 52, 62. The exposed portion 510 of the insulating base member 51 as the first exposed portion and the exposed portion 610 of the insulating base member 61 as the second exposed portion overlap each other at least in part in the plan view in the Z direction. The exposed portions 510, 610 overlap each other. That is, at least part of the exposed portion 510 opposes the exposed portion 610 in the Z direction.

The back-face metal body 53, 63 is disposed on the back face 51*b*, 61*b* of the insulating base member 51, 61. The back-face metal body 53, 63 is exposed from the sealing body 30. In the back-face metal body 53, 63, a face opposite to an opposing face 53*a*, 63*a* with respect to the insulating base member 51 serves an exposed face 53*b*, 63*b*. The exposed face 53*b* is exposed to be substantially flush with the one face 30*a* of the sealing body 30. The exposed face 63*b* is exposed to be substantially flush with the back face 30*b* of the sealing body 30. The exposed face 53*b*, 63*b* form the back face 50*b*, 60*b* of the substrate 50, 60. The sealing body 30 includes a side face 30*e* as a second face in continuous with the one face 30*a* and the back face 30*b* as first faces. The side face 30*e* includes the side faces 30*c*, 30*d* in the Y direction and also includes a side face in the X direction. The side face 30*e* includes all the side faces. The side face 30*e* as the second face is a tapered face inclined with respect to the Z direction for removal of a die at the time of molding. The side face 30*e* includes a draft. In the preceding embodiments, a draft is omitted for convenience. The side face 30*e* includes a bent portion near the substantially center in the Z direction. The side face 30*e* approaches the semiconductor element 40 in the plan view in the Z direction as approaching the one face 30*a* and the back face 30*b* from the bent portion. That is, a positional relationship in the plan view is that the bent portion is on the outer side, and the one face 30*a* and the back face 30*b* are on the inner side. Hereinafter, the one face 30*a* and the back face 30*b* of the sealing body 30 may be referred to as "first face(s) 30*a*, 30*b*".

As illustrated in FIGS. 84 and 86, the substrate 50, 60 includes a laminate 500, 600. The laminate 500 has a two-layer structure of the insulating base member 51 and the back-face metal body 53. Similarly, the laminate 600 has a two-layer structure of the insulating base member 61 and the back-face metal body 63. In the laminates 500, 600, a side face connecting the front face 51*a*, 61*a* of the insulating base member 51, 61 and the corresponding exposed face 53*b*, 63*b* of the back-face metal body 53, 63 has a so-called V-cut shape. The side face of the laminate 500, 600 has a central portion protruding outward with respect to the front face 51*a*, 61*a* as an upper end and the exposed face 53*b*, 63*b* as a lower end.

The side face of the laminate 500, 600 includes a first inclined portion 501, 601, a second inclined portion 502, 602, and an intermediate portion 503, 603. First, the laminate 500 will now be described.

The first inclined portion 501 is a portion within a predetermined range from the front face 51*a*. The first inclined portion 501 has an inclination in which a distance from the center 50*sc* is smallest at the upper end on the front face 51*a* side in the plan view, and a distance from the center 50*sc* is farther at the lower end than on the upper end side. That is, the lower end is positioned on the outer side of the upper end in the first inclined portion 501. In FIG. 85, the first inclined portion 501 is provided at an edge portion of the substrate 50. The first inclined portion 501 has an annular shape so as to surround the front-face metal body 52.

In the present embodiment, the first inclined portion 501 has an inclination away from the center 50*sc* in the plan view as being away from the front face 51*a* in the Z direction. Accordingly, in the upper portion including the first inclined portion 501, the laminate 500 has the smallest area orthogonal to the Z direction at the front face 51*a*, and the area becomes larger as the distance from the front face 51*a* increases. The inclination of the first inclined portion 501 can tolerate manufacturing variation. The first inclined portion 501 macroscopically has the above-described inclination. The first inclined portion 501 is a tapered face.

The second inclined portion 502 is a portion within a predetermined range from the exposed face 53*b*. The second inclined portion 502 has an inclination in which a distance from the center 50*sc* is smallest at the lower end on the exposed face 53*b* side in the plan view, and a distance from the center 50*sc* is farther at the upper end than on the lower end side. That is, the upper end is positioned on the outer side of the lower end in the second inclined portion 502. Similarly to the first inclined portion 501, the second inclined portion 502 is provided at an edge portion of the substrate 50. The second inclined portion 502 has an annular shape so as to surround the back-face metal body 53.

In the present embodiment, the second inclined portion 502 has an inclination away from the center 50*sc* in the plan view as being away from the exposed face 53*b* in the Z direction. Accordingly, in the lower portion including the second inclined portion 502, the laminate 500 has the smallest area at the exposed face 53*b*, and the area becomes larger as the distance from the exposed face 53*b* increases. The inclination of the second inclined portion 502 can tolerate manufacturing variation. The second inclined portion 502 macroscopically has the above-described inclination. The second inclined portion 502 is a tapered face. Assuming that the first inclined portion 501 is tapered forwardly, the second inclined portion 502 is tapered inversely.

The intermediate portion 503 is continuous with the first inclined portion 501 and the second inclined portion 502. The intermediate portion 503 is a portion connecting the first inclined portion 501 and the second inclined portion 502 and has a predetermined length in the Z direction. The intermediate portion 503 is a vertex portion of a side face of the laminate 500. The side face of the laminate 500 is farthest from the center 50*sc* at the intermediate portion 503. The intermediate portion 503 is the outermost portion of the laminate 500 in the plan view. The laminate 500 has the largest area orthogonal to the Z direction at the intermediate portion 503. In the intermediate portion 503, the area of the laminate 500 is substantially constant. The distance between the first inclined portion 501 and the center 50*sc* in the plan view reduces as the distance from the intermediate portion 503 increases. The distance between the second inclined portion 502 and the center 50*sc* in the plan view reduces as the distance from the intermediate portion 503 increases.

The laminate 600 has a configuration that is the same as or similar to the configuration of the laminate 500. The first inclined portion 601 is a portion within a predetermined range from the front face 61*a*. The first inclined portion 601 has an inclination in which a distance from the center 60*sc* is smallest at the upper end on the front face 61*a* side in the plan view, and a distance from the center 60*sc* is farther at the lower end than on the upper end. That is, the lower end is positioned on the outer side of the upper end in the first inclined portion 601. The first inclined portion 601 is provided at an edge portion of the substrate 60. The first inclined portion 601 has an annular shape so as to surround the front-face metal body 62.

In the present embodiment, the first inclined portion 601 has an inclination away from the center 60*sc* in the plan view as being away from the front face 61*a* in the Z direction. Accordingly, in the upper portion including the first inclined portion 601, the laminate 600 has the smallest area orthogonal to the Z direction at the front face 61*a*, and the area becomes larger as the distance from the front face 61*a* increases. The inclination of the first inclined portion 601 can tolerate manufacturing variation. The first inclined portion 601 macroscopically has the above-described inclination. The first inclined portion 601 is a tapered face.

The second inclined portion 602 is a portion within a predetermined range from the exposed face 63*b*. The second inclined portion 602 has an inclination in which a distance from the center 60*sc* is smallest at the lower end on the exposed face 63*b* side in the plan view, and a distance from the center 60*sc* is farther at the upper end than on the lower end side. That is, the upper end is positioned on the outer side of the lower end in the second inclined portion 602. Similarly to the first inclined portion 601, the second inclined portion 602 is provided at an edge portion of the substrate 60. The second inclined portion 602 has an annular shape so as to surround the back-face metal body 63.

In the present embodiment, the second inclined portion 602 has an inclination away from the center 60*sc* in the plan view as being away from the exposed face 63*b* in the Z direction. Accordingly, in the lower portion including the second inclined portion 602, the laminate 600 has the smallest area at the exposed face 63*b*, and the area becomes larger as the distance from the exposed face 63*b* increases. The inclination of the second inclined portion 602 can tolerate manufacturing variation. The second inclined portion 602 macroscopically has the above-described inclination. The second inclined portion 602 is a tapered face. Assuming that the first inclined portion 601 is tapered forwardly, the second inclined portion 602 is tapered inversely.

The intermediate portion 603 is continuous with the first inclined portion 601 and the second inclined portion 602. The intermediate portion 603 is a portion connecting the first inclined portion 601 and the second inclined portion 602 and has a predetermined length in the Z direction. The intermediate portion 603 is a vertex portion of a side face of the laminate 600. The side face of the laminate 600 is farthest from the center 60*sc* at the intermediate portion 603. The intermediate portion 603 is the outermost portion of the laminate 600 in the plan view. The laminate 600 has the largest area orthogonal to the Z direction at the intermediate portion 603. In the intermediate portion 603, the area of the laminate 600 is substantially constant. The distance between the first inclined portion 601 and the center 60*sc* in the plan view reduces as the distance from the intermediate portion 603 increases. The distance between the second inclined portion 602 and the center 60*sc* in the plan view reduces as the distance from the intermediate portion 603 increases.

<Dimensions and Angles>

Figure 87:
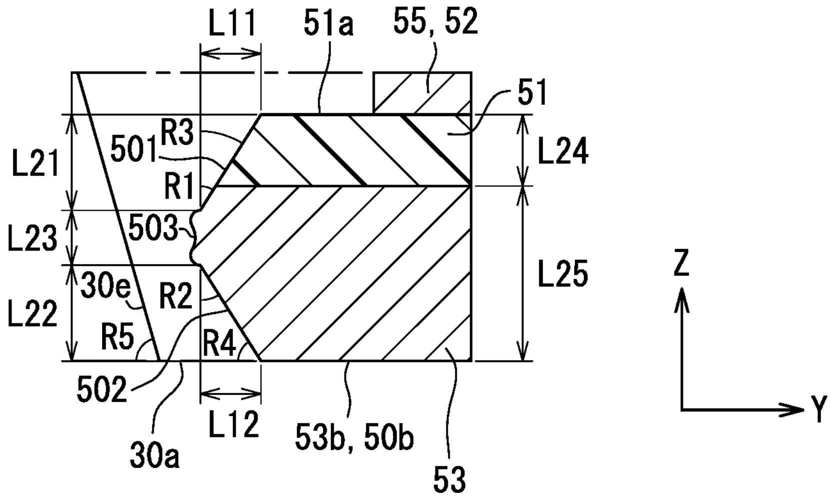
FIG. 87 is a view illustrating dimensions and angles.

Next, the dimension and the angle of the laminate 500, 600 will be described with reference to FIG. 87. FIG. 87 is a view corresponding to FIG. 86 and illustrates dimensions and angles. Hereinafter, the laminate 500 will be described as an example.

A length L11 illustrated in FIG. 87 is a length of the first inclined portion 501 in the plan view, that is, a width of the first inclined portion 501 having an annular shape. A length L12 is a length of the second inclined portion 502 in the plan view, that is, a width of the second inclined portion 502 having an annular shape. A length L21 is a length of the first inclined portion 501 in the Z direction, that is, a height of the first inclined portion 501. A length L22 is a length of the second inclined portion 502 in the Z direction, that is, a height of the second inclined portion 502. A length L23 is a length of the intermediate portion 503 in the Z direction, that is, a height of the intermediate portion 503. A length L24 is a length of the insulating base member 51 in the Z direction, that is, a thickness of the insulating base member 51. A length L25 is a length of the back-face metal body 53 in the Z direction, that is, a thickness of the back-face metal body 53.

An angle R1 is an inclination angle of the back-face metal body 53 in the first inclined portion 501 with respect to the Z direction that is the plate thickness direction of the semiconductor element 40. An angle R2 is an inclination angle of the back-face metal body 53 in the second inclined portion 502 with respect to the Z direction. An angle R3 is an inclination angle of the insulating base member 51 in the first inclined portion 501 with respect to the Z direction. An angle R4 is an inclination angle of the second inclined portion 502 with respect to the exposed face 53*b* of the back-face metal body 53. An angle R5 is an inclination angle of the side face 30*e* with respect to the one face 30*a* of the sealing body 30.

As illustrated in FIG. 87, in the present embodiment, the length of the second inclined portion 502 is smaller than the length of the first inclined portion 501. That is, the relationship of L11>L12 is satisfied. The angle R1 satisfies the relationship of 0°<R1≤45°, and the angle R2 satisfies the relationship of 0°<R2<45°. As the angle R1 is closer to 45°, heat generated at the semiconductor element 40 can be more effectively diffused. As the angle R2 is closer to 45°, the thermal resistance can be reduced as will be described later.

Further, the first inclined portion 501 is provided from the insulating base member 51 to the back-face metal body 53, and the second inclined portion 502 is provided at the back-face metal body 53. That is, the relationships of L21>L24 and L22<L25 is satisfied. In the configuration including the intermediate portion 503, the intermediate portion 503 is provided in the back-face metal body 53. That is, the relationship of L24<(L24+L25−L23)/2 is satisfied.

Further, in the configuration in which the first inclined portion 501 is provided from the insulating base member 51 to the back-face metal body 53, the inclination angle of the back-face metal body 53 is substantially equal to the inclination angle of the insulating base member 51. That is, the relationship of R1=R3 is satisfied.

Furthermore, the inclination angle of the second inclined portion 502 with respect to the exposed face 53*b* of the back-face metal body 53 is smaller than the inclination angle of the side face 30*e* (second face) with respect to the one face 30*a* (first face) of the sealing body 30. That is, the relationship of R4<R5 is satisfied. Although not described, the laminate 600 also has a configuration that is the same as or similar to the configuration of the laminate 500.

<Method of Manufacturing Laminate>

Next, an example of a method of manufacturing the above-described laminate 500 will be described. First, a mother substrate having a two-layer structure of the insulating base member 51 containing resin and the back-face metal body 53 is formed. Next, the mother substrate is simultaneously severed (cut into a V shape) with a blade from both sides of the front face 51*a* of the insulating base member 51 and the exposed face 53*b*. In this severing, the first inclined portion 501 and the second inclined portion 502 are formed without completely separating the mother substrate. In the mother substrate, the adjacent laminates 500 are connected at the intermediate portion 503. Then, the adjacent laminates 500 are separated (cut off) at the intermediate portion 503, so that the laminate 500 having the V-cut shaped side face can be obtained.

Figure 88:
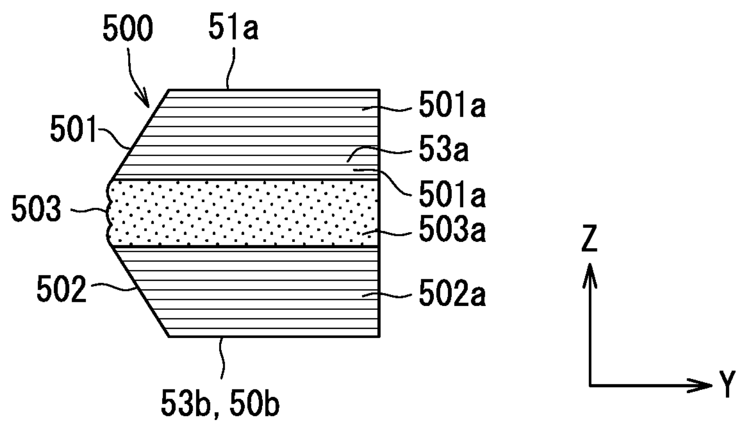
FIG. 88 is a side view of a laminate.

FIG. 88 is a side view of the laminate 500 obtained by the above-described manufacturing method. By severing (cutting) using the blade, the first inclined portion 501 includes a cutting mark 501*a* along the circumferential direction. Similarly, the second inclined portion 502 includes a cutting mark 502*a* along the circumferential direction. In order to separate the adjacent laminates 500 at the intermediate portion 503, the intermediate portion 503 includes an uneven portion 503*a*. Although not described, the laminate 600 is also formed by a method that is the same as or similar to the configuration of the laminate 500.

Summary of Ninth Embodiment

In the present embodiment, the side face of the laminate 500, 600 includes the first inclined portion 501, 601 and the second inclined portion 502, 602. That is, the side face has a bent shape (substantially V shape). As a result, even when peeling occurred in the sealing body 30 starting from the interface with the exposed face 53*b*, 63*b* progresses along the second inclined portion 502, 602, this peeling can be suppressed from progressing to reach the first inclined portion 501, 601 due to the bent shape. Thus, peeling can be suppressed from progressing to reach the front-face metal body 52, 62, the semiconductor element 40, and the bonded portion between the front-face metal body 52, 62 and the semiconductor element 40. In other words, thermal stress concentrates on the front-face metal bodies 52, 62, the semiconductor element 40, and the like described above, and thus a decrease in connection reliability and the like can be suppressed. Therefore, connection reliability can be enhanced.

Since the second inclined portion 502, 602 is provided, the back-face metal body 53, 63 can be suppressed from slipping off (falling) from the sealing body 30 when the above-described peeling occurs.

The heat spreads ideally at an angle of 45 degrees. In the present embodiment, the laminate 500, 600 includes the first inclined portion 501, 601 on the semiconductor element 40 side in the Z direction. With this configuration, the heat generated at the semiconductor element 40 diffuses above the bent portion, that is, in the portion corresponding to the first inclined portion 501, 601. On the other hand, since the second inclined portion 502, 602 is provided, the heat transfer path of the portion corresponding to the second inclined portion 502, 602 is narrower than the heat transfer path of the portion corresponding to the first inclined portion 501, 601. The narrow heat transfer path increases thermal resistance. In the present embodiment, the length L12 of the second inclined portion 502, 602 is made smaller than the length L11 of the first inclined portion 501, 601 (L11>L12). In this manner, as compared with the configuration satisfying L11≤L12, the length L22 of the second inclined portion 502, 602 in the Z direction can be shortened, and the thermal resistance below the bent portion can be reduced. That is, the heat diffused in the upper portion of the laminate 500, 600 can be efficiently dissipated from the exposed face 53*b*, 63*b*. As described above, the semiconductor device 20 according to the present embodiment can secure reliability while enhancing heat dissipation properties.

The first inclined portion 501, 601 may be provided on the insulating base member 51, 61, and the second inclined portion 502, 602 may be provided on the back-face metal body 53, 63. The first inclined portion 501, 601 may be provided on the insulating base member 51, 61, and the second inclined portion 502, 602 may be provided over the insulating base member 51, 61 and the back-face metal body 53, 63. In the present embodiment, the first inclined portion 501, 601 is provided over the insulating base member 51, 61 and the back-face metal body 53, 63, and the second inclined portion 502, 602 is provided at the back-face metal body 53, 63. That is, the bent portion is in the back-face metal body 53, 63. Thus, even when peeling occurred in the sealing body 30 starting from the interface with the exposed face 53*b*, 63*b* progresses along the second inclined portion 502, 602, this peeling can be suppressed from progressing to reach the interface with the insulating base member 51, 61. As a result, the thermal stress can be suppressed from concentrating to the insulating base member 51, 61 and from lowering the insulation reliability. That is, reliability can be further enhanced.

The first inclined portion 501, 601 and the second inclined portion 502, 602 may be continuous. In the present embodiment, the intermediate portion 503, 603 is provided between the first inclined portion 501, 601 and the second inclined portion 502, 602. In this configuration, the intermediate portion 503, 603 forms a bent portion. With the intermediate portion 503, 603 thus provided, as described above, even when the mother substrate is simultaneously severed (cut) from both the front face 51*a*, 61*a* of the insulating base member 51, 61 and the exposed face 53*b*, 63*b* of the back-face metal body 53, 63, contact between the blades can be avoided. The intermediate portion 503, 603 provided on the back-face metal body 53, 63 can suppress peeling from progressing to reach the interfaces with the insulating base member 51, 61, as described above.

In the configuration in which the first inclined portion 501, 601 is provided from the insulating base member 51, 61 to the back-face metal body 53, 63, the inclination angle R1 of the back-face metal body 53, 63 may be made different from the inclination angle R3 of the insulating base member 51, 61. For example, in the case of R1<R3, thermal stress concentrates on the end of the insulating base member 51, 61 containing resin, and thus the insulation performance may be deteriorated. In the case of R1>R3, thermal stress concentrates on the interfaces between the insulating base member 51, 61 and the back-face metal body 53, 63, and interface peeling may occur. In the present embodiment, the inclination angle R1 and the inclination angle R3 are set to substantially the same angle (R1=R3). That is, in the first inclined portion 501, 601, the inclined face of the insulating base member 51, 61 and the inclined face of the back-face metal body 53, 63 are continuous and substantially flush with each other. The inclined face of the insulating base member 51, 61 and the inclined face of the back-face metal body 53, 63 are continuous to form one flat face. As a result, thermal stress can be suppressed from concentrating at a point at which the sealing body 30, the insulating base member 51, 61, and the back-face metal body 53, 63 meat.

The inclination angle R4 of the second inclined portion 502, 602 with respect to the exposed face 53*b*, 63*b* may be set to be equal to or greater than the inclination angle R5 of the side face 30*e* (second face) with respect to the first face 30*a*, 30*b* of the sealing body 30. In the present embodiment, the inclination angle R4 is set to be smaller than the inclination angle R5 (R4<R5). As described in the preceding embodiment (see, for example, FIG. 72), the semiconductor device 20 warps when the semiconductor element 40 generates heat. As described above, when the configuration having the warped shape with high heat dissipation properties is adopted, peeling easily occurs at the interface between the back-face metal body 53, 63 and the sealing body 30 due to the warpage protruding in the Z direction. With the configuration satisfying the relationship of R4<R5, the back-face metal body 53, 63 can be suppressed from slipping off from the sealing body 30 even when peeling occurs.

In the present embodiment, the exposed portion 510 of the insulating base member 51 as the first exposed portion and the exposed portion 610 of the insulating base member 61 as the second exposed portion overlap each other in the plan view in the Z direction. As a result, an arrangement imbalance between the front-face metal body 52 of the substrate 50 as the first substrate and the front-face metal body 62 of the substrate 60 as the second substrate can be suppressed, and thus, a warpage imbalance of the semiconductor device 20 can be suppressed. The interface peeling between the back-face metal body 53, 63 and the sealing body 30 can be suppressed from easily occurring on the side where large deformation occurs due to the uneven warpage.

In the present embodiment, the first inclined portion 501 and the second inclined portion 502 respectively include the cutting marks 501*a*, 502*a* along the circumferential direction. With the cutting marks 501*a*, 502*a*, an anchor effect is generated, and an adhesive force with the sealing body 30 is increased. As a result, the sealing body 30 can be suppressed from being peeled from the laminate 500, 600. Note that a cutting mark along the circumferential direction may be provided only on one of the first inclined portion 501 and the second inclined portion 502. In the present embodiment, since the intermediate portion 503 also includes the uneven portion 503*a*, suppression of peeling due to the anchor effect can be expected.

<Modifications>

Although the example of the semiconductor device 20 having the double-sided heat dissipation structure including the pair of substrates 50, 60 has been described, the present disclosure is not limited thereto. The present disclosure can also be applied to the semiconductor device 20 having a single-sided heat dissipation structure including only the substrate 50 to which the drain electrode 40D (first main electrode) is connected. In the semiconductor device 20 including the pair of substrates 50, 60, the above-described structure (V-cut shape) may be applied only to one of the substrates 50, 60.

An example in which the semiconductor device 20 includes the semiconductor elements 40H, 40L, but the present disclosure is not limited thereto. Only the semiconductor element 40 constituting one of the arms may be provided. The semiconductor device 20 may include, for example, only one semiconductor element 40.

The configuration described in the present embodiment can be combined with any of the configurations described in the first embodiment, the second embodiment, the third embodiment, the fourth embodiment, the fifth embodiment, the sixth embodiment, the seventh embodiment, the eighth embodiment, and the modifications thereof.

Tenth Embodiment

This embodiment is a modification based on the preceding embodiment, and the description of the preceding embodiment can be incorporated. In order to enhance the connection reliability, as will be described in the present embodiment, the sintered member as a bonding member may be disposed in a predetermined arrangement.

<Semiconductor Device>

Figure 89:
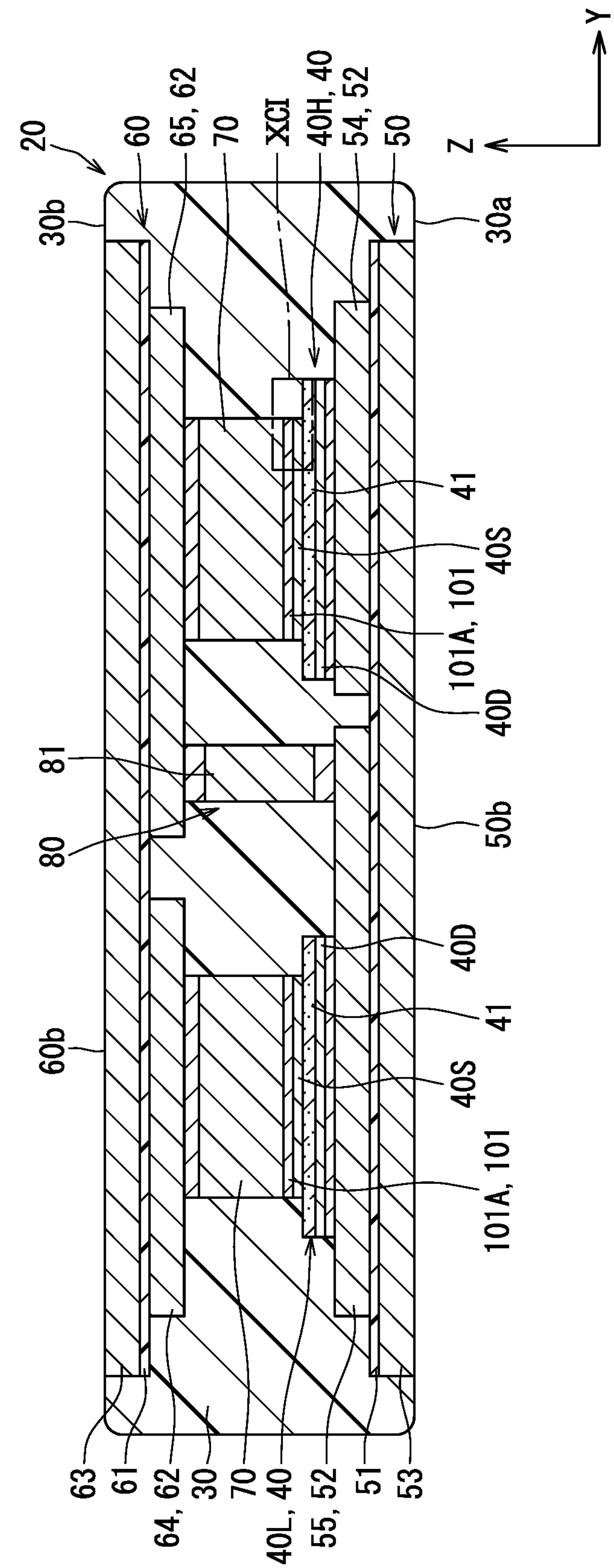
FIG. 89 is a sectional view illustrating a semiconductor device according to a tenth embodiment.

First, the semiconductor device 20 according to the present embodiment will be described with reference to FIG. 89. FIG. 89 is a sectional view corresponding to FIG. 5. In FIG. 89, illustration of the external connection terminals 90 is omitted for convenience.

The semiconductor device 20 according to the present embodiment has a configuration that is the same as or similar to the configuration described in the preceding embodiment (see FIGS. 2 to 13). As illustrated in FIG. 89, the semiconductor device 20 includes the semiconductor elements 40 (40H, 40L), the substrates 50, 60 that are wiring members disposed so as to sandwich the semiconductor elements 40 in the Z direction, and the sealing body 30. The front-face metal body 52 of the substrate 50 as the first wiring member is connected to the drain electrode 40D as the first main electrode of the semiconductor element 40. The front-face metal body 62 of the substrate 60 as the second wiring member is connected to the source electrode 40S as the second main electrode of the semiconductor element 40 via the conductive spacer 70 as the second wiring member. The sealing body 30 seals the semiconductor element 40, the substrates 50, 60, and the conductive spacer 70. The source electrode 40S and the conductive spacer 70 are bonded by a sintered member 101A as the bonding member 101.

<Semiconductor Element>

Figure 90:
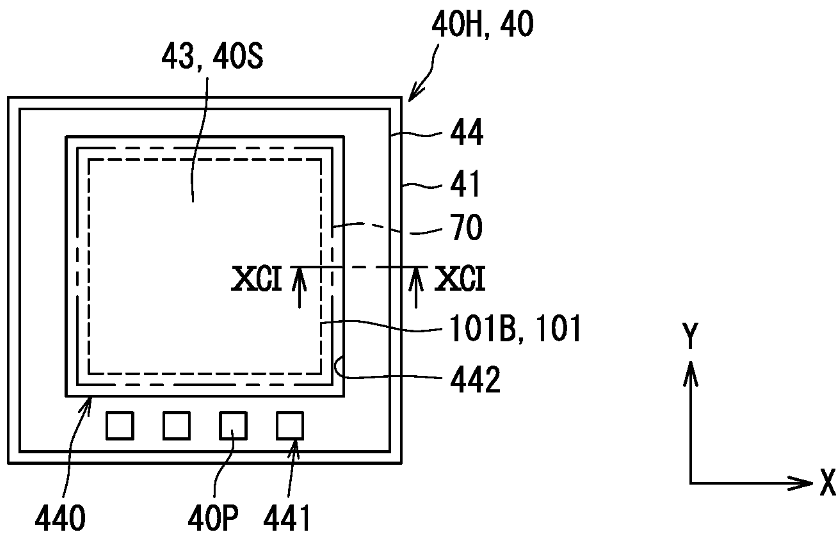
FIG. 90 is a plan view illustrating the semiconductor element.
Figure 91:
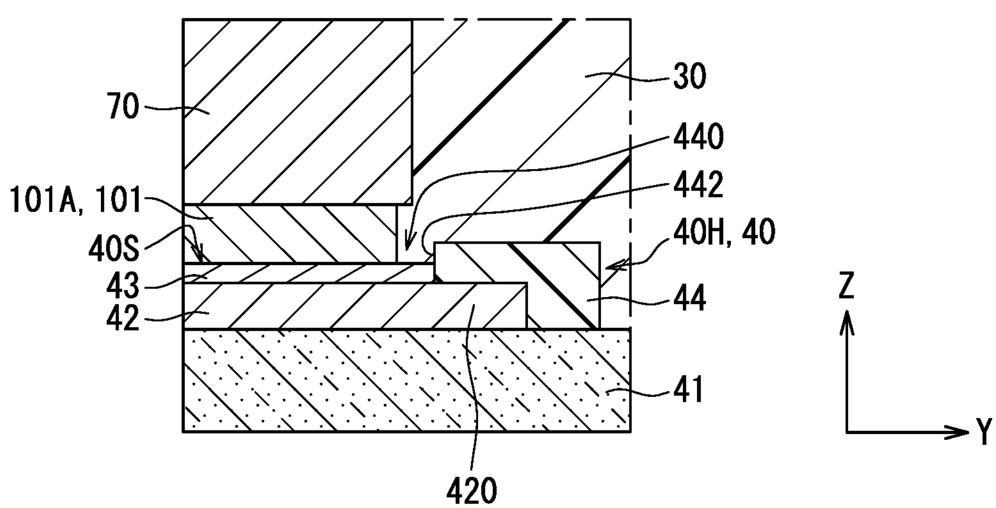
FIG. 91 is an enlarged view of a region XCI in FIG. 89.

Next, the semiconductor element 40 will be described with reference to FIGS. 90 and 91. FIG. 90 is a plan view illustrating the semiconductor element 40 (40H). FIG. 91 is an enlarged view of a region XCI in FIG. 89. FIG. 91 is a sectional view taken along line XCI-XCI of FIG. 90.

Although FIG. 91 illustrates the semiconductor element 40H, the semiconductor element 40L has the same or similar configuration, and thus will be described below as the semiconductor element 40.

As described above, the semiconductor element 40 includes a semiconductor substrate 41 on which the switching element is formed. The semiconductor substrate 41 has a substantially rectangular shape in the plan view. The drain electrode is provided on one face of the semiconductor substrate 41, and the source electrode 40S and the pad 40P are provided on the back face of the semiconductor substrate 41. The source electrode 40S has a multilayer structure. The source electrode 40S includes an underlying electrode 42 and a connection electrode 43. The pad 40P also has a configuration that is the same as or similar to the configuration of the source electrode 40S.

The semiconductor element 40 further includes a protective film 44. The protective film 44 is an insulating film provided on the back face of the semiconductor substrate 41 so as to cover the peripheral edge portion of the source electrode 40S. As a material of the insulating film, for example, polyimide, a silicon nitride film, or the like can be adopted. The protective film 44 includes an opening 440 that defines a connection region in the source electrode 40S. The opening 440 exposes the source electrode 40S so as to be able to be bonded. The protective film 44 includes an opening 441 that defines a connection region in the pad 40P. Both the openings 440, 441 are through holes passing through the protective film 44 in the Z direction. A portion of the source electrode 40S (connection electrode 43) exposed from the opening 440 of the protective film 44 forms a bonded portion with the sintered member 101A.

The protective film 44 according to the present embodiment includes polyimide. The protective film 44 covers a below-described peripheral edge portion 420 of the underlying electrode 42. The protective film 44 is not provided, for example, in a scribe region in a predetermined range from the outer peripheral end of the semiconductor substrate 41. The opening shape of the opening 440, that is, an inner peripheral face 442 of the protective film 44, defining the opening 440, has a substantially rectangular shape in the plan view. The inner peripheral face 442 may be referred to as an inner peripheral end or an opening end.

The underlying electrode 42 is a metal layer formed adjacent to the semiconductor substrate 41 in the source electrode 40S having a multilayer structure. The underlying electrode 42 may be referred to as a "lower electrode", "lower layer electrode", "wiring electrode", "underlying layer", "first metal layer", or the like. The underlying electrode 42 is connected to the back face of the semiconductor substrate 41. The underlying electrode 42 is formed using, for example, a material containing Al (aluminum) as a main component. In the present embodiment, the underlying electrode 42 includes an AlSi-based alloy such as AlSi or AlSiCu.

The underlying electrode 42 includes an element region (active region; not illustrated) of the semiconductor substrate 41 and extends onto an outer peripheral region surrounding the element region in the plan view. The peripheral edge portion 420 of the underlying electrode 42 has a substantially rectangular frame shape in the plan view. The peripheral edge portion 420 is covered with the protective film 44.

The connection electrode 43 is disposed to be laminated on the underlying electrode 42. The connection electrode 43 is also referred to as an "overlying electrode", "upper electrode", "upper layer electrode", "upper layer", or "second metal layer". The connection electrode 43 contains at least a noble metal such as Au (gold), Ag (silver), Pt (platinum), or Pd (palladium) for bonding with the sintered member 101A. The connection electrode 43 may contain a base metal together with a noble metal.

The connection electrode 43 according to the present embodiment contains nickel (Ni). Ni is harder than the Al alloy constituting the underlying electrode 42. The connection electrode 43 contains Ni and a noble metal, for example, Au or Ag. The connection electrode 43 is formed to have multiple layers by, for example, a plating method. At least part of the noble metal of the connection electrode 43 diffuses into the sintered member 101A at the time of bonding.

The connection electrode 43 is disposed to be laminated on the underlying electrode 42 in the opening 440 of the protective film 44. The outer peripheral end of the connection electrode 43 is in contact with the inner peripheral face 442 of the protective film 44 over the entire circumference.

<Bonding Structure>

Figure 92:
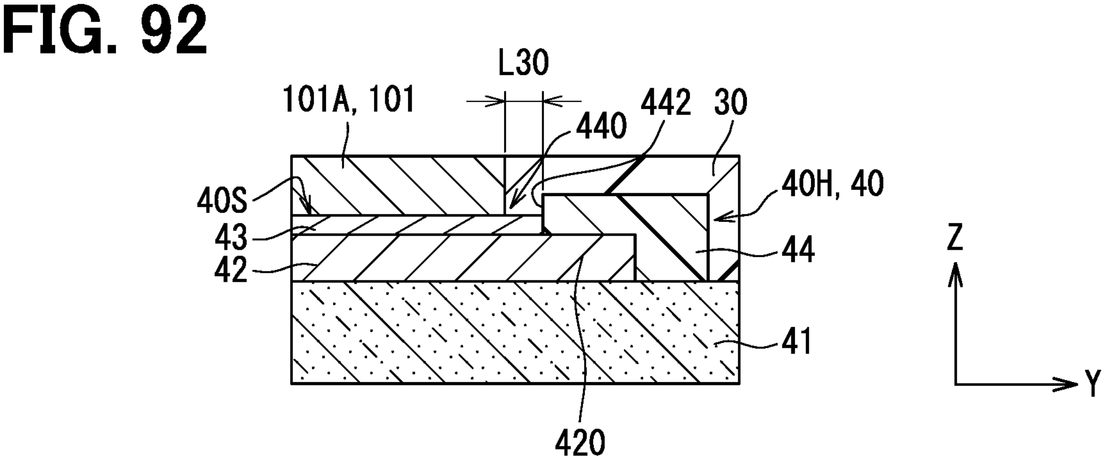
FIG. 92 is a sectional view illustrating an arrangement of sintered members.

Next, a bonding structure of the semiconductor element 40 will be described with reference to FIGS. 90 to 92. In FIG. 90, the outer peripheral end of the sintered member 101A is denoted by a dashed line, and the outer peripheral end of the conductive spacer 70 is denoted by a long and double-short dashed line. FIG. 92 is a sectional view illustrating an arrangement of the sintered members 101A. FIG. 92 corresponds to FIG. 91. Hereinafter, "inner side", "inside" or "inward", and "outer side" or "outside" or "outward" indicate a relative positional relationship with the center of the semiconductor element 40 as a reference position in the plan view in the Z direction. The side closer to the center is the inner side, and the side farther from the center is the outer side.

In the present embodiment, the substrate 60 and the conductive spacer 70 are wiring members (second wiring members) electrically connected to the source electrode 40S. As illustrated in FIGS. 90 and 91, the sintered member 101A is interposed between the source electrode 40S of the semiconductor element 40 and the conductive spacer 70. The sintered member 101A bonds together the source electrode 40S and the conductive spacer 70.

The sintered member 101A includes Ag or Cu. The sintered member 101A is a sintered body of Ag particles or Cu particles. The sintered member 101A enables bonding at a low temperature as compared with solder. As illustrated in FIG. 92, the sintered member 101A is disposed with a predetermined distance L30 from the inner peripheral face 442 of the protective film 44. As illustrated in FIGS. 90 to 92, the sintered member 101A is disposed further on the inner side than the inner peripheral face 442. The sintered member 101A has, for example, a substantially rectangular shape in the plan view. The outer peripheral end of the sintered member 101A is not in contact with the protective film 44 over the entire circumference. That is, the inner peripheral face 442 of the protective film 44 includes the sintered member 101A in the plan view.

The conductive spacer 70 includes a metal film (not illustrated) on a bonding face with the sintered member 101A. Similarly to the connection electrode 43, the metal film contains at least noble metal. In the present embodiment, the metal film is a plating film containing Ni and a noble metal, for example, Au or Ag.

As illustrated in FIGS. 90 to 92, the conductive spacer 70 is disposed further on the inner side than the inner peripheral face 442. The conductive spacer 70 has, for example, a substantially rectangular shape in the plan view. The outer peripheral end of the conductive spacer 70 is disposed further on the outer side than or so as to substantially match the outer peripheral end of the sintered member 101A in the plan view. That is, the conductive spacer 70 is disposed so as to include the sintered member 101A or substantially match the sintered member 101A in the plan view. In the present embodiment, the conductive spacer 70 includes the sintered member 101A.

<Bonding Method>

Figure 93:
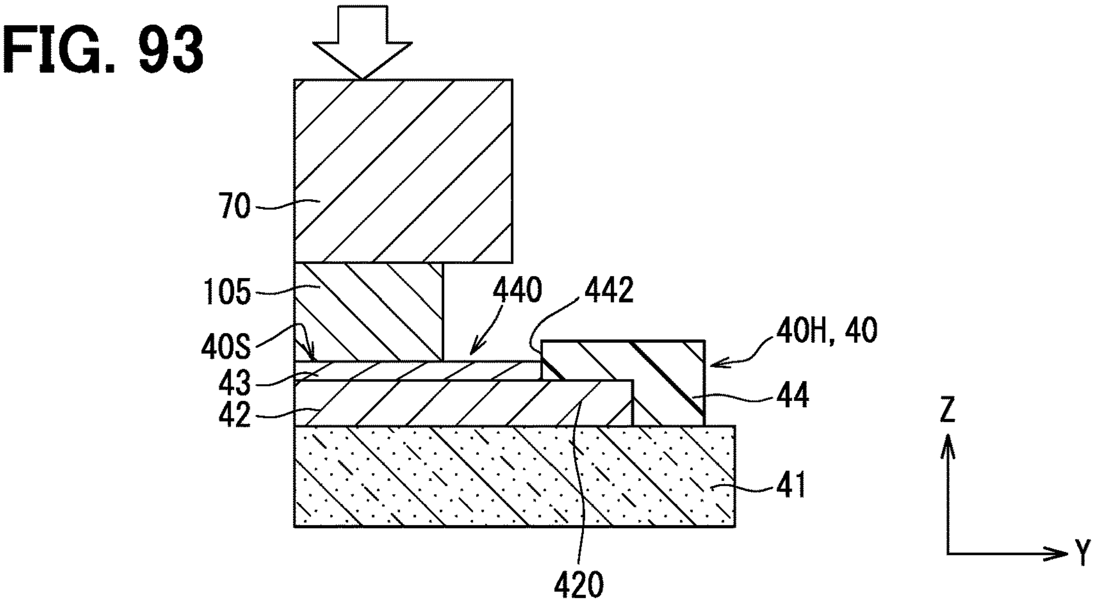
FIG. 93 is a sectional view illustrating a bonding method.

Next, a method of forming the above-described bonding structure, that is, the bonding method will be described with reference to FIG. 93. FIG. 93 is a sectional view illustrating a bonding method. FIG. 93 corresponds to FIG. 91.

In the present embodiment, a sheet 105 for sintering is used to form the sintered member 101A. The sheet 105 for sintering may be referred to as a "sintered film". The sheet 105 for sintering contains Ag or Cu. As illustrated in FIG. 93, the sheet 105 for sintering is disposed on the source electrode 40S (connection electrode 43) of the semiconductor element 40. The sheet 105 for sintering has a predetermined size such that the sheet 105 for sintering is not in contact with the protective film 44 in the plan view.

Next, the conductive spacer 70 is disposed on the sheet 105 for sintering. Then, while heating, the pressure is applied from the conductive spacer 70 side by a pressurizing device (not illustrated). As a result, the sheet 105 for sintering is pushed and spread between the opposing faces between the connection electrode 43 and the conductive spacer 70 to reduce the thickness, and is sintered to become the sintered member 101A. The size of the sheet 105 for sintering is determined such that the sintered member 101A has the above-described predetermined positional relationship with respect to the inner peripheral face 442 of the protective film 44 and the conductive spacer 70.

<Simulation Results>

Figure 94:
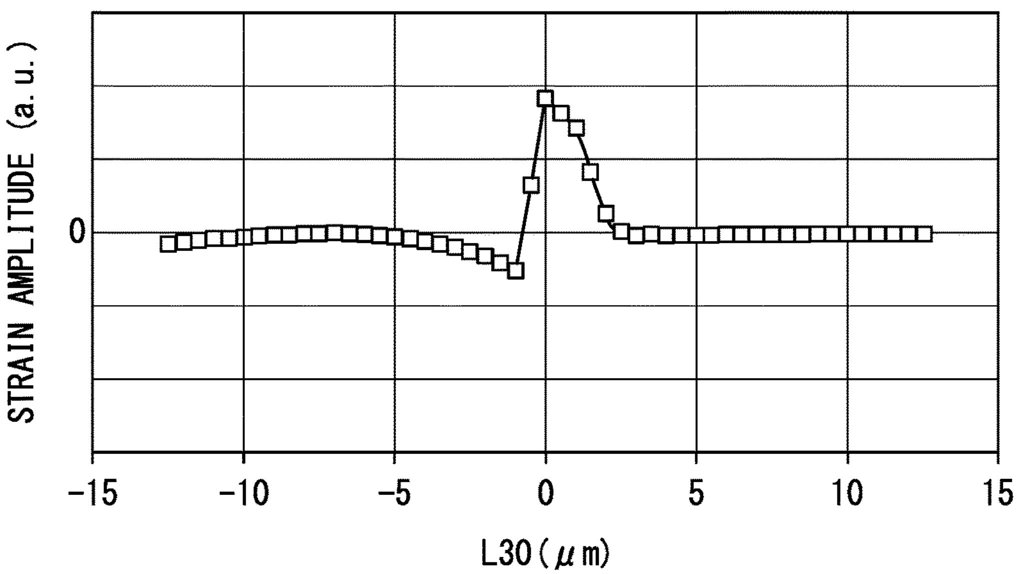
FIG. 94 is a graph indicating the relationship between the distance between the inner peripheral face of the protective film and the sintered member and the strain amplitude of the underlying electrode.

FIG. 94 illustrates results of thermal stress simulation. In this simulation, the strain amplitude generated in the underlying electrode 42 was measured in a power cycle test in which changing the temperature from room temperature to 150° C., and vice versa, were alternately repeated. FIG. 94 indicates the relationship between the above-described distance L30 and the strain amplitude. In FIG. 94, 0 (zero) of the distance L30 is a position that matches the inner peripheral face 442 of the protective film 44 in the plan view. A negative numerical value of the distance L30 indicates a distance from the inner peripheral face 442 to the inner side, and a positive numerical value indicates a numerical value to the outer side.

As indicated in FIG. 94, the following has become clear: the strain amplitude generated in the underlying electrode 42 is substantially 0 (zero) when the distance L30 is 5 μm or more. Based on this finding, the predetermined distance L30 is set to 5 μm in the present embodiment.

Summary of Tenth Embodiment

Figure 95:
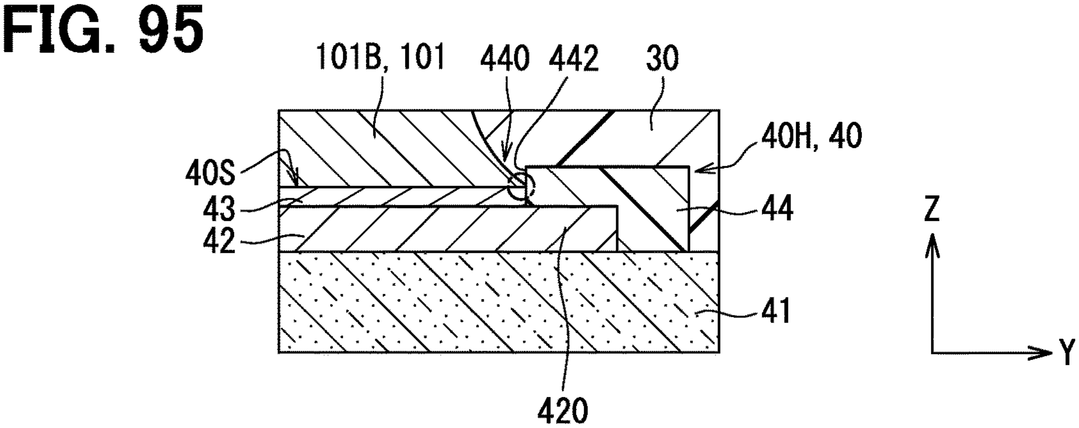
FIG. 95 is a sectional view illustrating an arrangement of solder as a bonding member.

FIG. 95 illustrates a connection structure using solder 101B as the bonding member 101. FIG. 95 corresponds to FIG. 93. In the case of using the solder 101B, the solder 101B is reflowed to perform bonding. At the time of bonding, the molten solder 101B spreads and wets the surface of the connection electrode 43. Therefore, as indicated by an alternate long and short dashed line in FIG. 95, a point at which the sealing body 30, the source electrode 40S (connection electrode 43), and the solder 101B (bonding member 101) meat is formed. Thermal stress based on a difference in linear expansion coefficient is concentrated on this point. The thermal stress concentrates on a portion immediately below the outer peripheral end of the connection electrode 43 in the underlying electrode 42. Therefore, the underlying electrode 42 may be cracked, and the semiconductor substrate 41 may thus be damaged.

In the present embodiment, the sintered member 101A is adopted instead of the solder 101B. The sintered member 101A is formed by heating at a temperature lower than the melting point. The sintered member 101A is not brought into a molten state at the time of bonding unlike the solder 101B. The sintered member 101A has low wettability to the connection electrode 43 and the conductive spacer 70 as compared with the solder 101B. Therefore, the sintered member 101A does not spread and wet the surface of the connection electrode 43 and the surface of the conductive spacer 70 at the time of bonding unlike the solder 101B.

Since the sintered member 101A is easily held at a predetermined position, the sintered member 101A can be disposed with a predetermined distance L30 from the inner peripheral face 442 of the protective film 44. Therefore, a point at which the sealing body 30, the source electrode 40S (connection electrode 43), and the sintered member 101A (bonding member 101) meat is not formed. Therefore, the semiconductor device 20 that can suppress concentration of thermal stress and has high connection reliability can be provided. The sintered member 101A has higher thermal conductivity than the solder 101B. Accordingly, heat dissipation properties can also be enhanced.

The distance L30 is not particularly limited. It is sufficient that the sintered member 101A be separated from at least the inner peripheral face 442. In the present embodiment, the distance L30 between the sintered member 101A and the inner peripheral face 442 of the protective film 44 is 5 μm or more. With this distance L30, the strain amplitude of the underlying electrode 42 due to thermal stress can be effectively reduced. That is, connection reliability can be further enhanced.

In the plan view, the positional relationship between the conductive spacer 70 and the sintered member 101A is not particularly limited. For example, the sintered member 101A may protrude from the conductive spacer 70 in the plan view. As described above, the sintered member 101A is formed by sintering Ag particles or Cu particles by heating and pressurization. The portion protruding from the conductive spacer 70 is not pressurized, and thus the portion may remain without being sintered and fall as a conductive foreign substance. Accordingly, a short circuit or the like may occur.

In the present embodiment, the inner peripheral face 442 of the protective film 44 includes the conductive spacer 70, and the conductive spacer 70 matches or includes the sintered member 101A in the plan view. With this arrangement, pressure can be applied to the entire region of the sintered member 101A (sheet 105 for sintering) before sintering via the conductive spacer 70. Therefore, the generation of a sintered residue can be suppressed while avoiding contact between the sintered member 101A and the protective film 44.

<Modifications>

An example in which the sheet 105 for sintering is used to form the sintered member 101A has been described, but the present disclosure is not limited thereto. For example, a paste for sintering in which Ag particles or Cu particles are dispersed in a solvent may be used. The sheet 105 for sintering is more easily held at a predetermined position than the paste for sintering.

The example in which the second wiring member to which the source electrode 40S is connected includes the substrate 60 as a wiring board and the conductive spacer 70 has been described, but the present disclosure is not limited thereto. The front-face metal body 62 may be provided with a projection instead of the conductive spacer 70. That is, the second wiring member may include only the substrate 60 without including the conductive spacer 70. In this case, the sintered member 101A is interposed between the distal end face of the projection of the front-face metal body 62 and the source electrode 40S (connection electrode 43).

Although an example in which the substrate 50 is adopted as the first wiring member has been described, the present disclosure is not limited thereto. A metal plate (lead frame) may be adopted instead of the substrate 50. Although an example in which the substrate 60 is adopted as the second wiring member has been described, the present disclosure is not limited thereto. A metal plate (lead frame) may be adopted instead of the substrate 60. The second wiring member may include a metal plate and the conductive spacer 70, or may include a projection on the metal plate instead of the conductive spacer 70.

An example in which the semiconductor device 20 includes the semiconductor elements 40H, 40L, but the present disclosure is not limited thereto. Only the semiconductor element 40 constituting one of the arms may be provided. The semiconductor device 20 may include, for example, only one semiconductor element 40.

The configuration described in the present embodiment can be combined with any of the configurations described in the first embodiment, the second embodiment, the third embodiment, the fourth embodiment, the fifth embodiment, the sixth embodiment, the seventh embodiment, the eighth embodiment, the ninth embodiment, and the modifications thereof.

Eleventh Embodiment

This embodiment is a modification based on the preceding embodiment, and the description of the preceding embodiment can be incorporated. In order to enhance the heat dissipation properties, as will be described in the present embodiment, the sintered member may be used for bonded portion between the main electrode and the wiring member.

<Semiconductor Device>

Figure 96:
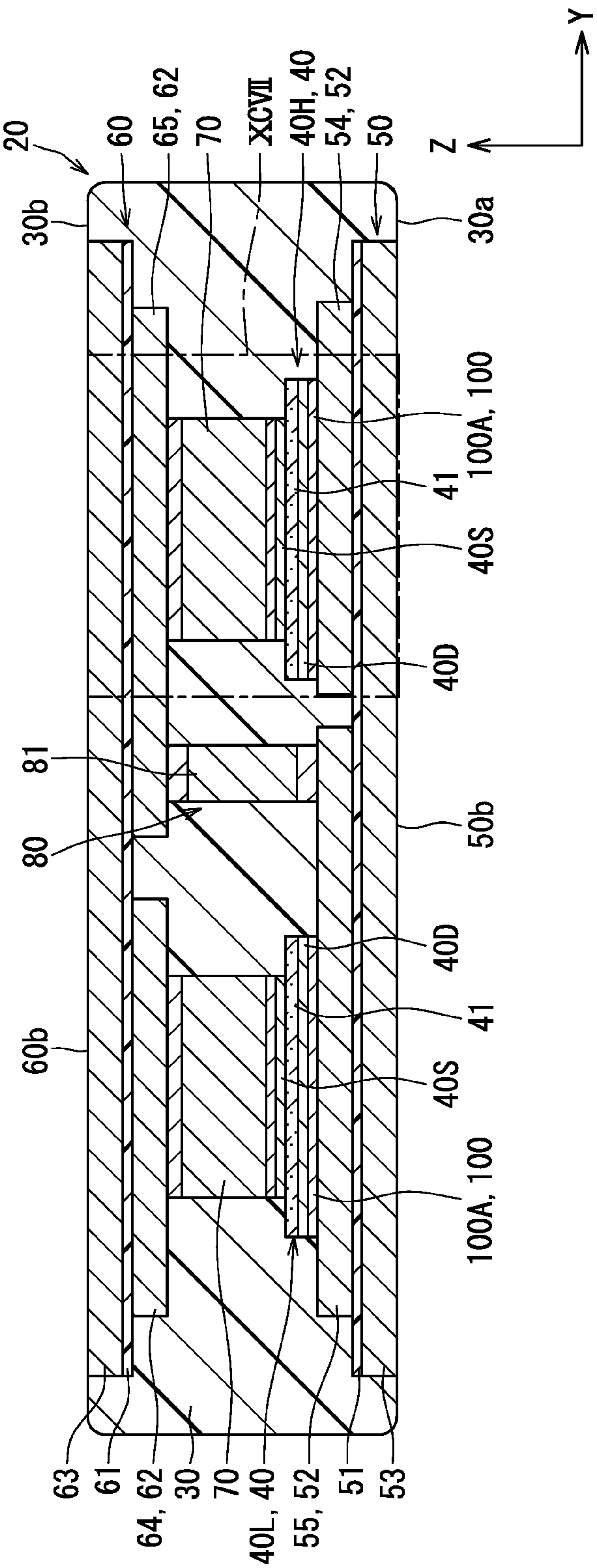
FIG. 96 is a sectional view illustrating a semiconductor device according to an eleventh embodiment.

First, the semiconductor device 20 according to the present embodiment will be described with reference to FIG. 96. FIG. 96 is a sectional view corresponding to FIG. 5. In FIG. 96, illustration of the external connection terminals 90 is omitted for convenience.

The semiconductor device 20 according to the present embodiment has a configuration that is the same as or similar to the configuration described in the preceding embodiment (see FIGS. 2 to 13). As illustrated in FIG. 96, the semiconductor device 20 includes the semiconductor elements 40 (40H, 40L), the substrates 50, 60 that are wiring members disposed so as to sandwich the semiconductor elements 40 in the Z direction, and the sealing body 30. The front-face metal body 52 of the substrate 50 is connected to the drain electrode 40D as the first main electrode of the semiconductor element 40. The front-face metal body 62 of the substrate 60 is connected to the source electrode 40S as the second main electrode of the semiconductor element 40 via the conductive spacer 70. The sealing body 30 seals the semiconductor element 40, the substrates 50, 60, and the conductive spacer 70. The drain electrode 40D and the front-face metal body 52 of the substrate 50 are bonded by a sintered member 100A as the bonding member 100.

<Arrangement of Sintered Member and Uneven Oxide Film>

Figure 97:
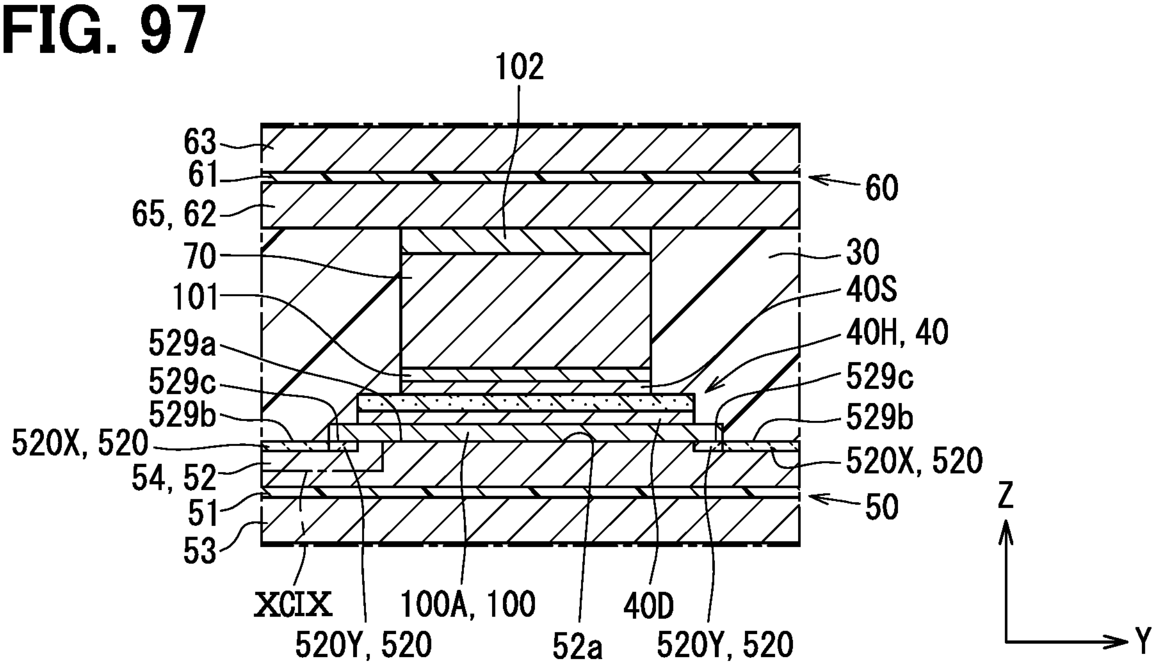
FIG. 97 is an enlarged view of a region XCVII in FIG. 96.
Figure 98:
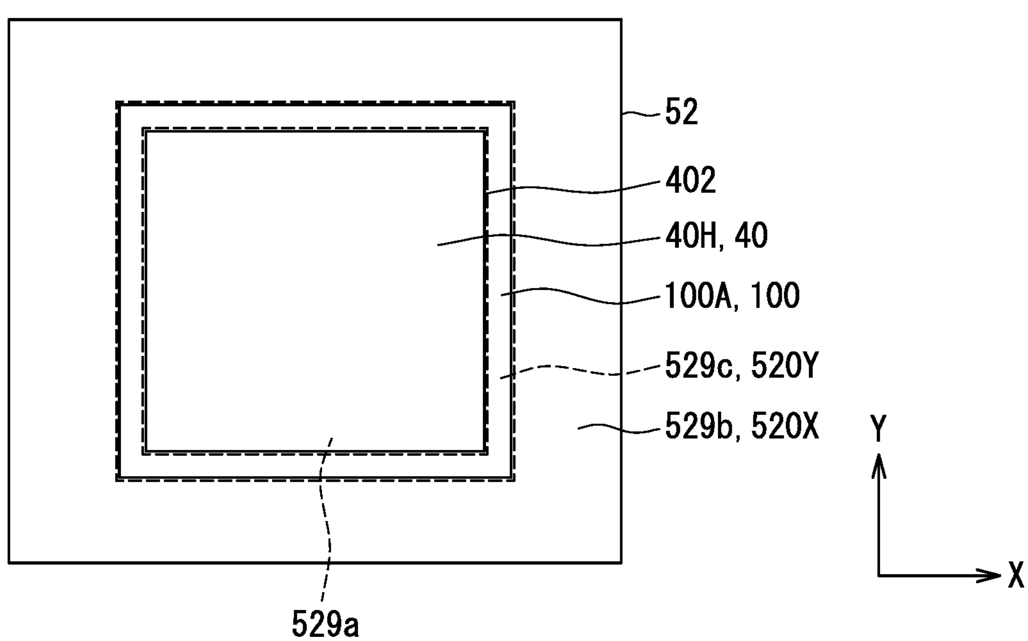
FIG. 98 is a plan view illustrating an arrangement of a semiconductor element, a sintered member, and an uneven oxide film.
Figure 99:
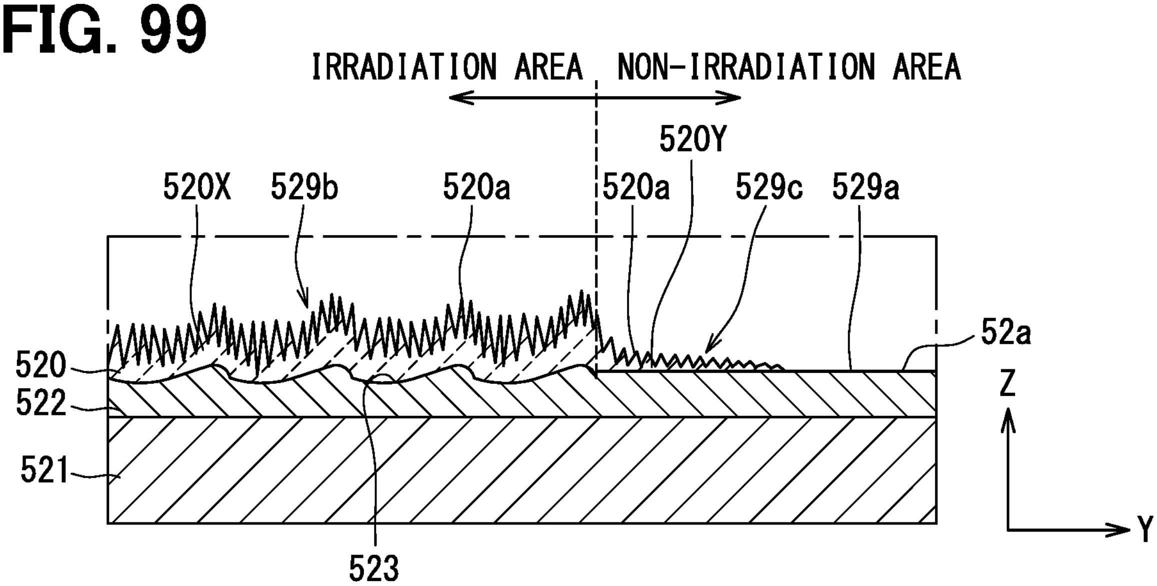
FIG. 99 is an enlarged view of a region XCIX in FIG. 97.

Next, the arrangement of the sintered member 100A and the uneven oxide film 520 with respect to the semiconductor element 40 will be described with reference to FIGS. 97 to 99. FIG. 97 is an enlarged view of a region XCVII in FIG. 96. FIG. 98 is a plan view illustrating a positional relationship of the semiconductor element 40, the sintered member 100A, and the uneven oxide film 520. FIG. 99 is an enlarged view of a region XCVIX in FIG. 97.

As illustrated in FIGS. 97 and 98, the upper face 52*a* of the front-face metal body 52 includes a mounting portion 529*a*, an outer peripheral portion 529*b*, and an intermediate portion 529*c*. The uneven oxide film 520 is not provided on the mounting portion 529*a*, but is provided on the outer peripheral portion 529*b* and the intermediate portion 529*c*.

The mounting portion 529*a* includes a portion overlapping the semiconductor element 40 (drain electrode 40D) in the plan view in the Z direction, and is a portion to which the drain electrode 40D is bonded via the sintered member 100A. The outer peripheral portion 529*b* includes a portion further on the outer side than an outer peripheral end 402 of the semiconductor element 40 in the plan view and surrounds the semiconductor element 40. The intermediate portion 529*c* is a portion between the mounting portion 529*a* and the outer peripheral portion 529*b*, and surrounds the mounting portion 529*a*. In the present embodiment, the mounting portion 529*a* substantially matches the semiconductor element 40 (drain electrode 40D) in the plan view. The intermediate portion 529*c* has a substantially rectangular frame shape in the plan view, and an inner peripheral end of the intermediate portion 529*c* substantially matches the outer peripheral end 402 of the semiconductor element 40. The entire region of the intermediate portion 529*c* is positioned outside the semiconductor element 40 in the plan view.

As illustrated in FIGS. 97 to 99, the front-face metal body 52 of the substrate 50 includes the uneven oxide film 520 as in the configuration described in the preceding embodiment (see FIGS. 67 and 74). As illustrated in FIG. 99, the front-face metal body 52 includes the base material 521, the metal film 522 and the uneven oxide film 520 provided on the surface of the base material 521.

The metal film 522 according to the present embodiment includes a lower base film containing Ni as a main component and an upper base film containing a noble metal, for example, Au or Ag as a main component, which can be bonded to the sintered member 100A. Specifically, as the lower base film, a Ni plating film containing P and an Au plating film are adopted. A plurality of dents 523 are formed in the outer peripheral portion 529*b* in the upper face 52*a* of the metal film 522. No dent 523 is formed in the mounting portion 529*a* and the intermediate portion 529*c*. In the portion where the dent 523 is not formed, the film thickness of the metal film 522 is, for example, about 10 μm. That is, the film thickness before irradiation with laser light is about 10 μm. The dent 523 is formed by irradiation of pulsed laser light. One dent 523 is formed per pulse. In the outer peripheral portion 529*b*, the surface of the metal film 522 has a scaly shape due to the plurality of dents 523. The outer peripheral portion 529*b* is an irradiation area of laser light, and the mounting portion 529*a* and the intermediate portion 529*c* are non-irradiation areas.

The uneven oxide film 520 is formed on the metal film 522. The uneven oxide film 520 is not formed on the mounting portion 529*a*, but is formed on the outer peripheral portion 529*b* and the intermediate portion 529*c*, both of which are peripheral portions of the mounting portion 529*a*. As described in the preceding embodiment, the uneven oxide film 520 is formed by irradiating the metal film 522 with laser light. The uneven oxide film 520 is a laser irradiation film formed by irradiation with laser light. The main component of the uneven oxide film 520 is an oxide of the main component metal of the metal film 522.

In the outer peripheral portion 529*b*, that is, in the irradiation area of the laser light, the average film thickness of the uneven oxide film 520 is 10 nm to several hundred nanometers. The uneven oxide film 520 is formed to follow the recesses and protrusions of the surface of the metal film 522 having the dent 523. On the surface of the uneven oxide film 520, recesses and protrusions are formed at a pitch finer than the width of the dent 523. That is, very fine recesses and protrusions (roughened portion) are formed. In other words, a plurality of projections 520*a* (columnar bodies) is formed at a fine pitch. For example, the average width of the projections 520*a* is 1 nm to 300 nm, and the average interval between the projections 520*a* is 1 nm to 300 nm. The average height of the projections 520*a* is 10 nm to several hundred nanometers.

The uneven oxide film 520 is formed by irradiating the metal film 522 with laser light and melting and depositing the face layer of the metal film 522. The uneven oxide film is thus formed not only in the outer peripheral portion 529*b* that is the irradiation area of the laser light, but also in the periphery (vicinity) of the outer peripheral portion 529*b*. In the present embodiment, the uneven oxide film 520 is formed over the entire region of the intermediate portion 529*c* in the non-irradiation area of the laser light. However, the uneven oxide film 520 is not formed on the mounting portion 529*a* in the non-irradiation area of the laser light. The width of the intermediate portion 529*c* including the uneven oxide film 520 in the entire region is, for example, 0.2 mm to 0.3 mm.

The uneven oxide film 520 in the intermediate portion 529*c* is not directly irradiated with the laser light. Thus, the average thickness of the uneven oxide film 520 in the intermediate portion 529*c* is smaller than the average film thickness of the uneven oxide film 520 in the outer peripheral portion 529*b* and greater than the average film thickness of a natural oxide film. Specifically, the average film thickness of the uneven oxide film 520 in the intermediate portion 529*c* is 0.1 nm to 10 nm. The height of the projection 520*a* on the surface of the uneven oxide film 520 is also lower in the intermediate portion 529*c* than in the outer peripheral portion 529*b*. Specifically, the height of the projection 520*a* in the intermediate portion 529*c* is 0.1 nm to 10 nm. The average width and the average interval of the projections 520*a* in the intermediate portion 529*c* are substantially the same as those in the outer peripheral portion 529*b*.

As described above, the uneven oxide film 520 includes a thick film portion 520X and a thin film portion 520Y The thick film portion 520X is a portion of the uneven oxide film 520 provided in the irradiation area of the laser light, that is, in the outer peripheral portion 529*b*. The thin film portion 520Y is a portion of the uneven oxide film 520 provided in the non-irradiation area of the laser light, that is, in the intermediate portion 529*c*. The thin film portion 520Y has a film thickness of the uneven oxide film 520 smaller than that in the thick film portion 520X. The thin film portion 520Y has the height of the projection 520*a* smaller than that in the thick film portion 520X. The thick film portion 520X is provided at the outer peripheral portion 529*b*. The thick film portion 520Y is provided at the intermediate portion 529*c*.

In the thick film portion 520X, the height of the projection 520*a* is higher than that of the thin film portion 520Y Accordingly, the sealing body 30 is entangled, and an anchor effect is generated. The contact area with the sealing body 30 increases. Thus, the sealing body 30 is in close contact with the outer peripheral portion 529*b*. The thick film portion 520X may be referred to as a "roughened portion" or an "adhesive portion".

Similarly to the sintered member 101A described in the preceding embodiment, the sintered member 100A include Ag or Cu. The sintered member 100A is a sintered body of Ag particles or Cu particles. The sintered member 100A enables bonding at a low temperature as compared with solder. The sintered member 100A is formed by heating and pressurizing a sheet for sintering or a paste for sintering. The sintered member 100A protrudes toward the outer side than the outer peripheral end 402 of the semiconductor element 40 in the plan view. The sintered member 100A is disposed so as to overlap the mounting portion 529*a* and the intermediate portion 529*c* in the plan view. In the present embodiment, the outer peripheral end of the sintered member 100A substantially matches the outer peripheral end of the intermediate portion 529*c*. The sintered member 100A overlaps the entire region of the mounting portion 529*a* and the entire region of the intermediate portion 529*c* in the plan view.

Summary of Eleventh Embodiment

As described above, the intermediate portion 529*c* includes the thin film portion 520Y of the uneven oxide film 520. Due to including the thin film portion 520Y, wettability of the intermediate portion 529*c* with respect to the solder is lower than that of the mounting portion 529*a*. As a result, the solder is less likely to spread and wet the surface from the mounting portion 529*a* toward the intermediate portion 529*c*.

In the present embodiment, the sintered member 100A is used instead of the solder. The sintered member 100A is formed by heating at a temperature lower than the melting point. The sintered member 100A is not brought into a molten state at the time of bonding unlike solder. The sintered member 100A does not spread and wet the surface of the front-face metal body 52 at the time of bonding unlike solder.

The sintered member 100A is pushed and spread between the opposing faces between the drain electrode 40D and the front-face metal body 52 during pressure sintering. By being pushed and spread, the sintered member 100A is disposed not only on the mounting portion 529*a* but also on the intermediate portion 529*c*. The sintered member 100A does not spread and wet the surface, but is pushed and spread by pressurization to come into contact with the thin film portion 520Y In this manner, not only the bonded portion between the sintered member 100A and the mounting portion 529*a* but also the contact portion between the sintered member 100A and the intermediate portion 529*c* function as a heat dissipation path. As a result, the semiconductor device 20 with high heat dissipation properties can be provided. The sintered member 100A has higher thermal conductivity than the solder. Accordingly, heat dissipation properties can be further enhanced.

The thin film portion 520Y has the height of the projection 520*a* smaller than that in the thick film portion 520X. That is, the adhesive force of the intermediate portion 529*c* with respect to the sealing body 30 is lower than that of the outer peripheral portion 529*b*. Accordingly, the sealing body 30 is less likely to come into close contact with the intermediate portion 529*c*. In the present embodiment, the sintered member 100A is in contact with the intermediate portion 529*c*. The sintered member 100A covers a portion having low adhesive force on the upper face 52*a*. Therefore, the sealing body 30 can be suppressed from being peeled from the upper face 52*a* around (near) the semiconductor element 40. As a result, thermal stress can be suppressed from concentrating on the bonded portion of the sintered member 100A and the drain electrode 40D, and connection reliability can thus be enhanced.

In the present embodiment, the entire intermediate portion 529*c* is positioned further on the outer side than the semiconductor element 40. With this arrangement, the bonded portion between the sintered member 100A and the mounting portion 529*a* can be enlarged. A contact portion between the sintered member 100A and the intermediate portion 529*c* positioned outside the semiconductor element 40 also functions as a heat dissipation path. Therefore, heat dissipation properties can be further enhanced.

<Modifications>

Although an example in which the sintered member 100A overlaps the entire region of the intermediate portion 529*c* has been described, but the present disclosure is not limited thereto. It is sufficient that the sintered member 100A overlap at least part of the intermediate portion 529*c*. That is, it is sufficient that the sintered member 100A be in contact with at least part of the thin film portion 520Y of the uneven oxide film 520. In this manner, the heat dissipation path can be enlarged, and heat dissipation properties can be enhanced.

The arrangement of the intermediate portion 529*c* is not limited to that in the above-described example. Only part in the width direction of the intermediate portion 529*c* may be positioned further on the outer side than the semiconductor element 40. When at least part of the intermediate portion 529*c* in the width direction is provided further on the outer side than the semiconductor element 40, the bonded portion can be enlarged, and the heat dissipation path can be enlarged. Therefore, heat dissipation properties can be enhanced.

At least part of the intermediate portion 529*c* in the width direction may be positioned further on the inner side than the outer peripheral end 402 of the semiconductor element 40. With this arrangement, the sintered member 100A comes into contact with the thin film portion 520Y (intermediate portion 529*c*). Accordingly, the position of the outer peripheral portion 529*b* can be brought close to the semiconductor element 40 while enhancing the heat dissipation properties. That is, the sealing body 30 can be suppressed from being peeled around the semiconductor element 40.

Figure 100:
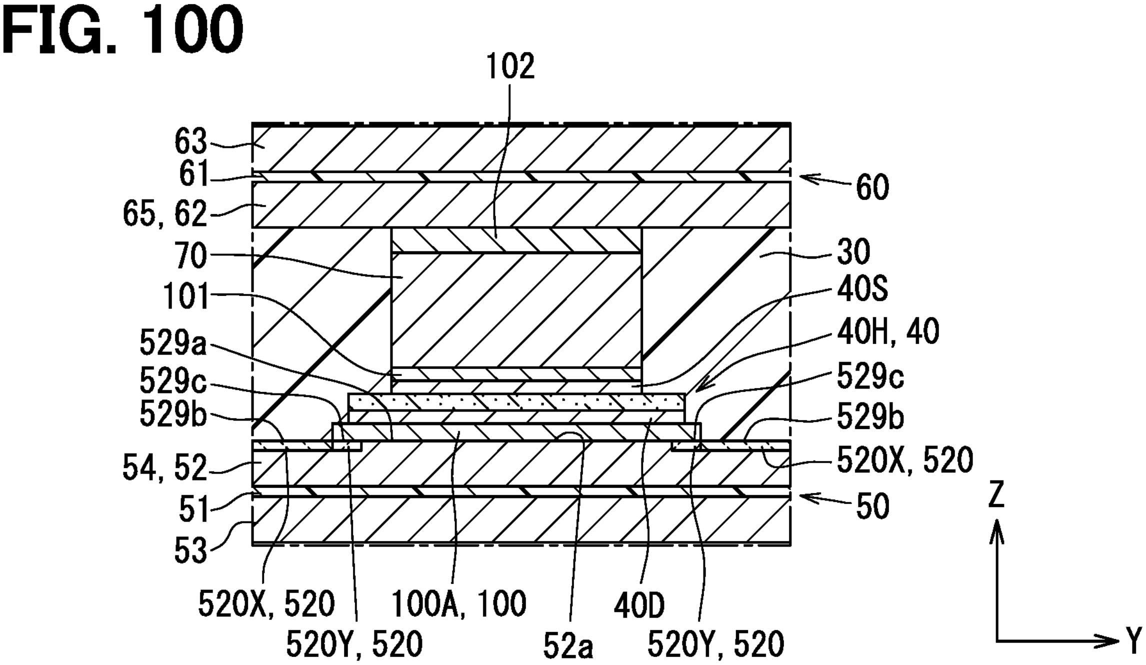
FIG. 100 is a sectional view illustrating a modification.
Figure 101:
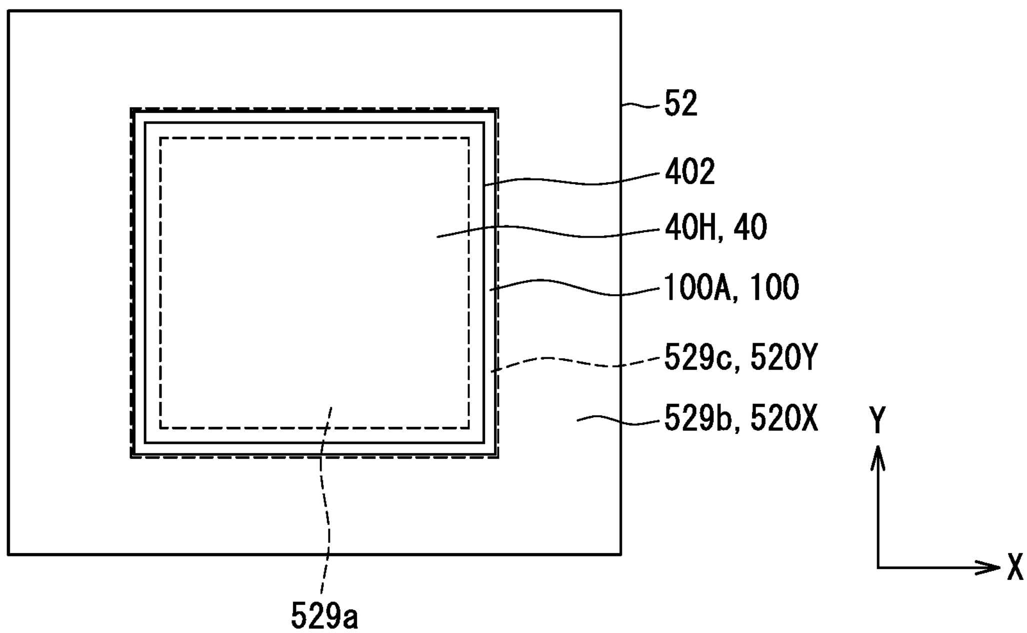
FIG. 101 is a plan view illustrating an arrangement of the semiconductor element, the sintered member, and the uneven oxide film.

In the example illustrated in FIGS. 100 and 101, the intermediate portion 529*c* extends over the outer peripheral end 402 of the semiconductor element 40 in the plan view. That is, part of the intermediate portion 529*c* in the width direction is positioned further on the outer side than the outer peripheral end 402, and the other part is positioned further on the inner side than the outer peripheral end 402. The sintered member 100A overlaps the entire region of the mounting portion 529*a* and the entire region of the intermediate portion 529*c* in the plan view. With this arrangement, as described above, the sealing body 30 can be suppressed from being peeled in the periphery of the semiconductor element 40 while enhancing the heat dissipation properties. FIGS. 100 and 101 are views illustrating a modification. FIG. 100 corresponds to FIG. 97, and FIG. 101 corresponds to FIG. 98.

Figure 102:
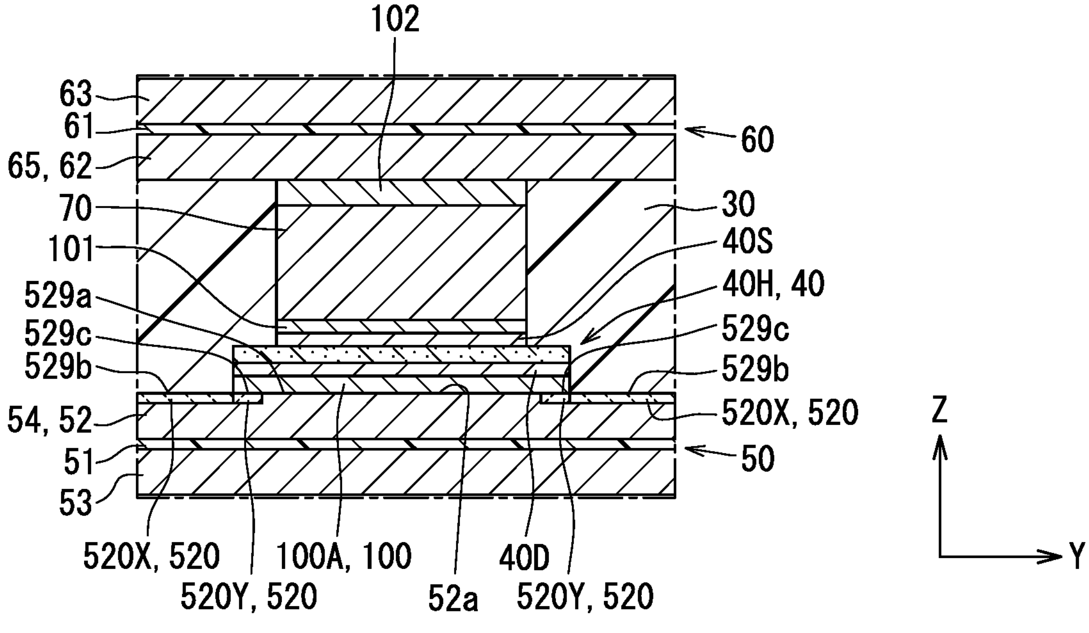
FIG. 102 is a sectional view illustrating a modification.
Figure 103:
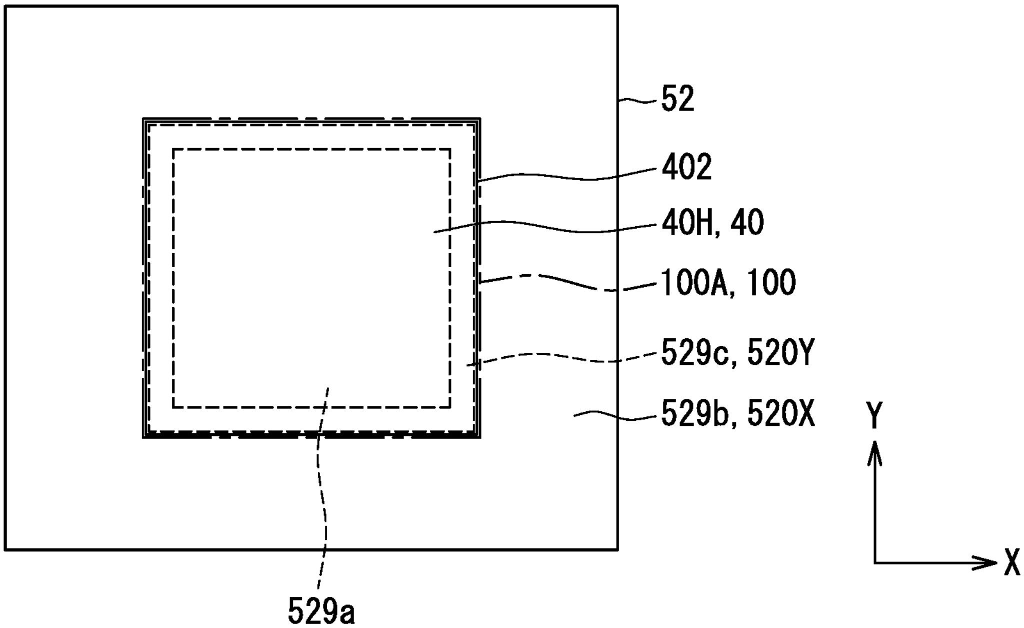
FIG. 103 is a plan view illustrating an arrangement of the semiconductor element, the sintered member, and the uneven oxide film.

In the example illustrated in FIGS. 102 and 103, the outer peripheral end of the intermediate portion 529*c* substantially matches the outer peripheral end 402 of the semiconductor element 40 in the plan view. The outer peripheral end of the sintered member 100A also substantially match the outer peripheral end 402 of the semiconductor element 40 in the plan view. In this configuration, the outer peripheral portion 529*b* (thick film portion 520X) is positioned adjacent to the semiconductor element 40 in the plan view. Therefore, the sintered member 100A being in contact with the intermediate portion 529*c* makes it possible to suppress the sealing body 30 more effectively from being peeled around the semiconductor element 40 while enhancing the heat dissipation properties. FIGS. 102 and 103 are views illustrating a modification. FIG. 102 corresponds to FIG. 97, and FIG. 103 corresponds to FIG. 98.

Figure 104:
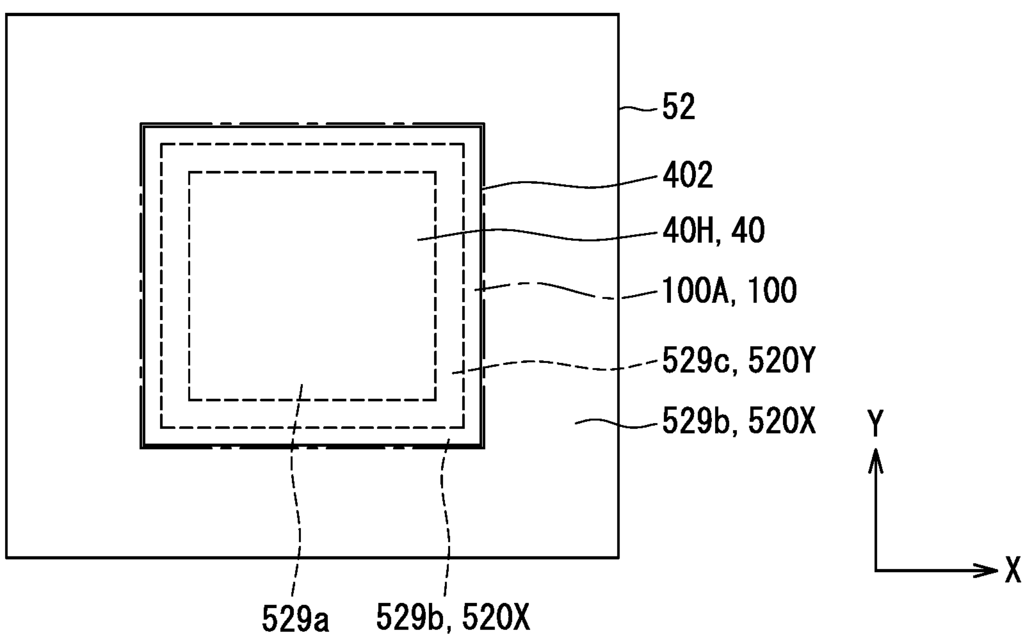
FIG. 104 is a sectional view illustrating a modification.

In the example illustrated in FIG. 104, part of the outer peripheral portion 529*b* overlaps the semiconductor element 40 in the plan view. The intermediate portion 529*c* is positioned further on the inner side than the outer peripheral end 402 of the semiconductor element 40. FIG. 104 is a sectional view illustrating a modification. FIG. 104 corresponds to FIG. 98. In this case, the sintered member 100A may be in contact with only the thin film portion 520Y The sintered member 100A may be in contact with the thin film portion 520Y and a portion immediately below the semiconductor element 40 in the thick film portion 520X.

An example in which the uneven oxide film 520 is provided only on the front-face metal body 52 to which the drain electrode 40D is connected has been described. However, the present disclosure is not limited thereto. In addition to the front-face metal body 52, the uneven oxide film 520 may be provided on the side face of the conductive spacer 70 to which the source electrode 40S is connected and/or to the front-face metal body 62 of the substrate 60. As described above, the thick film portion 520X of the uneven oxide film 520 provides a function of enhancing adhesive force with the sealing body 30 and a function of suppressing spreading and wetting of solder as a bonding member. The uneven oxide film 520 may be provided at a place where overflow of the solder is desired to be suppressed or a place where adhesive force to the sealing body 30 is desired to be increased.

Although an example in which the substrate 50 is adopted as the wiring member has been described, the present disclosure is not limited thereto. A metal plate (lead frame) may be adopted instead of the substrate 50. A metal plate (lead frame) may be adopted instead of the substrate 60. Instead of the conductive spacer 70, a projection may be provided on the metal plate on the source electrode 40S side.

An example in which the semiconductor device 20 includes the semiconductor elements 40H, 40L, but the present disclosure is not limited thereto. Only the semiconductor element 40 constituting one of the arms may be provided. The semiconductor device 20 may include, for example, only one semiconductor element 40.

The configuration described in the present embodiment can be combined with any of the configurations described in the first embodiment, the second embodiment, the third embodiment, the fourth embodiment, the fifth embodiment, the sixth embodiment, the seventh embodiment, the eighth embodiment, the ninth embodiment, the tenth embodiment, and the modifications thereof.

Twelfth Embodiment

This embodiment is a modification based on the preceding embodiment, and the description of the preceding embodiment can be incorporated. In order to suppress the main electrode from being cracked, the sintered member as a bonding member may have a multilayer structure as will be described in the present embodiment.

<Semiconductor Device>

Figure 105:
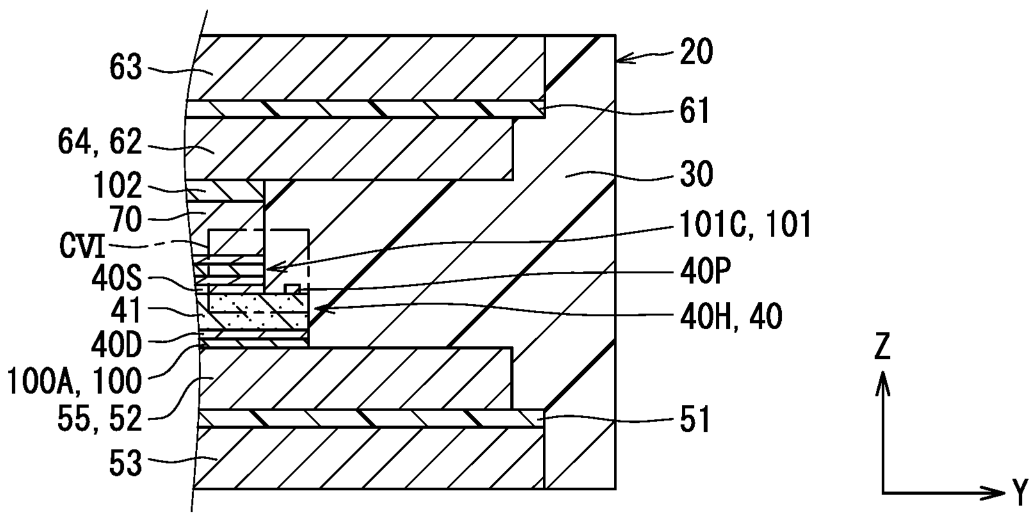
FIG. 105 is a sectional view illustrating a semiconductor device according to a twelfth embodiment.

First, the semiconductor device 20 according to the present embodiment will be described with reference to FIG. 105. FIG. 105 is a sectional view corresponding to (part of) FIG. 7. In FIG. 105, illustration of the external connection terminals 90 and the bonding wire 110 is omitted for convenience.

The semiconductor device 20 according to the present embodiment has a configuration that is the same as or similar to the configuration described in the preceding embodiment (see FIGS. 2 to 13). As illustrated in FIG. 105, the semiconductor device 20 includes the semiconductor element 40 (40H), the substrates 50, 60 that are wiring members disposed so as to sandwich the semiconductor elements 40 in the Z direction, and the sealing body 30. The semiconductor element 40 includes the drain electrode 40D as a first main electrode on one face of the semiconductor substrate 41, and includes the source electrode 40S as a second main electrode on a back face of the semiconductor substrate 41. The drain electrode 40D is a main electrode on the high potential side, and the source electrode 40S is a main electrode on the low potential side. The source electrode 40S is provided on the same face as the pad 40P.

The front-face metal body 52 of the substrate 50 as the first wiring member is connected to the drain electrode 40D. The substrate 60 as the second wiring member and the conductive spacer 70 are connected to the source electrode 40S. The sealing body 30 seals the semiconductor element 40, the substrates 50, 60, and the conductive spacer 70. Although not illustrated, the semiconductor device 20 includes the semiconductor element 40L which is a lower arm element.

The drain electrode 40D and the front-face metal body 52 of the substrate 50 are bonded by the sintered member 100A as the bonding member 100, similarly to the configuration described in the preceding embodiment (see FIG. 97). The source electrode 40S and the conductive spacer 70 are bonded by a multilayer bonding member 101C as the bonding member 101.

<Multilayer Bonding Member and Peripheral Structure Thereof>

Figure 106:
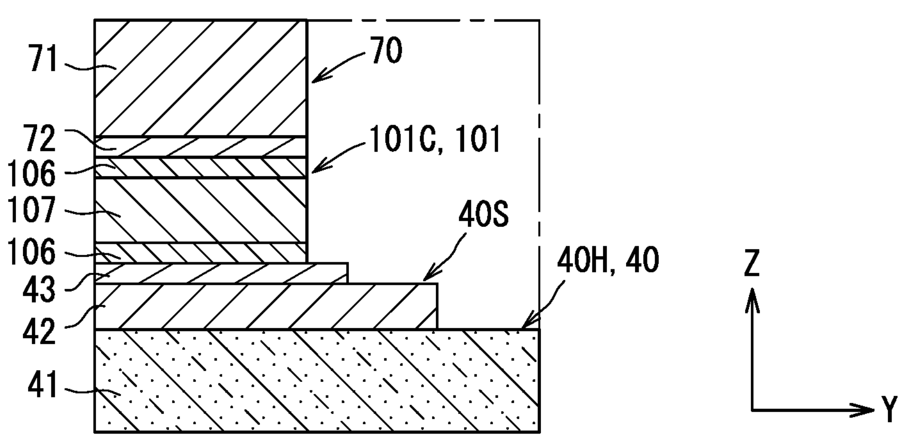
FIG. 106 is an enlarged view of a region CVI in FIG. 105.
Figure 107:
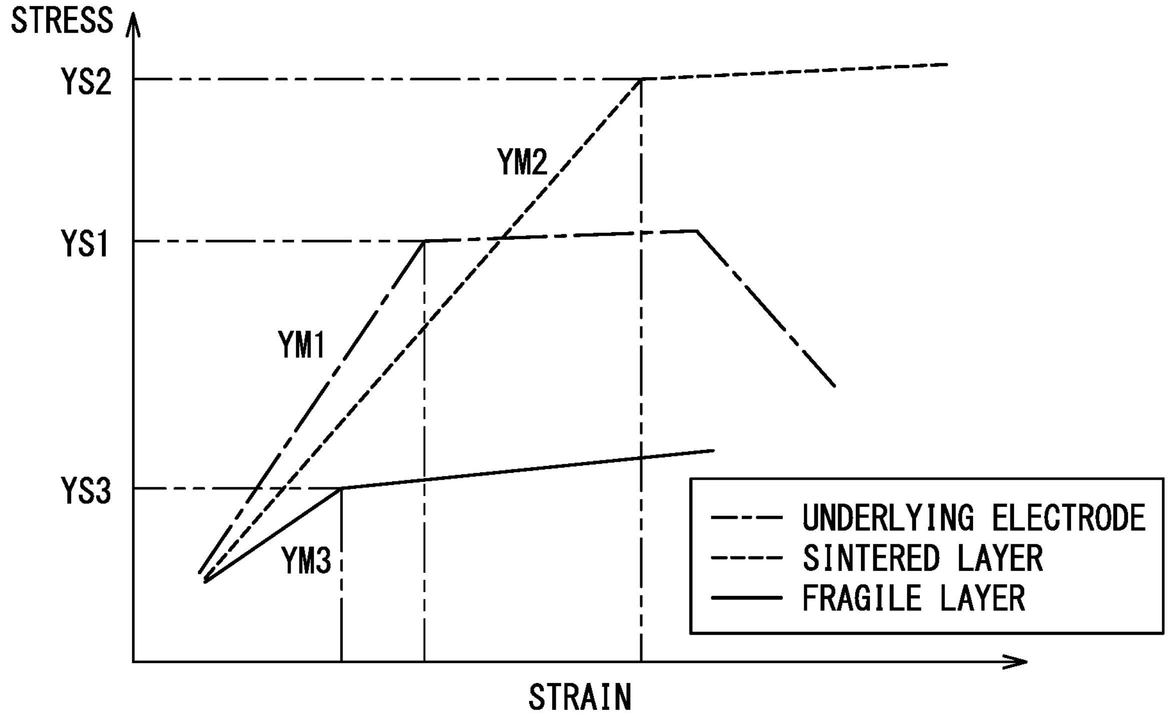
FIG. 107 is a diagram indicating a relationship between Young's modulus and yield stress of an underlying electrode, a sintered layer, and a fragile layer.

Next, the multilayer bonding member 101C and a peripheral structure thereof will be described with reference to FIGS. 106 and 107. FIG. 106 is an enlarged view of a region CVI in FIG. 105. In FIG. 106, illustration of the pad is omitted for convenience. FIG. 107 is a diagram indicating a relationship between Young's modulus and yield stress of the underlying electrode 42, a sintered layer 106, and a fragile layer 107. In the stress-strain diagram given in FIG. 107, a solid line denotes the fragile layer 107, a dashed line denotes the sintered layer 106, and an alternate long and short dashed line denotes the underlying electrode 42.

Similarly to the configuration described in the preceding embodiment (see FIG. 91), the source electrode 40S includes the underlying electrode 42 formed on the semiconductor substrate 41 and the connection electrode 43 formed on the underlying electrode 42. The underlying electrode 42 includes an AlSi-based alloy such as AlSi or AlSiCu. The connection electrode 43 contains at least a noble metal for bonding with the multilayer bonding member 101C. The connection electrode 43 is a plating film contains Au or Ag, and Ni.

The conductive spacer 70 contains a metal such as Cu, and includes a base material 71 forming a main portion of the conductive spacer 70 and a metal film 72 formed on the surface of the base material 71. The metal film 72 contains at least a noble metal for bonding to the multilayer bonding member 101C. The metal film 72 is a plating film contains Au or Ag, and Ni. The metal film 72 is provided, for example, on a bonding face including an opposing face with respect to the semiconductor element 40.

The multilayer bonding member 101C includes the sintered layer 106 and the fragile layer 107. The sintered layer 106 has a configuration that is the same as or similar to the sintered member 101A described in the preceding embodiment. The sintered layer 106 is a pressure-sintered body of Ag particles or Cu particles. The strength of the fragile layer 107 is intentionally lowered such that a crack occurs earlier than in the source electrode 40S, particularly the underlying electrode 42 upon action of thermal stress.

As illustrated in FIG. 107, a Young's modulus YM2 of the sintered layer 106 is slightly smaller than a Young's modulus YM1 of the underlying electrode 42. However, a yield stress YS2 of the sintered layer 106 is sufficiently greater than the yield stress YS1 of the underlying electrode 42. The yield strain of the sintered layer 106 is greater than the yield strain of the underlying electrode 42. On the other hand, a Young's modulus YM3 of the fragile layer 107 is smaller than the Young's modulus YM1 of the underlying electrode 42. A yield stress YS3 of the fragile layer 107 is smaller than the yield stress YS1 of the underlying electrode 42. The Young's modulus YM3 of the fragile layer 107 is smaller than the Young's modulus YM2 of the sintered layer 106. The yield stress YS3 of the fragile layer 107 is smaller than the yield stress YS2 of the sintered layer 106.

The fragile layer 107 according to the present embodiment is a sintered body including particles (e.g., Ag particles) of the same type as that in the sintered layer 106. The fragile layer 107 is a low-pressure sintered body sintered at a pressurizing force lower than a pressurizing force at which the sintered layer 106 is formed. The fragile layer 107 is, for example, a pressureless-sintered body sintered without being pressurized. Due to sintering at a low pressurizing force, the fragile layer 107 has larger voids between particles than the sintered layer 106. The fragile layer 107 is sparse as compared with the sintered layer 106.

The fragile layer 107 is a sintered body of Ag particles or Cu particles. The fragile layer 107 has a thermal conductivity of 200 W/m·K or more. The sintered layer 106 that is denser than the fragile layer 107 has a higher thermal conductivity than the fragile layer 107.

As illustrated in FIG. 106, the multilayer bonding member 101C has a three-layer structure including the sintered layers 106 at both ends in the Z direction and the fragile layer 107 between the sintered layers 106. The Z direction is the plate thickness direction of the semiconductor element 40. The fragile layer 107 is laminated on the sintered layer 106, and the sintered layer 106 is laminated on the fragile layer 107. One of the sintered layers 106 is bonded to the connection electrode 43 of the source electrode 40S, and the other one of the sintered layers 106 is bonded to the metal film 72 of the conductive spacer 70. The fragile layer 107 is sandwiched between the sintered layers 106 in the Z direction.

Since the fragile layer 107 is a low-pressure sintered body as described above, the thickness of the fragile layer 107 is greater than the thickness of each of the sintered layers 106, for example.

Summary of Twelfth Embodiment

As described in the preceding embodiment, thermal stress tends to concentrate on the source electrode 40S, particularly on the underlying electrode 42. In the bonding structure using the bonding member 101, when only the sintered member is used as the bonding member 101, the sintered member is less likely to reach the yield stress than the source electrode 40S. Thus, the thermal stress tends to concentrate on the source electrode 40S (underlying electrode 42).

In the present embodiment, the bonding member 101 that bonds the source electrode 40S and the conductive spacer 70 together is the multilayer bonding member 101C. The multilayer bonding member 101C includes the sintered layer 106 and the fragile layer 107. The fragile layer 107 has a Young's modulus and/or a yield stress smaller than a Young's modulus and/or a yield stress of the source electrode 40S (underlying electrode 42). With this feature, thermal stress is concentrated on the fragile layer 107. For example, before the source electrode 40S is cracked, the fragile layer 107 is cracked. Therefore, an element can be suppressed from being damaged.

In the present embodiment, as illustrated in FIG. 107, the fragile layer 107 is smaller than the source electrode 40S (underlying electrode 42) in both Young's modulus and yield stress. Accordingly, an element can be effectively suppressed from being damaged.

The multilayer bonding member 101C (bonding member 101) includes a sintered body. The thermal conductivity of the sintered body is sufficiently higher than that of the solder. Therefore, heat dissipation properties can be enhanced.

In the present embodiment, the fragile layer 107 is a sintered body including particles of the same type as that in the sintered layer 106. The fragile layer 107 has larger voids between particles than the sintered layer 106. The fragile layer 107 is a sintered body formed at a pressurizing force lower than a pressurizing force at which the sintered layer 106 is formed. The sintered layer 106 and the fragile layer 107 can be formed in the same manner except that the pressurizing force is changed. Therefore, the configuration can be simplified.

In the present embodiment, the multilayer bonding member 101C has a three-layer structure. The multilayer bonding member 101C includes the sintered layer 106 at both ends and the fragile layer 107 between the sintered layers 106. One of the sintered layers 106 forms a bonded portion with the source electrode 40S, and the other one of the sintered layers 106 forms a bonded portion with the conductive spacer 70 as the second wiring member. Therefore, an element can be suppressed from being damaged while the bondability between the source electrode 40S and the conductive spacer 70 is secured.

<Modifications>

Figure 108:
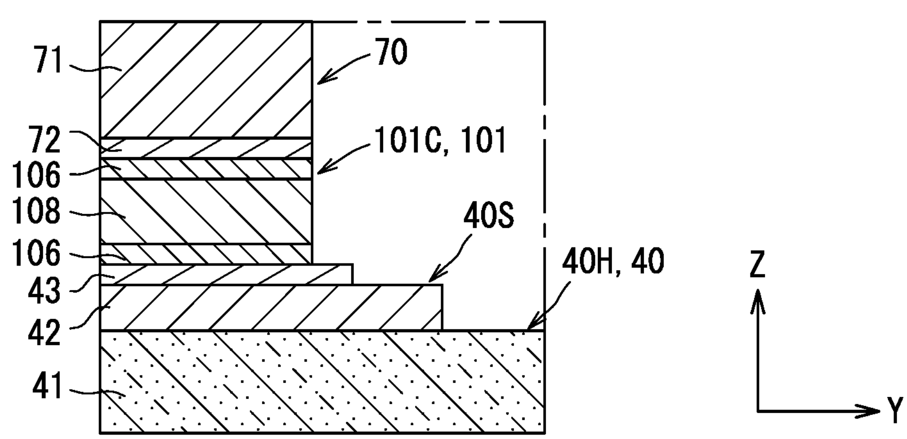
FIG. 108 is a sectional view illustrating a modification.

An example in which the fragile layer 107 sintered at a pressurizing force lower than a pressurizing force at which the sintered layer 106 is formed has been described. However, the present disclosure is not limited thereto. Instead of the fragile layer 107 as a sintered body, a fragile layer 108 as a non-sintered body may be adopted as illustrated in FIG. 108. The fragile layer 108 contains, for example, Al. The fragile layer 108 containing Al has a Young's modulus and/or a yield stress smaller than a Young's modulus and/or a yield stress of the source electrode 40S (underlying electrode 42). Therefore, similarly to the fragile layer 107, an element can be suppressed from being damaged. The thermal conductivity of the fragile layer 108 containing Al is also 200 W/m·K or more. FIG. 108 is a sectional view illustrating a modification and corresponds to FIG. 106.

Figure 109:
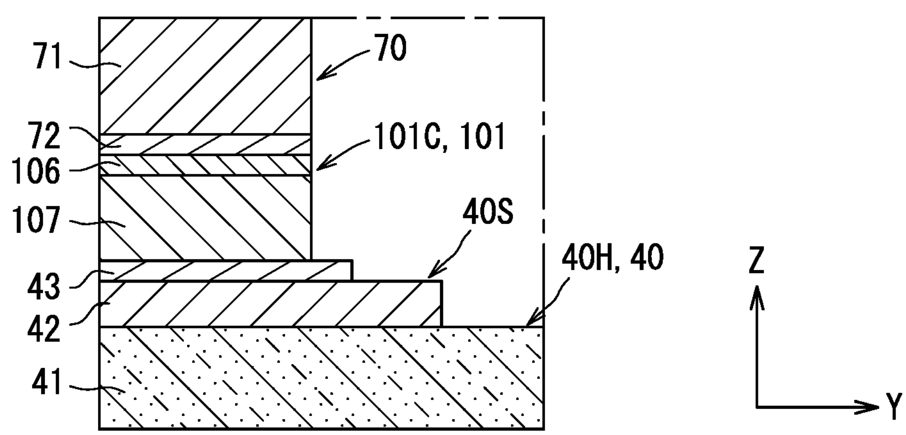
FIG. 109 is a sectional view illustrating a modification.

Although the example in which the multilayer bonding member 101C has a three-layer structure has been described, the present disclosure is not limited thereto. For example, the multilayer bonding member 101C may have a structure including four or more layers. Alternatively, the multilayer bonding member 101C may have a two-layer structure as illustrated in FIG. 109. The multilayer bonding member 101C includes the sintered layer 106 on the conductive spacer 70 side and the fragile layer 107 on the source electrode 40S side. As described above, the fragile layer 107 is disposed at a position close to the semiconductor element 40. Therefore, an effect of suppressing an element from being damaged can be enhanced. FIG. 109 is a sectional view illustrating a modification and corresponds to FIG. 106.

Figure 110:
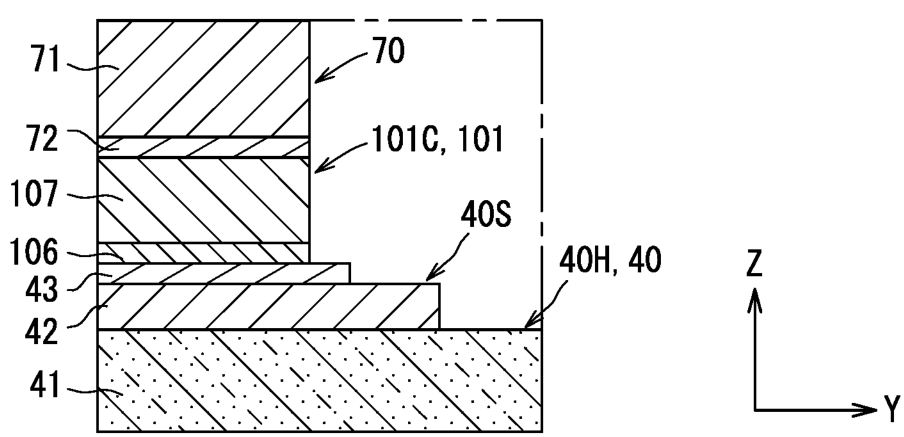
FIG. 110 is a sectional view illustrating a modification.

In the example illustrated in FIG. 110, the multilayer bonding member 101C includes the sintered layer 106 on the source electrode 40S side and the fragile layer 107 on the conductive spacer 70 side. The sintered layer 106 that is a pressure-sintered body and is more excellent in heat dissipation properties than the fragile layer 107 is disposed at a position close to the semiconductor element 40. Therefore, heat dissipation properties can be enhanced. FIG. 110 is a sectional view illustrating a modification and corresponds to FIG. 106.

The example in which the second wiring member to which the source electrode 40S is connected includes the substrate 60 as a wiring board and the conductive spacer 70 has been described, but the present disclosure is not limited thereto. The front-face metal body 62 may be provided with a projection instead of the conductive spacer 70. That is, the second wiring member may include only the substrate 60 without including the conductive spacer 70. In this case, the multilayer bonding member 101C is interposed between the distal end face of the projection of the front-face metal body 62 and the source electrode 40S (connection electrode 43).

Although an example in which the substrate 50 is adopted as the first wiring member has been described, the present disclosure is not limited thereto. A metal plate (lead frame) may be adopted instead of the substrate 50. Although an example in which the substrate 60 is adopted as the second wiring member has been described, the present disclosure is not limited thereto. A metal plate (lead frame) may be adopted instead of the substrate 60. The second wiring member may include a metal plate and the conductive spacer 70, or may include a projection on the metal plate instead of the conductive spacer 70.

An example in which the semiconductor device 20 includes the semiconductor elements 40H, 40L, but the present disclosure is not limited thereto. Only the semiconductor element 40 constituting one of the arms may be provided. The semiconductor device 20 may include, for example, only one semiconductor element 40.

The configuration described in the present embodiment can be combined with any of the configurations described in the first embodiment, the second embodiment, the third embodiment, the fourth embodiment, the fifth embodiment, the sixth embodiment, the seventh embodiment, the eighth embodiment, the ninth embodiment, the tenth embodiment, the eleventh embodiment, and the modifications thereof.

Thirteenth Embodiment

This embodiment is a modification based on the preceding embodiment, and the description of the preceding embodiment can be incorporated. As will be described in the present embodiment, each arm may be configured by one semiconductor element 40.

<Power Conversion Device>

Figure 111:
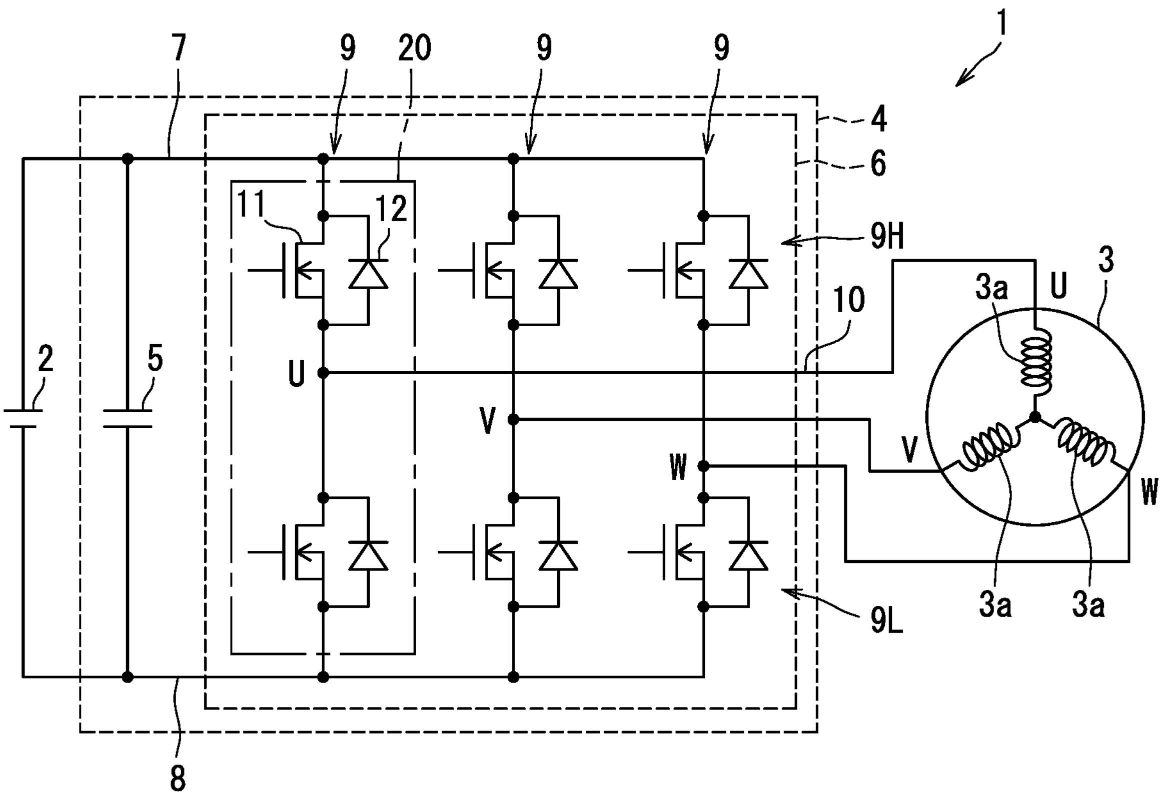
FIG. 111 is a diagram illustrating a circuit configuration of a power conversion device to which a semiconductor device according to a thirteenth embodiment is applied.

Next, a circuit configuration of the power conversion device 4 to which the semiconductor device 20 is applied will be described with reference to FIG. 111. FIG. 111 is a diagram illustrating an equivalent circuit of the power conversion device 4.

The power conversion device 4 illustrated in FIG. 111 is also used for the drive system 1 of a vehicle. The configuration of the power conversion device 4 is substantially the same as the configuration described in the preceding embodiment (see FIG. 1). The difference is that each arm includes only one MOSFET 11. The upper-lower arm circuit 9 for one phase includes two MOSFETs 11. The upper-lower arm circuit 9 for one phase is provided by one semiconductor device 20.

<Semiconductor Device>

Figure 112:
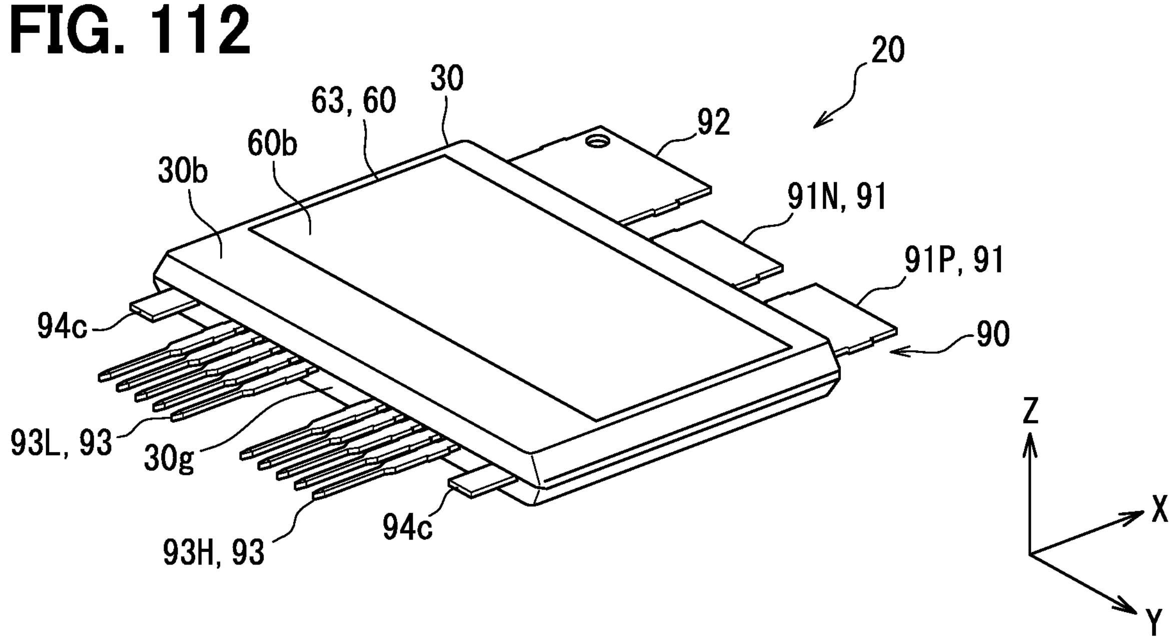
FIG. 112 is a perspective view illustrating the semiconductor device.
Figure 113:
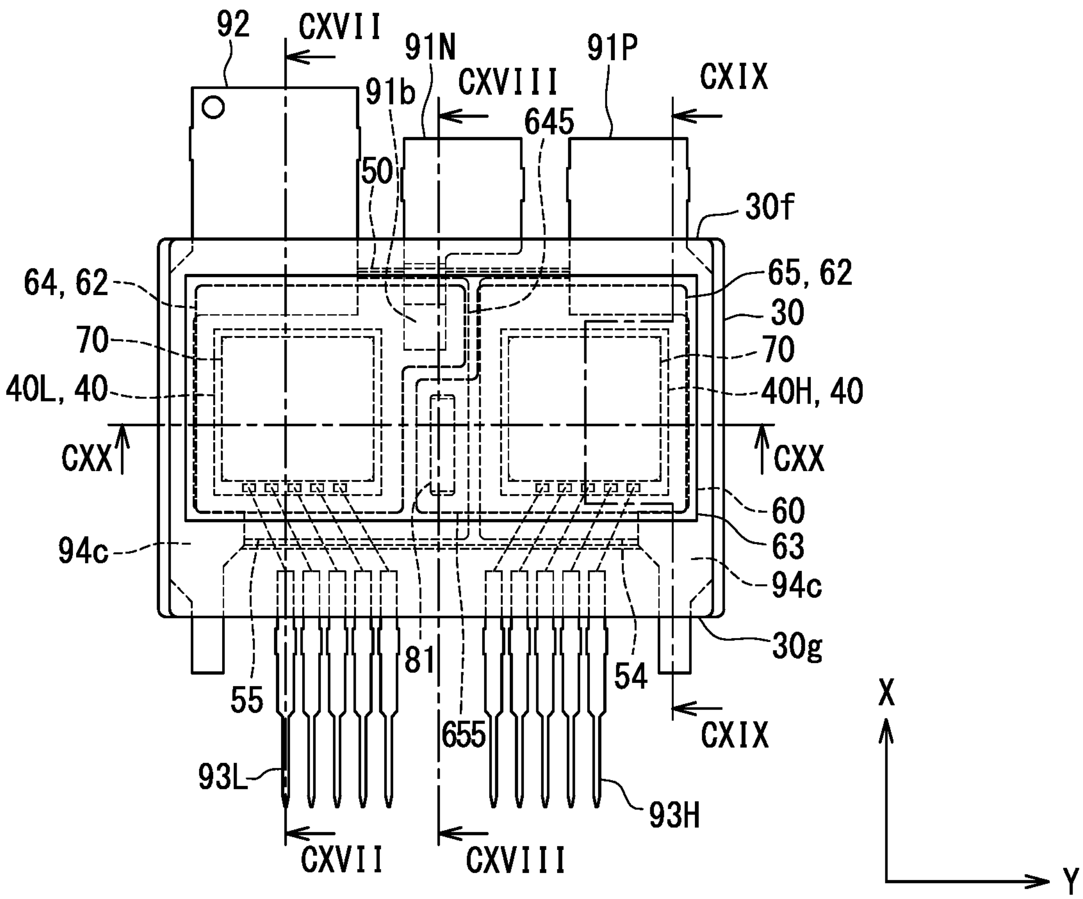
FIG. 113 is a plan view illustrating the semiconductor device.
Figure 114:
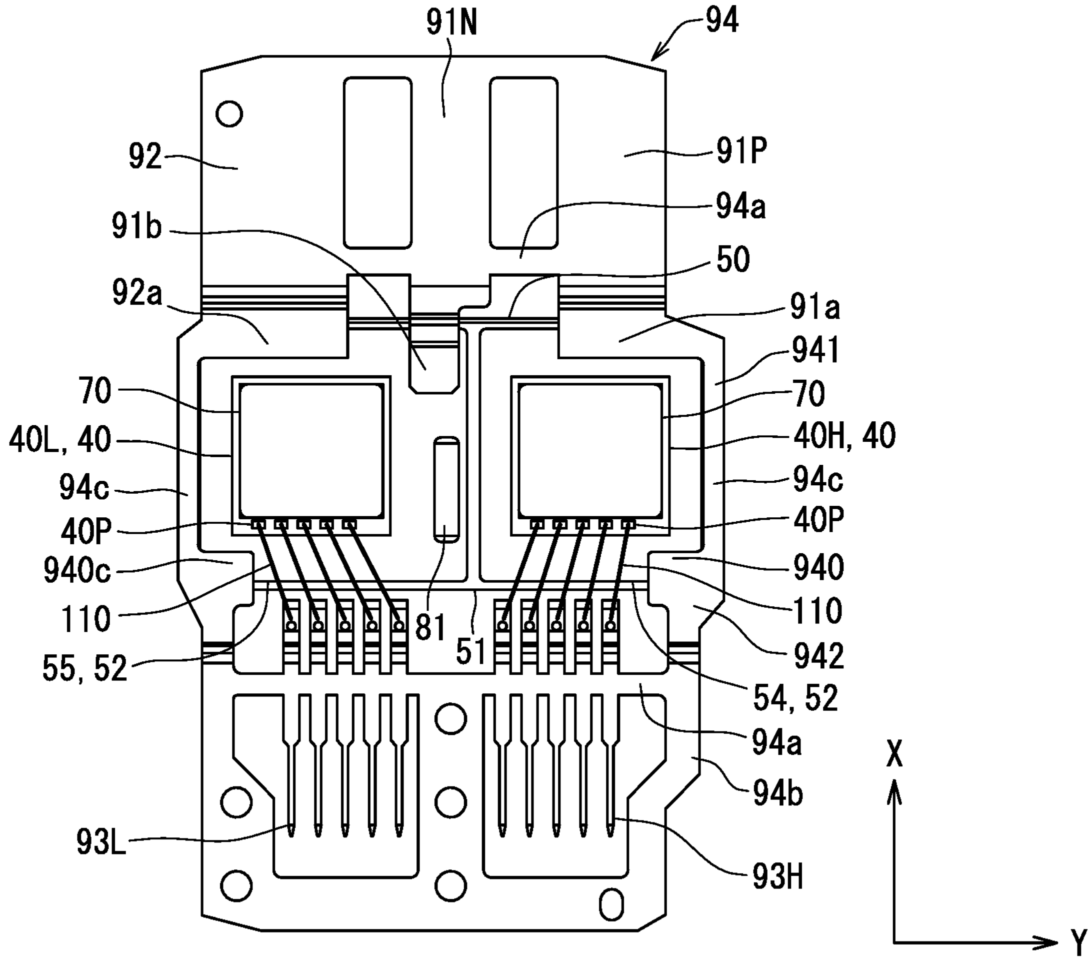
FIG. 114 is a plan view illustrating a state in which a semiconductor element is mounted on the substrate on the drain electrode side.
Figure 115:
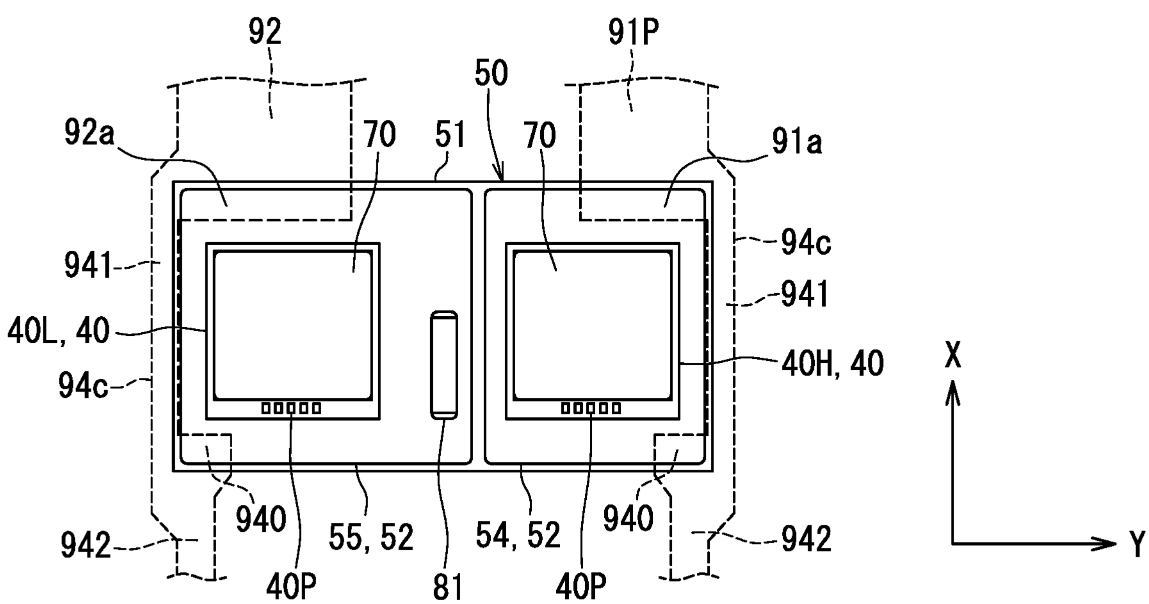
FIG. 115 is a plan view illustrating a circuit pattern of the substrate on the drain electrode side.

Next, a semiconductor device will be described with reference to FIGS. 112 to 121. FIG. 112 is a perspective view illustrating a semiconductor device 20. FIG. 113 is a plan view illustrating the semiconductor device 20. FIG. 113 is transparent view illustrating an internal structure. FIG. 114 is a plan view illustrating a state in which the semiconductor element 40 is mounted on the substrate 50. In FIG. 114, the lead frame 94 is illustrated for convenience. FIG. 115 is a plan view illustrating a circuit pattern of the substrate 50. FIG. 115 illustrates a state in which the semiconductor element 40 and the joint portion 81 are mounted on substrate 50. In FIG. 115, the P terminal 91P, the output terminal 92, and a guide frame 94*c*, which are bonded to the front-face metal body 52, are also illustrated by dashed lines.

Figure 116:
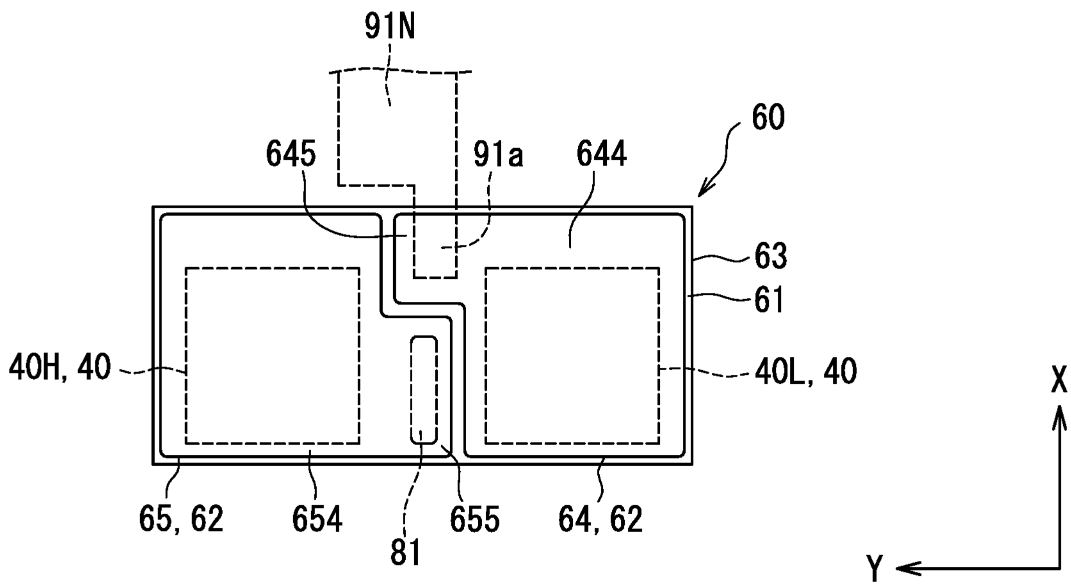
FIG. 116 is a plan view illustrating a circuit pattern of the substrate on the source electrode side.
Figure 117:
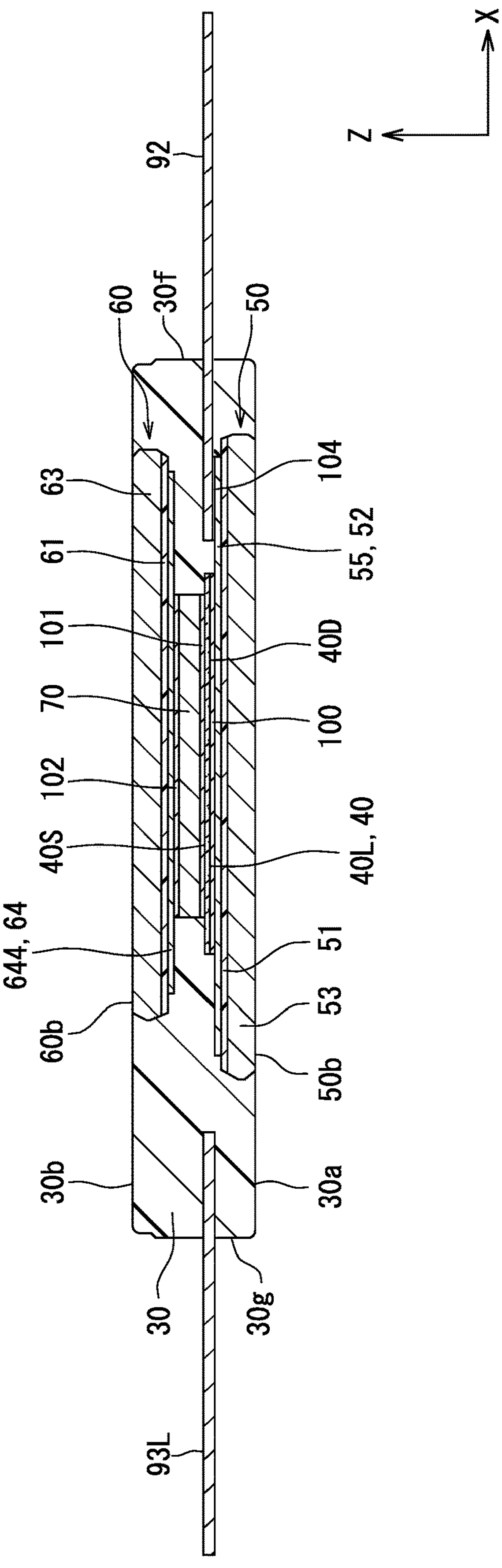
FIG. 117 is a sectional view taken along line CXVII-CXVII of FIG. 113.
Figure 118:
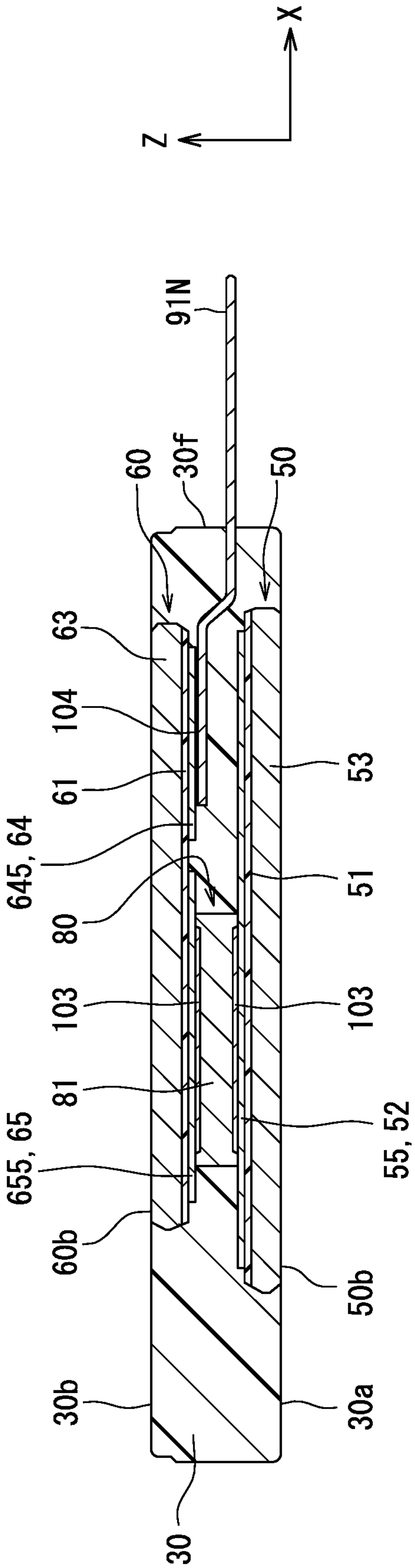
FIG. 118 is a sectional view taken along line CXVIII-CXVIII of FIG. 113.
Figure 119:
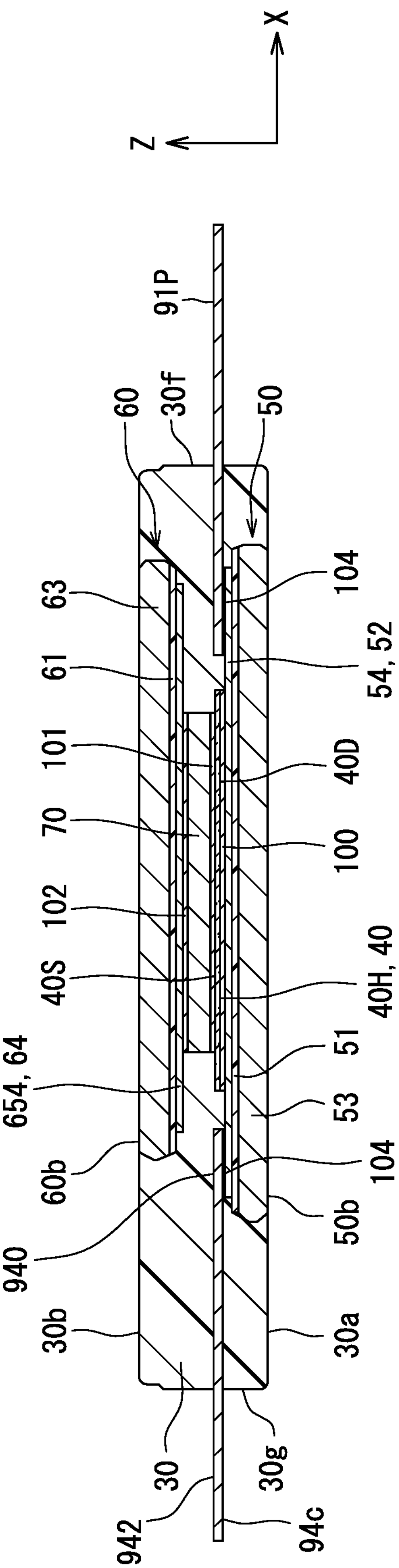
FIG. 119 is a sectional view taken along line CXIX-CXIX of FIG. 113.
Figure 120:
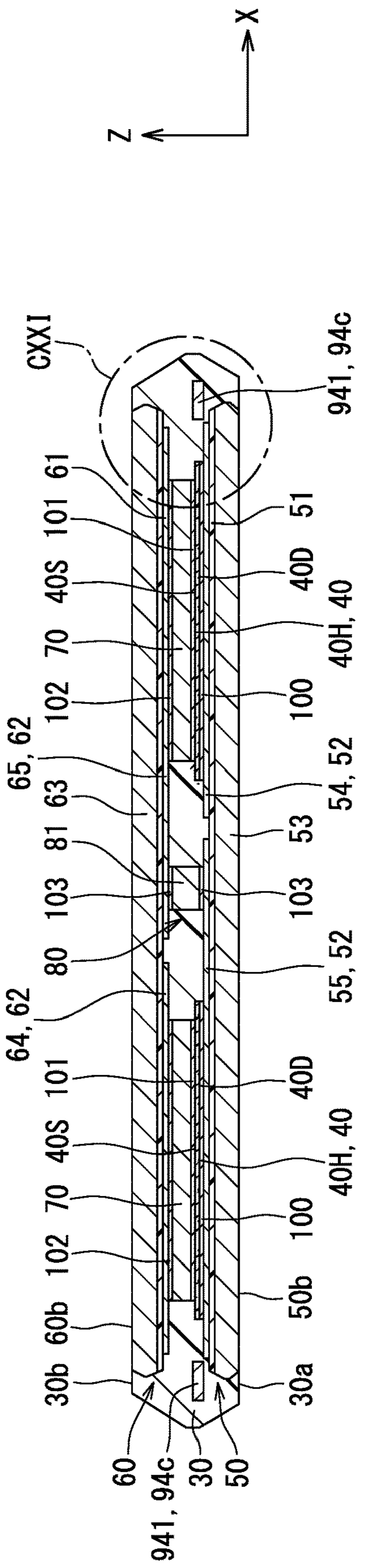
Figure 121:
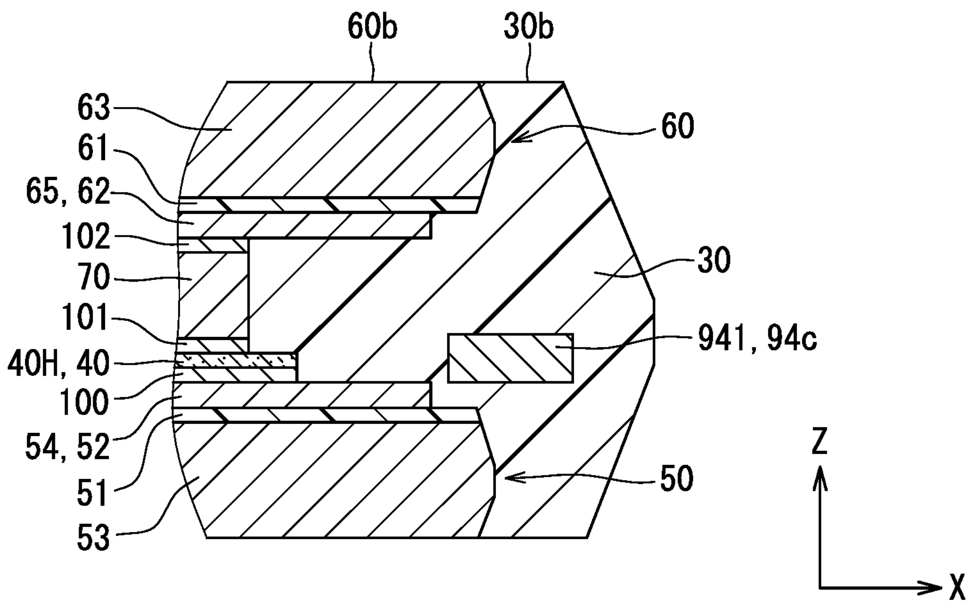

FIG. 116 is a plan view illustrating a circuit pattern of the substrate 60. In FIG. 116, the semiconductor element 40, the joint portion 81, and the N terminal 91N bonded to the front-face metal body 62 are also denoted by dashed lines. FIG. 117 is a sectional view taken along line CXVII-CXVII of FIG. 113. FIG. 118 is a sectional view taken along line CXVIII-CXVIII of FIG. 113. FIG. 119 is a sectional view taken along line CXIX-CXIX of FIG. 113. FIG. 120 is a sectional view taken along line CXX-CXX of FIG. 113. FIG. 121 is an enlarged view of a region CXXI denoted by an alternate long and short dashed line in FIG. 120.

Also in the present embodiment, as in the preceding embodiment, a plate thickness direction of the semiconductor element 40 (semiconductor substrate) is defined as the Z direction, and an arrangement direction of the semiconductor elements 40H, 40L is defined as the Y direction. A direction orthogonal to both of the Z direction and the Y direction is defined as the X direction. Unless otherwise specified, a shape in a plan view seen from the Z direction, in other words, a shape along the XY plane defined by the X and Y directions is denoted as a planar shape. Hereinafter, "inner side", "inside" or "inward", and "outer side" or "outside" or "outward" indicate a relative positional relationship with the center of the semiconductor element 40 as a reference position in a plan view in the Z direction. The side closer to the center is the inner side, and the side farther from the center is the outer side.

The semiconductor device 20 according to the present embodiment constitutes one of the upper-lower arm circuits 9, that is, the upper-lower arm circuit 9 for one phase, as in the preceding embodiment. The semiconductor device 20 includes elements that is the same as or similar to those in the configuration described in the preceding embodiment (see FIGS. 2 to 13). As illustrated in FIGS. 112 to 121, the semiconductor device 20 includes the sealing body 30, the semiconductor element 40, the substrates 50, 60, the conductive spacer 70, the arm connection portion 80, and the external connection terminals 90. Hereinafter, portions different from the configuration described in the preceding embodiment will be mainly described.

As in the preceding embodiments, the sealing body 30 seals part of other elements constituting the semiconductor device 20. As illustrated in FIGS. 112 and 113, the sealing body 30 has a substantially rectangular shape in the plan view. The sealing body 30 includes the one face 30*a* and the back face 30*b* in the Z direction. The side face connecting the one face 30*a* and the back face 30*b* includes two side faces 30*f*, 30*g* from which the external connection terminals 90 protrude. The side face 30*g* is opposite to the side face 30*f* in the X direction.

The semiconductor element 40 includes a switching element on a semiconductor substrate. The switching element is formed on the semiconductor substrate. As in the preceding embodiment, the semiconductor element 40 according to the present embodiment includes a semiconductor substrate including SiC, and the n-channel MOSFET 11. The MOSFET 11 is formed on the semiconductor substrate. The semiconductor element 40 includes the drain electrode 40D on one face and the source electrode 40S on the back face as main electrodes. The semiconductor element 40 includes the pad 40P on the back face.

The semiconductor elements 40 include one semiconductor element 40H constituting the upper arm 9H and one semiconductor element 40L constituting the lower arm 9L. The configurations of the semiconductor elements 40H, 40L are common to each other. As illustrated in FIGS. 113 and 114, the semiconductor elements 40H, 40L are arranged in the Y direction. The semiconductor elements 40 are disposed at positions substantially identical to each other in the Z direction. The drain electrode 40D of each semiconductor element 40 opposes the substrate 50. The source electrode 40S of each semiconductor element 40 opposes the substrate 60.

The substrates 50, 60 are disposed so as to sandwich the plurality of semiconductor elements 40 in the Z direction. The substrates 50, 60 are disposed so that at least parts thereof oppose each other in the Z direction. The substrates 50, 60 include all of the plurality of semiconductor elements 40 (40H, 40L) in the plan view.

The substrate 50 is disposed on the drain electrode 40D side. The substrate 60 is disposed on the source electrode 40S side. The substrate 50 is electrically connected to the drain electrode 40D to provide a wiring function. The substrate 60 is electrically connected to the source electrode 40S to provide a wiring function as described later. The substrate 50, 60 provides a heat dissipation function of dissipating heat generated at the semiconductor element 40.

The substrate 50 includes the insulating base member 51, the front-face metal body 52, and the back-face metal body 53. The substrate 60 includes the insulating base member 61, the front-face metal body 62, and the back-face metal body 63. In the substrate 60, the insulating base member 61 and the metal bodies 62, 63 are laminated. Hereinafter, the front-face metal body 52, 62 and the back-face metal body 53, 63 may be each simply referred to as the metal body 52, 53, 62, 63.

The insulating base member 51 electrically isolates the front-face metal body 52 and the back-face metal body 53. Similarly, the insulating base member 61 electrically isolates the front-face metal body 62 and the back-face metal body 63. In the present embodiment, the resin-based insulating base members 51, 61 are adopted, and the material configurations thereof are common to each other.

The metal body 52, 53, 62, 63 is provided, for example, as a metal plate or metal foil. The front-face metal body 52, 62 is patterned. The front-face metal body 52, 62 may include a plating film of Ni-based metal, Au, or the like on the metal face. Hereinafter, the pattern of the front-face metal body 52, 62 may be referred to as a "circuit pattern". The front-face metal body 52 includes the P wiring 54 and the relay wiring 55 as in the preceding embodiment. The P wiring 54 and the relay wiring 55 are electrically isolated by providing a predetermined interval (gap). The gap is filled with the sealing body 30.

The P wiring 54 is connected to the P terminal 91P and the drain electrode 40D of the semiconductor element 40H. The P wiring 54 electrically connects the P terminal 91P and the drain electrode 40D of the semiconductor element 40H. The P wiring 54 line has a substantially rectangular shape, whose longitudinal direction is the X direction, in the plan view. The relay wiring 55 is connected to the drain electrode 40D, the arm connection portion 80, and the output terminal 92 of the semiconductor element 40L. The relay wiring 55 has a substantially rectangular shape in the plan view.

The P wiring 54 and the relay wiring 55 are disposed side by side in the Y direction. The semiconductor element 40L is mounted on one end side of the relay wiring 55 in the Y direction, specifically, on a side far from the P wiring 54. The joint portion 81 constituting the arm connection portion 80 is mounted on the other end side in the Y direction of the relay wiring 55, specifically, on a side closer to the P wiring 54. The P terminal 91P is connected to one end or the vicinity thereof of the P wiring 54 in the X direction. The output terminal 92 is connected to one end or the vicinity thereof of the relay wiring 55 in the X direction. The P terminal 91P and the output terminal 92 are disposed on the same side in the X direction with respect to the semiconductor element 40.

The front-face metal body 62 includes the N wiring 64 and the relay wiring 65 as in the preceding embodiment. The N wiring 64 and the relay wiring 65 are electrically isolated by providing a predetermined interval (gap). The gap is filled with the sealing body 30. The N wiring 64 is connected to the N terminal 91N and the source electrode 40S of the semiconductor element 40L. The relay wiring 65 is connected to the source electrode 40S of the semiconductor element 40H and the arm connection portion 80.

The N wiring 64 includes a base portion 644 and an extending portion 645. The N wiring 64 has a substantially L shape in the plan view. The base portion 644 has a substantially rectangular shape in the plan view. The base portion 644 includes the semiconductor element 40L in the plan view. The extending portion 645 is continuous with one side of the base portion 644 having a substantially rectangular shape in the plan view. The extending portion 645 extends from the opposing side of the base portion 644 with respect to the relay wiring 65 toward a base portion 654 in the Y direction.

The relay wiring 65 includes the base portion 654 and an extending portion 655. The relay wiring 65 has a substantially L shape in the plan view. The base portion 654 has a substantially rectangular shape in the plan view. The base portion 654 includes the semiconductor element 40H in the plan view. The extending portion 655 is continuous with one side of the base portion 654 having a substantially rectangular shape in the plan view. The extending portion 655 extends from the opposing side of the base portion 654 with respect to the N wiring 64 toward the base portion 644 in the Y direction. At least part of the extending portion 655 overlaps the relay wiring 55 in the plan view.

The N wiring 64 and the relay wiring 65 are disposed side by side in the Y direction. The base portions 644, 654 are arranged in the Y direction. The source electrode 40S of the semiconductor element 40L is electrically connected to the base portion 644. The source electrode 40S of the semiconductor element 40H is electrically connected to the base portion 654. The extending portions 645, 655 are arranged in the X direction. The N terminal 91N is connected to the extending portion 645. The joint portion 81 is connected to the extending portion 655.

The back-face metal body 53, 63 is electrically isolated from the front-face metal body 52, 62 by the insulating base member 51, 61. The back-face metal body 53, 63 according to the present embodiment is so-called solid conductor respectively disposed on substantially the entire regions of the back faces of the insulating base members 51 and 61. The back-face metal body 53 is exposed from the one face 30*a* of the sealing body 30, and the back-face metal body 63 is exposed from the back face 30*b*. The exposed face of the back-face metal body 53 is substantially flush with the one face 30*a*. The exposed face of the back-face metal body 63 is substantially flush with the back face 30*b*.

The conductive spacer 70 is interposed between the source electrode 40S of the semiconductor element 40 and the substrate 60. The conductive spacers 70 are individually connected to the source electrode 40S of the semiconductor elements 40. The semiconductor device 20 includes two conductive spacers 70. One of the conductive spacers 70 electrically connects the source electrode 40S of the semiconductor element 40H and the relay wiring 65. The other one of the conductive spacers 70 electrically connects the source electrode 40S of the semiconductor element 40L and the N wiring 64.

The arm connection portion 80 electrically connects the relay wirings 55, 65. The arm connection portion 80 is provided between the semiconductor element 40H and the semiconductor element 40L in the Y direction. The arm connection portion 80 is provided in a region where the relay wiring 55 and the relay wiring 65 (extending portion 655) overlap each other in the plan view. As in the preceding embodiment, the arm connection portion 80 according to the present embodiment includes the joint portion 81 and the bonding member 103. The joint portion 81 is a metal columnar body. In the Z direction, the bonding member 103 is interposed between one end of the joint portion 81 and the relay wiring 55, and the bonding member 103 is interposed between the other one end thereof and the relay wiring 65.

Alternatively, the joint portion 81 may be integrally continuous with at least one of the front-face metal bodies 52, 62. That is, the joint portion 81 may be provided integrally with the front-face metal body 52, 62 as part of the substrate 50, 60. The arm connection portion 80 may not include the joint portion 81. In other words, the arm connection portion 80 may only include the bonding member 103.

The external connection terminals 90 include the power supply terminal 91, the output terminal 92, and the signal terminal 93. The power supply terminal 91 includes the P terminal 91P and the N terminal 91N. Hereinafter, the P terminal 91P, the N terminal 91N, and the output terminal 92 may be referred to as "main terminals 91P, 91N, 92". The signal terminal 93 includes the signal terminal 93H on the upper arm 9H side and the signal terminal 93L on the lower arm 9L side.

The P terminal 91P is connected to one end or the vicinity thereof of the P wiring 54 in the X direction. The P terminal 91P extends outward in the X direction from the connection portion 91*a* with the P wiring 54. Part of the P terminal 91P including the connecting portion 91*a* is covered with the sealing body 30, and the remaining part protrudes from the sealing body 30. The P terminal 91P protrudes to the outside of the sealing body 30 from the center or the vicinity thereof in the Z direction on the side face 30*f*.

The N terminal 91N is connected to one end or the vicinity thereof of the N wiring 64 in the X direction. The N terminal 91N extends outward in the X direction from the connection portion 91*b* with the N wiring 64. Part of the N terminal 91N including the connecting portion 91*b* is covered with the sealing body 30, and the remaining part protrudes from the sealing body 30. The N terminal 91N protrudes to the outside of the sealing body 30 from the center or the vicinity thereof in the Z direction on the side face 30*f*.

The output terminal 92 is connected to one end or the vicinity thereof of the relay wiring 55 in the X direction. The output terminal 92 extends outward in the X direction from a connection portion 92*a* with the relay wiring 55. Part of the output terminal 92 including the connecting portion 92*a* is covered with the sealing body 30, and the remaining part protrudes from the sealing body 30. The output terminal 92 protrudes to the outside of the sealing body 30 from the center or the vicinity thereof in the Z direction on the side face 30*f*.

The three main terminals 91P, 91N, 92 are disposed side by side in the Y direction. The main terminals 91P, 91N, 92 are disposed in the order of the P terminal 91P, the N terminal 91N, and the output terminal 92 in the Y direction. The side faces of the P terminal 91P and the N terminal 91N, which are the power supply terminals 91, oppose each other in part including a portion protruding from the sealing body 30.

The signal terminal 93 is electrically connected to the pad 40P of the corresponding semiconductor element 40 via a connection member such as the bonding wire 110. The signal terminal 93H is connected to the pad 40P of the semiconductor element 40H via the bonding wire 110. The signal terminal 93L is connected to the pad 40P of the semiconductor element 40L via the bonding wire 110. The signal terminal 93 extends outward in the X direction, and protrudes to the outside of the sealing body 30 from the center or the vicinity thereof in the Z direction on the side face 30*g*. The signal terminal 93 extends to the side opposite to the main terminals 91P, 91N, 92 in the X direction.

The lead frame 94 includes the external connection terminals 90, the tie bars 94*a*, and the outer peripheral frame 94*b* as in the configuration described in the preceding embodiment. The lead frame 94 according to the present embodiment further includes the guide frame 94*c*. As described in the preceding embodiment, the tie bars 94*a* and the outer peripheral frame 94*b* are removed as unnecessary portions in the manufacturing process of the semiconductor device 20. On the other hand, the guide frame 94*c* remains as an element of the semiconductor device 20 together with the external connection terminals 90.

As illustrated in FIG. 114, the lead frame 94 includes two guide frames 94*c*. One of the guide frames 94*c* is connected to the P terminal 91P. The guide frame 94*c* connects the P terminal 91P and the outer peripheral frame 94*b* in a state before the unnecessary portion is removed. The other one of the guide frames 94*c* is connected to the output terminal 92. The guide frame 94*c* connects the output terminal 92 and the outer peripheral frame 94*b* in a state before the unnecessary portion is removed.

As illustrated in FIG. 114 and FIGS. 119 to 121, the guide frame 94*c* includes a connecting portion 940, a first linking portion 941, and a second linking portion 942. The connecting portion 940 is a portion of the guide frame 94*c* connecting with the front-face metal body 52. The guide frame 94*c* continuous with the P terminal 91P is connected to the P wiring 54. Specifically, in the P wiring 54, the connecting portion 940 is connected to an end opposite to the connecting portion of the P terminal 91P and to an end or the vicinity thereof opposite to the relay wiring 55 in the Y direction. The connecting portion 940 is connected to one of four corners of the P wiring 54 having a substantially rectangular shape in the plan view.

The first linking portion 941 links the P terminal 91P and the connecting portion 940. The first linking portion 941 extends from the connecting portion 91*a* of the P terminal 91P toward the side face 30*g* in the X direction. The first linking portion 941 does not overlap the P wiring 54 (front-face metal body 52) in the plan view. The first linking portion 941 extends along the outer peripheral end of the front-face metal body 52 outside the front-face metal body 52. The second linking portion 942 links the connecting portion 940 and the outer peripheral frame 94*b*. The second linking portion 942 extends outward in the X direction from the connecting portion 940.

The guide frame 94*c* continuous with the output terminal 92 is connected to the relay wiring 55. Specifically, in the relay wiring 55, the connecting portion 940 is connected to an end opposite to the connecting portion of the output terminal 92 and to an end or the vicinity thereof opposite to the P wiring 54 in the Y direction. The connecting portion 940 is connected to one of four corners of the relay wiring 55 having a substantially rectangular shape in the plan view.

The first linking portion 941 links the output terminal 92 and the connecting portion 940. The first linking portion 941 extends from the connecting portion 92*a* of the output terminal 92 toward the side face 30*g* in the X direction. The first linking portion 941 does not overlap the relay wiring 55 (front-face metal body 52) in the plan view. The first linking portion 941 extends along the outer peripheral end of the front-face metal body 52 outside the front-face metal body 52. The second linking portion 942 links the connecting portion 940 and the outer peripheral frame 94*b*. The second linking portion 942 extends outward in the X direction from the connecting portion 940.

The guide frame 94*c* can have a connection structure (bonding structure) that is the same as or similar to the main terminals 91P, 91N, 92. The guide frame 94*c* is connected to the front-face metal body 52 via, for example, the bonding member 104. As the bonding member 104, solder or a sintered member can be used as described in the preceding embodiment. The guide frame 94*c* may be directly bonded to the front-face metal body 52 without interposing the bonding member 104 therebetween. For example, the guide frame 94*c* may be directly bonded to the front-face metal body 52 by ultrasonic bonding, friction stir welding, laser welding, or the like.

As described above, in the semiconductor device 20 according to the present embodiment, the plurality of semiconductor elements 40 constituting the upper-lower arm circuit 9 for one phase is sealed by the sealing body 30. The sealing body 30 integrally seals the plurality of semiconductor elements 40, part of the substrate 50, part of the substrate 60, the plurality of conductive spacers 70, the arm connection portion 80, and part of each of the external connection terminals 90. The sealing body 30 seals the insulating base member 51, 61 and the front-face metal body 52, 62 in the substrate 50, 60.

The semiconductor element 40 is disposed between the substrates 50, 60 in the Z direction. The semiconductor element 40 is sandwiched between the substrates 50, 60 disposed to oppose each other. As a result, the heat of the semiconductor element 40 can be dissipated to both sides in the Z direction. The semiconductor device 20 has a double-sided heat dissipation structure. The back face 50*b* of the substrate 50 is substantially flush with the one face 30*a* of the sealing body 30. The back face 60*b* of the substrate 60 is substantially flush with the one face 30*b* of the sealing body 30. Since the back faces 50*b*, 60*b* are exposed faces, heat dissipation properties can be enhanced.

Summary of Thirteenth Embodiment

The configuration described in the present embodiment can be combined with various configurations described in the preceding embodiments with some exceptions. Some exceptions described above include: a configuration in which the power supply terminal is connected to each of the pair of extending portions of the front-face metal body (see FIGS. 15 and 23); and a configuration in which a slit is provided in the front-face metal body so as to separate the plurality of semiconductor elements connected in parallel (see FIG. 28 and the like). The configuration described in the present embodiment can be combined with any of the configurations described in the first embodiment, the second embodiment, the third embodiment, the fourth embodiment, the fifth embodiment, the sixth embodiment, the seventh embodiment, the eighth embodiment, the ninth embodiment, the tenth embodiment, the eleventh embodiment, the twelfth embodiment, and the modifications thereof.

An example in which the semiconductor device 20 includes the conductive spacer 70, but the present disclosure is not limited thereto. The front-face metal body 62 may be provided with a projection instead of the conductive spacer 70.

Although the example in which the substrate 50 is adopted as the wiring member connected to the drain electrode 40D has been described, the present disclosure is not limited thereto. In a configuration not limited to the substrate 50, a metal plate (lead frame) may be adopted instead of the substrate 50. Although the example in which the substrate 60 is adopted as the wiring member connected to the source electrode 40S has been described, the present disclosure is not limited thereto. In a configuration not limited to the substrate 60, a metal plate (lead frame) may be adopted instead of the substrate 60.

OTHER EMBODIMENTS

The disclosure in this specification, the drawings, and the like is not limited to the exemplified embodiments. The present disclosure encompasses embodiments described above and modifications of the above-described embodiments made by a person skilled in the art. For example, the present disclosure is not limited to a combination of the components and/or elements described in the embodiments. The present disclosure may be implemented by various different combinations. The present disclosure may include additional configuration that can be added to the above-described embodiments. The present disclosure also encompasses modifications which include partial components/elements of the above-described embodiments. The present disclosure also encompasses replacement or combination of components and/or elements between one embodiment and another. The technical scope disclosed in the present disclosure is not limited to the above-described embodiments. It should be understood that part of disclosed technical scope is indicated by recitation of claims, and includes every modification within the equivalent meaning and the scope of recitation of claims.

The disclosure in the specification, the drawings and the like is not limited by the recitation of the claims. The disclosures in the specification, the drawings, and the like encompass the technical ideas recited in the claims, and further extend to a wider variety of technical ideas than those in the claims. Therefore, various technical ideas can be extracted from the disclosure of the specification, the drawings and the like without being limited to the recitation of the claims.

When an element or a layer is described as "disposed above", "linked" or "connected", the element or the layer may be directly disposed above, linked or connected to another element or another layer, or an intervening element or an intervening layer may be present therebetween. In contrast, when an element or a layer is described as "disposed directly above", "directly linked" or "directly connected", an intervening element or an intervening layer is not present. Other terms used to describe the relationships between elements (for example, "between" vs. "directly between", and "adjacent" vs. "directly adjacent") should be interpreted similarly. As used herein, the term "and/or" includes any combination, and all combinations, with respect to one or more related listed items.

Spatial relative terms "inside", "outside", "back", "bottom", "low", "top", "high", and the like are used herein to facilitate the description that describes relationships between one element or feature and another element or feature. Spatial relative terms can be intended to encompass different orientations of a device in use or operation, in addition to the orientations depicted in the drawings. For example, when the device in the figure is flipped over, an element described as "below" or "directly below" another element or feature is directed "above" the other element or feature. Therefore, the term "below" can encompass both above and below. The device may be oriented in the other direction (e.g., rotated 90 degrees or in any other direction) and the spatially relative terms used herein are interpreted accordingly.

The drive system 1 of a vehicle is not limited to the above configuration. For example, an example in which one motor generator 3 is provided has been described, but the present disclosure is not limited thereto. A plurality of motor generators may be provided. Although the example in which the power conversion device 4 includes the inverter 6 as the power conversion circuit has been described, the present disclosure is not limited thereto. For example, a plurality of inverters may be provided. At least one inverter and a converter may be provided. Only the converter may be provided.

Although the example in which the semiconductor element 40 includes the MOSFET 11 as the switching element has been described, the present disclosure is not limited thereto. For example, an IGBT can be adopted. The IGBT is an abbreviation for "insulated gate bipolar transistor".

What is claimed is:

1. A semiconductor device to be arranged adjacent to a cooler in a predetermined direction, the semiconductor device comprising:

a semiconductor element having main electrodes on opposite faces opposite in the predetermined direction;

a substrate having an insulating base member containing resin, a front-face metal body disposed on a front face of the insulating base member and a back-face metal body disposed on a back face of the insulating base member, the front-face metal body being electrically connected to at least one of the main electrodes of the semiconductor element; and a sealing body containing resin and sealing at least a part of the substrate and the semiconductor element, wherein the back-face metal body is exposed from the sealing body so that the back-face metal body is configured to face the cooler in the predetermined direction and to be thermally connected to the cooler, wherein a glass transition point of the insulating base member is referred to as Tgi, a linear expansion coefficient of the insulating base member is referred to as $\alpha i$, a glass transition point of the sealing body is referred to as Tgs, and a linear expansion coefficient of the sealing body is referred to as $\alpha s$, and wherein the insulating base member and the sealing body satisfy a relationship of $Tgs \geq Tgi$ and a relationship of $\alpha i \geq \alpha s$ in a direction orthogonal to the predetermined direction.

2. The semiconductor device according to claim 1, wherein the semiconductor element has, as the main electrodes, a first main electrode and a second main electrode disposed on the opposite faces in the predetermined direction, wherein the substrate includes a first substrate to which the first main electrode is connected and a second substrate to which the second main electrode is connected, and wherein the first substrate and the second substrate are disposed to interpose the semiconductor element therebetween in the predetermined direction.

3. The semiconductor device according to claim 1, wherein wherein a linear expansion of the insulating base member in a temperature range lower than the glass transition point Tgi of the insulating base member is referred to as $\alpha 1i$, and a linear expansion of the insulating base member in a temperature range equal to or higher than the glass transition point Tgi is referred to as $\alpha 2i$, wherein a linear expansion of the sealing body in a temperature range lower than the glass transition point Tgs is referred to as $\alpha 1s$, and a linear expansion of the insulating base member in a temperature range equal to or higher than the glass transition point Tgs is referred to as $\alpha 2s$, and wherein the insulating base member and the sealing body satisfy a relationship of $\alpha 1i \geq \alpha 1s$ and a relationship of $\alpha 2i \geq \alpha 2s$ in the direction orthogonal to the predetermined direction.

4. The semiconductor device according to claim 1, wherein the substrate is disposed between the semiconductor element and the cooler.

5. A semiconductor module comprising:

a cooler; and a semiconductor device arranged adjacent to the cooler in a predetermined direction, wherein the semiconductor device includes:

a semiconductor element having main electrodes on opposite faces opposite in the predetermined direction;

a substrate having an insulating base member containing resin, a front-face metal body disposed on a front face of the insulating base member and a back-face metal body disposed on a back face of the insulating base member, the front-face metal body being electrically connected to at least one of the main electrodes of the semiconductor element; and a sealing body containing resin and sealing at least a part of the substrate and the semiconductor element, wherein the back-face metal body is exposed from the sealing body so that the back-face metal body faces the cooler and is thermally connected to the cooler through a heat conductive member, wherein a glass transition point of the insulating base member is referred to as Tgi, a linear expansion coefficient of the insulating base member is referred to as $\alpha i$, a glass transition point of the sealing body is referred to as Tgs, and a linear expansion coefficient of the sealing body is referred to as $\alpha s$, and wherein the insulating base member and the sealing body satisfy a relationship of $Tgs \geq Tgi$ and a relationship of $\alpha i \geq \alpha s$ in a direction orthogonal to the predetermined direction.

* * * * *